US011727254B2

(12) United States Patent
Lie et al.

(10) Patent No.: US 11,727,254 B2
(45) Date of Patent: *Aug. 15, 2023

(54) CONTROL WAVELET FOR ACCELERATED DEEP LEARNING

(71) Applicant: Cerebras Systems Inc., Sunnyvale, CA (US)

(72) Inventors: Sean Lie, Los Gatos, CA (US); Gary R. Lauterbach, Los Altos, CA (US); Michael Edwin James, San Carlos, CA (US); Michael Morrison, Sunnyvale, CA (US); Srikanth Arekapudi, Santa Clara, CA (US)

(73) Assignee: Cerebras Systems Inc., Sunnyvale, CA (US)

( * ) Notice: Subject to any disclaimer, the term of this patent is extended or adjusted under 35 U.S.C. 154(b) by 26 days.

This patent is subject to a terminal disclaimer.

(21) Appl. No.: 17/005,140

(22) Filed: Aug. 27, 2020

(65) Prior Publication Data

US 2021/0224639 A1 Jul. 22, 2021

Related U.S. Application Data

(63) Continuation of application No. 16/090,049, filed as application No. PCT/IB2018/052664 on Apr. 17, 2018, now Pat. No. 10,762,418.

(Continued)

(51) Int. Cl.
*G06N 3/063* (2023.01)
*G06F 13/00* (2006.01)
*G06N 3/084* (2023.01)
(Continued)

(52) U.S. Cl.
CPC ............ *G06N 3/063* (2013.01); *G06F 5/06* (2013.01); *G06F 9/3001* (2013.01);
(Continued)

(58) Field of Classification Search
CPC .... G06N 3/063; G06N 3/0445; G06N 3/0454; G06N 3/0472; G06N 3/0481; G06N 3/08;
(Continued)

(56) References Cited

U.S. PATENT DOCUMENTS

| 2015/0356055 A1* | 12/2015 | Omtzigt | G06F 15/825 |
| | | | 712/11 |
| 2016/0085547 A1* | 3/2016 | Memon | G06F 9/30032 |
| | | | 712/208 |
| 2018/0189063 A1* | 7/2018 | Fleming | G06F 9/3016 |

* cited by examiner

*Primary Examiner* — Shane D Woolwine
(74) *Attorney, Agent, or Firm* — PatentVentures; Bennett Smith

(57) ABSTRACT

Techniques in advanced deep learning provide improvements in one or more of accuracy, performance, and energy efficiency. An array of processing elements performs flow based computations on wavelets of data. Each processing element has a compute element and a routing element. Each compute element has memory. Each router enables communication via wavelets with nearest neighbors in a 2D mesh. A compute element receives a wavelet. If a control specifier of the wavelet is a first value, then instructions are read from the memory of the compute element in accordance with an index specifier of the wavelet. If the control specifier is a second value, then instructions are read from the memory of the compute element in accordance with a virtual channel specifier of the wavelet. Then the compute element initiates execution of the instructions.

20 Claims, 39 Drawing Sheets

Related U.S. Application Data

(60) Provisional application No. 62/655,826, filed on Apr. 11, 2018, provisional application No. 62/655,210, filed on Apr. 9, 2018, provisional application No. 62/652,933, filed on Apr. 5, 2018, provisional application No. 62/628,784, filed on Feb. 9, 2018, provisional application No. 62/628,773, filed on Feb. 9, 2018, provisional application No. 62/580,207, filed on Nov. 1, 2017, provisional application No. 62/542,645, filed on Aug. 8, 2017, provisional application No. 62/542,657, filed on Aug. 8, 2017, provisional application No. 62/522,065, filed on Jun. 19, 2017, provisional application No. 62/522,081, filed on Jun. 19, 2017, provisional application No. 62/520,433, filed on Jun. 15, 2017, provisional application No. 62/517,949, filed on Jun. 11, 2017, provisional application No. 62/486,372, filed on Apr. 17, 2017.

(51) Int. Cl.
  *G06N 3/08* (2023.01)
  *G06F 9/30* (2018.01)
  *H04L 49/00* (2022.01)
  *G06F 9/38* (2018.01)
  *H04L 12/54* (2022.01)
  *G06F 5/06* (2006.01)
  *G06F 13/40* (2006.01)
  *G06N 3/04* (2023.01)
  *G06N 3/044* (2023.01)
  *G06N 3/045* (2023.01)
  *G06N 3/047* (2023.01)
  *G06N 3/048* (2023.01)
  *H04L 49/506* (2022.01)
  *G06F 30/392* (2020.01)

(52) U.S. Cl.
  CPC ........ *G06F 9/3009* (2013.01); *G06F 9/30014* (2013.01); *G06F 9/3016* (2013.01); *G06F 9/30036* (2013.01); *G06F 9/30087* (2013.01); *G06F 9/30192* (2013.01); *G06F 9/3851* (2013.01); *G06F 13/00* (2013.01); *G06F 13/4027* (2013.01); *G06N 3/04* (2013.01); *G06N 3/044* (2023.01); *G06N 3/045* (2023.01); *G06N 3/047* (2023.01); *G06N 3/048* (2023.01); *G06N 3/08* (2013.01); *G06N 3/084* (2013.01); *H04L 12/56* (2013.01); *H04L 49/3018* (2013.01); *G06F 30/392* (2020.01); *H04L 49/3045* (2013.01); *H04L 49/506* (2013.01)

(58) Field of Classification Search
  CPC ........ G06N 3/084; G06N 20/00; G06N 20/10; G06N 20/20; G06N 3/04; G06N 3/044; G06N 3/045; G06N 3/047; G06N 3/048; G06F 9/3001; G06F 9/30014; G06F 9/30036; G06F 9/30087; G06F 9/3009; G06F 9/3016; G06F 9/30192; G06F 9/3851; G06F 30/392; G06F 5/06; G06F 13/00; G06F 13/14027; H04L 49/506; H04L 49/3045; H04L 49/3018; H04L 12/56
  USPC .......................................................... 706/15
  See application file for complete search history.

| CH 2114 | SQ 2113 | SC 2112 | SA 2111 | SS 2110 | Type 2109 | US 2108 | CX 2107 | Term 2106 | AC 2105 | SW 2104 | UE 2103 | UTID 2102 | Length 2101 |
|---|---|---|---|---|---|---|---|---|---|---|---|---|---|

Fabric Input Data Structure Descriptor, 2100

Fig. 21A

| AC 2125 | Index High 2128.2 | WLI 2132 | SA 2131 | SS 2130 | Type 2129 | Index Low 2128.1 | C 2127 | Color 2126 | SW 2124 | UE 2123 | UTID 2122 | Length 2121 |
|---|---|---|---|---|---|---|---|---|---|---|---|---|

Fabric Output Data Structure Descriptor, 2120

Fig. 21B

| Stride 2153 | WLI 2152 | SA 2151 | SS 2150 | Type 2149 | Base Address 2142 | Length 2141 |
|---|---|---|---|---|---|---|

1D Memory Vector Data Structure Descriptor, 2140

Fig. 21C

Length, 2161

| Length Upper Bits 2161.2 | WLI 2172 | SA 2171 | SS 2170 | Type 2169 | Base Address 2162 | Length Lower Bits 2161.1 |
|---|---|---|---|---|---|---|

4D Memory Vector Data Structure Descriptor, 2160

Fig. 21D

| SW 2184 | WLI 2192 | SA 2191 | SS 2190 | Type 2189 | FW 2188 | Base Address 2182 | Length 2181 |
|---|---|---|---|---|---|---|---|

Circular Memory Buffer Data Structure Descriptor, 2180

Fig. 21E

| Pop Color 2216 | Push Color 2215 | FIFO 2214 | End Address 2213 | Start Address 2212 | Type 2211 |

Circular Memory Buffer Extended Data Structure Descriptor, 2210

Fig. 22A

| Stride 2245 | Stride Select 4 2244.4 | Stride Select 3 2244.3 | Stride Select 2 2244.2 | Stride Select 1 2244.1 | DF 2243 | Dimensions 2242 | Type 2241 |

4D Memory Vector Extended Data Structure Descriptor, 2240

Fig. 22B

CONTROL WAVELET FOR ACCELERATED DEEP LEARNING

CROSS REFERENCE TO RELATED APPLICATIONS

To the extent permitted by the type of the instant application, this application incorporates by reference for all purposes the following applications, all commonly owned with the instant application not later than the effective filing date of the instant application:

U.S. application Ser. No. 16/090,049, filed 2018 Sep. 28, now U.S. Pat. No. 10,762,418 first named inventor Sean LIE, and entitled CONTROL WAVELET FOR ACCELERATED DEEP LEARNING;

PCT Application Serial No. PCT/IB2018/052664, filed 2018 Apr. 17, first named inventor Sean LIE, and CONTROL WAVELET FOR ACCELERATED DEEP LEARNING;

PCT Application Serial No. PCT/IB2018/052651, filed 2018 Apr. 17, first named inventor Sean LIE, and entitled TASK ACTIVATING FOR ACCELERATED DEEP LEARNING;

PCT Application Serial No. PCT/IB2018/052643, filed 2018 Apr. 17, first named inventor Sean LIE, and entitled DATA STRUCTURE DESCRIPTORS FOR DEEP LEARNING ACCELERATION;

PCT Application Serial No. PCT/IB2018/052640, filed 2018 Apr. 17, first named inventor Sean LIE, and entitled MICROTHREADING FOR ACCELERATED DEEP LEARNING;

PCT Application Serial No. PCT/IB2018/052638, filed 2018 Apr. 16, first named inventor Sean LIE, and entitled TASK SYNCHRONIZATION FOR ACCELERATED DEEP LEARNING;

PCT Application Serial No. PCT/IB2018/052610, filed 2018 Apr. 15, first named inventor Sean LIE, and entitled WAVELET REPRESENTATION FOR ACCELERATED DEEP LEARNING;

PCT Application Serial No. PCT/IB2018/052607, filed 2018 Apr. 15, first named inventor Sean LIE, and entitled NEURON SMEARING FOR ACCELERATED DEEP LEARNING;

PCT Application Serial No. PCT/IB2018/052606, filed 2018 Apr. 15, first named inventor Sean LIE, and entitled DATAFLOW TRIGGERED TASKS FOR ACCELERATED DEEP LEARNING;

PCT Application Serial No. PCT/IB2018/052602, filed 2018 Apr. 13, first named inventor Sean LIE, and entitled FLOATING-POINT UNIT STOCHASTIC ROUNDING FOR ACCELERATED DEEP LEARNING;

U.S. Provisional Application Ser. No. 62/655,826, filed 2018 Apr. 11, first named inventor Sean LIE, and entitled MICROTHREADING FOR ACCELERATED DEEP LEARNING;

U.S. Provisional Application Ser. No. 62/655,210, filed 2018 Apr. 9, first named inventor Sean LIE, and entitled BACKPRESSURE FOR ACCELERATED DEEP LEARNING;

U.S. Provisional Application Ser. No. 62/652,933, filed 2018 Apr. 5, first named inventor Sean LIE, and entitled TASK ACTIVATING FOR ACCELERATED DEEP LEARNING;

U.S. Non-Provisional application Ser. No. 15/903,340, filed 2018 Feb. 23, first named inventor Sean LIE, and entitled ACCELERATED DEEP LEARNING;

PCT Application Serial No. PCT/IB2018/051128, filed 2018 Feb. 23, first named inventor Sean LIE, and entitled ACCELERATED DEEP LEARNING;

U.S. Provisional Application Ser. No. 62/628,784, filed 2018 Feb. 9, first named inventor Sean LIE, and entitled FABRIC VECTORS FOR DEEP LEARNING ACCELERATION;

U.S. Provisional Application Ser. No. 62/628,773, filed 2018 Feb. 9, first named inventor Sean LIE, and entitled DATA STRUCTURE DESCRIPTORS FOR DEEP LEARNING ACCELERATION;

U.S. Provisional Application Ser. No. 62/580,207, filed 2017 Nov. 1, first named inventor Sean LIE, and entitled NEURON SMEARING FOR ACCELERATED DEEP LEARNING;

U.S. Provisional Application Ser. No. 62/542,645, filed 2017 Aug. 8, first named inventor Sean LIE, and entitled DATAFLOW TRIGGERED TASKS FOR ACCELERATED DEEP LEARNING;

U.S. Provisional Application Ser. No. 62/542,657, filed 2017 Aug. 8, first named inventor Sean LIE, and entitled TASK SYNCHRONIZATION FOR ACCELERATED DEEP LEARNING;

U.S. Provisional Application Ser. No. 62/522,065, filed 2017 Jun. 19, first named inventor Sean LIE, and entitled WAVELET REPRESENTATION FOR ACCELERATED DEEP LEARNING;

U.S. Provisional Application Ser. No. 62/522,081, filed 2017 Jun. 19, first named inventor Sean LIE, and entitled CONTROL WAVELET FOR ACCELERATED DEEP LEARNING;

U.S. Provisional Application Ser. No. 62/520,433, filed 2017 Jun. 15, first named inventor Michael Edwin JAMES, and entitled INCREASED CONCURRENCY AND EFFICIENCY OF DEEP NETWORK TRAINING VIA CONTINUOUS PROPAGATION;

U.S. Provisional Application Ser. No. 62/517,949, filed 2017 Jun. 11, first named inventor Sean LIE, and entitled ACCELERATED DEEP LEARNING;

U.S. Provisional Application Ser. No. 62/486,372, filed 2017 Apr. 17, first named inventor Sean LIE, and entitled ACCELERATED DEEP LEARNING;

U.S. Provisional Application Ser. No. 62/485,638, filed 2017 Apr. 14, first named inventor Sean LIE, and entitled FLOATING-POINT UNIT STOCHASTIC ROUNDING FOR MACHINE LEARNING; and U.S. Provisional Application Ser. No. 62/462,640, filed 2017 Feb. 23, first named inventor Michael Edwin JAMES, and entitled INCREASED CONCURRENCY AND EFFICIENCY OF DEEP NETWORK TRAINING VIA CONTINUOUS PROPAGATION.

BACKGROUND

Field: Advancements in accelerated deep learning are needed to provide improvements in one or more of accuracy, performance, and energy efficiency.

Related Art: Unless expressly identified as being publicly or well known, mention herein of techniques and concepts, including for context, definitions, or comparison purposes, should not be construed as an admission that such techniques and concepts are previously publicly known or otherwise part of the prior art. All references cited herein (if any), including patents, patent applications, and publications, are hereby incorporated by reference in their entireties, whether specifically incorporated or not, for all purposes.

SYNOPSIS

The invention may be implemented in numerous ways, e.g., as a process, an article of manufacture, an apparatus, a system, a composition of matter, and a computer readable medium such as a computer readable storage medium (e.g., media in an optical and/or magnetic mass storage device such as a disk, an integrated circuit having non-volatile storage such as flash storage), or a computer network wherein program instructions are sent over optical or electronic communication links. The Detailed Description provides an exposition of one or more embodiments of the invention that enable improvements in cost, profitability, performance, efficiency, and utility of use in the field identified above. The Detailed Description includes an Introduction to facilitate understanding of the remainder of the Detailed Description. The Introduction includes Example Embodiments of one or more of systems, methods, articles of manufacture, and computer readable media in accordance with concepts described herein. As is discussed in more detail in the Conclusions, the invention encompasses all possible modifications and variations within the scope of the issued claims.

BRIEF DESCRIPTION OF DRAWINGS

FIG. 21A illustrates selected details of an embodiment of a Fabric Input Data Structure Descriptor.

FIG. 21B illustrates selected details of an embodiment of a Fabric Output Data Structure Descriptor.

FIG. 21C illustrates selected details of an embodiment of a 1D Memory Vector Data Structure Descriptor.

FIG. 21D illustrates selected details of an embodiment of a 4D Memory Vector Data Structure Descriptor.

FIG. 21E illustrates selected details of an embodiment of a Circular Memory Buffer Data Structure Descriptor.

FIG. 22A illustrates selected details of an embodiment of a Circular Memory Buffer Extended Data Structure Descriptor.

FIG. 22B illustrates selected details of an embodiment of a 4D Memory Vector Extended Data Structure Descriptor.

LIST OF REFERENCE SYMBOLS IN DRAWINGS

Figure 1:
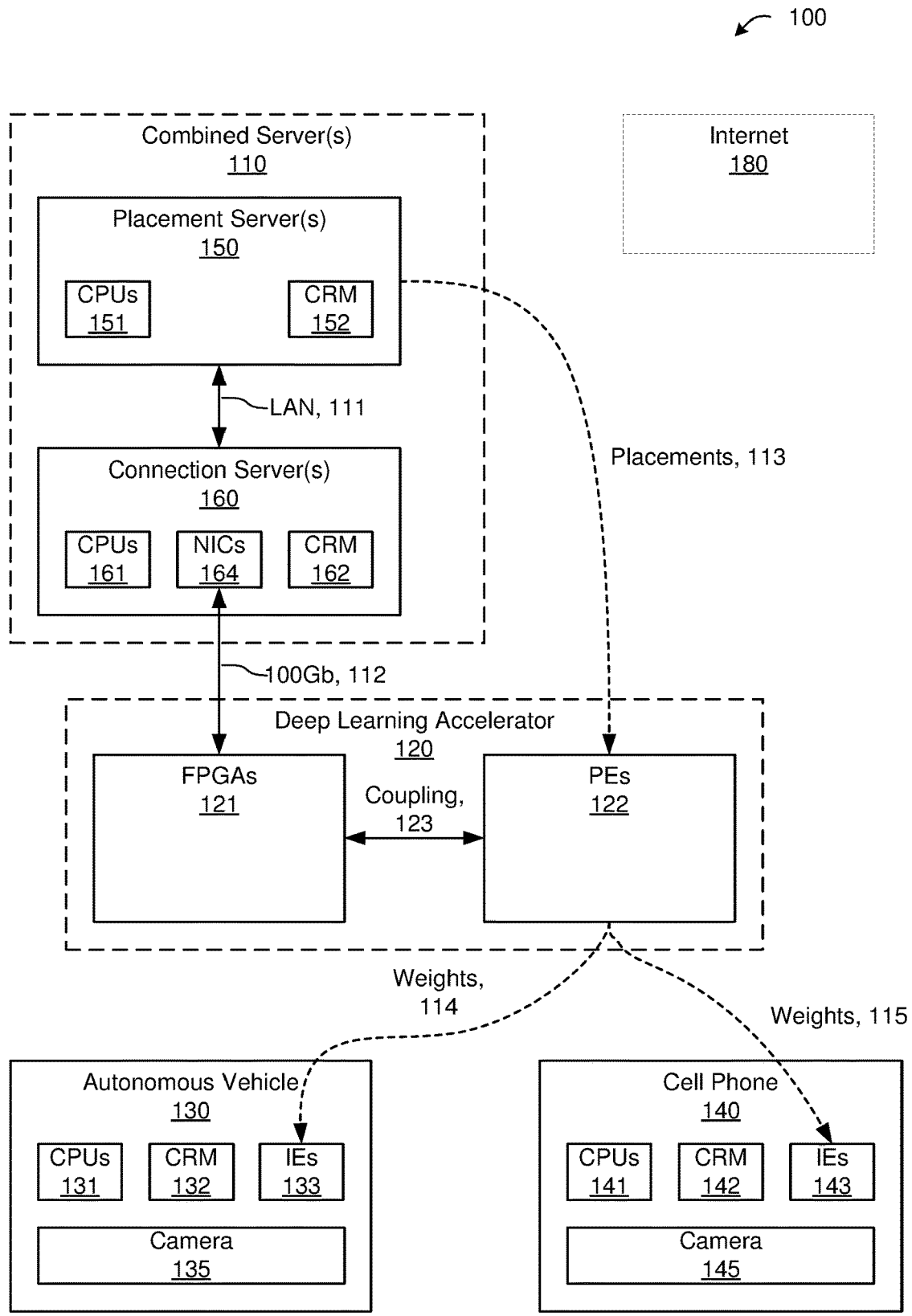
FIG. 1 illustrates selected details of an embodiment of a system for neural network training and inference, using a deep learning accelerator.

| Ref. Symbol | Element Name |
| --- | --- |
| 100 | Neural Network System |
| 110 | Combined Server(s) |
| 111 | LAN |
| 112 | 100 Gb |
| 113 | Placements |
| 114 | Weights |
| 115 | Weights |
| 120 | Deep Learning Accelerator |
| 121 | FPGAs |
| 122 | PEs |
| 123 | Coupling |
| 130 | Autonomous Vehicle |
| 131 | CPUs |
| 132 | CRM |
| 133 | IEs |
| 135 | Camera |
| 140 | Cell Phone |
| 141 | CPUs |
| 142 | CRM |
| 143 | IEs |
| 145 | Camera |
| 150 | Placement Server(s) |
| 151 | CPUs |
| 152 | CRM |
| 160 | Connection Server(s) |
| 161 | CPUs |
| 162 | CRM |
| 164 | NICs |
| 180 | Internet |
| 200 | Neural Network Software |
| 210 | Placement Server(s) SW |
| 212 | Neuron to PE Mapping SW |
| 220 | Connection Server(s) SW |
| 224 | 100 Gb NIC Driver |
| 225 | Training Info Provider SW |
| 226 | Weight Receiver SW |
| 230 | Autonomous Vehicle SW |
| 232 | Video Camera SW |
| 233 | Inference Engine(s) SW |
| 234 | Navigating SW |
| 240 | Cell Phone SW |
| 242 | Still Camera SW |
| 243 | Inference Engine(s) SW |
| 244 | Posting SW |
| 250 | Misc SW on FPGAs |
| 260 | Task SW on PEs |

-continued

| Ref. Symbol | Element Name |
| --- | --- |
| 300 | Neural Network Training/Inference, Overall |
| 310 | Place Neurons |
| 320 | Initialize FPGAs |
| 330 | Initialize PEs |
| 340 | Training Data => PEs |
| 350 | Forward Pass, Delta Pass, Chain Pass, Update Weights |
| 360 | Training Complete? |
| 370 | Weights Out |
| 380 | Use Weights for Inference |
| 400 | Deep Learning Accelerator |
| 401 | Forward |
| 402 | Delta |
| 403 | Chain |
| 410 | ASIC |
| 411 | ASIC |
| 412 | Wafer |
| 420 | I/O FPGAs |
| 430 | North coupling |
| 431 | East coupling |
| 432 | South coupling |
| 433 | West coupling |
| 497 | Particular PE |
| 498 | Particular PE |
| 499 | PE |
| 500 | PE |
| 510 | Router |
| 511 | West |
| 512 | Skip West |
| 513 | North |
| 514 | Skip East |
| 515 | East |
| 516 | South |
| 520 | Compute Element |
| 521 | Off Ramp |
| 522 | On Ramp |
| 600 | Router |
| 610 | Data In |
| 611 | skipX+ |
| 612 | skipX− |
| 613 | X+ |
| 614 | X− |
| 615 | Y+ |
| 616 | Y− |
| 617 | On Ramp |
| 620 | Data Out |
| 621 | skipX+ |
| 622 | skipX− |
| 623 | X+ |
| 624 | X− |
| 625 | Y+ |
| 626 | Y− |
| 627 | Off Ramp |
| 630 | Stall Out |
| 631 | skipX+ |
| 632 | skipX− |
| 633 | X+ |
| 634 | X− |
| 635 | Y+ |
| 636 | Y− |
| 637 | On Ramp |
| 640 | Stall In |
| 641 | skipX+ |
| 642 | skipX− |
| 643 | X+ |
| 644 | X− |
| 645 | Y+ |
| 646 | Y− |
| 647 | Off Ramp |
| 650 | Data Queues |
| 651 | Write Dec |
| 652 | Out |
| 653 | Sources |
| 654 | Router Sched |
| 656 | Gen Stall |
| 657 | Stall |
| 660 | Control Info |
| 661 | Dest |

| Ref. Symbol | Element Name |
|---|---|
| 662 | Sent |
| 670 | Src |
| 710 | Wavelet Ingress |
| 711 | Wait for Wavelet |
| 712 | Receive Wavelet |
| 713 | Wavelet => Router Q |
| 740 | Generating and Providing Backpressure Information, Overall |
| 741 | CE of PE |
| 742 | Router of PE |
| 743 | Start |
| 744 | Determine Input Q(s) over Threshold |
| 745 | Determine Colors Associated with Input Q(s) |
| 746 | Provide Stall/Ready to Router |
| 747 | Provide Wavelet to CE in Accordance with Stall/Ready |
| 748 | End |
| 750 | Generating and Providing Backpressure Information, Overall |
| 751 | Router of PE |
| 752 | CE of PE |
| 753 | Router(s) of Neighbor(s) |
| 755 | Start |
| 756 | Determine Data Queue(s) Over Threshold |
| 757 | Check Color Sources |
| 758 | Determine Stall/Ready Colors for CE, Neighbors |
| 759 | Provide Stall/Ready to CE, Neighbors |
| 760 | Provide Wavelet to Router in Accordance with Stall/Ready |
| 761 | Provide Wavelet to Router in Accordance with Stall/Ready |
| 762 | End |
| 780 | Stalling Processing, Overall |
| 781 | CE of PE |
| 782 | Start |
| 783 | Determine Full Output Q(s) |
| 784 | Determine Colors Associated Output Q(s) |
| 785 | Stall Processing for Colors Associated with Full Output Q(s) |
| 786 | End |
| 800 | CE |
| 812 | Terminate |
| 820 | Off Ramp |
| 822 | Hash |
| 824 | Qdistr |
| 830 | Picker |
| 834 | PC |
| 836 | I-Seq |
| 837 | On Ramp |
| 840 | Dec |
| 842 | RF |
| 844 | D-Seq |
| 845 | UT State |
| 846 | DSRs |
| 847 | Off Ramp |
| 848 | D-Store |
| 852 | Data Path |
| 854 | Memory |
| 859 | Output Queues |
| 859.0 | Output Q0 |
| 859.N | Output QN |
| 860 | On Ramp |
| 890 | Base |
| 896 | Scheduling Info |
| 897 | Input Qs |
| 897.0 | Input Q0 |
| 897.N | Input QN |
| 898 | Active Bits |
| 898.0 | Active Bit 0 |
| 898.N | Active Bit N |
| 899 | Block Bits |
| 899.0 | Block Bit 0 |
| 899.N | Block Bit N |
| 900 | Processing a Wavelet for Task Initiation, Overall |
| 901 | Start |
| 902 | Select Ready Wavelet for Task Initiation |
| 903 | Control/Data? |
| 904 | Add (Color * 4) to Base Register to Form Instruction Address |
| 905 | Fetch Instructions From Memory at Instruction Address |
| 906 | Execute Fetched Instruction(s) |
| 908 | Not Terminate |
| 909 | Terminate |
| 910 | Add Lower Index Bits to Base Register to Form Instruction Address |
| 919 | End |
| 920 | Task Activating, Overall |
| 921 | Start |
| 923 | Activate Operation for Color(s) |
| 924 | Activate Color(s) |
| 925 | Picker Selects Color |
| 926 | Initiate Task, Deactivate Color |
| 929 | End |
| 940 | Block and Unblock Instruction Processing Flow, Overall |
| 941 | Start |
| 942 | Fetch, Decode Instruction |
| 943 | Block Instruction? |
| 944 | Block Color(s) |
| 945 | Unblock Instruction? |
| 946 | Unblock Color(s) |
| 947 | Execute Instruction |
| 949 | End |
| 1040 | Neural Network Portion |
| 1041 | (Neuron) A |
| 1042 | (Neuron) B |
| 1043 | (Neuron) C |
| 1044 | (Neuron) D |
| 1045 | (Neuron) E |
| 1046 | (Neuron) F |
| 1060 | Processing Element Array Portion |
| 1061 | (Activation) aA |
| 1062 | (Activation) aB |
| 1063 | (Activation) aC |
| 1064 | (Activation) aD |
| 1065 | (Activation) aE |
| 1066 | (Activation) aF |
| 1070 | PE0 |
| 1071 | PE1 |
| 1072 | PE2 |
| 1073 | PE3 |
| 1074 | PE4 |
| 1075 | PE5 |
| 1076 | PE6 |
| 1077 | PE7 |
| 1078 | PE8 |
| 1080 | (weight) wAD |
| 1081 | (weight) wAE |
| 1082 | (weight) wAF |
| 1083 | (weight) wBD |
| 1084 | (weight) wBE |
| 1085 | (weight) wBF |
| 1086 | (weight) wCD |
| 1087 | (weight) wCE |
| 1088 | (weight) wCF |
| 1090 | PSA |
| 1091 | PSA |
| 1092 | PSA |
| 1101 | f_rxact:acc |
| 1102 | f_rxact:close |
| 1103 | f_psum:prop |
| 1104 | f_txact:tx |
| 1111 | Activations from Prior Layer |
| 1112 | Closeouts from Prior Layer |
| 1113 | Flow |
| 1114 | Wake |
| 1115 | Reschedule |
| 1116 | Start Psums |
| 1121 | Activations to Next Layer |
| 1122 | Closeouts to Next Layer |
| 1130 | Prop Psums |
| 1131 | Prop Psums |
| 1200 | Activation Accumulation/Closeout and Partial Sum Computation/Closeout, Overall |

| Ref. Symbol | Element Name |
|---|---|
| 1201 | Start |
| 1202 | Receive Activation |
| 1203 | Accumulate Activations |
| 1204 | Receive Activation Closeout |
| 1205 | Start Partial Sum Ring |
| 1206 | Receive Partial Sum |
| 1207 | Compute Partial Sum |
| 1208 | Transmit Partial Sum |
| 1209 | Transmit Activations |
| 1210 | Transmit Closeout |
| 1211 | End |
| 1301 | Sparse Wavelet |
| 1302 | Sparse Wavelet Payload |
| 1320 | Control Bit |
| 1321 | Index |
| 1321.1 | Lower Index Bits |
| 1321.2 | Upper Index Bits |
| 1322 | Sparse Data |
| 1324 | Color |
| 1331 | Dense Wavelet |
| 1332 | Dense Wavelet Payload |
| 1340 | Control Bit |
| 1343.1 | Dense Data |
| 1343.2 | Dense Data |
| 1344 | Color |
| 1400 | Wavelet Creation Flow, Overall |
| 1401 | Start |
| 1402 | Initialize PEs |
| 1403 | Set Source |
| 1404 | Set Destination (Fabric) DSR |
| 1405 | Fetch/Decode Instruction with Destination DSR |
| 1406 | Read DSR(s) |
| 1407 | Read (Next) Source Data Element(s) from Queue/Memory |
| 1408 | Provide Data Element(s) as Wavelet to Output Queue |
| 1409 | More Data Elements? |
| 1411 | Transmit Wavelet(s) to Fabric |
| 1412 | Receive Wavelet(s) from Fabric |
| 1410 | End |
| 1420 | CE of Transmitting PE |
| 1430 | Router of Transmitting PE |
| 1440 | Router of Receiving PE |
| 1500 | Wavelet Receive Flow, Overall |
| 1501 | Start |
| 1502 | Initialize PEs |
| 1503 | Receive Wavelet at Router |
| 1504 | To Other PE(s)? |
| 1505 | Transmit Wavelet to Output(s) |
| 1506 | For Local CE? |
| 1507 | Write Wavelet to Picker Queue |
| 1510 | End |
| 1520 | Router of Receiving PE |
| 1530 | CE of Receiving PE |
| 1600 | Wavelet Consumption Flow, Overall |
| 1601 | Start |
| 1602 | Picker Selects Wavelet for Processing |
| 1603 | Fetch, Execute Instructions |
| 1604 | End |
| 1700 | Neural Network |
| 1710 | Input Layer |
| 1711 | N11 |
| 1712 | N12 |
| 1713 | N13 |
| 1720 | Internal Layers |
| 1721 | N21 |
| 1721.1, 1721.2 | ½ N21 portions, respectively |
| 1722 | N22 |
| 1722.1, 1722.2 | ½ N22 portions, respectively |
| 1723 | N23 |
| 1723.1, 1723.2 | ½ N23 portions, respectively |
| 1724 | N24 |
| 1724.1, 1724.2 | ½ N24 portions, respectively |
| 1731 | N31 |
| 1731.1, 1731.2, 1731.3, 1731.4 | ¼ N31 portions, respectively |
| 1732 | N32 |
| 1732.1, 1732.2, 1732.3, 1732.4 | ¼ N32 portions, respectively |
| 1733 | N33 |
| 1740 | Output Layer |
| 1741 | N41 |
| 1742 | N42 |
| 1791 | communication |
| 1791.1 | communication portion |
| 1792 | communication |
| 1792.1 | communication portion |
| 1793 | communication |
| 1793.1 | communication portion |
| 1820 | PE0 |
| 1821 | PE1 |
| 1822 | PE2 |
| 1823 | PE3 |
| 1824 | PE4 |
| 1825 | PE5 |
| 1910 | in0 |
| 1911 | in1 |
| 1912 | in2 |
| 1913 | in3 |
| 1914 | in4 |
| 1915 | in5 |
| 1920 | out0 |
| 1921 | out1 |
| 1922 | out2 |
| 1923 | out3 |
| 1924 | out4 |
| 1925 | out5 |
| 1930.1 | ½ Local Compute |
| 1930.2 | ½ Local Compute |
| 1940.1 | ½ Local Storage |
| 1940.2 | ½ Local Storage |
| 1950.1 | Additional Compute |
| 1950.2 | Additional Compute |
| 1960.1 | Additional Storage |
| 1960.2 | Additional Storage |
| 1970 | Additional Communication |
| 2000 | Wafer Portion |
| 2040, 2041, 2043, 2044 | coupling between adjacent PEs, respectively |
| 2050, 2051, 2052, 2053, 2054, 2055, 2056, 2057 | portion of coupling between adjacent PEs, respectively |
| 2060 | communication |
| 2100 | Fabric Input Data Structure Descriptor |
| 2101 | Length |
| 2102 | UTID (Microthread Identifier) |
| 2103 | UE (Microthread Enable) |
| 2104 | SW (SIMD Width) |
| 2105 | AC (Activate Color) |
| 2106 | Term (Terminate Microthread on Control Wavelet) |
| 2107 | CX (Control Wavelet Transform Enable) |
| 2108 | US (Microthread Sparse Mode) |
| 2109 | Type |
| 2110 | SS (Single Step) |
| 2111 | SA (Save Address/Conditional Single Step Mode) |
| 2112 | SC (Color Specified, Normal Mode) |
| 2113 | SQ (Queue Specified, Normal Mode) |
| 2114 | CH (Color, High Bits) |
| 2120 | Fabric Output Data Structure Descriptor |
| 2121 | Length |
| 2122 | UTID (Microthread Identifier) |
| 2123 | UE (Microthread Enable) |
| 2124 | SW (SIMD Width) |
| 2125 | AC (Activate Color) |
| 2126 | Color |
| 2127 | C (Output Control Bit) |
| 2128.1 | Index Low |
| 2128.2 | Index High |
| 2129 | Type |
| 2130 | SS (Single Step) |
| 2131 | SA (Save Address/Conditional Single Step Mode) |
| 2132 | WLI (Wavelet Index Select) |
| 2140 | 1D Memory Data Structure Descriptor |

| Ref. Symbol | Element Name |
|---|---|
| 2141 | Length |
| 2142 | Base Address |
| 2149 | Type |
| 2150 | SS (Single Step) |
| 2151 | SA (Save Address/Conditional Single Step Mode) |
| 2152 | WLI (Wavelet Index Select) |
| 2153 | Stride |
| 2160 | 4D Memory Data Structure Descriptor |
| 2161 | Length |
| 2161.1 | Length Lower Bits |
| 2161.2 | Length Upper Bits |
| 2162 | Base Address |
| 2169 | Type |
| 2170 | SS (Single Step) |
| 2171 | SA (Save Address/Conditional Single Step Mode) |
| 2172 | WLI (Wavelet Index Select) |
| 2180 | Circular Memory Buffer Data Structure Descriptor |
| 2181 | Length |
| 2182 | Base Address |
| 2184 | SW (SIMD Width) |
| 2188 | FW (FIFO Wrap Bit) |
| 2189 | Type |
| 2190 | SS (Single Step) |
| 2191 | SA (Save Address/Conditional Single Step Mode) |
| 2192 | WLI (Wavelet Index Select) |
| 2210 | Circular Memory Buffer Extended Data Structure Descriptor |
| 2211 | Type |
| 2212 | Start Address |
| 2213 | End Address |
| 2214 | FIFO |
| 2215 | Push (Activate) Color |
| 2216 | Pop (Activate) Color |
| 2240 | 4D Memory Vector Extended Data Structure Descriptor |
| 2241 | Type |
| 2242 | Dimensions |
| 2243 | DF (Dimension Format) |
| 2244.1 | Stride Select (for Dimension) 1 |
| 2244.2 | Stride Select (for Dimension) 2 |
| 2244.3 | Stride Select (for Dimension) 3 |
| 2244.4 | Stride Select (for Dimension) 4 |
| 2245 | Stride |
| 2300 | Data Structure Descriptor Flow, Overall |
| 2301 | Start |
| 2302 | Set DSR(s) |
| 2303 | Fetch/Decode Instruction with DSR(s) |
| 2304 | Read DSR(s) |
| 2305 | (optional) Set XDSR(s) |
| 2306 | (optional) Read XDSR(s) |
| 2310 | Read (Next) Source Data Element(s) from Queue/Memory |
| 2310A | Read (Next) Source Data Element(s) from Queue/Memory |
| 2311 | Perform (Next) Operation(s) on Data Element(s) |
| 2312 | Write (Next) Destination Data Element(s) to Queue/Memory |
| 2313 | More Data Element(s)? |
| 2316 | End |
| 2400 | Data Structure Descriptor Decode Flow, Overall |
| 2401 | Start |
| 2410 | Fabric Vector |
| 2411 | Type = Fabric? |
| 2412 | Access via DSD |
| 2420 | Memory Vector |
| 2421 | Type = XDSR? |
| 2422 | Read XDSR Specified via DSD |
| 2423 | Type = 4D Vector? |
| 2424 | (optional) Read Stride Register(s) |
| 2427 | Access 1D via DSD |
| 2428 | Access 4D via XDSD |
| 2429 | Access Circular Buffer via XDSD |
| 2499 | End |
| 2510 | Multiple Operand Instruction |
| 2511 | Instruction Type |
| 2512 | Opcode |
| 2513 | Operand 0 Encoding |
| 2513.1 | Operand 0 Type |
| 2513.2 | Operand 0 |
| 2514 | Operand 1 Encoding |
| 2514.1 | Operand 1 Type |
| 2514.2 | Operand 1 |
| 2515 | Terminate |
| 2520 | One Source, No Destination Operand Instruction |
| 2521 | Instruction Type |
| 2522 | Opcode |
| 2523 | Operand 1 Encoding |
| 2523.1 | Operand 1 Type |
| 2523.2 | Operand 1 |
| 2524 | Immediate |
| 2525 | Terminate |
| 2530 | Immediate Instruction |
| 2531 | Instruction Type |
| 2532 | Opcode |
| 2533.2 | Operand 0 |
| 2534.1 | Immediate Low |
| 2534.2 | Immediate High |
| 2534 | Immediate |
| 2600 | Microthreaded Instruction Flow, Overall |
| 2603 | Stall? |
| 2605 | Stall Resolved? |
| 2606 | Microthreading Enabled? |
| 2607 | Save Microthreaded Instruction Information |
| 2608 | Execute Next Instruction(s) |
| 2609 | Stall Resolved? |
| 2610 | Read (Next) Source Data Element(s) from Queue/Memory |
| 2711 | First Forward Pass |
| 2712 | Second Forward Pass |
| 2721 | First Backward Pass |
| 2722 | Second Backward Pass |
| 2731 | Mini-Batch Size (N) |
| 2732 | Overhead |
| 2733 | Update Interval (U) |
| 2751 | Forward Pass |
| 2761 | Backward Pass |
| 2765 | Forward Pass |
| 2766 | Backward Pass |
| 2767 | Weight Update Use |
| 2771 | Forward Pass |
| 2781 | Backward Pass |
| 2785 | Activation Storage |
| 2786 | Recomputed Activation Storage |
| 2801 | Previous Layer |
| 2802 | Subsequent Layer |
| 2803 | Previous Layer |
| 2804 | Subsequent Layer |
| 2810 | Compute |
| 2811 | F |
| 2812 | B |
| 2815 | Storage |
| 2816 | A |
| 2817 | W |
| 2818 | W |
| 2820 | Compute |
| 2821 | F |
| 2822 | B |
| 2825 | Storage |
| 2826 | A |
| 2827 | W |
| 2828 | W |
| 2829 | A |
| 2830 | Compute |
| 2835 | Storage |
| 2840 | Compute |
| 2845 | Storage |
| 2881 | $A_{1,t}$ |
| 2882 | $A_{2,t}$ |
| 2883 | $A_{3,t}$ |
| 2884 | $A'_{2,t}$ |
| 2891 | $\Delta_{1,t}$ |
| 2892 | $\Delta_{2,t}$ |
| 2893 | $\Delta_{3,t}$ |
| 2894 | $\Delta'_{1,t}$ |
| 2895 | $\Delta'_{2,t}$ |

-continued

| Ref. Symbol | Element Name |
| --- | --- |
| 2896 | $\Delta'_{3,t}$ |
| 2900 | Processor |
| 2901 | Floating-Point Unit (FPU) |
| 2911 | Multiplier |
| 2912 | Accumulator |
| 2913 | Normalizer |
| 2914 | Incrementer |
| 2915 | Exponent DP (Data Path) |
| 2920 | Instruction Decode Logic |
| 2921 | Random Number Generators (RNGs) |
| 2922 | N-bit Adder |
| 2925 | FP Control Register |
| 2925.1 | Static Rounding Mode Bits |
| 2925.2 | Static RNG Bits |
| 2925.3 | FTZ (Flush To Zero) |
| 2925.4 | Max Sat |
| 2925.5 | Min Sat |
| 2950 | Instruction |
| 2951 | Src A |
| 2952 | Src B |
| 2953 | Intermediate Result |
| 2954 | Src C |
| 2955 | Mantissa |
| 2955.1 | Leading Zeros |
| 2955.2 | Other Bits |
| 2956 | Normalized Mantissa |
| 2957.1 | N Most Significant Lower Bits |
| 2958 | Mantissa Bits Subject to Rounding |
| 2961 | RNG Selector |
| 2962 | N-bit Random Number |
| 2963 | Carry Bit |
| 2964 | Stochastically Rounded Mantissa |
| 2965 | Stochastically Rounded Exponent |
| 3002.1 | Unit of Least Precision (ULP) |
| 3003 | Lower Bits |
| 3003.2 | Least Significant Lower Bits |
| 3021 | Rounding Mode Bits |
| 3022 | RNG Bits |
| 3023 | OpCode Bits |
| 3024 | Source Bits |
| 3025 | Dest Bits |
| 3100 | Start |
| 3110 | Decode FP Multiply-Accumulate Instruction |
| 3120 | Perform FP Multiply-Accumulate Operation |
| 3130 | Normalize Result |
| 3140 | Stochastic Rounding? |
| 3141 | No |
| 3142 | Yes |
| 3150 | Deterministically Round Mantissa of Result |
| 3160 | Select N-bit Random Number |
| 3170 | Add N-bit Random Number and N Most Significant Lower Bits |
| 3180 | Carry? |
| 3181 | No |
| 3182 | Yes |
| 3190 | Increment ULP |
| 3198 | Provide Rounded Result |
| 3199 | End |

DETAILED DESCRIPTION

A detailed description of one or more embodiments of the invention is provided below along with accompanying figures illustrating selected details of the invention. The invention is described in connection with the embodiments. The embodiments herein are understood to be merely exemplary, the invention is expressly not limited to or by any or all of the embodiments herein, and the invention encompasses numerous alternatives, modifications, and equivalents. To avoid monotony in the exposition, a variety of word labels (such as: first, last, certain, various, further, other, particular, select, some, and notable) may be applied to separate sets of embodiments; as used herein such labels are expressly not meant to convey quality, or any form of preference or prejudice, but merely to conveniently distinguish among the separate sets. The order of some operations of disclosed processes is alterable within the scope of the invention. Wherever multiple embodiments serve to describe variations in process, system, and/or program instruction features, other embodiments are contemplated that in accordance with a predetermined or a dynamically determined criterion perform static and/or dynamic selection of one of a plurality of modes of operation corresponding respectively to a plurality of the multiple embodiments. Numerous specific details are set forth in the following description to provide a thorough understanding of the invention. The details are provided for the purpose of example and the invention may be practiced according to the claims without some or all of the details. For the purpose of clarity, technical material that is known in the technical fields related to the invention has not been described in detail so that the invention is not unnecessarily obscured.

INTRODUCTION

This introduction is included only to facilitate the more rapid understanding of the Detailed Description; the invention is not limited to the concepts presented in the introduction (including explicit examples, if any), as the paragraphs of any introduction are necessarily an abridged view of the entire subject and are not meant to be an exhaustive or restrictive description. For example, the introduction that follows provides overview information limited by space and organization to only certain embodiments. There are many other embodiments, including those to which claims will ultimately be drawn, discussed throughout the balance of the specification.

In an aspect conceptually related to control wavelets for accelerated deep learning, techniques in advanced deep learning provide improvements in one or more of accuracy, performance, and energy efficiency. An array of processing elements performs flow-based computations on wavelets of data. Each processing element has a respective compute element and a respective routing element. Each compute element has a memory. Each router enables communication via wavelets with at least nearest neighbors in a 2D mesh. A particular one of the compute elements receives a wavelet. If a control specifier of the wavelet is a first value, then instructions are read from the memory of the particular compute element in accordance with an index specifier of the wavelet. If the control specifier is a second value, then instructions are read from the memory of the particular compute element in accordance with a virtual channel specifier of the wavelet. Then the particular compute element initiates execution of the instructions.

A first example of accelerated deep learning is using a deep learning accelerator to train a neural network. A second example of accelerated deep learning is using a deep learning accelerator to operate a trained neural network to perform inferences. A third example of accelerated deep learning is using a deep learning accelerator to train a neural network and subsequently perform inference with any one or more of the trained neural network, information from same, and a variant of same.

Examples of neural networks include Fully Connected Neural Networks (FCNNs), Recurrent Neural Networks (RNNs), Convolutional Neural Networks (CNNs), Long Short-Term Memory (LSTM) networks, autoencoders, deep belief networks, and generative adversarial networks.

An example of training a neural network is determining one or more weights associated with the neural network, such as by hardware acceleration via a deep learning accelerator. An example of making an inference is using a trained neural network to compute results by processing input data based on weights associated with the trained neural network. As used herein, the term 'weight' is an example of a 'parameter' as used in various forms of neural network processing. For example, some neural network learning is directed to determining parameters that are then usable for performing neural network inferences using the parameters.

A neural network processes data according to a dataflow graph comprising layers of neurons. Stimuli (e.g., input data) is received by an input layer of neurons and the computed results of the dataflow graph (e.g., output data) are provided by an output layer of neurons. Example layers of neurons include input layers, output layers, rectified linear unit layers, fully connected layers, recurrent layers, long short-term memory layers, convolutional layers, kernel layers, dropout layers, and pooling layers. A neural network is conditionally and/or selectively trained, subject to hardware acceleration. After being trained, a neural network is conditionally and/or selectively used for inference, subject to hardware acceleration.

An example of a deep learning accelerator is one or more relatively specialized hardware elements operating in conjunction with one or more software elements to train a neural network and/or perform inference with a neural network relatively more efficiently than using relatively less specialized hardware elements. Some implementations of the relatively specialized hardware elements include one or more hardware logic circuitry elements such as transistors, resistors, inductors, capacitors, wire interconnects, combinatorial logic (e.g., NAND, NOR) gates, latches, register files, memory arrays, tags for memory arrays, content-addressable memories, flash, ROM, DRAM, SRAM, Serializer/Deserializer (SerDes), I/O drivers, and the like, such as implemented via custom logic, synthesized logic, ASICs, and/or FPGAs. Some of the relatively less specialized hardware elements include conventional CPUs and conventional GPUs.

An example implementation of a deep learning accelerator is enabled to process dataflow in accordance with computations performed for training of a neural network and/or inference with a neural network. Some deep learning accelerators comprise processing elements coupled via a fabric and enabled to communicate with each other via the fabric. Sometimes the processing elements and the fabric are collectively referred to as a fabric of processing elements.

An example implementation of a processing element is enabled to communicate and process wavelets. In various circumstances, the wavelets correspond to dataflow and/or instruction flow in accordance with communication and/or processing enabling computations performed for training of and/or inference using a neural network.

An example processing element comprises a router to communicate wavelets via the fabric and a compute element to process the wavelets. An example router is coupled to a plurality of elements: a fabric, an off ramp to the compute element, and an on ramp from the compute element. An example coupling between the router and the fabric enables communication between the router and, e.g., four logically and/or physically adjacent processing elements. The router variously receives wavelets from the fabric and the on ramp. The router variously transmits wavelets to the fabric and the off ramp.

An example implementation of a compute element is enabled to process wavelets by initiating tasks and executing instructions associated with the wavelets, and accessing data associated with the wavelets and/or the instructions. The instructions are in accordance with an instruction set architecture comprising arithmetic instructions, control flow instructions, datatype conversion instructions, configuration instructions, fabric management instructions, and load/store instructions. The instructions operate on operands comprising various datatypes, e.g., integer datatypes and floating-point datatypes of various widths. The operands variously comprise scalar operands and vector operands. In various embodiments and/or usage scenarios, a vector variously represents, e.g., weights of a neural network, inputs or stimuli of a neural network, activations of a neural network, and/or partial sums of a neural network. In some scenarios, a vector is a sparse vector (e.g., a vector of neuron activations) and comprises sparse data elements (e.g., only non-zero elements). In some other scenarios, a vector is a dense vector (e.g., pixel values) and comprises dense data elements (e.g., all elements of the vector, including zero elements).

An example compute element comprises hardware elements that collectively execute the instructions associated with a wavelet by performing operations specified by the instructions (e.g., arithmetic operations, control flow operations, and load/store operations). Examples of the hardware elements include picker queues, a picker, a task definition table, an instruction sequencer, an instruction decoder, a data sequencer, a register file, a memory, a pseudo-random number generator, and an ALU. Some implementations of the hardware elements are in accordance with hardware logic circuitry elements as described elsewhere herein. Sometimes a compute element is referred to as a compute engine. Sometimes the compute scheduler is referred to as a picker and the compute scheduler queues are referred to as picker queues.

An example fabric is a collection of logical and/or physical couplings between processing elements and/or within a single processing element. The fabric is usable to implement logical and/or physical communication topologies such as a mesh, a 2D mesh, a 3D mesh, a hypercube, a torus, a ring, a tree, or any combination thereof. An example of a physical coupling between processing elements is a set of physical interconnects (comprising optional and/or selective buffering) between physically-coupled processing elements. A first example of physically-coupled processing elements is immediately physically adjacent processing elements, such as a first processing element located directly beside (such as 'north', 'south', 'east', or 'west') of a second processing element. A second example of physically-coupled processing elements is relatively physically nearby processing elements, such as a first processing element located within a relatively small number of intervening processing elements, e.g., one or two 'rows' and/or 'columns' away from a second processing element. A third example of physically-coupled processing elements is relatively physically far away processing elements, such as a first processing element located physical relatively far away from a second processing element, such as a distance limited by signal propagation (with or without optional and/or selective buffering) within a clock cycle and/or clock sub-cycle associated with the processing elements. An example of physical coupling within a single processing element (having, e.g., a compute element and a router) is an on ramp coupling output information from the compute element to the router, and an off ramp coupling input information from the router to the compute element. In some situations, the router routes information from the on ramp to the off ramp.

An example of a logical coupling between processing elements is a virtual channel as implemented by routers within processing elements. A route between a first processing element and a second processing element is implemented, e.g., by routers within processing elements along the route forwarding in accordance with the virtual channel and routing configuration information. An example of a logical coupling within a single particular processing element (having, e.g., a router) is a virtual channel as implemented by the router, enabling the particular processing element to send information via the virtual channel to the particular processing element. The router forwards "internally" with respect to the particular processing element in accordance with the virtual channel and routing configuration information.

An example wavelet is a bundle of information communicated between processing elements via the fabric. An example wavelet comprises a wavelet payload and a color. A wavelet payload comprises data and is associated with instructions. A first response to a wavelet received by a compute element of a processing element comprises the compute element initiating a task, such as corresponding to processing of instructions associated with the wavelet. A second response to a wavelet received by a compute element of a processing element comprises the compute element processing data of the wavelet. Example types of wavelets include dense wavelets and sparse wavelets, as well as data wavelets and control wavelets.

Wavelets are used, for example, for communicating between processing elements. In a first scenario, a first processing element transmits wavelets to a second processing element. In a second scenario, an external device (e.g., an FPGA) transmits wavelets to a processing element. In a third scenario, a processing element transmits wavelets to an external device (e.g., an FPGA).

An example virtual channel is one or more communication pathways specified by a color and enabled, e.g., by a fabric and one or more routers. A wavelet comprising a particular color is sometimes referred to as being associated with a particular virtual channel associated with the particular color. A first example of a color is a fabric color specifying a virtual channel between two different processing elements. In some embodiments, a fabric color is a 5-bit integer. A second example of a color is a local color specifying a virtual channel from a processing element to the processing element. In some embodiments, a color is a 6-bit integer and specifies one of a fabric color and a local color.

An example task comprises a collection of instructions executed in response to a wavelet. An example instruction comprises an operation and optionally one or more operands specifying locations of data elements to be processed in accordance with the operation. A first example of an operand specifies data elements in memory. A second example of an operand specifies data elements communicated (e.g., received or transmitted) via the fabric. An example of a data sequencer determines the locations of data elements. An example of an instruction sequencer determines an address in memory of instructions associated with a wavelet.

An example picker queue is enabled to hold wavelets received via an off ramp of the fabric for processing in the compute element. An example of a picker selects a wavelet from the picker queue for processing, and/or selects an active unblocked color for processing to initiate a corresponding task.

An example of storage is one or more elements enabled to retain state information, e.g., any one or more of: a flip-flop, a latch or an array of latches, a register or an array of registers, a register file, a memory, a memory array, a magnetic storage device, an optical storage device, SRAM, DRAM, flash, and ROM. In various embodiments storage is volatile (e.g., SRAM or DRAM) and/or non-volatile (e.g., flash or ROM).

An example of an Integrated Circuit (IC) is a collection of circuitry implemented on a single portion of semiconductor material. An example of an Application-Specific Integrated Circuit (ASIC) is an IC designed for a particular use. An example of wafer-scale integration is implementing a system using all or a significant portion of a wafer as an element of the system, e.g., by leaving the wafer whole or substantially whole.

In some embodiments and/or usage scenarios, wafer-scale integration enables connecting multiple elements in a system via wafer interconnect formed using silicon fabrication processes instead of via inter-chip interconnect, and thus improves any one or more of improved performance, cost, reliability, and energy efficiency. As a specific example, a system implemented using wafer-scale integration technology enables implementation of three million PEs on a single wafer, each of the PEs having bandwidth to nearest physical neighbors that is greater than a comparable system using other-than wafer-scale integration technology. The greater bandwidth enables the system implemented using wafer-scale integration technology to relatively efficiently train and/or perform inferences for larger neural networks than the system implemented using other-than wafer-scale integration technology.

Acronyms

At least some of the various shorthand abbreviations (e.g., acronyms) defined here refer to certain elements used herein.

| Acronym | Description |
| --- | --- |
| ASIC | Application Specific Integrated Circuit |
| CE | Compute Element |
| CNN | Convolutional Neural Network |
| CPGD | Continuous Propagation Gradient Descent |
| CPU | Central Processing Unit |
| CRM | Computer Readable Media |
| DRAM | Dynamic Random Access Memory |
| DSD | Data Structure Descriptor |
| DSP | Digital Signal Processor |
| DSR | Data Structure Register |
| FCNN | Fully Connected Neural Network |
| FP | Floating-Point |
| FPGA | Field-Programmable Gate Array |
| FPU | Floating-Point Unit |
| FTZ | Flush To Zero |
| GPU | Graphics Processing Unit |
| HPC | High-Performance Computing |
| HW | HardWare |
| IC | Integrated Circuit |
| IE | Inference Engine |
| LFSR | Linear Feedback Shift Register |
| LSB | Least Significant Bit |
| LSTM | Long Short-Term Memory |
| MBGD | Mini-Batch Gradient Descent |
| ML | Machine Learning |
| MSB | Most Significant Bit |
| PE | Processing Element |
| PRN | Pseudo Random Number |
| PRNG | Pseudo Random Number Generator |
| RNG | Random Number Generator |
| RNN | Recurrent Neural Network |

-continued

| Acronym | Description |
|---|---|
| RCP | Reverse CheckPoint |
| SGD | Stochastic Gradient Descent |
| SRAM | Static Random Access Memory |
| SW | SoftWare |
| ULP | Unit of Least Precision |
| XDSD | eXtended Data Structure Descriptor |
| XDSR | eXtended Data Structure Register |

EXAMPLE EMBODIMENTS

In concluding the introduction to the detailed description, what follows is a collection of example embodiments, including at least some explicitly enumerated as "ECs" (Example Combinations), providing additional description of a variety of embodiment types in accordance with the concepts described herein; these examples are not meant to be mutually exclusive, exhaustive, or restrictive; and the invention is not limited to these example embodiments but rather encompasses all possible modifications and variations within the scope of the issued claims and their equivalents.

EC1) A method comprising:
sending a fabric packet by a sending processing element to a fabric, the fabric packet comprising one or more data elements, a virtual channel specifier, an index specifier, and a control specifier selectively specifying that the fabric packet is a control fabric packet,
the sending comprises the sending processing element executing an instruction that comprises
a source operand specifying the one or more data elements, a destination instruction operand specifying a destination operand descriptor, the destination operand descriptor specifying the virtual channel specifier, a location of the index specifier, and the control specifier;
routing the fabric packet via the fabric from the sending processing element to one or more receiving processing elements via one or more routing elements, the routing in accordance with the virtual channel specifier; and
in each of the one or more receiving processing elements, receiving the fabric packet from the fabric, and processing the fabric packet in accordance with at least the control specifier.

EC2) The method of EC1, wherein:
the fabric packet is a first fabric packet;
the virtual channel specifier is a first virtual channel specifier of a plurality of virtual channel specifiers; and
the processing comprises
first selecting the first fabric packet for processing,
reading one or more instructions from a memory of one of the one or more receiving processing elements at an address based at least in part on the index specifier,
executing at least one of the one or more instructions, and
subsequent to the executing, second selecting a second fabric packet comprising a second virtual channel specifier of the plurality of virtual channel specifiers.

EC3) The method of EC2, wherein the first selecting and the second selecting are performed by a scheduler of the one of the one or more receiving processing elements.

EC4) The method of EC2, wherein the address is based at least in part on a portion of the index specifier plus a base register of the one of the one or more receiving processing elements.

EC5) The method of EC1, wherein
the virtual channel specifier is a first virtual channel specifier of a plurality of virtual channel specifiers;
each of the plurality of virtual channel specifiers is associated with a respective set of one or more sets of fabric packets;
the receiving comprises associating the fabric packet with the respective set associated with the first virtual channel specifier;
the processing comprises executing an instruction in one of the one or more receiving processing elements, the instruction comprises a source instruction operand specifying a source operand descriptor;
the source operand descriptor comprises
a first portion specifying the first virtual channel specifier,
a second portion specifying terminate on control mode, and
a third portion specifying a second virtual channel specifier of the plurality of virtual channel specifiers; and
the executing is responsive to the fabric packet being older than any other fabric packets associated with the respective set associated with the first virtual channel specifier, and the executing comprises
terminating the instruction, and
the one or more of the receiving processing elements activating the set associated with the second virtual channel specifier and selecting for processing a fabric packet associated with the set associated with the second virtual channel specifier.

EC6) The method of EC5, wherein the activating and the selecting are performed by a scheduler of the receiving processing element.

EC7) The method of EC2 or EC5, wherein the first virtual channel specifier and the second virtual channel specifier are respectively associated with a first task and a second task, and the first task and the second task respectively implement a first portion of a neural network and a second portion of the neural network.

EC8) The method of EC7, wherein the first portion of the neural network implements receiving activations of a neuron of the neural network and the second portion of the neural network implements computing a partial sum of the received activations.

EC9) The method of EC7, wherein the second portion of the neural network is dependent on the first portion of the neural network.

EC10) The method of EC7, wherein the first portion of the neural network and the second portion of the neural network implement portions of one or more of: receiving activations of a neuron of a neural network, computing activations of a neuron of a neural network, transmitting activations of a neuron of a neural network, computing partial sums of activations of a neural network, receiving deltas of a neural network, computing deltas of a neural network, transmitting deltas of a neural network, receiving errors of a neural network, computing errors of a neural network, transmitting errors of a neural network, computing gradient estimates of a neural network, and updating weights of a neural network.

EC11) The method of EC1, wherein the sending processing element, the one or more routing elements, and the one or more receiving processing elements are fabricated via wafer-scale integration.

EC12) The method of EC1, wherein the sending processing element comprises one of the one or more routing elements.

EC13) The method of EC1, wherein the fabric packet comprises a closeout fabric packet.

EC14) The method of EC1, wherein one or more of the sending, the routing, the receiving, and the processing comprise transitioning between implementing a first portion of a neural network and implementing a second portion of the neural network.

EC15) The method of EC1, wherein one or more of the sending, the routing, the receiving, and the processing comprise transitioning between a first software stage implementing a first portion of a neural network and a second software stage implementing a second portion of the neural network.

EC16) A method comprising:
receiving a fabric packet at a processing element via a fabric, the processing element comprising a compute element and a coupling to the fabric, the fabric packet comprising a control specifier, a virtual channel specifier, and an index specifier;
reading one or more instructions from a memory of the compute element, the reading being in accordance with the index specifier responsive to the control specifier being a first value, and the reading being in accordance with the virtual channel specifier responsive to the control specifier being a second value; and
initiating execution of one of the one or more instructions.

EC17) The method of EC16, wherein the fabric packet comprises a closeout fabric packet.

EC18) The method of EC16, wherein the fabric packet is in accordance with a wavelet.

EC19) The method of EC16, wherein the processing element is a first processing element and the fabric packet is transmitted to the fabric by a second processing element.

EC20) The method of EC19, wherein the first processing element and the second processing element are implemented via wafer-scale integration.

EC21) The method of EC16, wherein an instruction address of the one or more instructions is based at least in part on the index specifier.

EC22) The method of EC21, wherein the instruction address is the least significant six bits of the index specifier.

EC23) The method of EC16, wherein the fabric packet further comprises a data element.

EC24) The method of EC16, wherein the index specifier comprises one or more of: an identifier of a neuron of a neural network, an identifier of a portion of a vector, and an identifier of a portion of a matrix.

EC25) The method of EC24, wherein the portion of the vector comprises an element of the vector.

EC26) The method of EC24, wherein the portion of the matrix comprises an element of the matrix.

EC27) The method of EC16, wherein the execution of the one or more instructions comprises a portion of one or more of: computing an activation of a neural network, computing a partial sum of activations of a neural network, computing an error of a neural network, computing a gradient estimate of a neural network, and updating a weight of a neural network.

EC28) The method of EC16, wherein the execution of the one or more instructions implements at least a portion of a neuron of a neural network.

EC29) The method of EC16, wherein a virtual channel associated with the virtual channel specifier comprises at least a portion of a neural network.

EC30) The method of EC16, wherein a virtual channel associated with the virtual channel specifier comprises at least a portion of a connection between neurons of a neural network.

EC31) The method of EC16, wherein a virtual channel associated with the virtual channel specifier comprises at least a portion of a connection between layers of a neural network.

EC32) The method of EC16, wherein a virtual channel associated with the virtual channel specifier is used for communicating at least one of data and control associated with one or more of: computing an activation of a neural network, computing a partial sum of activations of a neural network, computing an error of a neural network, computing a gradient estimate of a neural network, and updating a weight of a neural network.

EC33) The method of EC16, wherein the processing element implements at least a portion of a neuron of a neural network.

EC34) The method of EC16, wherein the fabric packet comprises at least one of control and data associated with one or more of: computing an activation of a neural network, computing a partial sum of activations of a neural network, computing an error of a neural network, computing a gradient estimate of a neural network, and updating a weight of a neural network.

EC35) The method of EC16, wherein the fabric packet comprises at least one of control and data associated with a compute stage of a plurality of compute stages implementing a neural network.

EC36) The method of EC35, wherein the compute stage comprises one or more of: computing an activation of a neural network, computing a partial sum of activations of a neural network, computing an error of a neural network, computing a gradient estimate of a neural network, and updating a weight of a neural network.

EC37) The method of EC36, wherein in response to the control specifier being the first value, the execution of the one or more instructions comprises at least a portion of terminating the compute stage.

EC38) A method comprising:
decoding an instruction in a processing element, the instruction comprising a destination operand; and
accessing one or more data elements in accordance with the destination operand, wherein:
the destination operand specifies an operand descriptor, the operand descriptor comprising a first portion, a second portion, and a third portion,
the first portion specifies that the accessing comprises transmitting at least one of the one or more data elements via a fabric coupled to the processing element,
the second portion specifies a location of an index value and specifies that the accessing comprises transmitting the index value via the fabric, and
the third portion specifies a control value and specifies that the accessing comprises transmitting the control value via the fabric.

EC39) The method of EC38, wherein the transmitting the at least one data element comprises transmitting a fabric packet comprising the control value, the index value, and the at least one of the data elements via the fabric.

EC40) The method of EC39, wherein the fabric packet comprises a closeout fabric packet.

EC41) The method of EC39, wherein the fabric packet is in accordance with a wavelet.

EC42) The method of EC39, wherein the processing element is a first processing element and the fabric packet is transmitted on the fabric to a second processing element.

EC43) The method of EC38, wherein the processing element implements a portion of a neuron of a neural network.

EC44) The method of EC38, wherein the at least one of the data elements comprises a portion of one or more of: a weight of a neural network, an activation of a neural network, a partial sum of activations of a neural network, an error of a neural network, a gradient estimate of a neural network, and a weight update of a neural network.

EC45) The method of EC38, wherein the index value comprises one or more of: an identifier of a neuron of a neural network, an identifier of a portion of a vector, and an identifier of a portion of a matrix.

EC46) The method of EC45, wherein the portion of the vector comprises an element of the vector.

EC47) The method of EC45, wherein the portion of the matrix comprises an element of the matrix.

EC48) A method comprising:
sending a fabric packet by a sending processing element to a fabric, the fabric packet comprising a virtual channel specifier and a control specifier selectively specifying that the fabric packet is a control fabric packet;
routing the fabric packet via the fabric from the sending processing element to one or more receiving processing elements via one or more routing elements, the routing in accordance with the virtual channel specifier; and
in each of the one or more receiving processing elements, receiving the fabric packet from the fabric, and processing the fabric packet in accordance with at least the control specifier.

EC49) The method of EC48, wherein:
the fabric packet further comprises an index specifier and one or more data elements;
the sending comprises executing an instruction in the sending processing element;
the instruction comprises a destination instruction operand specifying a destination operand descriptor;
the destination operand descriptor comprises a first portion specifying the virtual channel specifier, a second portion specifying the control specifier, and a third portion specifying a location of the index specifier; and
the instruction comprises at least one source operand specifying the one or more data elements.

EC50) The method of EC49, wherein:
the first portion is a virtual channel field comprising the virtual channel specifier;
the second portion is a control field comprising the control specifier;
the third portion comprises an index select portion indicating selection of one of: a register of the sending processing element, a fourth portion of the operand descriptor comprising a function of one or more index fields comprising a portion of the index specifier, and a second of the one or more data elements; and
the executing comprises sending the virtual channel specifier, the control specifier, a first of the one or more data elements, and one of
a value of the selected register, a value of the zero-extended selected fourth portion, and the second of the one or more data elements.

EC51) The method of EC50, wherein the control field is a bit and the control specifier is a predetermined value.

EC52) The method of EC50, wherein the index select portion comprises an index select bit that indicates selection between the register and the fourth portion of the operand descriptor and a single instruction multiple data width field that indicates selection between the second of the one or more data elements and the selection of the index select field.

EC53) The method of EC50, wherein the one or more index fields comprise a low index field and a high index field.

EC54) A system comprising:
a sending processing element comprising means for sending a fabric packet to a fabric, the fabric packet comprising one or more data elements, a virtual channel specifier, an index specifier, and a control specifier selectively specifying that the fabric packet is a control fabric packet;
the means for sending comprising means for executing an instruction that comprises
a source operand specifying the one or more data elements, a destination instruction operand specifying a destination operand descriptor, the destination operand descriptor specifying the virtual channel specifier, a location of the index specifier, and the control specifier;
one or more routing elements comprising means for routing the fabric packet via the fabric from the sending processing element to at least one receiving processing element, the means for routing operable in accordance with the virtual channel specifier; and
at least one receiving processing element, the at least one receiving processing element comprising means for receiving the fabric packet from the fabric, and further comprising means for processing the fabric packet in accordance with at least the control specifier.

EC55) The system of EC54, wherein:
the fabric packet is a first fabric packet;
the virtual channel specifier is a first virtual channel specifier of a plurality of virtual channel specifiers;
and wherein the at least one receiving processing element further comprises
means for first selecting the first fabric packet for processing,
means for reading one or more instructions from a memory of the receiving processing element at an address based at least in part on the index specifier,
means for executing at least one of the one or more instructions, and
means for, subsequent to the executing, second selecting a second fabric packet comprising a second virtual channel specifier of the plurality of virtual channel specifiers.

EC56) The system of EC55, wherein the first means for selecting and the second means for selecting comprise a scheduler of the receiving processing element.

EC57) The system of EC55, wherein the address is based at least in part on a portion of the index specifier plus a base register of the receiving processing element.

EC58) The system of EC54, wherein
the virtual channel specifier is a first virtual channel specifier of a plurality of virtual channel specifiers;
each of the plurality of virtual channel specifiers is associated with a respective set of one or more sets of fabric packets;
the means for receiving further comprises means for associating the fabric packet with the respective set associated with the first virtual channel specifier;

the means for processing further comprises means for executing an instruction in the receiving processing element, the instruction comprises a source instruction operand specifying a source operand descriptor;
the source operand descriptor comprises
a first portion specifying the first virtual channel specifier,
a second portion specifying terminate on control mode, and
a third portion specifying a second virtual channel specifier of the plurality of virtual channel specifiers; and
each of the at least one receiving processing element further comprises
means for terminating the instruction, activating the set associated with the second virtual channel specifier, and selecting a fabric packet associated with the set associated with the second virtual channel specifier for processing,
wherein the means for terminating, activating, and selecting is responsive to the fabric packet being older than any other fabric packets associated with the respective set associated with the first virtual channel specifier.

EC59) The system of EC58, wherein the means for activating and selecting comprises a scheduler of the receiving processing element.

EC60) The system of EC55 or EC58, wherein the first virtual channel specifier and the second virtual channel specifier are respectively associated with a first and second a task, and the first task and the second task respectively implement a first portion of a neural network and a second portion of the neural network.

EC61) The system of EC60, wherein the first portion of the neural network implements receiving activations of a neuron of the neural network and the second portion of the neural network implements computing a partial sum of the received activations.

EC62) The system of EC60, wherein the second portion of the neural network is dependent on the first portion of the neural network.

EC63) The system of EC60, wherein the first portion of the neural network and the second portion of the neural network implement respective portions of one or more of: receiving activations of a neuron of a neural network, computing activations of a neuron of a neural network, transmitting activations of a neuron of a neural network, computing partial sums of activations of a neural network, receiving deltas of a neural network, computing deltas of a neural network, transmitting deltas of a neural network, receiving errors of a neural network, computing errors of a neural network, transmitting errors of a neural network, computing gradient estimates of a neural network, and updating weights of a neural network.

EC64) The system of EC54, wherein the sending processing element, the one or more routing elements, and the one or more receiving processing elements are fabricated via wafer-scale integration.

EC65) The system of EC54, wherein the sending processing element comprises one of the one or more routing elements.

EC66) The system of EC54, wherein the fabric packet comprises a closeout fabric packet.

EC67) A system comprising:
a sending processing element, one or more routing elements, and at least one receiving processing element, wherein the sending processing element, the one or more routing elements, and the at least one receiving processing element each comprise respective couplings to a fabric, and wherein the at least one receiving processing element each further comprises a compute element;
wherein the sending processing element is enabled to send a fabric packet comprising a virtual channel specifier and a control specifier specifying that the fabric packet is a control fabric packet via the fabric coupling of the sending processing element;
wherein the one or more routing elements are enabled to route the fabric packet from the sending processing element to the at least one receiving processing element in accordance with the virtual channel specifier via the fabric couplings of the one or more routing elements; and
wherein each of the at least one receiving processing element is enabled to receive the fabric packet via the fabric coupling of the respective receiving processing element and the compute element of the respective receiving processor element is enabled to process the fabric packet in accordance with at least the control specifier.

EC68) The system of EC67, wherein the fabric packet further comprises an index specifier and one or more data elements, the sending processing element further comprises a compute element enabled to execute an instruction, the instruction comprises a destination instruction operand specifying a destination operand descriptor, the destination operand descriptor comprising a first portion specifying the virtual channel specifier, a second portion specifying the control specifier, and a third portion specifying a location of the index specifier, and the instruction comprises at least one source operand specifying the one or more data elements.

EC69) The system of EC68, wherein the first portion is a virtual channel field comprising the virtual channel specifier, the second portion is a control field comprising the control specifier, the third portion comprises an index select portion indicating selection of one of: a register of the sending processing element, a fourth portion of the operand descriptor comprising a concatenation of one or more index fields comprising a portion of the index specifier, and a second of the one or more data elements; and the compute element of the sending processing element is further enabled to send the virtual channel specifier, the control specifier, a first of the one or more data elements, and one of a value of the selected register, a value of the zero-extended selected fourth portion, and the second of the one or more data elements.

EC70) The system of EC69, wherein the control field is a bit and the control specifier is a predetermined value.

EC71) The system of EC69, wherein the index select portion comprises an index select bit that indicates selection between the register of the sending processing element and the fourth portion of the operand descriptor and a SIMD width field that indicates selection between the second of the one or more data elements and the selection of the index select field.

EC72) The system of EC69, wherein the one or more index fields comprise a low index field and a high index field.

EC73) The system of EC67, wherein the fabric packet is a first fabric packet, the virtual channel specifier is a first virtual channel specifier of a plurality of virtual channel specifiers, a each of the at least one receiving processing element further comprises a memory enabled to store one or more instructions, a scheduler enabled to first select the first fabric packet for processing, an instruction sequencer enabled to read the one or more instructions from the memory at an address based at least in part on the index specifier, wherein the compute element of each of the at least one receiving processing element is enabled to execute at least one of the one or more instructions, and wherein the scheduler is enabled to, subsequent to the executing, second select a second fabric packet comprising a second virtual channel specifier of the plurality of virtual channel specifiers.

EC74) The system of EC73, wherein the address is based at least in part on a portion of the index specifier plus a base register of each of the at least one receiving processing element.

EC75) The system of EC67, wherein
the virtual channel specifier is a first virtual channel specifier of a plurality of virtual channel specifiers,
each of the plurality of virtual channel specifiers is associated with a respective set of one or more sets of fabric packets,
the receiving processing element is further enabled to associate the fabric packet with the respective set associated with the first virtual channel specifier,
and the compute element of the respective receiving processing element is enabled to execute an instruction that comprises a source instruction operand specifying a source operand descriptor,
the source operand descriptor comprises
a first portion specifying the first virtual channel specifier,
a second portion specifying terminate on control mode, and
a third portion specifying a second virtual channel specifier of the plurality of virtual channel specifiers,
the compute element of the respective receiving processing element is further enabled to, responsive to the fabric packet being older than any other fabric packets associated with the respective set associated with the first virtual channel specifier, terminate the instruction,
and the compute element comprises of the respective processing element comprises a scheduler, responsive to the fabric packet being older than any other fabric packets associated with the respective set associated with the first virtual channel specifier, enabled to activate the set associated with the second virtual channel specifier, and enabled to select a fabric packet associated with the set associated with the second virtual channel specifier for processing.

EC76) The system of EC73 or EC75, wherein the first virtual channel specifier and the second virtual channel specifier are respectively associated with first and second tasks, the first task and the second task respectively implementing a first portion of a neural network and a second portion of the neural network.

EC77) The system of EC76, wherein the first portion of the neural network comprises receiving activations of a neuron of the neural network and the second portion of the neural network comprises computing a partial sum of the received activations.

EC78) The system of EC76, wherein the second portion of the neural network is dependent on the first portion of the neural network.

EC79) The system of EC76, wherein the first portion of the neural network and the second portion of the neural network comprise respective portions of ones or more of: receiving activations of a neuron of a neural network, computing activations of a neuron of a neural network, transmitting activations of a neuron of a neural network, computing partial sums of activations of a neural network, receiving deltas of a neural network, computing deltas of a neural network, transmitting deltas of a neural network, receiving errors of a neural network, computing errors of a neural network, transmitting errors of a neural network, computing gradient estimates of a neural network, and updating weights of a neural network.

EC80) The system of EC67, wherein the sending processing element, the one or more routing elements, and the at least one receiving processing element are fabricated via wafer-scale integration.

EC81) The system of EC67, wherein the sending processing element comprises one of the one or more routing elements.

EC82) The system of EC67, wherein the fabric packet comprises a closeout fabric packet.

Selected Embodiment Details

Embodiments relating to neural network training and inference, comprising deep learning accelerator hardware elements and software elements are described herein (see, e.g., FIGS. 1-4 and section "Deep Learning Accelerator Overview"). The deep learning accelerator comprises hardware processing elements (see, e.g., FIGS. 5-8 and sections "Fabric Overview" and "Processing Element: Compute Element and Router"). The deep learning accelerator implements and/or uses various techniques such as tasks, including task initiation and task blocking/unblocking (see, e.g., FIGS. 9A-9C and sections "Task Initiation" and "Task Block and Unblock"), neuron to processor element mapping and associated dataflow (see, e.g., FIGS. 10A-10B and section "High-Level Dataflow"), task state machines and closeouts (see, e.g., FIGS. 11-12 and section "Example Workload Mapping and Exemplary Tasks"), wavelet processing (see, e.g., FIGS. 13A-16 and section "Wavelets"), neuron smearing (see, e.g., FIGS. 17-20 and section "Neuron Smearing"), fabric vectors, memory vectors, and associated data structure descriptors (see, e.g., FIGS. 21A-24 and section "Vectors and Data Structure Descriptors"), and instruction formats (see, e.g., FIGS. 25A-25C and section "Instruction Formats"). The hardware processing elements of the deep learning accelerator are enabled to perform work when stalled (see, e.g., FIG. 26 and section "Microthreading"). The deep learning accelerator is usable in a variety of scenarios (see, e.g., FIGS. 27A-28E and section "Deep Learning Accelerator Example Uses"). The deep learning accelerator optionally provides floating-point with optional stochastic rounding (see, e.g., FIGS. 29, 30A-D, and 31; and section "Floating-Point Operating Context and Stochastic Rounding Operation"). The deep learning accelerator is scalable for large deep neural networks (see, e.g., section "Scalability for Large Deep Neural Networks"). The deep learning accelerator is contemplated in various embodiments (see, e.g., section "Other Embodiment Details"). The deep learning accelerator is variously implementable (see, e.g., section "Example Implementation Techniques").

Deep Learning Accelerator Overview

FIG. 1 illustrates selected details of an embodiment of a system for neural network training and inference, using a deep learning accelerator, as Neural Network System 100. Conceptually a neural network is trained using the deep learning accelerator. One or more results of the training (e.g., weights) are then used for inferences. For example, the training comprises mapping neurons of the neural network onto PEs of the deep learning accelerator. Then training data is applied to the PEs. The PEs process the training data (e.g., via forward, delta, and chain passes) and update weights until the training is complete. Then the weights are used for inference.

Referring to the figure, Deep Learning Accelerator 120 comprises FPGAs 121 and PEs 122, enabled to communicate with each other, as illustrated by Coupling 123. Placement Server(s) 150, (comprising CPUs 151 and CRM 152) is coupled to Connection Server(s) 160 (comprising CPUs 161, CRM 162, and NICs 164) via LAN 111. Connection Server(s) 160 is enabled to communicate with FPGAs 121 via NICs 164 and 100 Gb 112. Autonomous Vehicle 130 comprises CPUs 131, CRM 132, IEs 133, and Camera 135. Cell Phone 140 comprises CPUs 141, CRM 142, IEs 143, and Camera 145.

Internet 180 provides for coupling (not explicitly illustrated) between any combination of Placement Server(s) 150, Connection Server(s) 160, Autonomous Vehicle 130, and/or Cell Phone 140, according to various embodiments and/or usage scenarios.

Dashed-arrow Placements 113 conceptually indicates placement information communicated from Placement Server(s) 150 to PEs 122 (e.g., via LAN 111, Connection Server(s) 160/NICs 164, 100 Gb 112, FPGAs 121, and Coupling 123). In some embodiments and/or usage scenarios, Placements 113 is implicit, reflected in initialization information provided to router elements of PEs 122 and compute elements of PEs 122. In some embodiments and/or usage scenarios, a portion of initialization information of Placements 113 is provided to FPGAs 121 to configure elements of FPGAs 121 for operation with PEs 122.

Dashed-arrow Weights 114 and dashed-arrow Weights 115 conceptually indicate weight information communicated from PEs 122 respectively to Autonomous Vehicle 130 and Cell Phone 140 (e.g., via Coupling 123, FPGAs 121, 100 Gb 112, Connection Server(s) 160/NICs 164 and Internet 180). In some embodiments and/or usage scenarios, the weight information is any one or more of all or any portions of weight information as directly produced as a result of training, a sub-sampling thereof, a quantization thereof, and/or other transformations thereof.

Deep Learning Accelerator 120 is enabled to perform training of neural networks, such as by computing weights in response to placement information and training information received via 100 Gb 112. Deep Learning Accelerator 120 is further enabled to, upon training completion, provide the weights as results via 100 Gb 112. The weights are then usable for inference, such as in Autonomous Vehicle 130 and/or in Cell Phone 140. PEs 122 comprises a relatively large number of PEs (e.g., 10,000 or more) each enabled to independently perform routing and computations relating to training. In some embodiments and/or usage scenarios, PEs 122 is implemented via wafer-scale integration, such as respective pluralities of PEs implemented on respective dice of a single wafer. FPGAs 121 is enabled to interface PEs 122 to information provided via 100 Gb 112. The interfacing includes conversion to/from modified Ethernet frames from/to Wavelets, as communicated on Coupling 123.

Placement Server(s) 150 is enabled to programmatically determine placements of neurons (e.g., as indicated by Placements 113) via one or more placement programs. The placement programs are stored in CRM 152 and executed by CPUs 151. The placement information is communicated to Connection Server(s) 160 via LAN 111. An example of a placement is a mapping of logical neurons of a neural network onto physical memory and execution hardware resources (e.g., PEs 122).

Connection Server(s) 160 is enabled to communicate with FPGAs 121 and indirectly with PEs 122 via FPGAs 121/Coupling 123, via NICs 164 and programmed control thereof via driver programs. In various embodiments and/or usage scenarios, the communication comprises placement information (e.g., from Placement Server(s) 150), training information (e.g., from sources not illustrated but accessible via Internet 180) and/or results of training (e.g., weights from PEs 122). The driver programs are stored in CRM 162 and executed by CPUs 161.

Autonomous Vehicle 130 is enabled to use Weights 114 to perform inferences using IEs 133 as programmatically controlled and/or assisted by CPUs 131 executing programs stored in CRM 132. The inferences are optionally and/or selectively performed using information obtained from Camera 135. For example, a car is operable as an autonomous vehicle. The car comprises cameras enabled to provide video to an inference engine. The inference engine is enabled to recognize objects related to navigating the car, such as traffic lanes, obstructions, and other objects. The car is enabled to navigate using results of the object recognition. Any combination of the providing, the recognizing, and the navigating are controlled and/or performed at least in part via one or more CPUs executing programs stored in a CRM.

Cell Phone 140 is enabled to use Weights 115 to perform inferences using IEs 143 as programmatically controlled and/or assisted by CPUs 141 executing programs stored in CRM 142. The inferences are optionally and/or selectively performed using information obtained from Camera 145. For example, the cell phone is operable to post tagged photos on a social networking web site. The cell phone comprises a camera enabled to provide image data to an inference engine. The inference engine is enabled to tag objects (e.g., by type such as 'cat', 'dog', and so forth, or by name such as 'Bob', 'Mary', and so forth) in the image. The cell phone is enabled to post the image and results of the tagging to the social networking web site. Any combination of the providing, the tagging, and the posting are controlled and/or performed at least in part via one or more CPUs executing programs stored in a CRM.

In various embodiments and/or usage scenarios, all or any portions of weight information determined via a deep learning accelerator is post-processed outside of the accelerator before inference usage. For example, all or any portions of information represented by Weights 114 and/or Weights 115, is processed in whole or in part by Placement Server(s) 150 before inference usage by Autonomous Vehicle 130 and/or Cell Phone 140. In various embodiments and/or usage scenarios, an example of post-processing comprises quantizing Weights 114 and/or Weights 115 (e.g., converting from a floating-point number format to a fixed-point number format). In various embodiments and/or usage models, Camera 135 and Camera 145 are respective examples of sensors that provide input to IEs 133 and IEs 143. Other examples of sensors are location sensors, orientation sensors, magnetic sensors, light sensors, and pressure sensors.

CPUs 151 comprises one or more CPUs that are compatible with respective instruction set architectures. CPUs 151 is enabled to fetch and execute instructions from CRM 152 in accordance with the instruction set architectures. CPUs 161 comprises one or more CPUs that are compatible with respective instruction set architectures. CPUs 161 is enabled to fetch and execute instructions from CRM 162 in accordance with the instruction set architectures. In some embodiments, at least one of the instruction set architectures of CPUs 151 is compatible with at least one of the instruction set architectures of CPUs 161.

CPUs 131 comprises one or more CPUs that are compatible with respective instruction set architectures. CPUs 131 is enabled to fetch and execute instructions from CRM 132 in accordance with the instruction set architectures. CPUs 141 comprises one or more CPUs that are compatible with respective instruction set architectures. CPUs 141 is enabled to fetch and execute instructions from CRM 142 in accordance with the instruction set architectures. In some embodiments, at least one of the instruction set architectures of CPUs 131 is compatible with at least one of the instruction set architectures of CPUs 141. In some embodiments, any one or more of CPUs 151, CPUs 161, CPUs 131, and CPUs 141 have instruction set architectures that are compatible with each other.

In some embodiments and/or usage scenarios, at least a respective portion of each of CRM 152 and CRM 162 CRM 132, and CRM 142, is non-volatile and comprised of any one or more of flash memory, magnetic memory, optical memory, phase-change memory, and other non-volatile memory technology elements.

In various embodiments and/or usage scenarios, IEs 133 and/or IEs 143 comprise one or more inference engines enabled to use weight information as determined by Deep Learning Accelerator 120 (and indicated conceptually by Weights 114 and/or Weights 115). In various embodiments and/or usage scenarios, IEs 133 operates in conjunction with and/or under control of programs executed by CPUs 131 and stored in CRM 132. In various embodiments and/or usage scenarios, IEs 143 operates in conjunction with and/or under control of programs executed by CPUs 141 and stored in CRM 142. In various embodiments and/or usage scenarios, all or any portions of IEs 133 and/or IEs 143 are implemented via various combinations of HW and/or SW techniques. In some embodiments, all or any portions of functionality provided by IEs 133 and/or IEs 143 is implemented using techniques such as implemented by and/or associated with Deep Learning Accelerator 120. In various embodiments and/or usage scenarios, all or any portions of IEs 133 and/or IEs 143 are variously implemented via techniques comprising various combinations of conventional CPUs, conventional GPUs, conventional DSPs, conventional FPGAs, and specialized hardware.

In various embodiments, 100 Gb 112, is variously a 100 Gb Ethernet coupling for sending standard Ethernet frames, a 100 Gb Ethernet coupling for sending modified Ethernet frames, a 100 GB modified Ethernet coupling for sending modified Ethernet frames, a 100 Gb serial coupling of other-than Ethernet technology, or some other relatively high-speed serial coupling.

In some embodiments and/or usage scenarios, Coupling 123 communicates information as wavelets.

In various embodiments, LAN 111 is implemented using techniques such as Ethernet, Fibre Channel, and/or other suitable interconnection technologies.

In some embodiments and/or usage scenarios, Placement Server(s) 150 and Connection Server(s) 160 are implemented and/or operated as a combined element (e.g., sharing CPU, CRM, and/or NIC resources), as illustrated conceptually by Combined Server(s) 110. In some embodiments and/or usage scenarios, Placement Server(s) 150 and Connection Server(s) 160 are coupled via Internet 180 rather than (or in addition to) LAN 111.

Figure 2:
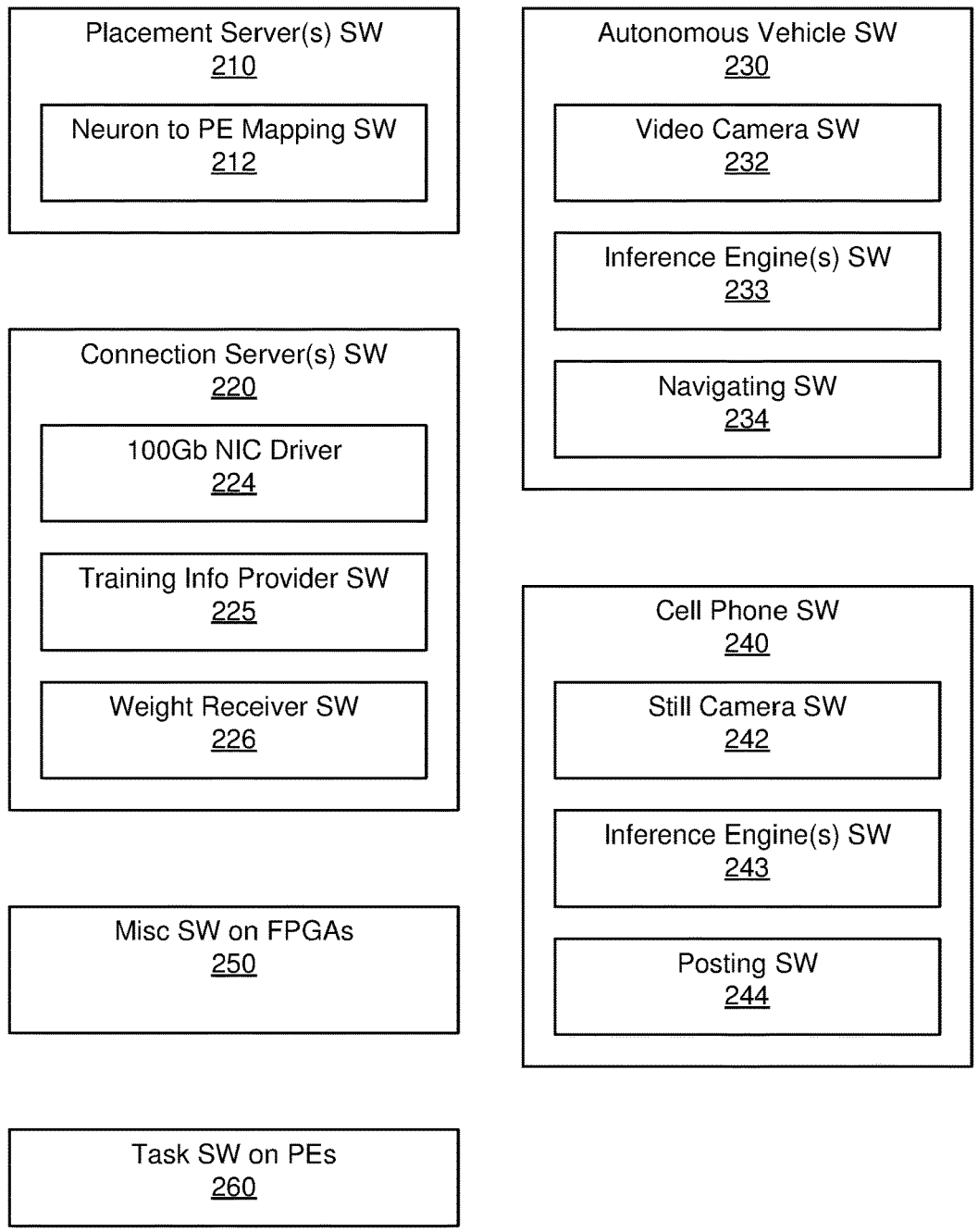
FIG. 2 illustrates selected details of an embodiment of software elements associated with neural network training and inference, using a deep learning accelerator.

FIG. 2 illustrates selected details of an embodiment of software elements associated with neural network training and inference, using a deep learning accelerator, as Neural Network Software 200. Placement Server(s) SW 210 comprises Neuron to PE Mapping SW 212, as well as other elements not illustrated, according to embodiment. In various embodiments and/or usage scenarios, all or any portions of Placement Server(s) SW 210 is stored in CRM 152 and executable by CPUs 151 of FIG. 1. One or more programs of Neuron to PE Mapping SW 212 enable determining placements of neurons of a neural network onto specific PEs of PEs 122 of FIG. 1.

Connection Server(s) SW 220 comprises 100 Gb NIC Driver 224, Training Info Provider SW 225, and Weight Receiver SW 226, as well as other elements not illustrated, according to embodiment. In various embodiments and/or usage scenarios, all or any portions of Connection Server(s) SW 220 is stored in CRM 162 and executable by CPUs 161 of FIG. 1. One or more programs of 100 Gb NIC Driver 224 enable communication between Connection Server(s) 160 and Deep Learning Accelerator 120, both of FIG. 1 (via NICs 164 and 100 Gb 112, also of FIG. 1). One or more programs of Training Info Provider SW 225 enable determination of training information for application under control of 100 Gb NIC Driver 224 for communication to Deep Learning Accelerator 120 of FIG. 1 (via NICs 164 and 100 Gb 112). In various embodiments and/or usage scenarios, the training information is variously determined from, e.g., non-volatile storage accessible to Connection Server(s) 160 and/or Internet 180, both of FIG. 1. One or more programs of Weight Receiver SW 226 enable receiving weight information under control of 100 Gb NIC Driver 224 as determined by Deep Learning Accelerator 120 (via NICs 164 and 100 Gb 112).

In various embodiments and/or usage scenarios, Misc SW on FPGAs 250 conceptually represents SW executed by one or more CPUs comprised in FPGAs 121 of (FIG. 1). The CPUs of the FPGAs are, e.g., hard-coded during manufacturing of one or more elements of FPGAs 121, and/or soft-coded during initialization of one or more elements of FPGAs 121. In various embodiments and/or usage scenarios, all or any portions of Misc SW on FPGAs 250 and/or a representation thereof is stored in non-volatile memory comprised in FPGAs 121 and/or accessible to Connection Server(s) 160. In various embodiments and/or usage scenarios, Misc SW on FPGAs 250 enables performing various housekeeping functions, such as relating to initialization and/or debugging of PEs 122 of FIG. 1.

In various embodiments and/or usage scenarios, Task SW on PEs 260 conceptually represents distributed SW executed as tasks on various PEs of PEs 122. In various embodiments and/or usage scenarios, all or any portions of Task SW on PEs 260 and/or a representation thereof is stored in non-volatile memory comprised in PEs 122 and/or accessible to Connection Server(s) 160. In various embodiments and/or usage scenarios, Task SW on PEs 260 enables performing processing of training data such as to determine weights of a neural network (e.g., via forward, delta, and chain passes).

Autonomous Vehicle SW 230 comprises Video Camera SW 232, Inference Engine(s) SW 233, and Navigating SW 234, as well as other elements not illustrated, according to embodiment. In various embodiments and/or usage scenarios, all or any portions of Autonomous Vehicle SW 230 is stored in CRM 132 and executable by CPUs 131 of FIG. 1. One or more programs of Video Camera SW 232 enable controlling and/or operating Camera 135 of FIG. 1 to provide video information to Inference Engine(s) SW 233. One or more programs of Inference Engine(s) SW 233 enable controlling and/or operating IEs 133 of FIG. 1 to determine navigational information, such as objects to avoid and/or traffic lanes to follow, from the video information. One or more programs of Navigating SW 234 enable navigating Autonomous Vehicle SW 230 in response to the navigational information.

Cell Phone SW 240 comprises Still Camera SW 242, Inference Engine(s) SW 243, Posting SW 244, as well as other elements not illustrated, according to embodiment. In various embodiments and/or usage scenarios, all or any portions of Cell Phone SW 240 is stored in CRM 142 and executable by CPUs 141 of FIG. 1. One or more programs of Still Camera SW 242 enable controlling and/or operating Camera 145 of FIG. 1 to provide still image information to Inference Engine(s) SW 243. One or more programs of Inference Engine(s) SW 243 enable controlling and/or operating IEs 143 of FIG. 1 to determine tag information from the still image information. One or more programs of Posting SW 244 enable posting to a social networking web site in response to the still image information and/or the tag information.

In various embodiments and/or usage scenarios, any one or more of SW collections Placement Server(s) SW 210, Connection Server(s) SW 220, Autonomous Vehicle SW 230, and/or Cell Phone SW 240 optionally and/or selectively comprise one or more operating system elements, e.g., one or more real-time operating systems, one or more non-real-time operating systems, and/or one or more other control programs to coordinate elements of each respective SW collection.

Figure 3:
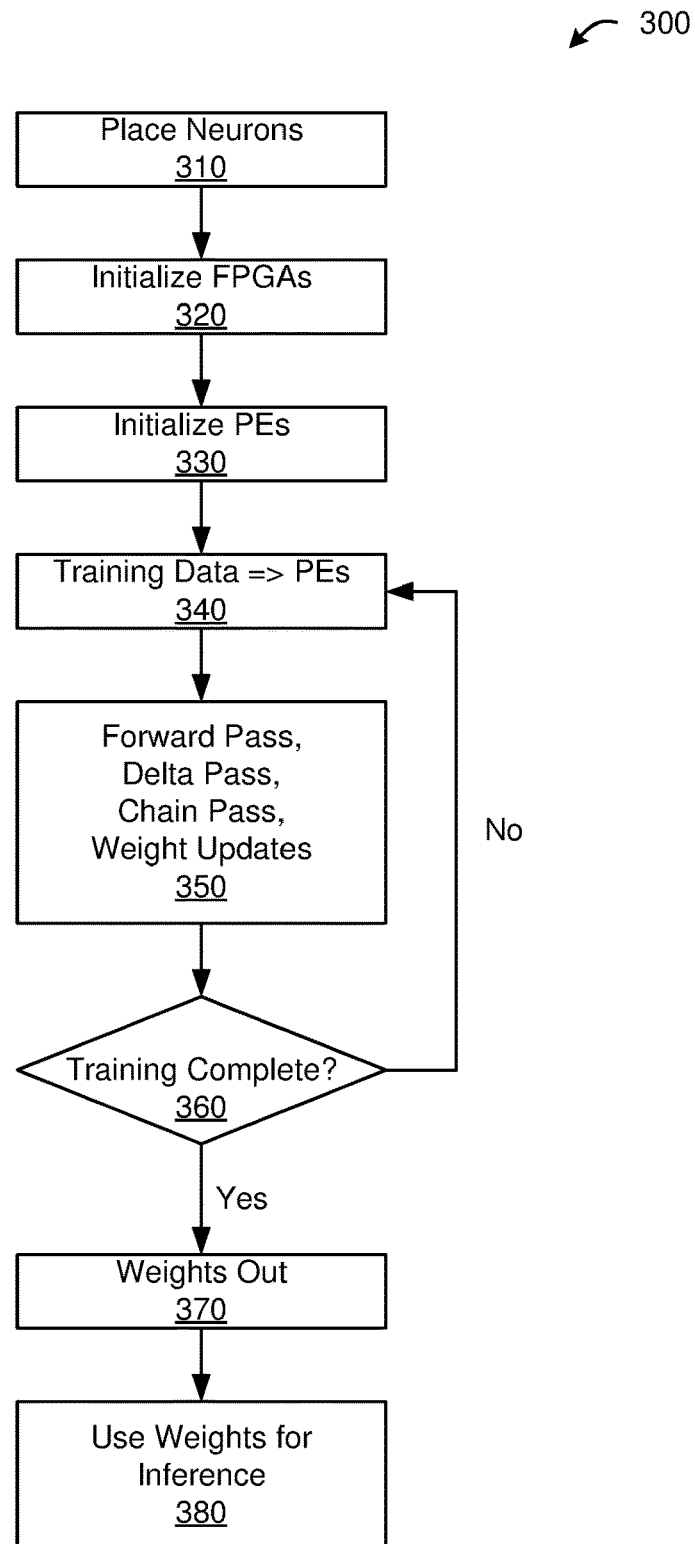
FIG. 3 illustrates selected details of an embodiment of processing associated with training a neural network and performing inference using the trained neural network, using a deep learning accelerator.

FIG. 3 illustrates selected details of an embodiment of processing associated with training a neural network and performing inference using the trained neural network, using a deep learning accelerator, as Neural Network Training/Inference 300. As illustrated, neurons of the neural network are placed, e.g., allocated and/or associated with specific PE resources in action 310. Then FPGA resources are initialized in preparation for training of the neural network in action 320. Then the PE resources are initialized in preparation for training of the neural network in action 330.

After the FPGA resources and PE resources are initialized in preparation for the training, training data is applied to the PEs in action 340. The PE resources process the training data in action 350. Then a check is made to determine if training is complete, e.g., because application of the training data is complete and/or one or more completion criteria are met (such as an inference error below a predetermine bound) in action 360. If not, then flow passes back to action 340 for application of further training data. In some scenarios, the training does not complete and in some embodiments, control instead passes to another action (not illustrated) to enable changing, for example, hyperparameters of the neural network (e.g., any one or more of: adding layers of neurons, removing layers of neurons, changing connectivity between neurons, changing the batch size, and changing the learning rule). The changed neural network is then trained in accordance with actions 310, 320, 330, 340, 350, and 360.

If training is complete, then flow continues to provide weights that are results of the training for use in inferences in 370. In some embodiments and/or usage scenarios, the weights are quantized, e.g., transformed to an integer data format. In some embodiments and/or usage scenarios, the integer data format is a reduced precision number format (e.g., 8-bit or 16-bit). The weights are then provided to one or more inference engines, and used to make inferences in action 380.

In various embodiments and/or usage scenarios, the inference engines correspond to one or more inference applications, e.g., text translation, optical character recognition, image classification, facial recognition, scene recognition for a self-driving car, speech recognition, data analysis for high energy physics, and drug discovery.

In various embodiments and/or usage scenarios, the PE resources correspond, e.g., to PEs 122 of FIG. 1, and the FPGAs resources correspond, e.g., to FPGAs 121 of FIG. 1.

In various embodiments and/or usage scenarios, any one or more of all or any portions of actions of Neural Network Training/Inference 300 are performed by and/or related to all or any portions of any one or more elements of Neural Network System 100 of FIG. 1 and/or Neural Network Software 200 of FIG. 2. For example, all or any portions of action 310 are performed by Placement Server(s) 150 via execution of Neuron to PE Mapping SW 212. For another example, all or any portions of action 320 are performed by Placement Server(s) 150 via execution of Neuron to PE Mapping SW 212. For another example, all or any portions of action 330 are performed by Placement Server(s) 150 via execution of Neuron to PE Mapping SW 212. For another example, all or any portions of action 330 are performed by PEs 122 via execution of Task SW on PEs 260. For another example, all or any portions of action 340 are performed by Connection Server(s) 160 via execution of Training Info Provider SW 225. For another example, all or any portions of action 350 are performed by PEs 122 via execution of Task SW on PEs 260. For another example, all or any portions of action 350 are performed by Combined Server(s) 110, Placement Server(s) 150 and/or Connection Server(s) 160. For another example, all or any portions of 370 are performed by Connection Server(s) 160 via execution of Weight Receiver SW 226. For another example, all or any portions of action 370 are performed by FPGAs 121 via execution of Misc SW on FPGAs 250. For another example, all or any portions of 380 are performed by IEs 133 such as under control of Inference Engine(s) SW 233. For another example, all or any portions of action 380 are performed by IEs 143 such as under control of Inference Engine(s) SW 243.

In various embodiments and/or usage scenarios, any one or more of all or any portions of actions of Neural Network Training/Inference 300 are performed in conjunction with communicating information between various elements of Neural Network System 100 of FIG. 1. For example, various actions of Neural Network Training/Inference 300 are performed at least in part via NICs 164 and 100 Gb 112 communicating information between Connection Server(s) 160 and FPGAs 121. For another example, various actions of Neural Network Training/Inference 300 are performed in conjunction with FPGAs 121 and Coupling 123 communicating information between Connection Server(s) 160 and PEs 122. For another example, various actions of Neural Network Training/Inference 300 performed in conjunction with any one or more of Placement Server(s) 150, Connection Server(s) 160, Autonomous Vehicle 130, and Cell Phone 140 communicating information as enabled at least in part by Internet 180.

Figure 4:
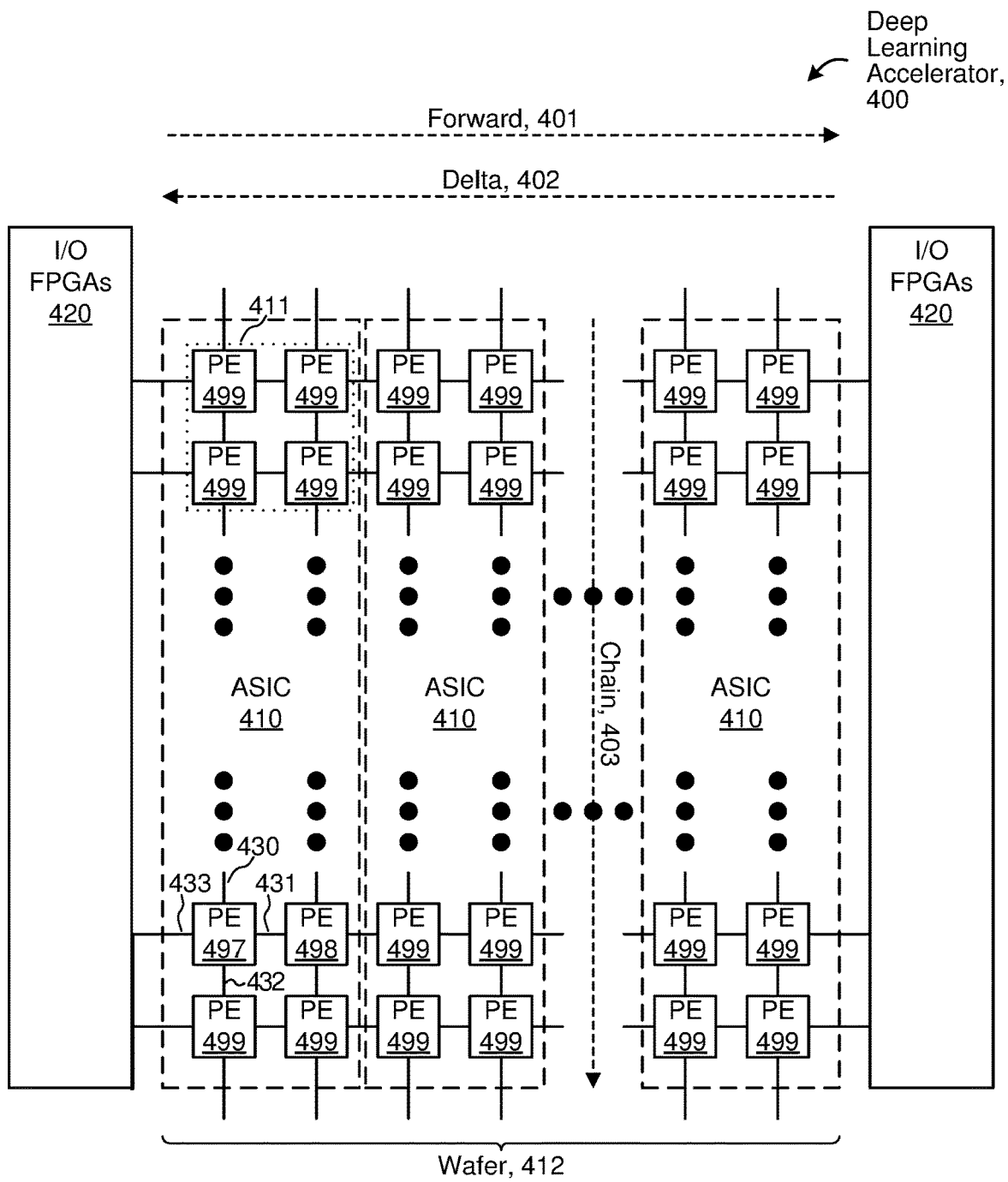
FIG. 4 illustrates selected details of an embodiment of a deep learning accelerator.

FIG. 4 illustrates selected details of an embodiment of a deep learning accelerator as Deep Learning Accelerator 400. Each of PE 499 elements has couplings to other of PE 499 elements. Two of the PE elements (PE 497 and PE 498) are illustrated with unique identifiers, and are otherwise respectively identical to instances of PE 499. PE 497 is illustrated with identifiers for each of four couplings (North coupling 430, East coupling 431 with PE 498, and South coupling 432) to others of the PEs and one of the I/O FPGAs (West coupling 433), but is otherwise identical to others of the PE elements illustrated. In some embodiments and/or usage scenarios, the couplings are logical and/or physical. In various embodiments and/or usage scenarios, the couplings are usable to communicate wavelets, backpressure information, or both. In various embodiments and/or usage scenarios, all or any portions of the physical couplings are to physically adjacent PEs. In some embodiments and/or usage scenarios, the PEs are physically implemented in a 2D grid. In some embodiments and/or usage scenarios, the PEs are physically implemented in a 2D grid of aligned rectangles, and physically adjacent PEs correspond to PEs sharing a horizontal boundary (North/South PEs with respect to each other) and PEs sharing a vertical boundary (East/West PEs with respect to each other).

In some embodiments and/or usage scenarios, an array of identical instances of a same ASIC is formed on a wafer, and each of the same ASICs comprises a plurality of identical instances of a same PE (e.g., PE 499), forming a wafer (e.g., Wafer 412) usable in wafer-scale integration techniques. Unless indicated to the contrary, references herein to a "wafer" (including to Wafer 412) are applicable to embodiments of a whole or substantially whole wafer as well as to embodiments of a significant portion of a wafer. In some embodiments and/or usage scenarios, a peripheral portion of the PEs are coupled to I/O FPGAs 420. Example ASICs are illustrated as ASIC 410, comprising a column-organized section of PEs (replicated, e.g., in a one-dimensional fashion to form a wafer), and ASIC 411, comprising a square-organized section or a rectangular-organized section of PEs (replicated, e.g., in a two-dimensional fashion to form a wafer). Other organizations of ASICs on a wafer are contemplated.

In some embodiments and/or usage scenarios, neurons associated with layers in a neural network are generally placed on PE 499 elements in a left to right fashion, with earlier layers (e.g., the input layer) on the left and subsequent layers (e.g., the output layer) on the right. Accordingly, data flow during training is illustrated conceptually as dashed-arrows Forward 401, Delta 402, and Chain 403. During Forward 401, stimuli is applied to the input layer and activations from the input layer flow to subsequent layers, eventually reaching the output layer and producing a forward result. During Delta 402, deltas (e.g., differences between the forward result and the training output data) are propagated in the backward direction. During Chain 403, gradients are calculated based on the deltas (e.g., with respect to the weights in the neurons) as they are generated during Delta 402. In some embodiments and/or usage scenarios, processing for Delta 402 is substantially overlapped with processing for 403.

In some embodiments and/or usage scenarios, Deep Learning Accelerator 400 is an implementation of Deep Learning Accelerator 120 of FIG. 1. In some embodiments and/or usage scenarios, individual PE 499 elements correspond to individual PEs of PEs 122 of FIG. 1. In some embodiments and/or usage scenarios, each ASIC 410 element or alternatively each ASIC 411 element corresponds to all or any portions of PEs of PEs 122 implemented as individual integrated circuits. In some embodiments and/or usage scenarios, each ASIC 410 element or alternatively each ASIC 411 element corresponds to (optionally identical) portions of PEs 122 implemented via respective dice of a wafer. In some embodiments and/or usage scenarios, I/O FPGAs 420 elements collectively correspond to FPGAs 121 of FIG. 1.

In some embodiments and/or usage scenarios, the placement of neurons (e.g., associated with layers in a neural network) onto PE 499 elements is performed in whole or in part by all or any portions of Placement Server(s) SW 210 of FIG. 2.

Fabric Overview

As illustrated in FIG. 4, an embodiment of a deep learning accelerator comprises a plurality of PEs coupled to each other via a fabric. Each PE includes a CE (e.g., for performing computations) and a router (e.g., for managing and/or implementing movement of information on the fabric).

The fabric operates as a communication interconnect between all the PEs in the deep learning accelerator. The fabric transfers wavelets, e.g., via 30-bit physical couplings to enable transfer of an entire wavelet per cycle (e.g., core clock cycle). Conceptually the fabric is a local interconnect distributed throughput the PEs such that each PE is enabled to communicate directly with its (physical) neighbors. Communication to other-than (physical) neighbors is via hops through intermediate nodes, e.g., others of the PEs. In some embodiments and/or usage scenarios, a distributed local fabric topology efficiently maps to a neural network workload, e.g., each layer sends data to a neighboring layer) and/or is implementable with relatively lower cost in hardware.

An example fabric comprises 16 logically independent networks referred to as colors. Each color is a virtual network, e.g., virtual channel, overlaid on a single physical network. Each color has dedicated physical buffering resources but shares the same physical routing resources. The dedicated physical buffers enable non-blocking operation of the colors. The shared physical routing reduces physical resources. In various embodiments and/or usage scenarios, a fabric comprises various numbers of colors (e.g., 8, 24, or 32).

There is a routing pattern associated with each color and implemented by the routers. The routing pattern of each pattern is programmable and in some embodiments is statically configured, e.g., based at least in part on determinations made by Placement Server(s) SW 210 and/or Neuron to PE Mapping SW 212 of FIG. 2. Once configured, e.g., under control of software (such as Connection Server(s) SW 220 of FIG. 2), each color is a fixed routing pattern. All data that flows within a color always flows in accordance with the fixed routing pattern. There are no dynamic routing decisions. The fixed routing matches neural network communication patterns where neuron connections are statically specified. The fixed routing enables relatively lower cost hardware implementation.

As illustrated in FIG. 4, an example (physical) fabric topology comprises a 2D mesh with each hop in the X or Y dimension (e.g. West 511 or North 513 of FIG. 5, respectively) performed in a single core clock cycle. In addition to the 2D mesh illustrated, some embodiments further comprise "skip" connections, e.g., in the horizontal dimension and "loop" connections, e.g., in the vertical dimension. An example skip connection enables PEs in a same row of the 2D mesh and physically separated by N other PEs to communicate with each other as if the PEs were physically adjacent. A hop along a skip connection (e.g. Skip West 512 of FIG. 5) is performed in a single core clock cycle. In various embodiments, an example loop connection enables a PE at the bottom of a column of PEs to communicate with a PE at the top of the column as if the PEs were physically adjacent. In some embodiments, a hop along a loop connection is performed in a single core clock cycle.

Performing each hop in the X or Y dimension in a single clock, in some embodiments and/or usage scenarios, enables simplifying implementation of arbitrary programmable routing topologies and related timing constraints. In some circumstances, the single cycle per hop latency is compatible with an associated pipelined data flow pattern. In some circumstances (e.g., when communicating from one layer to a next layer), the single cycle per hop latency adds additional latency and reduces performance. The additional latency is worst when the layer is deep and uses many PEs, since more hops are used to escape the layer and to reach all the PEs of the next layer. The additional latency results in overall workload pipeline length increasing and therefore storage (e.g. for forward pass activations) increasing.

The skip connections are used to reduce the additional latency. Consider an example. Each skip connection skips 50 PEs in a single core clock cycle. The latency to enter the first skip connection is 49 hops maximum. The latency to reach a final PE after exiting a final skip connection is 49 hops maximum. Therefore, there is a 98 core clock cycle maximum latency overhead and a 49 core clock cycle average latency overhead. The latency to process a layer is 2000 core clock cycles. Thus, in the example, there is a 5% maximum overall overhead and a 2.5% average overall overhead.

In some embodiments and/or usage scenarios, each row has skip connections and each column has loop connections. In some embodiments and/or usage scenarios, each skip connection skips 50 PEs, and each column has 200 PEs that a loop connection encompasses. In some embodiments, a single loop connection (e.g., in a context of a column of PEs, between the PE at the bottom of the column and the PE at the top of the column) approximately physically spans the column, and in other embodiments, loop connections of the column are physically implemented by folding so that the average and worst case loop hops approximately physically span two PEs.

In some embodiments and/or usage scenarios, the fabric interconnects 200×100 PEs per ASIC, with 200 PEs in the vertical dimension and 100 PEs in the horizontal dimension. The fabric is general purpose and usable by software executing on the PEs (e.g. Task SW on PEs 260 of FIG. 2) for any function. In some embodiments and/or usage scenarios, the software uses the horizontal dimension for communicating data between layers (e.g., activation broadcasting). The communicating data between layers is optionally and/or selectively via one or more skip connections. In some embodiments and/or usage scenarios, the software uses the vertical dimension for communicating data within a layer (e.g., partial sum accumulating). The communicating within a layer is optionally and/or selectively via one or more loop connections. In some circumstances, partial sum accumulating is via a ring topology.

Conceptually, on the fabric, backpressure information flows along the same topology and at the same rate as data the backpressure information corresponds to, but in the opposite direction of the corresponding data. E.g., a router sends backpressure information along the reverse path of the fixed routing pattern. There is an independent backpressure channel (e.g., signal) for each color, enabling communicating backpressure information for multiple colors simultaneously. The independent back pressure channels simplify, in some embodiments and/or usage scenarios, the backpressure communication when there are multiple queues draining on the same cycle (e.g., to different outputs).

When a color is back pressured, data queued at each hop within the fabric is stalled. Conceptually, the queued data is an extension to a queue at the destination since it is drained into the destination once the backpressure is released. For example, the backpressure signal from a particular PE and corresponding to a particular color is only asserted when a data queue of the router of the particular PE and corresponding to the particular color is at a predetermined threshold (e.g., full or nearly full). Therefore, with respect to the particular color, data flows until reaching a stalled PE, such that the data queue effectively operates as a portion of a distributed in-fabric queue.

The fixed routing pattern provides for multicast replication within each router. Multicast enables high fan-out communication patterns, such as within some neural network workloads. To perform multicast, each router node is statically configured with multiple outputs per multicast color. The router replicates an incoming wavelet corresponding to the multicast color to all outputs specified by the static configuration before processing the next wavelet of the multicast color. In some circumstances there are a plurality of multicast colors, each statically configured with a respective set of multiple outputs.

The router provides for multiple input sources per color and processes a single active input source at a time. Coordination of the input sources is performed, for example, by software at a higher-level (e.g. flow control dependency, explicit messaging between PEs, or other suitable mechanisms) so that only a single input source is active at a time. Implementing a single active input source enables, in some embodiments and/or usage scenarios, relatively lower-cost hardware since the router has a single buffer per color instead of a buffer per input source.

Since there is only a single active input source at a time, there is not any congestion within a color. However, in some circumstances, congestion occurs between colors since the colors share a single physical channel. The router responds to the congestion by scheduling between ready colors onto a single shared output channel.

Deadlock on the fabric is possible since the fabric is blocking (e.g., the fabric and the routers have no hardware deadlock avoidance mechanisms). Deadlock is avoided by software configuring the fixed routing patterns to be free of dependent loops, thus avoiding circular dependencies and deadlock.

Software also ensures there are no circular dependencies through PE data path resources. Such dependencies would otherwise be possible since the training workload shares the same physical PE data path for all three mega-phases (forward pass, delta pass, and chain pass) and processing of the delta pass and the chain pass is on the same PEs as processing of the forward pass. To break any circular dependencies, software ensures that all tasks in the (forward pass, delta pass, and chain pass) loop do not block indefinitely. To do so, at least one task in the loop is guaranteed to complete once scheduled. The task scheduling is enabled by the wavelet picker in the compute element. The picker is programmed to schedule a wavelet only when the downstream color for the wavelet is available. It is also independently desirable for software to program tasks with the foregoing property for performance, in some embodiments and/or usages scenarios.

In the event of incorrect configuration leading to deadlock, there is a watchdog mechanism that detects lack of progress and signals a fault to management software.

Processing Element: Compute Element and Router

Figure 5:
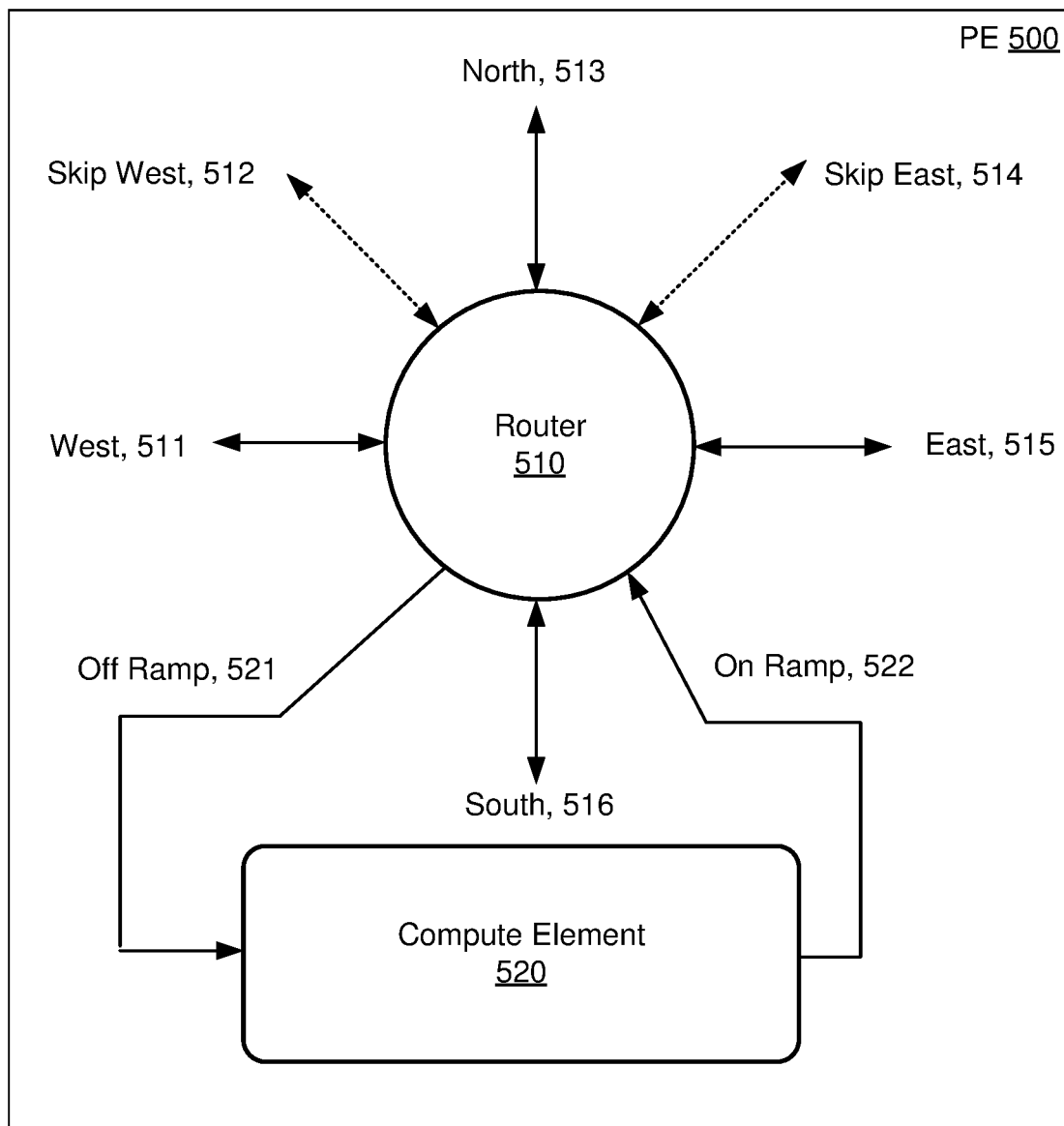
FIG. 5 illustrates selected details of an embodiment of a processing element of a deep learning accelerator.

FIG. 5 illustrates selected details of an embodiment of a PE as PE 500 of a deep learning accelerator. PE 500 comprises Router 510 and Compute Element 520. Router 510 selectively and/or conditionally communicates (e.g. transmits and receives) wavelets between other PEs (e.g., logically adjacent and/or physically adjacent PEs) and PE 500 via couplings 511-516. Couplings 511-516 are illustrated as bidirectional arrows to emphasize the bidirectional communication of wavelets on the couplings. Backpressure information is also transmitted on the couplings in the reverse direction of wavelet information the backpressure corresponds to. Router 510 selectively and/or conditionally communicates wavelets to PE 500 (e.g., Compute Element 520) via Off Ramp 521 and communicates wavelets from PE 500 (e.g., Compute Element 520) via On Ramp 522. Off Ramp 521 is illustrated as a unidirectional arrow to emphasize the unidirectional communication of wavelets on the coupling (e.g., from Router 510 to Compute Element 520). Backpressure information is also transmitted on the coupling in the reverse direction of wavelet information (e.g. from Compute Element 520 to Router 510). On Ramp 522 is illustrated as a unidirectional arrow to emphasize the unidirectional communication of wavelets on the coupling (e.g., from Compute Element 520 to Router 510). Backpressure information is also transmitted on the coupling in the reverse direction of wavelet information (e.g. from Router 510 to Compute Element 520).

Compute Element 520 performs computations on data embodied in the wavelets according to instruction address information derivable from the wavelets. The instruction address information is used to identify starting addresses of tasks embodied as instructions stored in storage (e.g., any one or more of memory, cache, and register file(s)) of the compute element. Results of the computations are selectively and/or conditionally stored in the storage and/or provided as data embodied in wavelets communicated to the router for, e.g., transmission to the other PEs and or PE 500.

In addition to data, Router 510 selectively and/or conditionally communicates (e.g. transmits and receives) backpressure information between the other PEs and PE 500 via couplings 511-516. Router 510 selectively and/or conditionally transmits backpressure information to PE 500 via On Ramp 522. Router 510 receives backpressure information from PE 500 via Off Ramp 521. The backpressure information provided to the other PEs, as well as the backpressure information provided to PE 500, is used by the other PEs and PE 500 to stall transmitting data (e.g. wavelets) that would otherwise be lost due to insufficient queue space to store the data in Router 510. The backpressure information received from the other PEs and PE 500 is used respectively by Router 510 to prevent transmitting data (e.g. wavelets) that would otherwise be lost due respectively to insufficient queue space in the routers of the other PEs and insufficient space in input queues of Compute Element 520.

In various embodiments, any one or more of 511-516 are omitted.

In some embodiments and/or usage scenarios, PE 500 is an embodiment of PE 499 of FIG. 4, and/or elements of PE 500 correspond to an implementation of PE 499. In some embodiments and/or usage scenarios, North 513, East 515, South 516, and West 511 correspond respectively to North coupling 430, East coupling 431, South coupling 432, and West coupling 433 of FIG. 4.

Figure 6:
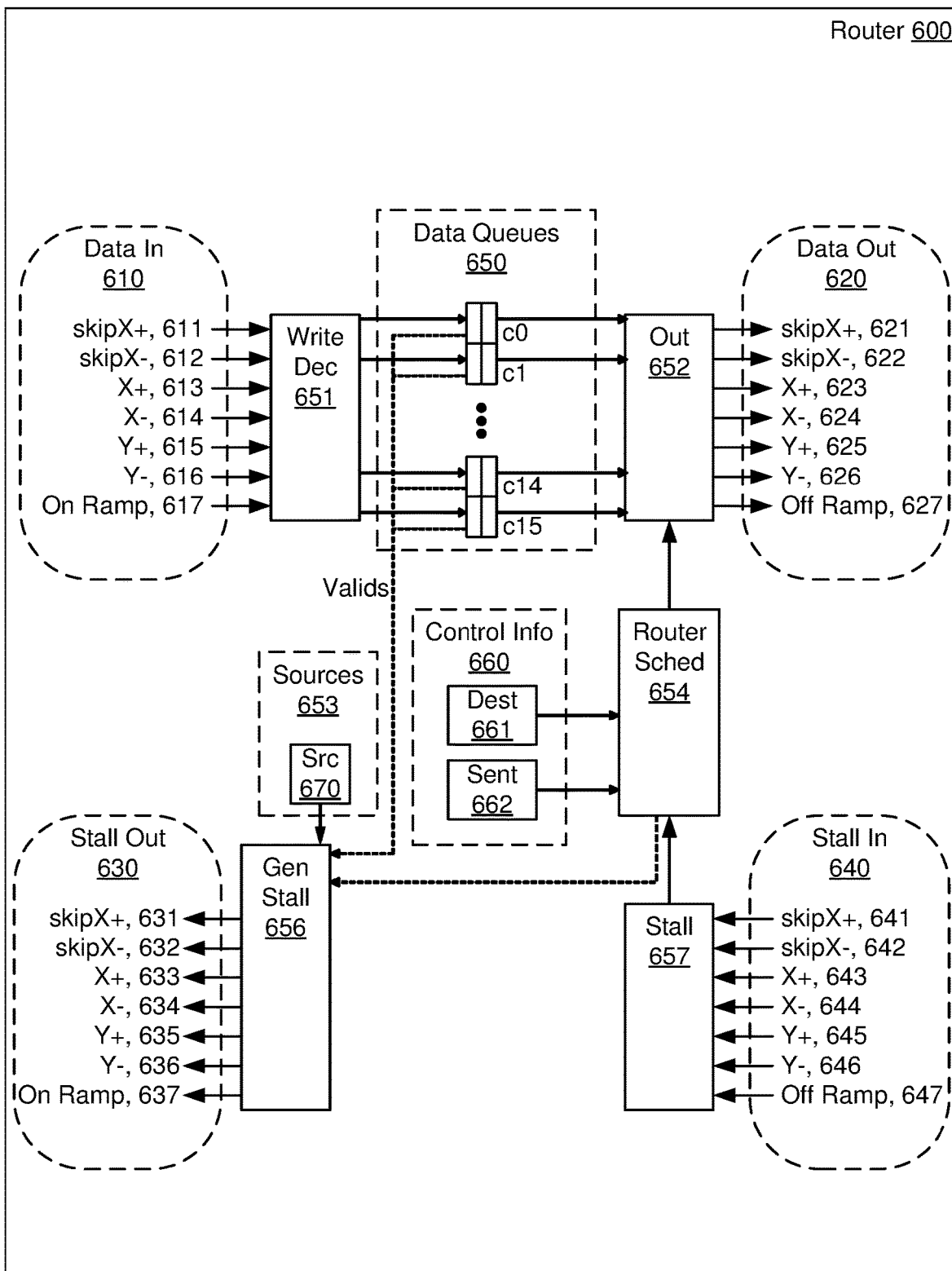
FIG. 6 illustrates selected details of an embodiment of a router of a processing element.

FIG. 6 illustrates selected details of an embodiment a router of a PE, as Router 600. Consider that there are a plurality of PEs, each comprising a respective router and a respective CE. Router 600 is an instance of one of the respective routers. Router 600 routes wavelets, in accordance with color information of the wavelets and routing configuration information, to the CE of the PE that the instant router is comprised in, as well as others of the routers. The routed wavelets are variously received by the instant router and/or generated by the CE of the PE that the instant router is comprised in. The routing enables communication between the PEs. Stall information is communicated to prevent overflowing of wavelet storage resources in Router 600.

Router 600 comprises four groups of interfaces, Data In 610, Data Out 620, Stall Out 630, and Stall In 640. Data In 610, Data Out 620, Stall Out 630, and Stall In 640 respectively comprise interface elements 611-617, 621-627, 631-637, and 641-647. Router 600 further comprises Write Dec 651, Out 652, Gen Stall 656, and Stall 657, respectively coupled to Data In 610, Data Out 620, Stall Out 630, and Stall In 640. Router 600 further comprises Sources 653 comprising Src 670 coupled to Gen Stall 656. Router 600 further comprises Data Queues 650, Control Info 660, and Router Sched 654. Control Info 660 comprises Dest 661 and Sent 662.

Conceptually, skipX+ 611, skipX+ 621, skipX+ 631, and skipX+ 641 comprise one of seven 'directions', e.g., the 'skipX+ ' direction. In some embodiments, the skipX+ direction corresponds to Skip East 514 of FIG. 5. SkipX− 612, SkipX− 622, SkipX− 632, and SkipX− 642 comprise a second, 'SkipX−' direction. In some embodiments, the skipX− direction corresponds to Skip West 512 of FIG. 5. X+ 613, X+ 623, X+ 633, and X+ 643 comprise a third, 'X+' direction. In some embodiments, the X+ direction corresponds to East 515 of FIG. 5. X− 614, X− 624, X− 634, and X− 644 comprise a fourth, 'X−' direction. In some embodiments, the X− direction corresponds to West 511 of FIG. 5. Y+ 615, Y+ 625, Y+ 635, and Y+ 645 comprise a fifth, 'Y+' direction. In some embodiments, the Y+ direction corresponds to North 513 of FIG. 5. Y− 616, Y− 626, Y− 636, and Y− 646 comprise a sixth, 'Y−' direction. In some embodiments, the Y− direction corresponds to South 516 of FIG. 5. Lastly, On Ramp 617, Off Ramp 627, On Ramp 637, and Off Ramp 647 comprise a seventh, 'On/Off Ramp' direction. In some embodiments, On Ramp 617 and On Ramp 637 portions of the On/Off Ramp direction correspond to On Ramp 522 of FIG. 5. In some embodiments, Off Ramp 627 and Off Ramp 647 of the On/Off Ramp direction correspond to Off Ramp 521 of FIG. 5.

Data In 610 is for receiving up to one wavelet from each direction each core clock cycle. Stall Out 630 is for transmitting stall information in each direction for each color each core clock cycle. Data Out 620 is for transmitting up to one wavelet to each direction in each core clock cycle. Stall In 640 is for receiving stall information from each direction for each color each core clock cycle.

Data Queues 650 is coupled to Write Dec 651 to receive incoming wavelet information and coupled to Out 652 to provide outgoing wavelet information. Data Queues 650 is further coupled to Gen Stall 656 to provide data queue validity information (e.g., corresponding to fullness) used for, e.g., generating stall information. Router Sched 654 is coupled to Control Info 660 to receive control information relevant to scheduling queued wavelets. Router Sched 654 is further coupled to Stall 657 to receive stall information relevant to scheduling queued wavelets. Router Sched 654 is further coupled to Out 652 to direct presentation of queued wavelets on one or more of 621-627. Router Sched 654 is further coupled to Gen Stall 656 to partially direct generation of stall information.

In some embodiments, Data Queues 650 comprises two entries per color (c0 . . . c15). Each entry is enabled to store at least payload information of a wavelet. In various embodiments, color information of the wavelet is not stored. A first of the entries is used to decouple the input of the queue from the output of the queue. A second of the entries is used to capture inflight data when a stall is sent in parallel (e.g., on a same core clock cycle) with the inflight data. In various embodiments, Data Queues 650 comprises a number of bits of storage equal to a number of colors multiplied by a number of bits of stored information per wavelet multiplied by a number of queue entries per color, e.g., 864 bits=16 colors*27 bits of wavelet data*2 entries per color. Alternatively, 33 bits of wavelet data are stored, and Data Queues 650 comprises 1056 bits=16 colors*33 bits of wavelet data*2 entries per color. In various embodiments, Data Queues 650 is implemented via one or more registers and/or a register file. Write Dec 651 stores, for each of the directions, information of the respective incoming wavelet into an entry of Data Queues 650 corresponding to the color of the incoming wavelet.

In some embodiments, Router Sched 654 comprises a scheduler for each of the directions (e.g., per 621-627). For each direction, the respective scheduler assigns available data in Data Queues 650 to the respective direction. Destination information per color is (statically) provided by Dest 661. In various embodiments, Dest 661 comprises a number of bits of storage equal to a number of colors multiplied by a number of directions, e.g., 112 bits=16 colors*7 directions. In various embodiments, Dest 661 is implemented via one or more registers and/or a register file. In some embodiments, Dest 661 comprises a data structure accessed by color that provides one or more directions as a result. E.g., a register file/array addressed by color encoded as a binary value and providing one bit per direction as a bit vector, each asserted bit of the bit vector indicating the color is to be sent to the associated direction(s).

Each of the schedulers operates independently of one another. Thus, for multicast outputs, a single wavelet is selectively and/or conditionally scheduled onto different directions in different core clock cycles, or alternatively in a same core clock cycle. Sent 662 is used to track which direction(s) a wavelet has been sent to. Each scheduler picks a color if the color has not been previously sent and the direction is not stalled for the color. In various embodiments, Sent 662 comprises a number of bits of storage equal to a number of colors multiplied by a number of directions, e.g., 112 bits=16 colors*7 directions. In various embodiments, Sent 662 is implemented via one or more registers and/or a register file.

In various embodiments, each scheduler implements one or more scheduling policies, e.g., round-robin and priority. The round-robin scheduling policy comprises the scheduler choosing between all available colors one at a time, conceptually cycling through all the colors before picking a same color again. The priority scheduling policy comprises the scheduler choosing from among a first set of predetermined colors (e.g., colors 0-7) with higher priority than from among a second set of predetermined colors (e.g., colors 8-15).

In some embodiments, Stall 657 is enabled to capture stall information and comprises a number of bits of storage equal to a number of colors multiplied by a number of directions, e.g., 112 bits=16 colors*7 directions. In various embodiments, Stall 657 is implemented via one or more registers and/or a register file.

In some embodiments, stall information is generated by Gen Stall 656 for all the colors of all the directions, based on occupancy of Data Queues 650. E.g., there is a stall generator for each color of each of 631-637. Src 670 stores and provides to Gen Stall 656 information to map a corresponding color of Data Queues 650 to one or more corresponding directions. In response to insufficient queue space in Data Queues 650 corresponding to a particular color, the directions acting as sources for the particular color are directed to stall providing further input, until queue space becomes available in Data Queues 650 for the further input. In various embodiments, Src 670 comprises a number of bits of storage equal to a number of colors multiplied by a number of directions, e.g., 112 bits=16 colors*7 directions.

In various embodiments, Src 670 is implemented via one or more registers and/or a register file. In some embodiments, Src 670 comprises a data structure accessed by color that provides one or more directions as a result. E.g., a register file/array addressed by color encoded as a binary value and providing one bit per direction as a bit vector, each asserted bit of the bit vector indicating the color is source from the associated direction(s).

In various embodiments and/or usage scenarios, all or any portions of information retained in any one or more of Src 670 and Dest 661 corresponds to all or any portions of routing configuration information. In various embodiments and/or usage scenarios, all or any portions of the routing configuration information is determined, e.g., based at least in part on Placement Server(s) SW 210 and/or Neuron to PE Mapping SW 212 of FIG. 2. In various embodiments and/or usage scenarios, the routing configuration information is distributed to routers, e.g., under control of software (such as Connection Server(s) SW 220, Misc SW on FPGAs 250, and/or Task SW on PEs 260 of FIG. 2). In various embodiments and/or usage scenarios, one or more predetermined colors (e.g. color zero) are used to distribute, in accordance with a predetermined fixed routing pattern, all or any portions of the routing configuration information and/or all or any portions of compute element configuration information. An example of the predetermined fixed routing pattern is a predetermined multicast topology, optionally and/or conditionally in conjunction with a non-stalling flow. In some embodiments and/or usage scenarios, the distribution of the configuration information is implemented via a wavelet format unique to the distribution. Wavelets of the unique format are parsed and interpreted, e.g., by a hard-coded state machine monitoring Off Ramp 627.

In various embodiments, each of interface elements 611-616, 621-626, 631-636, and 641-646 is variously implemented via passive interconnect (e.g., wire(s) without buffering), active interconnect (e.g., wire(s) with selective and/or optional buffering), and coupling with logic to accommodate additional functionality between one instance of Router 600 and another instance of Router 600. In various embodiments, each of interface elements 617, 627, 637, and 647 is variously implemented via passive interconnect (e.g., wire(s) without buffering), active interconnect (e.g., wire(s) with selective and/or optional buffering), and coupling with logic to accommodate additional functionality between the instant router and the CE of the PE the instant router is comprised in.

In some embodiments and/or usage scenarios, Router 600 is an implementation of Router 510 of FIG. 5.

Figure 7A:
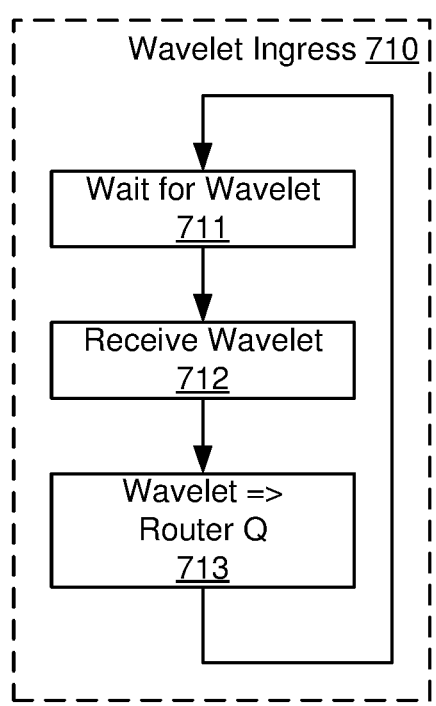
FIG. 7A illustrates selected details of an embodiment of processing associated with a router of a processing element.

FIG. 7A illustrates selected details of an embodiment of processing associated with a router of a processing element, as Wavelet Ingress 710. Conceptually, the router accepts as many wavelets as possible from ingress ports, queuing as necessary and as queue space is available, and routes as many wavelets as possible to egress ports per unit time (e.g., core clock cycle). In some embodiments and/or usage scenarios, there is one queue per color.

Wavelet Ingress 710 comprises actions 711-713 corresponding to wavelet ingress from (logically and/or physically) adjacent PEs and/or an instant PE, for each respective router direction (e.g., any of 611-617 of FIG. 6). The router waits for an incoming wavelet (Wait for Wavelet 711). In response to the incoming wavelet, the wavelet is received (Receive Wavelet 712) and written into a router queue corresponding to a color comprised in the wavelet (Wavelet=>Router Q 713). In some embodiments, the writing is at least partly under the control of Write Dec 651.

Flow then returns to wait for another wavelet. In some embodiments and/or usage scenarios, a respective instance of Wavelet Ingress 710 operates concurrently for each router direction. In various embodiments and/or usage scenarios, any one or more of all or any portions of actions of 710 correspond to actions performed by and/or related to all or any portions of any one or more elements of Router 600 of FIG. 6.

Figure 7B:
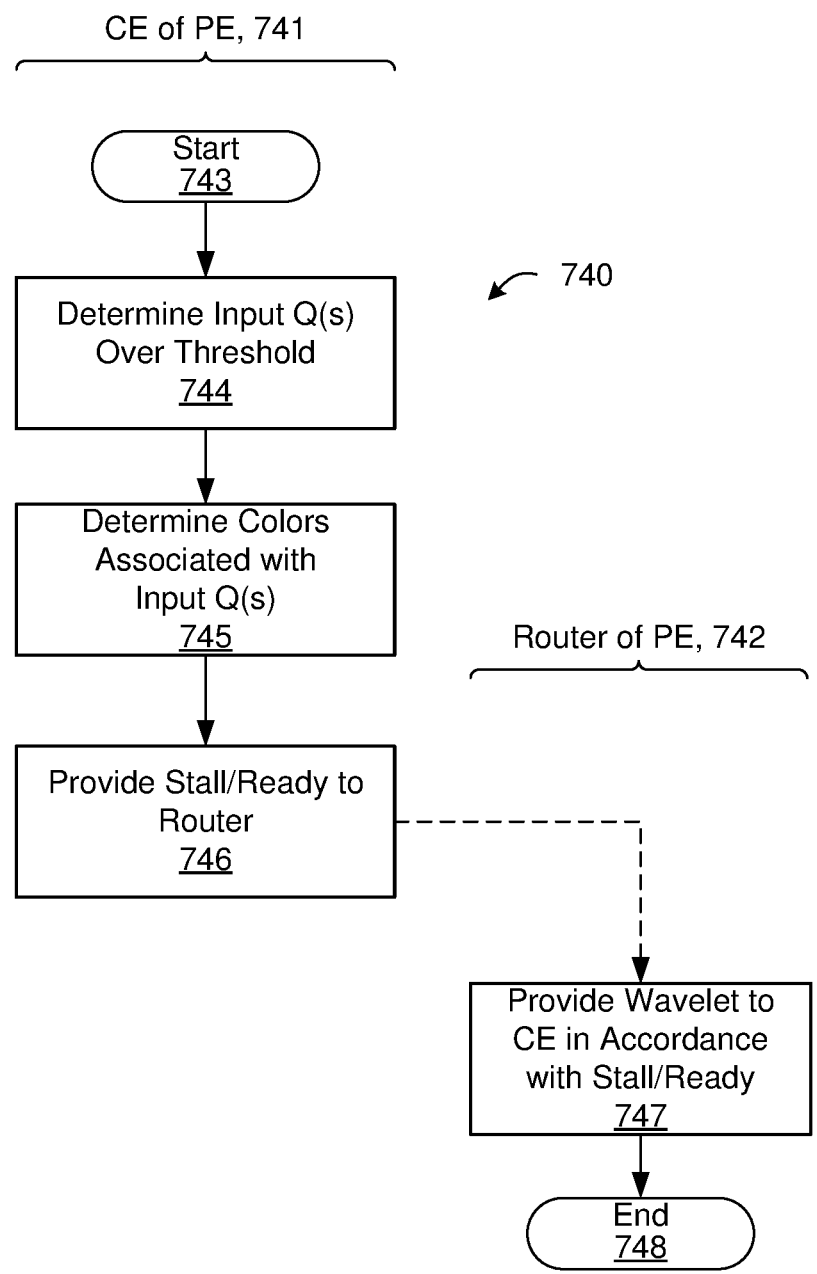
FIG. 7B illustrates selected details of an embodiment of generating and providing backpressure information associated with a compute element of a processing element.

FIG. 7B illustrates selected details of an embodiment of generating and providing backpressure information associated with a compute element of a processing element as flow 740. Actions of flow 740 are performed by various agents. A PE comprises a CE that performs actions 744-746, as illustrated by CE of PE 741. The PE further comprises a router that performs action 747, as illustrated by Router of PE 742.

In some embodiments, flow for generating and transmitting backpressure information begins (Start 743) by determining which input queues of the CE are storing more wavelets than a per-queue threshold (Determine Input Q(s) Over Threshold 744). In some embodiments, the per-queue threshold is predetermined. In various embodiments, the threshold for an input queue is two less than the maximum capacity of the input queue (e.g., an input queue enabled to store six wavelets has a threshold of four). In some other embodiments, the threshold for an input queue is one less than the maximum capacity. The determining occurs every period, e.g., every core clock cycle, and considers wavelets received and stored in the input queues and wavelets consumed and removed from the input queues in the period. Colors associated with each input queue and are determined by the CE (Determine Colors Associated with Input Q(s) 745). In some embodiments, an input queue is associated with multiple colors, and in other embodiments an input queue is associated with a single color. Based on whether the associated input queue is over/under the threshold, a stall/ready state is determined by the CE for each of the colors and provided as signals by the CE to the router (Provide Stall/Ready to Router 746).

In various embodiments, a ready state for a color indicates that the associated input queue has sufficient capacity to receive a number of wavelets (e.g., one or two) and the stall state indicates that the associated input queue does not have sufficient capacity to receive the number of wavelets. Based upon the provided stall/ready states, Router of PE 742 conditionally provides a wavelet to the CE (Provide Wavelet to CE in Accordance with Stall/Ready 747) and flow concludes (End 748). In some embodiments and/or usage scenarios, the router provides a wavelet for a color in the ready state and does not provide a wavelet for a color in the stall state.

Figure 8:
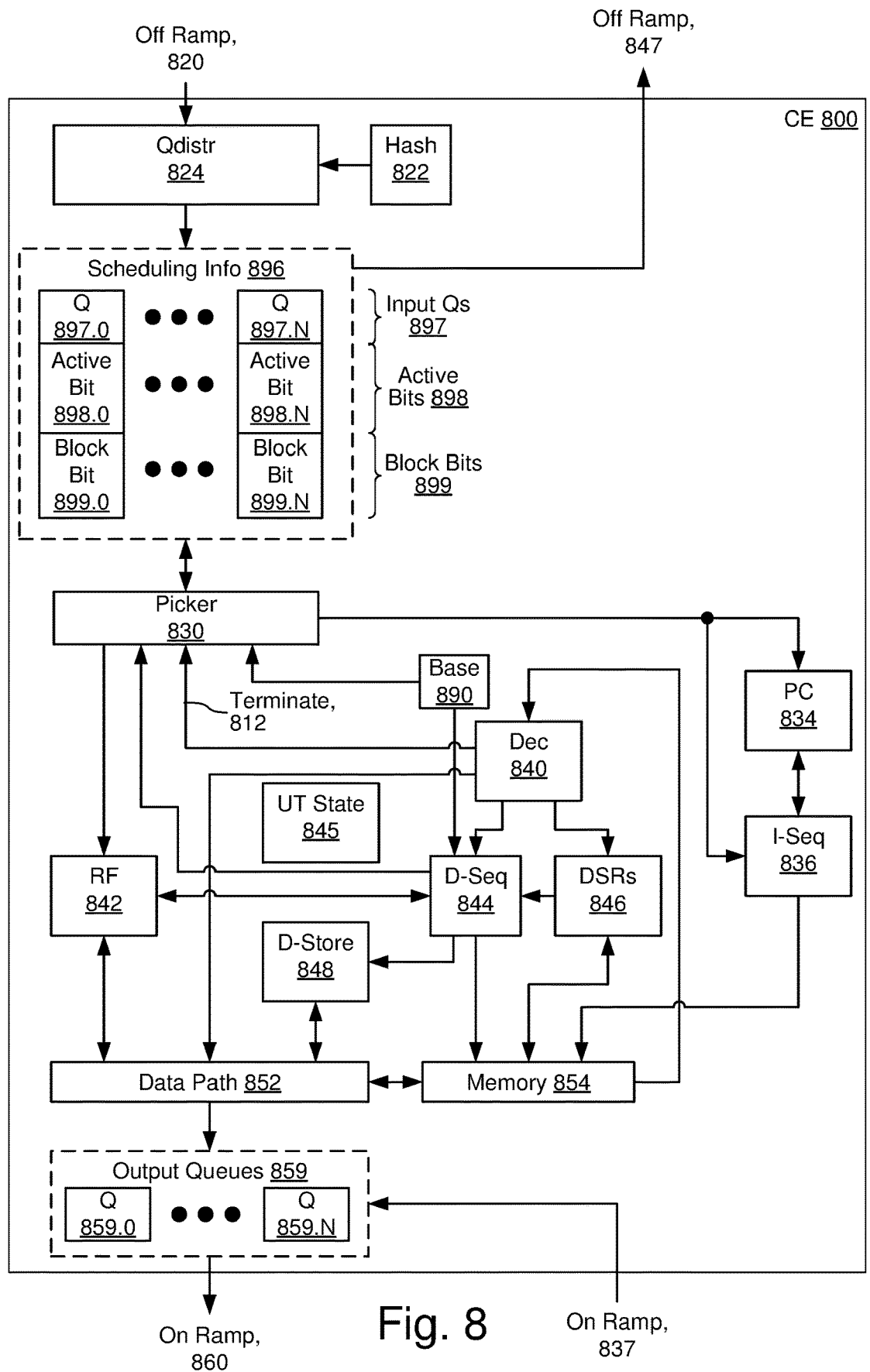
FIG. 8 illustrates selected details of an embodiment of a compute element of a processing element.

In various embodiments and/or usage scenarios, actions of flow 740 are conceptually related to a CE, e.g., CE 800 of FIG. 8 and a router, e.g., Router 600 of FIG. 6. In some embodiments, the input queues correspond to Input Qs 897. In various embodiments, the colors associated with each input queue are determined by computing the inverse of Hash 822. In some embodiments, the group of stall/ready signals is provided to the router via Off Ramp 647. In some embodiments and/or usage scenarios, one or more of: any portion or all of FIG. 9A, any portion or all of FIG. 16, and portions of FIG. 23 (e.g., Read (Next) Source Data Element(s) from Queue/Memory 2310) correspond to portions of consuming a wavelet from an input queue. In various embodiments, portions of FIG. 16 (e.g., Write Wavelet to Picker Queue 1507) correspond to receiving and storing a wavelet in an input queue.

Figure 7C:
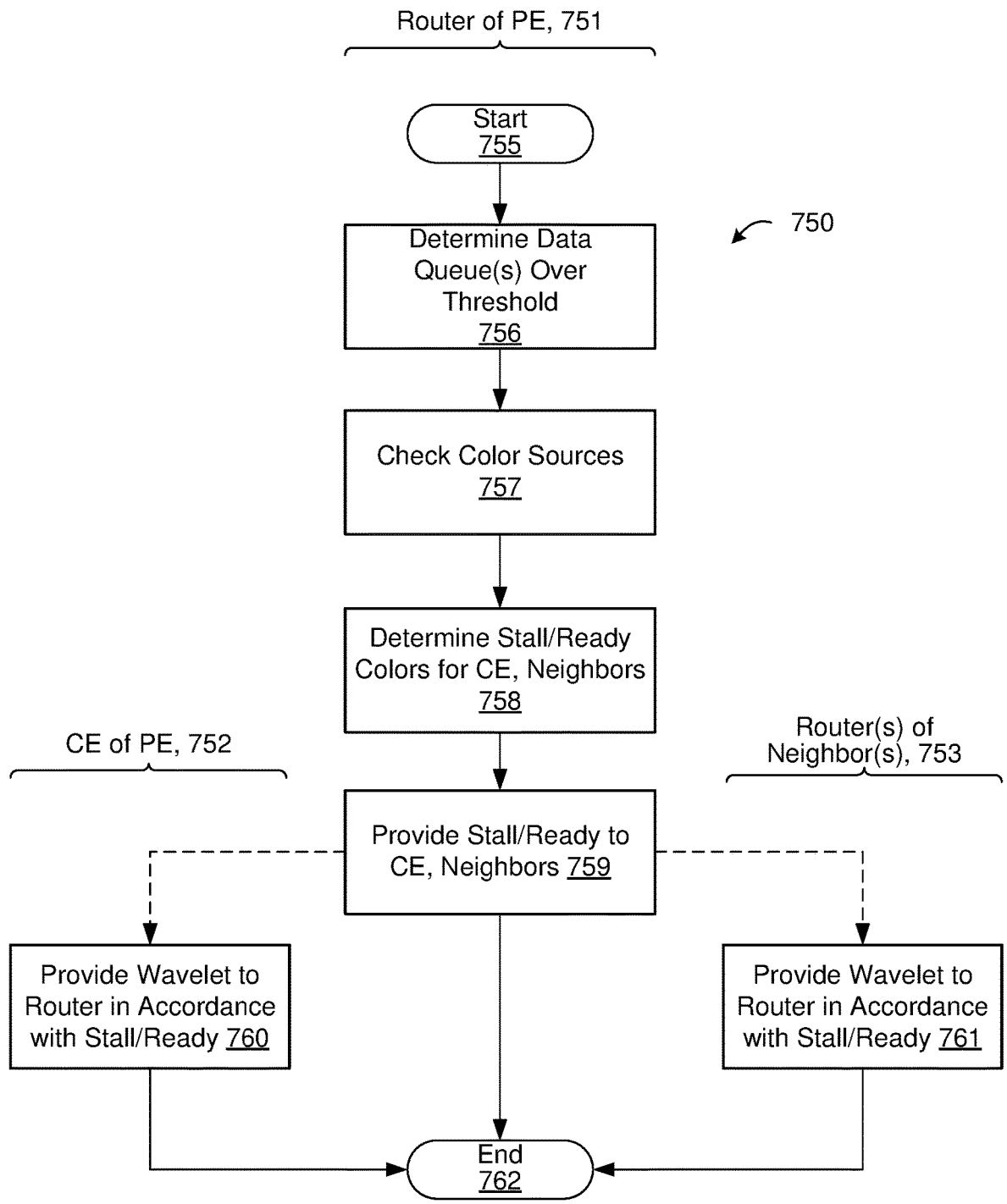
FIG. 7C illustrates selected details of an embodiment of generating and providing backpressure information associated with a router of a processing element.

FIG. 7C illustrates selected details of an embodiment of generating and providing backpressure information associated with a router of a processing element, as flow 750. Actions of flow 750 are performed by various agents. A router of a PE performs actions 756-759, as illustrated by Router of PE 751. The PE further comprises a CE that performs action 760, as illustrated by CE of PE 752. One or more routers of neighboring PEs perform actions 761 as illustrated by Router(s) of Neighbor(s) 753.

In some embodiments, flow for generating and providing backpressure information begins (Start 755) by the router of the PE determining which data queues of the router are storing more wavelets than a threshold (Determine Data Queue(s) Over Threshold 756). In some embodiments, the threshold is predetermined. In various embodiments, the threshold for a data queue is one less than the maximum capacity of the queue (e.g., a queue enabled to store two wavelets has a threshold of one). The determining occurs every period, e.g., every core clock cycle, and considers wavelets received and stored in the data queues and wavelets that are transmitted and removed from the data queues in the period. The router determines sources of wavelets for each color (Check Color Sources 757). Based on whether the data queues are over/under the threshold and the sources of wavelets, for each router output (e.g., the local CE and neighbor PEs), the router determines which colors are in a stall/ready state (Determine Stall/Ready Colors for CE, Neighbors 758).

In various embodiments, a ready state for a color indicates that the associated data queue for the color has sufficient capacity to receive a number of wavelets (e.g., one or two) and the stall state indicates that the associated data queue does not have sufficient capacity to receive the number of wavelets. For each output, the stall/ready state for the colors are provided as a group by asserting stall/ready signals to CE of PE 752 and to Router(s) of Neighbor(s) 753 (Provide Stall/Ready to CE, Neighbors 759). In some embodiments and/or usage scenarios, backpressure information provided to CE of PE 752 and each router of Router(s) of Neighbor(s) 753 is identical. Based upon the provided stall/ready states, CE of PE 752 conditionally provides a wavelet to Router of PE 751 (Provide Wavelet to Router in Accordance with Stall/Ready 760), Router(s) of Neighbor(s) 753 conditionally provide wavelet(s) to Router of PE 751 (Provide Wavelet to Router in Accordance with Stall/Ready 761), and flow concludes (End 762). In some embodiments and/or usage scenarios, the CE and neighbor routers provide a wavelet for a color in the ready state and do not provide a wavelet for a color in the stall state.

In various embodiments and/or usage scenarios, actions of flow 750 are conceptually related to a CE, e.g., CE 800 of FIG. 8 and a router, e.g., Router 600 of FIG. 6. In some embodiments, the router receives stall/ready colors via Stall In 640 (e.g., from a local CE via Off Ramp 647 and from neighbor PEs via 641-646). In various embodiments, each color and associated source(s) are stored in Src 670, which indicates direction(s) to provide stall/ready signals to for each respective color. For example, the entry for color seven in Src 670 indicates that the sources include the local CE (On Ramp 617) and X+ 613; thus, stall/ready state for color seven is provided to the local CE and X+. In some embodiments, a group of stall/ready signals is transmitted from the router to the CE via On Ramp 637. In various embodiments, a group of stall/ready signals is provided from the router to the routers of neighbor PEs via 631-636 of Stall Out 630.

Figure 7D:
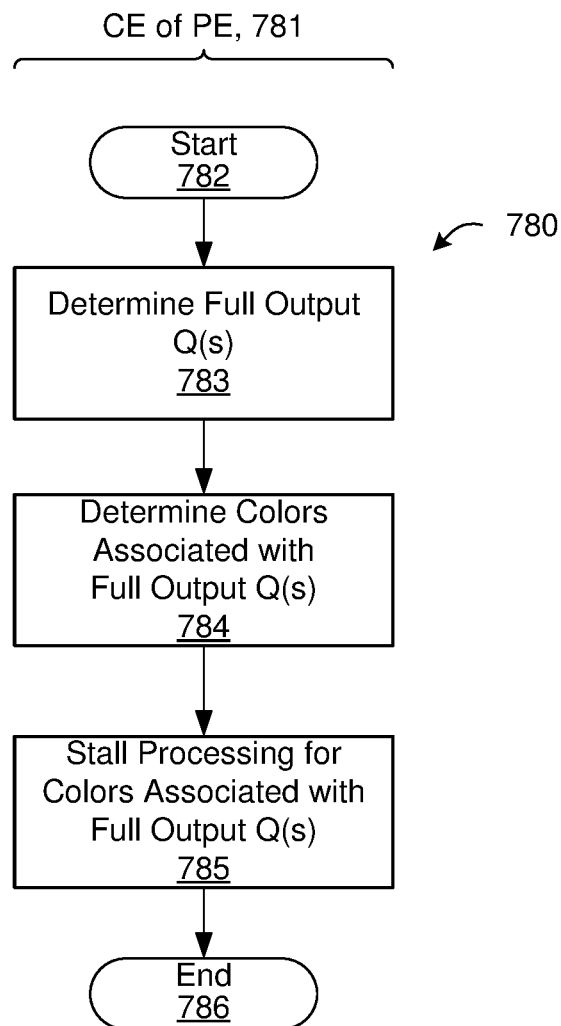
FIG. 7D illustrates selected details of an embodiment of stalling processing associated with a compute element of a processing element.

FIG. 7D illustrates selected details of an embodiment of stalling processing associated with a compute element of a processing element, as flow 780. Actions of flow 780 are performed by a CE of a PE, as illustrated by CE of PE 781.

In some embodiments, flow for stalling processing begins (Start 782) by the CE determining whether any output queues are storing a per-queue maximum capacity of wavelets (Determine Full Output Q(s) 783). In some embodiments, the per-queue maximum capacity is predetermined. The determining occurs every period, e.g., every core clock cycle, and considers wavelets that are created and stored in the output queues and wavelets that are transmitted to the router and removed from the output queues in the period. In response to determining an output queue is storing the maximum capacity of wavelets, the CE determines the colors associated with the output queue (Determine Colors Associated with Full Output Q(s) 784) and stalls processing for those colors (Stall Processing for Colors Associated with Full Output Q(s) 785), concluding flow (End 786).

In various embodiments and/or usage scenarios, actions of flow 780 are conceptually related to a CE, e.g., CE 800 of FIG. 8. In some embodiments, the output queues correspond to Output Queues 859. In various embodiments and usage scenarios, wavelets are stored in output queues in response to receiving a stall from the router on the color associated with the wavelet. In some embodiments and usage scenarios, each of Output Queues 859 is associated with one or more colors and the association is tracked in a portion of Output Queues 859. In other embodiments, each of Output Queues 859 is associated with a single color. In some embodiments and usage scenarios, the CE stalls processing associated with colors associated with output queues storing the maximum capacity of wavelets. In some embodiments, action 785 is performed at least in part by Picker 830. In various embodiments, processing is enabled for any colors associated with output queues storing less than the maximum capacity of wavelets.

FIG. 8 illustrates selected details of an embodiment of a compute element of a processing element, as CE 800.

In various embodiments, CE 800 is coupled to Router 600 of FIG. 6. For example, Off Ramp 820, On Ramp 860, Off Ramp 847, and On Ramp 837 are coupled respectively to Off Ramp 627, On Ramp 617, On Ramp 647, and On Ramp 637. CE 800 comprises Qdistr 824 coupled to receive wavelets via Off Ramp 820. Qdistr 824 is coupled to transmit wavelets to Scheduling Info 896. Scheduling Info 896 comprises Input Qs 897, Active Bits 898, and Block Bits 899. Scheduling Info 896 is coupled to Off Ramp 847 to send stall information (e.g., stall/ready signals for each color) to a router.

In various embodiments, Input Qs 897 comprises a virtual queue for each fabric color and each local color. The virtual queues for each fabric color are usable, e.g., to hold wavelets created by other processing elements and associated with the respective color. The virtual queues for each local color are usable, e.g., to hold wavelets created by CE 800 and associated with the respective color. In various embodiments, the virtual queues are implemented by one or more physical input queues. In some other embodiments, Input Qs 897 comprises a physical queue for each fabric color and each local color. Each one of Input Qs 897 (e.g., Input Q0 897.0) is associated with a respective one of Active Bit 898 (e.g., Active Bit 0 898.0) and Block Bits 899 (e.g., Block Bit 0 899.0). Each one of Active Bits 898 and each one of Block Bits 899 contain information about the respective one of Input Qs 897, e.g., Block Bit N 899.N indicates whether Input QN 897.N is blocked.

In various embodiments, there is variously a physical Q for each color, one or more physical Qs for a predetermined subset of colors, and one or more physical Qs for a dynamically determined subset of colors. In various embodiments, there is variously one or more physical Qs of a same size (e.g., each enabled to hold a same number of wavelets) and one or more physical Qs of differing sizes (e.g., each enabled to hold a different number of wavelets). In various embodiments, there are one or more physical Qs that are variously mapped to virtual Qs, each of the virtual Qs being associated with one or more colors. For example, there are N logical Qs and less than N physical Qs. For another example, some of Input Qs 897 are enabled to hold eight wavelets and others of Input Qs 897 are enabled to hold three wavelets. In some embodiments, traffic for one or more colors associated with a particular one of Input Qs 897 is estimated and/or measured, and the particular one of Input Qs 897 is enabled to hold a particular number of wavelets based on the traffic. In some embodiments, one or more of the physical Qs are implemented by one or more of: registers and SRAM.

Hash 822 is coupled to Qdistr 824 and selects a physical queue to store a wavelet, based at least in part on the color of the wavelet (e.g., by applying a hash function to the color). In some embodiments, the color associated with a wavelet payload is stored explicitly with the wavelet payload in a queue, such that an entry in the queue holds an entire wavelet (payload with color). In some embodiments, the color associated with a wavelet payload is not stored explicitly with the wavelet payload in a queue, such that an entry in the queue stores a wavelet payload without storing an associated color. The color of the wavelet payload is inferred, such as from the specific queue the wavelet payload is stored in.

In some embodiments, one or more of Active Bits 898 and Block Bits 899 are implemented as respective bit vectors with N entries, one entry for each color. In various embodiments, one or more of Active Bits 898 and Block Bits 899 are implemented as respective bit fields in a table comprising one entry for each color.

Picker 830 is coupled to Scheduling Info 896, RF 842, Dec 840, Base 890, PC 834, I-Seq 836, and D-Seq 844. RF, Dec, Base, PC, I-Seq, and D-Seq are respectively shorthand for Register File, Decoder, Base Register, Program Counter, Instruction Sequencer, and Data Sequencer. Picker 830 is enabled to select a wavelet for processing from one of Input Qs 897. In some embodiments, Picker 830 selects a wavelet by selecting one of Input Qs 897, and selecting the oldest wavelet in the selected queue. In some scenarios, Picker 830 selects a new wavelet for processing when Dec 840 signals that a terminate instruction has been decoded. In some other scenarios (e.g., an instruction accessing fabric input), Picker 830 selects a new wavelet for processing from one of Input Qs 897 in response to a queue identifier received from D-Seq 844.

Picker 830 receives the selected wavelet from one of Input Qs 897 and is enabled to selectively and/or optionally send one or more of data and index from the selected wavelet to RF 842. In some embodiments, Input Qs 897 is coupled to Data Path 852, and the Data Path is enabled to receive data directly from one of the Qs. Picker 830 is enabled to read a base address from Base 890 and calculate an instruction address to send to PC 834 and I-Seq 836. Base 890 stores a base address and is also coupled to D-Seq 844. PC 834 stores the address of the next instruction to fetch. In various embodiments, Base 890 and PC 834 are implemented as registers. In some embodiments, D-Seq 844 is enabled to read a base address from Base 890 and request data at one or more addresses from Memory 854 and D-Store 848, based at least in part upon the value read from Base 890.

Picker 830 is further enabled to select an activated color (as indicated by assertion of a corresponding one of Active Bits 898) for processing instead of selecting a wavelet for processing. A task corresponding to the selected color is initiated. In some embodiments and/or usage scenarios, unlike selection of a wavelet for processing, no information is provided to RF 842, and thus data communicated to the initiated task is via, e.g., global registers and/or memory.

I-Seq 836 is coupled to PC 834 and is enabled to read and modify PC 834 (e.g., increment for a sequential instruction or non-sequentially for a branch instruction). I-Seq 836 is also coupled to Memory 854 and is enabled to provide an instruction fetch address to Memory 854 (e.g., based upon PC 834).

Memory 854 is further coupled to Dec 840, Data Path 852, and D-Seq 844. In response to an instruction fetch address from I-Seq 836, Memory 854 is enabled to provide instructions located at the instruction fetch address to Dec 840 (an instruction decoder). In various embodiments, Memory 854 is enabled to provide up to three instructions in response to each instruction fetch address. In some embodiments, an instruction is formatted in accordance with one or more of FIGS. 25A, 25B, and 25C.

In various embodiments and/or usage scenarios, instructions are distributed to PEs, e.g., under control of software (such as Connection Server(s) SW 220, Misc SW on FPGAs 250, and/or Task SW on PEs 260 of FIG. 2). In various embodiments and/or usage scenarios, a PE operating as a master PE (e.g., any PE of PEs 122) distributes instructions and/or any portions of configuration information to one or more slave PEs (e.g., any PE of PEs 122, including the master PE) via the fabric. In some embodiments, the distribution is via wavelets on one or more predetermined colors (e.g. color zero) and/or in accordance with a predetermined fixed routing pattern. In some other embodiments, the distribution is via wavelets on one or more selected colors (e.g., selected by a program). In various embodiments, the wavelets are received by one or more PEs operating as slave PEs and written to respective instances of Memory 854 for subsequent fetch and execution.

Dec 840 is enabled to determine one or more characteristics of instructions, according to various embodiments and/or usage scenarios. For example, Dec 840 is enabled to parse instructions into an opcode (e.g., Opcode 2512 of FIG. 25A) and zero or more operands (e.g., source and/or destination operands). For another example, Dec 840 is enabled to identify an instruction according to instruction type (e.g., a branch instruction, or a multiply-accumulate instruction, and so forth). For yet another example, Dec 840 is enabled to determine that an instruction is a specific instruction and activates one or more signals accordingly.

Dec 840 is coupled to Picker 830 via Terminate 812 and is enabled to signal that one of the decoded instructions is a terminate instruction that ends a task (e.g., the terminate instruction is the last instruction of the instructions executed in response to a task initiated in response to the selected wavelet).

In some scenarios, Dec 840 is enabled to decode a branch instruction. Examples of branch instructions include: conditional branch instructions that conditionally modify PC 834 and jump instructions that unconditionally modify PC 834. A branch instruction is executed by I-Seq 836 and optionally and/or conditionally modifies PC 834. In some scenarios, a branch instruction implements software control flow (e.g., a loop) by conditionally modifying PC 834.

In response to decoding an instruction (e.g., a multiply-accumulate instruction), Dec 840 is enabled to transmit an opcode to Data Path 852. Dec 840 is coupled to DSRs 846 and enabled to transmit one or more operand identifiers to DSRs 846. Dec 840 is also coupled to D-Seq 844 and enabled to transmit one or more operand type identifiers to D-Seq 844.

DSRs 846 comprise registers that hold Data Structure Descriptors (DSDs) and is coupled to and enabled to send one or more DSDs to D-Seq 844. In some embodiments, DSRs comprise source DSRs, destination DSRs, extended DSRs, and stride registers. In response to receiving an operand identifier from Dec 840, DSRs 846 is enabled to read the DSD specified by the operand identifier, and to transmit the DSD to D-Seq 844. In various embodiments, DSRs 846 is enabled to receive up to two source operand identifiers and one destination operand identifier, read two source DSRs and one destination DSR, and transmit two source DSDs and one destination DSD to D-Seq 844. In some embodiments, the CE is enabled to explicitly write a DSD to DSRs from memory in response to load DSR instructions and the CE is enabled to explicitly write a DSD to memory from DSRs in response to store DSR instructions. In some embodiments, DSRs 846 is coupled to and enabled to receive data from and transmit data to Memory 854.

In some embodiments, DSRs 846 comprise three sets of DSRs: 12 DSRs for source0 operands (sometimes referred to as S0DSRs), 12 DSRs for source1 operands (sometimes referred to as S1DSRs), and 12 DSRs for destination operands (sometimes referred to as DDSRs). In addition, DSRs 846 also comprises six extended DSRs (sometimes referred to as XDSRs) and six stride registers. In some embodiments, DSRs comprise 48 bits, XDSRs comprise 51 bits, and stride registers comprise 15 bits. In various embodiments, respective instructions load 48 bits of data from memory (e.g., D-Store 848 or Memory 854) into respective DSRs (e.g., LDS0WDS, LDS1WDS, and LDDWDS instructions respectively load source0, source1, and destination DSRs). In various embodiments, respective instructions store 48 bits of data from respective DSRs to memory (e.g., STS0WDS, STS1WDS, and STDWDS instructions respectively store source0, source1, and destination DSRs to memory). In some embodiments, instructions (e.g., LDXDS) load data from memory into XDSRs and other instructions (e.g., STXDS) store data from XDSRs to memory. Instructions that move data between memory and XDSRs (e.g., LDXDS and STXDS) access 64 bits of memory, and only use the lower 51 bits. In some embodiments, instructions (e.g., LDSR) load data from memory into stride registers, and other instructions (e.g., STSR) store data from stride registers to memory. In some embodiments, instructions that move data between memory and stride registers access 16 bits of memory, and only use the lower 15 bits.

D-Seq 844 is also coupled to D-Store 848, RF 842, and Picker 830, and is enabled to initiate accessing vector data at various sources in response to DSDs received from DSRs 846. In some scenarios (e.g., in response to receiving a DSD describing one of a 1D memory vector, 4D memory vector, and circular memory buffer), D-Seq 844 is enabled to calculate a sequence of memory addresses to access (e.g., in Memory 854 and/or D-Store 848). In some other scenarios, (e.g., in response to receiving a DSD describing a fabric input), D-Seq 844 is enabled to initiate reading fabric data from one of Input Qs 897 via Picker 830. In yet other scenarios, (e.g., in response to receiving a DSD describing a fabric output), D-Seq 844 is enabled to initiate transforming data into wavelet(s) and transmitting wavelet(s) to a fabric coupling via Output Queues 859 and On Ramp 860. In some embodiments, D-Seq 844 is enabled to simultaneously access vector data at three sources (e.g., read vector data from memory, read vector data from a fabric input, and write vector data to a fabric output).

In some embodiments, D-Seq 844 is enabled to access data in one or more registers in RF 842 (e.g., an instruction with one or more input operands and/or one output operand). In some scenarios, D-Seq 844 is enabled to request operands from registers in RF 842. In yet other scenarios, D-Seq 844 is enabled to request data from a register (e.g., an index) in RF 842 as an input for calculating a sequence of memory addresses to access in accordance with a DSD.

In various embodiments, all or any portions of state of PE 800 is mapped in an address space, comprising software visible state (e.g., any combination of D-Store 848, Memory 854, RF 842, DSRs 846, Output Queues 859, and Input Qs 897, Block Bits 899) and state that is not software accessible (e.g., UT State 845). In various embodiments, the address space and/or portions of the address space are implemented by one or more of registers and SRAM. In some embodiments, the address spaces of multiple PEs implemented on a single ASIC are mapped to a single address space. In some embodiments, each respective PE (e.g., of multiple PEs implemented on a single ASIC or portion thereof) has a respective private address space. In some embodiments having private address spaces, one PE is unable to directly access elements in the address spaces of other PEs.

Data Path 852 is coupled to RF 842 and D-Store 848. In various embodiments, any one or more of Memory 854, RF 842, Input Qs 897, and D-Store 848 are enabled to provide data to Data Path 852 (e.g., in response to a request from D-Seq 844) and to receive data from Data Path 852 (e.g., results of operations). Data Path 852 comprises execution resources (e.g., ALUs) enabled to perform operations (e.g., specified by an opcode decoded and/or provided by Dec 840, according to embodiment). In some embodiments, RF 842 comprises sixteen general-purpose registers sometimes referred to as GPR0-GPR15. Each of the GPRs is 16 bits wide and is enabled to store integer or floating-point data.

Data Path 852 is also coupled via Output Queues 859 and On Ramp 860 to the router and enabled to send data via Output Queues 859 and On Ramp 860 to the router. In various embodiments, Output Queues 859 comprises a virtual queue for each fabric color (e.g., to hold information for wavelets created by Data Path 852 and associated with the respective color), e.g., Q 859.0, . . . , and Q 859.N. In various embodiments, a first portion of Output Queues 859 are statically or dynamically enabled to hold six wavelets, a second portion of Output Queues 859 are statically or dynamically enabled to hold two wavelets, and a third portion of Output Queues 859 are statically or dynamically enabled to hold zero wavelets.

In some embodiments, Data Path 852 is enabled to write one or more wavelets into one of Output Queues 859 based upon the fabric color associated with the one or more wavelets and the mapping of fabric colors to Output Queues 859. Output Queues 859 is enabled to transmit wavelets via On Ramp 860 to the router (e.g., Router 600 of FIG. 6). In some embodiments and/or usage scenarios, Output Queues 859 buffers wavelets that are not deliverable to the router (e.g., due to backpressure or contention). In some embodiments and/or usage scenarios, when one of Output Queues 859 is full, processing that writes fabric packets to the one of Output Queues 859 is stalled (e.g., by Picker 830). In some embodiments and/or usage models, Output Queues 859 is coupled to a router via On Ramp 837 and enabled to receive backpressure information from the router. In various embodiments, the backpressure information comprises stall/ready signals for each color, and in response to the backpressure information, wavelets corresponding to stalled colors are not sent to the router.

UT State 845 is coupled to Picker 830, Dec 840, D-Seq 844, DSRs 846, Scheduling Info 896, and Output Queues 859 (the foregoing couplings are omitted from the figure for clarity). In various embodiments and/or usage scenarios, UT State 845 is used to store and provide information about one or more microthreaded instructions. An example of a microthreaded instruction is an instruction enabling microthreading, e.g., via at least one fabric vector operand with a corresponding UE field indicating microthreading is enabled. In some embodiments, UT State 845 comprises a data structure of one or more (e.g., eight) entries (e.g., implemented by storage such as SRAM) and enabled to store and provide information about respective one or more microthreaded instructions (such as any combination of: the microthreaded instruction itself, an opcode of the microthreaded instruction, one or more operands of the microthreaded instruction, and one or more DSDs associated with operands of the microthreaded instruction). In various embodiments, each respective entry of UT State 845 is associated with one or more of a respective one of Input Qs 897 and Output Queues 859 (e.g., entry 0 is associated with Q 897.0 and Q 859.0). In some embodiments, the mapping from entries of UT State 845 to ones of Input Qs 897 and Output Queues 859 is static and predetermined. UT State 845 is enabled to communicate microthreaded instruction information (such as the microthreaded instruction itself) with Dec 840 and communicate portions of a DSD with one or more of D-Seq 844 and DSRs 846. In some embodiments, information about a microthreaded instruction is stored in the entry of UT State 845 determined by a microthread identifier from the associated DSD (e.g., UTID 2102 or UTID 2122). In various embodiments, information about a microthreaded instruction with a fabric destination operand is stored in an entry determined by UTID 2122. Information about a microthreaded instruction without a fabric destination is stored in an entry determined by UTID 2102 of the src0 operand and an entry determined by UTID 2102 of the src1 operand when there is no src0 operand from the fabric.

In various embodiments and usage scenarios, UT State 845 is enabled to receive and/or monitor stall information with any one or more of D-Seq 844, DSRs 846, Scheduling Info 896, and Output Queues 859. In some embodiments, UT State 845 is enabled to communicate to Picker 830 that one or more microthreaded instructions are ready for execution, and Picker 830 is enabled to schedule a microthreaded instruction for execution. In various embodiments and/or usage scenarios, when a microthreaded instruction from UT State 845 executes, UT State 845 is enabled to communicate instruction information (e.g., the operation and/or one or more operands) to one or more of: Dec 840, D-Seq 844, and Data Path 852.

In some embodiments, D-Store 848 is a type of memory that is smaller and more efficient (e.g., lower joules per bit of data read) than Memory 854. In some embodiments, D-Store 848 is a type of memory of relatively lower capacity (e.g., retaining less information) and relatively lower access latency and/or relatively higher throughput than Memory 854. In some scenarios, more frequently used data is stored in D-Store 848, while less frequently used data is stored in Memory 854. In some embodiments, D-Store 848 comprises a first address range and Memory 854 comprises a second, non-overlapping address range. In some embodiments and/or usage scenarios, Memory 854 is considered a first memory enabled to store instructions and any combination of D-Store 848 and RF 842 is considered a second memory enabled to store data.

In some embodiments and/or usage scenarios, there is a one to one correspondence between virtual queues (e.g., Input Qs 897 and Output Queues 859) and physical queues (e.g., storage implemented via SRAM), e.g., there is a physical queue for each virtual queue. In some of the one to one embodiments, respective sizes of one or more of the virtual queues are dynamically managed to vary over time, such as being zero at one time and being a maximum size in accordance with the physical queues at another point in time. In various embodiments and/or usage scenarios, there is a many to one correspondence between virtual queues and physical queues, e.g., a single physical queue implements a plurality of virtual queues. In various embodiments, there is variously a physical Q for each color, one or more physical Qs for a predetermined subset of colors, and one or more physical Qs for a dynamically determined subset of colors. In various embodiments, there is variously one or more physical Qs of a same size (e.g., each enabled to hold a same number of wavelets) and one or more physical Qs of differing sizes (e.g., each enabled to hold a different number of wavelets). In various embodiments, there are one or more physical Qs that are variously mapped to virtual Qs, each of the virtual Qs being associated with one or more colors. For example, there are more virtual Qs than physical Qs. For another example, a first portion of the virtual queues are statically or dynamically enabled to hold six wavelets, a second portion of the virtual queues are statically or dynamically enabled to hold two wavelets, and a third portion of the virtual queues are statically or dynamically enabled to hold zero wavelets. In some embodiments, one or more of the physical Qs are implemented by one or more of: registers and SRAM.

In various embodiments, CE 800 is enabled to process instructions in accordance with a five-stage pipeline. In some embodiments, in a first stage the CE is enabled to perform instruction sequencing, e.g., one or more of: receiving a wavelet (e.g., in Input Qs 897), selecting a wavelet for execution (e.g., by Picker 830), and accessing (e.g., by I-Seq 836) an instruction corresponding to the wavelet. In a second stage, the CE is enabled to decode (e.g., by Dec 840) the instruction, read any DSR(s) (e.g., from DSRs 846), and compute addresses of operands (e.g., by D-Seq 844 in accordance with a DSD). In a third stage, the CE is enabled to read data from any one or more memories (e.g., Memory 854, RF 842, D-Store 848, Input Qs 897). In a fourth stage, the CE is enabled to perform an operation specified by the instruction (e.g., in Data Path 852) and write results to a register file (e.g., RF 842). In a fifth stage, the CE is enabled to write results to any one or more memories, e.g., Memory 854, DSRs 846, D-Store 848. In various embodiments, in one of the stages the CE is enabled to optionally and/or conditionally provide results to Output Queues 859, and asynchronously provide wavelets to a router.

In some embodiments and/or usage scenarios, elements of the figure correspond to an implementation of Compute Element 520 of FIG. 5. For example, Off Ramp 820 and Off Ramp 847 in combination correspond to Off Ramp 521, and On Ramp 860 and On Ramp 837 in combination correspond to On Ramp 522.

The partitioning and coupling illustrated in FIG. 8 are illustrative only, as other embodiments are contemplated with different partitioning and/or coupling. For example, in other embodiments, RF 842 and DSRs 846 are combined into one module. In yet other embodiments, DSRs 846 and Data Path 852 are coupled. In some embodiments and/or usage scenarios, elements of Scheduling Info 896 are organized, managed, and/or implemented by color, e.g., a respective data structure and/or physical element or partition thereof is dedicated to color zero, another to color one, and so forth.

Task Initiation

Figure 9A:
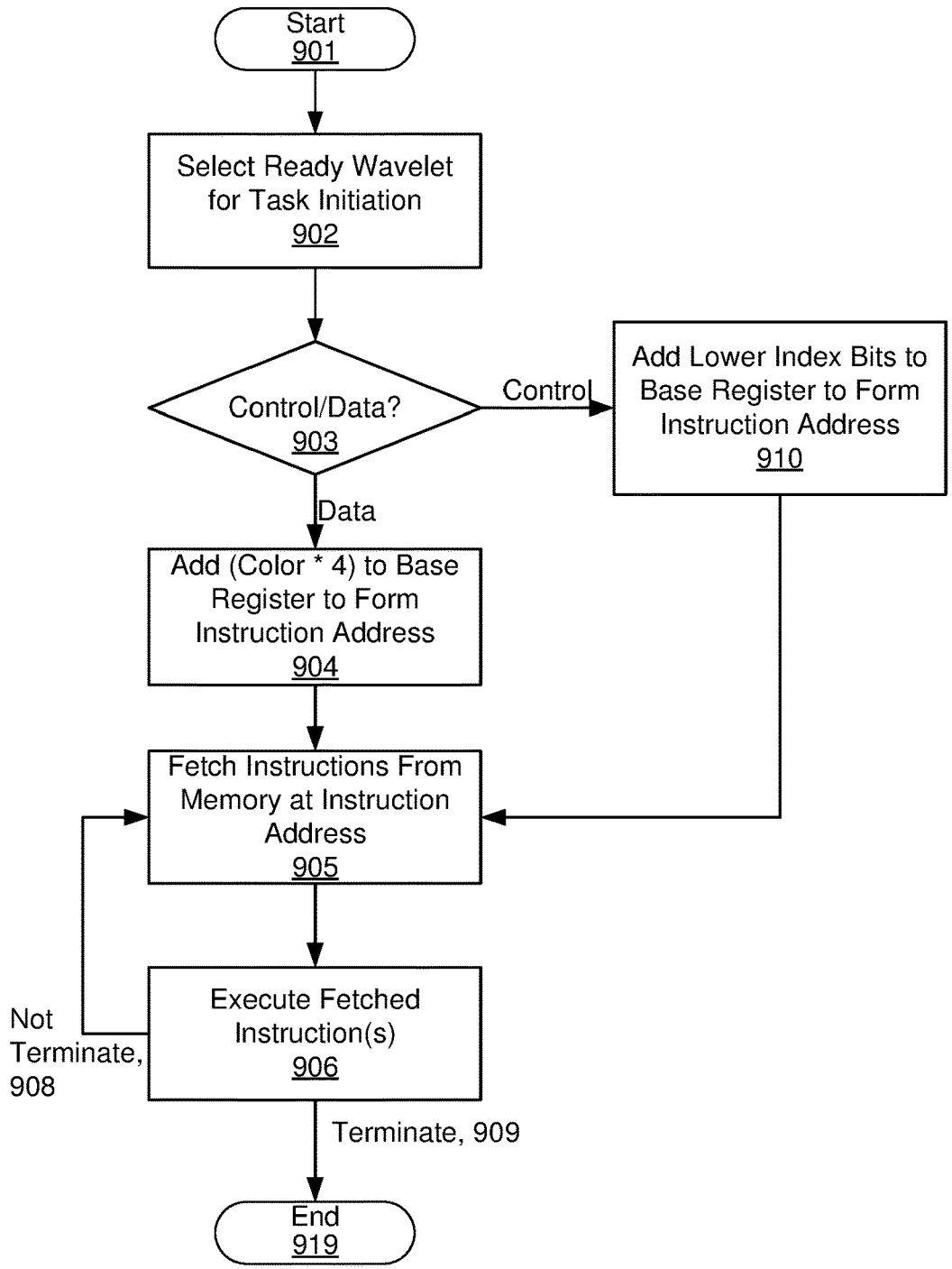
FIG. 9A illustrates selected details of an embodiment of processing a wavelet for task initiation.

FIG. 9A illustrates selected details of an embodiment of processing a wavelet for task initiation as flow 900. Conceptually, the processing comprises initiating a task by determining an address to begin fetching and executing instructions of the task. The address is determined based at least in part on information the wavelet comprises.

In some embodiments, processing a wavelet for task initiation begins (Start 901) by selecting a ready wavelet from among, e.g., one or more queues for processing (Select Ready Wavelet for Task Initiation 902). In some embodiments, the wavelet is selected based upon one or more of: block/unblock state associated with each queue, active/inactive state associated with each queue, color(s) of previously selected wavelets, and a scheduling algorithm.

After selecting the ready wavelet, the wavelet is checked to determine if the wavelet is a control wavelet or a data wavelet (Control/Data? 903). If the wavelet is a control wavelet (aka closeout wavelet), then a starting address of a task associated with the control wavelet is calculated by adding the lower six bits of the index of the wavelet to a base register (Add Lower Index Bits to Base Register to Form Instruction Address 910). If the wavelet is not a control wavelet, then the wavelet is a data wavelet. The starting address of a task associated with the data wavelet is calculated by adding the base register to the color of the wavelet multiplied by four (Add (Color*4) to Base Register to Form Instruction Address 904). The starting address of the task, either as calculated for a control wavelet or as calculated for a data wavelet, corresponds to a starting address of instructions for the task.

Once the starting address of the instructions has been calculated, the instructions are fetched from the starting instruction address (Fetch Instructions From Memory at Instruction Address 905). One or more of the fetched instructions are decoded and executed (Execute Fetched Instruction(s) 906). Fetching and executing (as illustrated by actions 905 and 906) continue (Not Terminate 908) until a Terminate instruction is executed (Terminate 909), and then processing associated with the initiated task is complete (End 919). In some embodiments, a terminate instruction is the last instruction associated with processing a wavelet. After the initiated task is complete, flow optionally and/or selectively proceeds to process another wavelet for task initiating, beginning with Start 901.

According to various usage scenarios, the executing (Execute Fetched Instruction(s) 906) comprises executing sequential and/or control-flow instructions, and the instruction address used for fetching varies accordingly (Fetch Instructions From Memory at Instruction Address 905).

The ready wavelet selected for task initiation is comprised of a particular color. In some embodiments and/or usage scenarios, once a ready wavelet has been selected for task initiation (Select Ready Wavelet for Task Initiation 902), further wavelets, if any, received of the particular color are consumed as operands for execution of instructions (Execute Fetched Instruction(s) 906). The consuming of the wavelets comprising the particular color as operands continues until fetching and executing of a terminate instruction (Terminate 909).

In various embodiments and/or usages scenarios, actions of flow 900 are conceptually related to a CE, e.g., CE 800 of FIG. 8. As an example, Block Bits 899 corresponds to block/unblock state associated with each queue. Active Bits 898 corresponds to active/inactive state associated with each queue. In some embodiments, the active bit of an input queue is set to an active state when a wavelet is written into the input queue. As another example, portions of action 902 are performed by Picker 830. Picker 830 selects the oldest wavelet from one of Input Qs 897 that is ready (e.g., the associated one of Block Bits 899 is deasserted and the associated one of Active Bits 898 is asserted), according to a scheduling policy such as round-robin or pick-from-last. In some embodiments and/or usage models, when Picker 830 operates in accordance with the pick-from-last scheduling policy, Picker 830 continues selecting wavelets from a same one of Input Qs 897 that is ready until Picker 830 selects a closeout wavelet. The wavelet selected by Picker 830 comprises a color and a wavelet payload formatted in accordance with one of FIG. 13A and FIG. 13B, e.g., assertion of Control Bit 1320 (FIG. 13A) or assertion of Control Bit 1340 (FIG. 13B) indicates a closeout wavelet.

As another example, action 903 is performed by elements of CE 800. If the control bit of the wavelet payload (e.g., Control Bit 1320 of FIG. 13A) is asserted (determined e.g., by Picker 830), then the wavelet is a control wavelet. Subsequently, action 910 is performed by CE 800, such as by Picker 830 adding contents of Base 890 to the six lowest bits of Lower Index Bits 1321.1 of FIG. 13A to form the instruction fetch address for instructions of the task associated with the control wavelet. Picker 830 then provides the instruction fetch address to PC 834. If the control bit of the wavelet payload (e.g., Control Bit 1320 of FIG. 13A) is deasserted (determined e.g., by Picker 830), then the wavelet is a data wavelet. Subsequently, action 904 is performed by CE 800, such as by Picker 830 adding contents of Base 890 to the color of the wavelet (e.g., corresponding to Color 1324 of FIG. 13A and FIG. 13B) multiplied by 4 to form the instruction fetch address for instructions of the task associated with the data wavelet. Picker 830 then provides the instruction fetch address to PC 834.

As another example, action 905 is performed by elements of CE 800, e.g., PC 834, I-Seq 836, and Memory 854. Action 906 is performed by elements of CE 800, e.g., Dec 840, D-Seq 844, Memory 854, RF 842, and Data Path 852, among others. Execution comprises execution of a terminate instruction. An example of a terminate instruction is an instruction with a terminate bit asserted. In the context of the example, when Dec 840 decodes a terminate instruction, Dec 840 signals Picker 830 via Terminate 812 that the wavelet is finished, and Picker 830 selects another wavelet for processing, corresponding, e.g., to action 902.

In various embodiments and/or usage scenarios, all or any portions of elements of Processing a Wavelet for Task Initiation 900 conceptually correspond to all or any portions of executions of instructions of Task SW on PEs 260 of FIG. 2.

Figure 15:
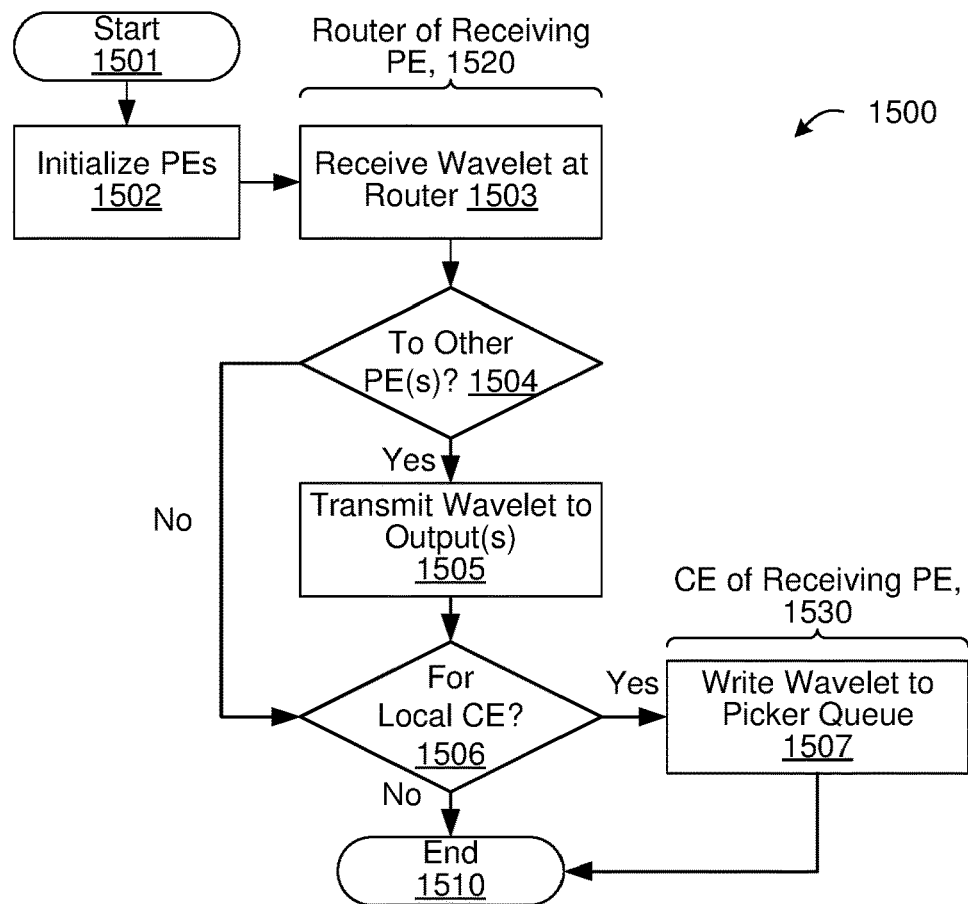
FIG. 15 illustrates selected details of an embodiment of receiving a wavelet.
Figure 16:
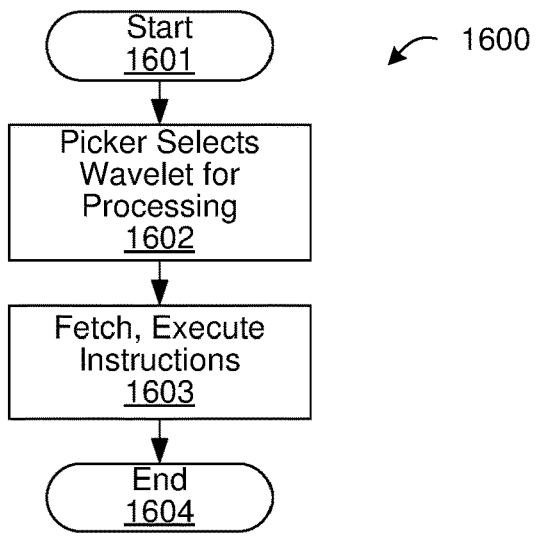
FIG. 16 illustrates selected details of an embodiment of consuming a wavelet.

In various embodiments and/or usage scenarios, all or any portions of the actions comprising flow 900 conceptually variously correspond to all or any portions of flow 1500 of FIG. 15 and/or flow 1600 of FIG. 16. E.g., action 902 comprises all or any portions of action 1602, and actions 903, 904, 910, 905, and 906 comprise all or any portions of action 1603.

Figure 9B:
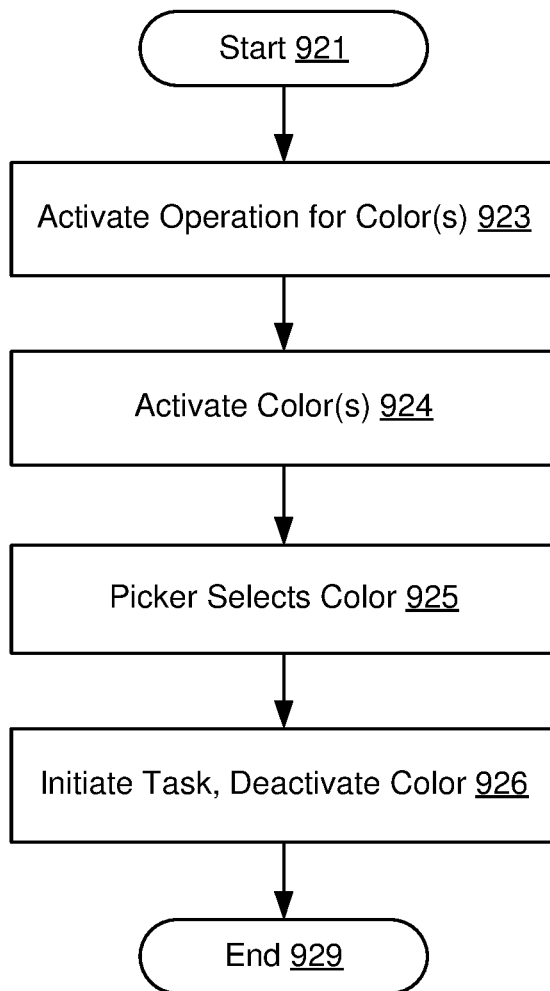
FIG. 9B illustrates selected details of an embodiment of task activating.

FIG. 9B illustrates selected details of an embodiment of task activating as flow 920. Conceptually, the task activating comprises activating on or more colors, resulting in the colors becoming selectable for execution, and then choosing a color (e.g. one of the activated colors) and initiating a task corresponding to the color.

In some embodiments, flow for task activating begins (Start 921) by performing an activate operation for one or more colors (Activate Operation for Color(s) 923). The activate operation is responsive to, e.g., an instruction or one of a set of events. In response to the activate operation, corresponding colors are activated, making them selectable for execution (Activate Color(s) 924). Then a color that is selectable for execution is chosen by the picker (Picker Selects Color 925). The task corresponding to the chosen color is initiated and the chosen color is deactivated (Initiate Task, Deactivate Color 926). Task initiation comprises determining a starting address for the task and fetching and executing instruction beginning at the starting address. Flow is then complete (End 929).

The instruction the activate operation is responsive to comprises an activate instruction. The activate instruction specifies the one or more colors to activate. The colors to activate are variously specified by one or more of an immediate value (e.g. a 6-bit field specifying a single color to activate) in the activate instruction, a register specified by the activate instruction, or other information. In some embodiments and/or usage scenarios, if an activate instruction source is not an immediate, then new task selection is stalled until the activate instruction completes.

In some embodiments and/or usage scenarios, the set of events the activate operation is responsive to comprises completing processing for a fabric vector that enables microthreading. For example, a fabric vector is processed in accordance with a fabric input Data Structure Descriptor (DSD). The fabric input DSD specifies that microthreading is enabled and the fabric input DSD further specifies a color to activate responsive to completing processing of the fabric vector. The color is activated in response to the completing processing of the fabric vector. For another example, a fabric vector is processed in accordance with a fabric output DSD. The fabric output DSD specifies that microthreading is enabled and the fabric output DSD further specifies a color to activate responsive to completing processing of the fabric vector. The color is activated in response to the completing processing of the fabric vector.

In some embodiments and/or usage scenarios, the set of events the activate operation is responsive to further comprises pushing and/or popping an element from a circular buffer in accordance with a circular memory buffer DSD having an associated circular memory buffer eXtended DSD (XDSD). The circular memory buffer XDSD has respective fields to specify colors to activate responsive to pushing an element onto the circular buffer and popping an element off of the circular buffer. The respective color is activated in response to the pushing and/or the popping.

In some embodiments and/or usage scenarios, activating a color comprises setting an indicator corresponding to the color to an activated stated, and making a color inactive comprises setting the indicator to an inactivated state. In some embodiments and/or usage scenarios, the indicator comprises a bit, assertion of the bit indicates the activated state, and deassertion of the bit indicates the inactivated state, and there is a corresponding bit for each color.

In various embodiments and/or usage scenarios, actions illustrated in FIG. 9B are applicable to fabric colors and/or local colors.

In various embodiments and/or usage scenarios, actions of flow 920 are conceptually related to a CE, e.g., CE 800 of FIG. 8. For example, activating/deactivating a color is performed by asserting/deasserting a corresponding one of Active Bits 898. For another example, Picker Selects Color 925 is performed by Picker 830. In various embodiments and/or usage scenarios, all or any portions of the actions comprising flow 920 conceptually variously correspond to all or any portions of flow 900 of FIG. 9A, e.g., action 926 comprises all or any portions of actions 904, 905, and 906 of FIG. 9A.

Fabric Input Data Structure Descriptor 2100 (FIG. 21A) is an example fabric input DSD having a field (UE 2103) to specify enabling microthreading and a field (AC 2105) to specify a color to activate responsive to completing processing of the fabric vector described by the fabric input DSD. Fabric Output Data Structure Descriptor 2120 (FIG. 21B) is an example fabric output DSD having a field (UE 2123) to specify enabling microthreading and a field (AC 2125) to specify a color to activate responsive to completing processing of the fabric vector described by the fabric output DSD. Circular Memory Buffer Data Structure Descriptor 2180 (FIG. 21E) is an example circular memory buffer DSD having an associated circular memory buffer eXtended DSD (XDSD) having respective fields to specify colors to activate responsive to pushing an element onto the circular buffer and popping an element off of the circular buffer. Circular Memory Buffer Extended Data Structure Descriptor 2210 (FIG. 22A) is an example circular memory buffer eXtended DSD (XDSD) having respective fields (Push Color 2215 and Pop Color 2216) to specify colors to activate responsive to pushing an element onto the circular buffer and popping an element off of the circular buffer.

Task Block and Unblock

In various embodiments and/or usage scenarios, the instruction set of CE 800 comprises block and unblock instructions, and instructions enabled to perform an activate operation (e.g., an activate instruction) useful for, inter alia, task synchronization. Task SW on PEs 260 of FIG. 2 is enabled to use the block and unblock instructions, and instructions enabled to perform an activate operation to selectively locally shape various aspects of fabric operation in pursuit of various goals. E.g., Task SW on PEs 260 is enabled to use these instructions to perform one or more of orchestrating computations and/or communications of one or more tasks, dataflow control, manage dependencies and/or priorities within and between tasks, throttle (stall/resume) task activities to indirectly manage the queues to have generally equal average rates of production and consumption, and implement software interlocks to synchronize intermediate data converging from multiple sources and/or paths of diverse latencies (e.g., as might arise in forward and/or backward pass computations near the boundary of a neural network layer, aspects of which are variously illustrated in FIG. 11, FIG. 12 and FIGS. 28A-28E).

Figure 9C:
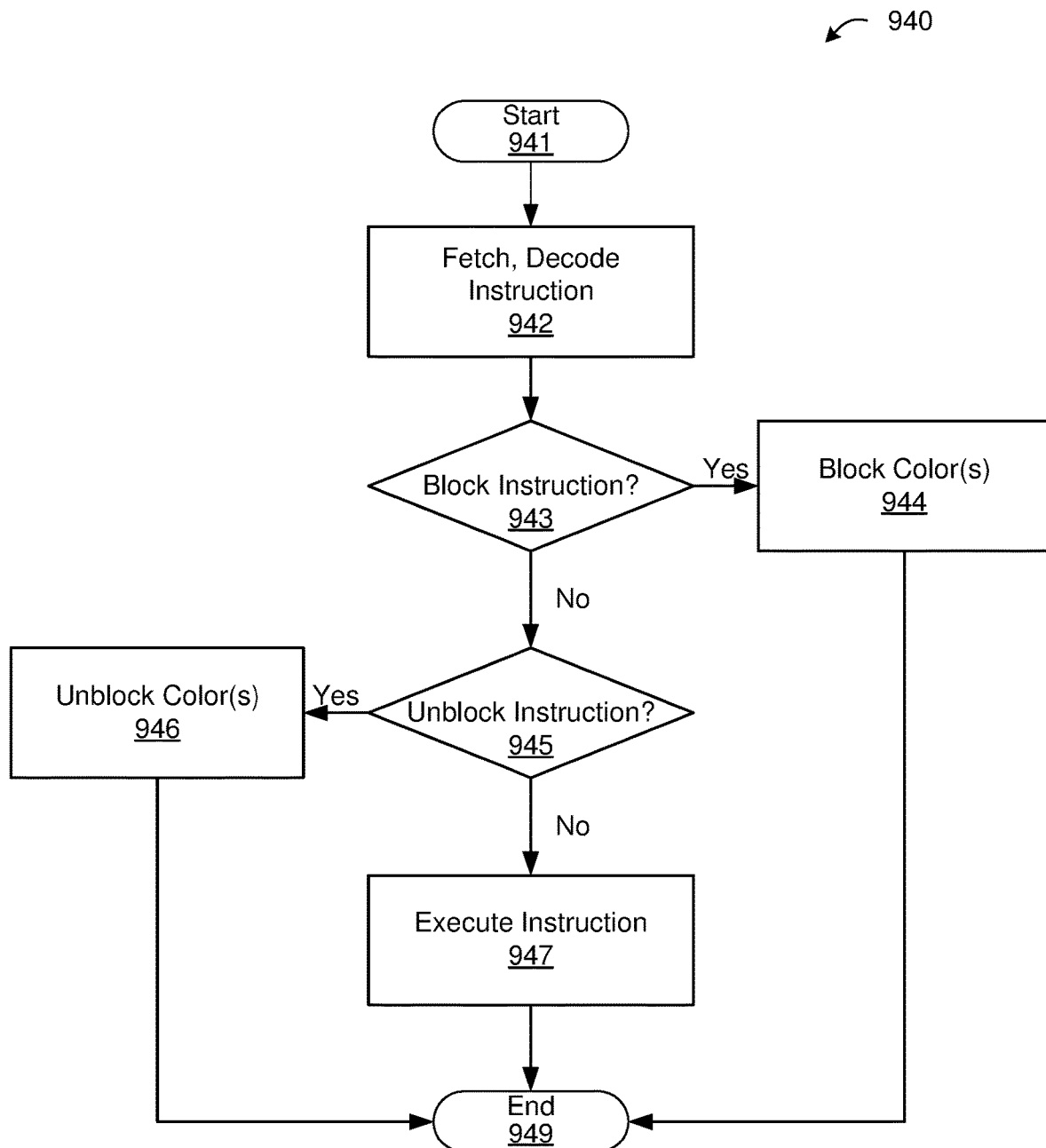
FIG. 9C illustrates selected details of an embodiment of block instruction and unblock instruction execution.

FIG. 9C illustrates selected details of an embodiment of block instruction and unblock instruction execution as flow 940. Conceptually, executing a block instruction specifying a particular color results in one or more of the following, according to embodiment and/or usage scenario. Instructions associated with the particular color are prevented from executing at least until execution of an unblock instruction specifying the particular color. Wavelets comprising the particular color are not selected at least until execution of an unblock instruction specifying the particular color. An activated color matching the particular color is not selected (and hence initiating a corresponding task is not performed) at least until execution of an unblock instruction specifying the particular color. Microthreads associated with the particular color are prevented from executing at least until execution of an unblock instruction specifying the particular color.

Referring to the figure, executing an instruction begins (Start 941) by fetching the instruction from memory and decoding the instruction (Fetch, Decode Instruction 942). If the instruction decodes to a block instruction (Block Instruction? 943), then a block operation is performed (Block Color(s) 944). The source operand of the block instruction specifies one or more colors to block with respect to instruction processing associated with blocked/unblocked colors. In various embodiments and/or usage scenarios, the block operation is performed by setting one or more block indicators to a blocked state for the one or more colors specified by the source operand, and execution is complete (End 949). In various scenarios, the source operand variously specifies blocking a single color, blocking all colors, and blocking an arbitrary plurality of colors. In subsequent operation, wavelets comprised of colors that are blocked are not selected for processing.

If the instruction decodes to an unblock instruction (Unblock Instruction? 945), then an unblock operation is performed (Unblock Color(s) 946). The source operand of the unblock instruction specifies one or more colors to unblock with respect to instruction processing associated with blocked/unblocked colors. In various embodiments and/or usage scenarios, the unblock operation is performed by setting a block indicator to an unblocked state for the one or more colors specified by the source operand, and execution is complete (End 949). In various scenarios, the source operand variously specifies unblocking a single color, unblocking all colors, and unblocking an arbitrary plurality of colors. In subsequent operation, wavelets comprised of colors that are unblocked are selectable for processing.

If the instruction decodes to an instruction that is not a block instruction and that is not an unblock instruction, then the instruction is otherwise executed (Execute Instruction 947) and execution is complete (End 949).

In some embodiments, if the source operand of a block instruction is an immediate (e.g., an 8-bit immediate), then the value of the immediate specifies the color to be blocked. In various embodiments, a block instruction with particular operands blocks multiple colors. If the source operand is not an immediate, then all colors are blocked until the block instruction completes.

In some embodiments, the source operand of an unblock instruction is an immediate (e.g., an 8-bit immediate) and the value of the immediate specifies the color to be unblocked. In various embodiments, an unblock instruction with particular operands unblocks multiple colors.

In various embodiments and/or usage scenarios, all or any portions of any one or more of elements of Block and Unblock Instruction Processing Flow 940 correspond conceptually to and/or are related conceptually to operations performed by and/or elements of a compute element, such as all or any portions of a CE of a PE, e.g., Compute Element 520 of FIG. 5 and/or CE 800 of FIG. 8.

As an example, Block Bits 899 comprise a bit for each color (e.g., as entries in a table, or as a bit-mask). The block operation (Block Color(s) 944) is performed by setting Block Bits 899 to a specific blocked state (e.g., '1') for the one or more colors specified by the source operand. In some embodiments, Picker 830 selects a wavelet for processing from a color where Block Bits 899 match an unblocked state (e.g., '0'). As another example, the unblock operation (Unblock Color(s) 946) is performed by setting Block Bits 899 to a specific unblocked state (e.g., '0') for the one or more colors specified by the source operand. In some embodiments, Picker 830 selects a wavelet comprising a color where Block Bits 899 match an unblocked state (e.g., '0').

In some embodiments, portions of Block and Unblock Instruction Processing Flow 940 correspond to portions of Processing a Wavelet for Task Initiation 900 of FIG. 9A. As an example, actions 942 943, 944, 945, 946, and 947 correspond to portions of actions 905 and 906 of FIG. 9A.

In various embodiments and/or usage scenarios, all or any portions of elements of Block and Unblock Instruction Processing Flow 940 conceptually correspond to all or any portions of executions of instructions of Task SW on PEs 260 of FIG. 2.

High-Level Dataflow

Figure 10A:
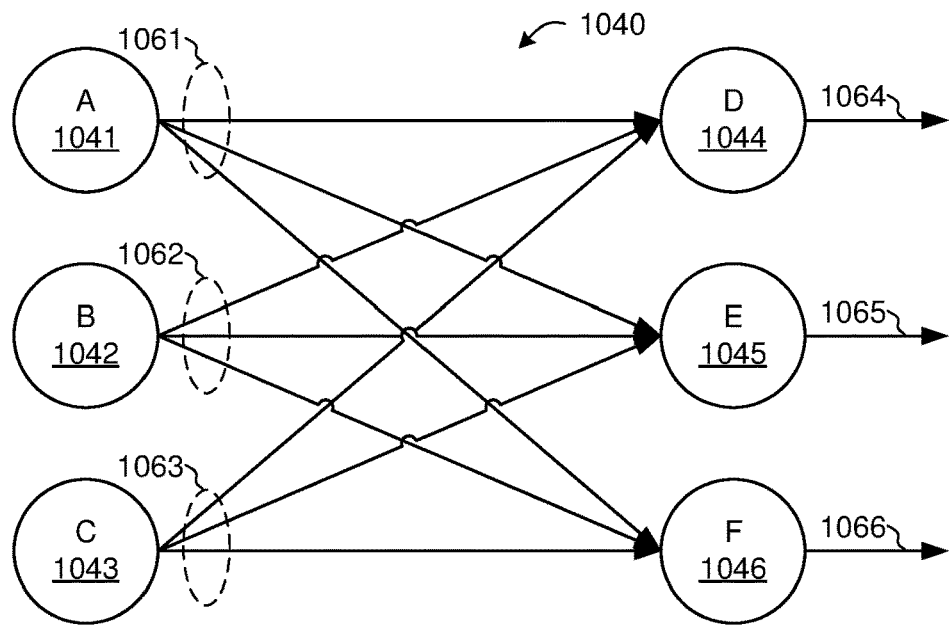
FIGS. 10A and 10B illustrate selected details of high-level dataflow occurring in an embodiment mapping multiple instances of a single neuron to respective sets of processor elements.
Figure 10B:
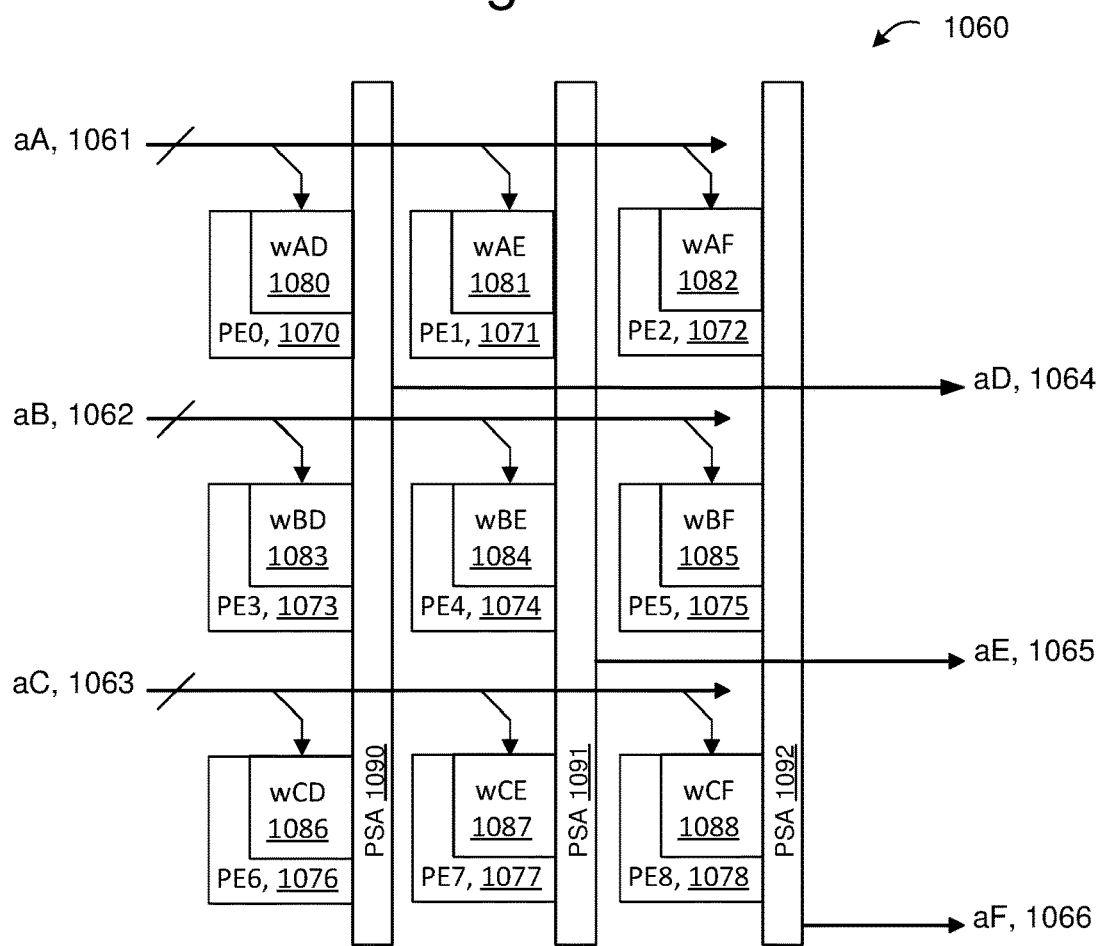

FIGS. 10A and 10B illustrate selected details of high-level dataflow occurring in an embodiment mapping multiple instances of a single neuron to respective sets of processor elements, e.g., as determined by Neuron to PE Mapping SW 212 of FIG. 2 executing on Placement Server(s) 150 of FIG. 1. FIG. 10A abstractly illustrates an internal neural network portion 1040 of a larger neural network, such as that of FIG. 17. Neural network portion 1040 has three neurons in a first neuron layer (on the left) and three neurons in a second neuron layer (on the right). The first neuron layer includes Neuron A 1041, Neuron B 1042, and Neuron C 1043. The second neuron layer includes Neuron D 1044, Neuron E 1045, and Neuron F 1046. Each of activation aA 1061 from Neuron A 1041, activation aB 1062 from Neuron B 1042, and activation aC 1063 from Neuron C 1043, when respectively non-zero, are broadcast into the second neuron layer and communicated to Neuron D 1044, Neuron E 1045, and Neuron F 1046 in accordance with the topology as illustrated. Each of activation aD 1064 from Neuron D 1044, activation aE 1065 from Neuron E 1045, and activation aF 1066 from Neuron 1046, when respectively non-zero, are broadcast into the next layer (not illustrated). Only non-zero activations are broadcast so no wasted compute is used for zero activations. In this way, activation sparsity is accumulated over the wafer to improve efficiency and reduce power consumption.

FIG. 10B illustrates processing element array portion 1060 of a larger processing element array, such as that of wafer 412 of FIG. 4. Like numbered elements of FIG. 10B correspond to like numbered elements of FIG. 10A. Neuron D 1044 is mapped to PE0 1070, PE3 1073, and PE6 1076 via respective locally stored distributions of weights wAD 1080, wBD 1083, and wCD 1086. Neuron E 1045 is mapped to PE1 1071, PE4 1074, and PE7 1077 via respective locally stored distributions of weights wAE 1081, wBE 1084, and wCE 1087. Neuron F 1046 is mapped to PE2 1072, PE5 1075, and PE8 1078 via respective locally stored distributions of weights wAF 1082, wBF 1085, and wCF 1088.

Non-zero activation aA 1061 from Neuron A 1041 triggers lookups of stored weights wAD 1080, wAE 1081, and wAF 1082. PE0 1070, PE1 1071, and PE2 1072 perform respective local multiply and accumulates of the respective local neuron weights with the incoming activation aA 1061 from Neuron A 1041 to produce respective local partial sums. Non-zero activation aB 1062 from Neuron B 1042 triggers lookups of stored weights wBD 1083, wBE 1084, and wBF 1085. PE3 1073, PE4 1074, and PE5 1075 perform respective local multiply and accumulates of the respective local neuron weights with the incoming activation aB 1062 from Neuron B 1042 to produce respective local partial sums. Non-zero activation aC 1063 from Neuron C 1043 triggers lookups of stored weights wCD 1086, wCE 1087, and wCF 1088. PE6 1076, PE7 1077, and PE8 1078 perform respective local multiply and accumulates of the respective local neuron weights with the incoming activation aC 1063 from Neuron C 1043 to produce respective local partial sums. The local partial sums of PE0 1070, PE3 1073, and PE6 1076 are accumulated to produce a final sum, an activation function is performed, and if non-zero, activation aD 1064 is broadcast to the next layer. The local partial sums of PE1 1071, PE4 1074, and PE7 1077 are accumulated to produce a final sum, an activation function is performed, and if non-zero, activation aE 1065 is broadcast to the next layer. The local partial sums of PE2 1072, PE5 1075, and PE8 1078 are accumulated to produce a final sum, an activation function is performed, and if non-zero, activation aF 1066 is broadcast to the next layer.

In FIG. 10B, activations aA 1061, aB 1062, aC 1063, aD 1064, aE 1065, aF 1066, are represented as being communicated via respective bus segments and the partial sum accumulations and activation functions corresponding to Neuron D 1044, Neuron E 1045, and Neuron F 1046, are represented as being respectively performed by PSA 1090, PSA 1091, and PSA 1092. In some embodiments and/or usage scenarios, the bus segments and PSA 1090, PSA 1091, and PSA 1092 of FIG. 10B are abstractions and the partial sum accumulations and activation functions are performed by various processing elements, e.g., as also determined by Neuron to PE Mapping SW 212 executing on Placement Server(s) 150, and the partial sums and activations are communicated as wavelets (see, e.g., FIGS. 13A-16 and section "Wavelets") via virtual channels over the couplings between the processing elements.

Example Workload Mapping and Exemplary Tasks

Conceptually, Deep Learning Accelerator 400 (FIG. 4) is a programmable compute fabric (see, e.g., FIGS. 5-8 and section "Processing Element: Compute Element and Router"). For example, the compute element of each PE 499 element is enabled to execute sequences of instructions of tasks (such as conceptually corresponding to all or any portions of executions of instructions of Task SW on PEs 260 of FIG. 2), and the respective router element of each PE 499 is configurable to route wavelets between the PEs. The programmable compute fabric enables mapping of workloads onto the compute fabric in various manners. Described following is an example high-level mapping of a workload to the compute fabric to illustrate various techniques and mechanisms implemented by the compute fabric.

The workload is deep neural network training, implemented via SGD. The deep neural network comprises a plurality of layers of neurons. The workload has three mega-phases: a forward pass, a delta pass, and a chain pass. The forward pass propagates activations in a forward direction. The delta pass propagates deltas in a backward direction. The chain pass calculates gradients based on the deltas as the deltas are generated in the delta pass. The three mega-phases have approximately a same amount of compute.

FIG. 4 illustrates an example mapping of the mega-phases to the PEs. Each layer is implemented by blocks of PEs allocated from the compute fabric (aka 'placed') back-to-back (e.g., in a horizontal dimension). Data movement propagates to the end of the fabric during the forward pass (Forward 401), and then circles back in the reverse direction during the delta pass (Delta 402) and chain pass (Chain 403). The placement is directed to reduce data movement since the forward pass saves activations to be used by the delta pass and the chain pass. In the example, all the PEs are time shared three ways between the three mega-phases, with each mega-phase using approximately a same amount of compute. In some circumstances, an entire chain of PEs performing the passes operates as a pipeline such that each layer is a pipe stage (taking roughly a same amount of time to complete) and each activation of a mini-batch fills the pipeline.

In some embodiments and/or usage scenarios, within a set of the PEs mapped to a single one of the layers, the weights of the single layer are distributed across the PEs such that a single neuron is mapped to multiple PEs. Splitting a single neuron across multiple PEs, in some circumstances, provides a load balancing benefit and provides a communication partitioning benefit (see, e.g., FIGS. 10A-10B and section "High-Level Dataflow" as well as FIGS. 17-20 and section "Neuron Smearing").

Conceptually, processing proceeds as follows (see Forward 401 of FIG. 4). Activations are broadcasted into the layer along the horizontal axis. Activations are received by the PEs and trigger a lookup of the associated weights that are stored local to the PEs (corresponding to the neurons mapped to the PEs). Only non-zero activations are broadcasted, so no compute is wasted for zero activations (an example of activation sparsity harvesting). Each PE performs a local multiply and accumulate of the incoming activation with all the neuron weights producing local partial sums. Since the weights of each neuron are distributed to multiple PEs, partial sums are then accumulated across the PEs in the vertical direction, in accordance with the neuron weight distribution. After the partial sums are accumulated producing a final sum, the activation function is performed and all new non-zero activations are broadcast to the next layer.

The delta pass (see Delta 402 of FIG. 4) and the chain pass (see Chain 403 of FIG. 4) follow a data flow similar to that of the forward pass. In some embodiments and/or usage scenarios, the delta pass and the chain pass are placed offset by one layer so the activations are stored in the same layers as the weights used in the backward direction. Activations are stored by the receiving layer such that in the delta pass and the chain pass, the activations are used directly without additional communication. In addition to storing activations, a weight transpose is performed to implement the delta pass. The weight transpose, in some embodiments and/or usage scenarios, is implemented by replicating the weights, using additional memory capacity and additional communication when updating the weights. In some embodiments and/or usage scenarios, the weight transpose is implemented by transposing the delta broadcast in the vertical dimension.

Figure 11:
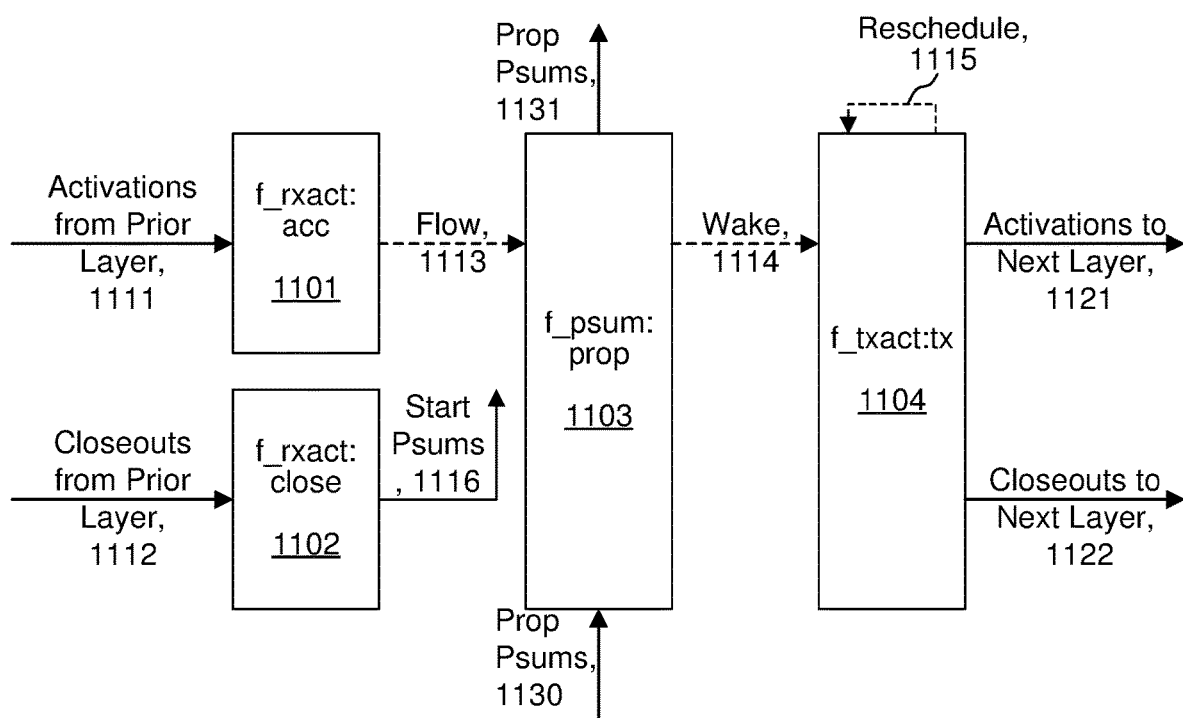
FIG. 11 illustrates an embodiment of tasks as used in a forward pass state machine, including dependency management via closeouts.

FIG. 11 illustrates an embodiment of tasks (see, e.g., FIGS. 9A-9C and sections "Task Initiation" and "Task Block and Unblock") as used in a forward pass state machine, including dependency management via closeouts. In some embodiments and/or usage scenarios, each of the PEs implements an instantiation of the state machine. In some embodiments and/or usage scenarios, various portions of the state machine are implemented by respective PEs (see, e.g., FIGS. 17-20 and section "Neuron Smearing"). There are four tasks in the state machine: f_rxact:acc 1101, f_rxact:close 1102, f_psum:prop 1103, and f_txact:tx 1104. Conceptually, activations arrive from a PE to the "left" of the instant PE (corresponding to a previous layer). Incoming (non-closeout) activations from, e.g., a prior layer on the activation broadcast wire (Activations from Prior Layer 1111) trigger f_rxact:acc 1101. The instant PE executes instructions of the task, looking up (e.g., from memory local to the instant PE) the weights associated with the activation and performing the local weight multiply and accumulate into partial sums. Control flow dependencies exist between f_rxact:acc 1101 and f_psum:prop 1103 (Flow 1113). Example data structures the task references are wrow, fpsum, and fact.

An incoming activation closeout on the activation broadcast wire (Closeouts from Prior Layer 1112) triggers f_rxact:close 1102. The closeout signals the end of all activations for the current wavefront. The instant PE executes instructions of the task, starting the partial sum accumulation ring with the partial sums in a start list of the instant PE (Start Psums 1116). Example data structures the task references are fpsum_acc_mem, and fpsum_acc_fab.

An incoming partial sum (Prop Psums 1130) triggers f_psum:prop 1103. The instant PE executes instructions of the task, adding the incoming partial sum to the local partial sum of the instant PE, and then forwarding the result to the next hop on the ring (Prop Psums 1131). If the instant PE is the end of the ring, then the final sum is generated. In some embodiments and/or usage scenarios, additional processing is performed to prevent deadlock. Example data structures the task references are fpsum_acc_mem, fpsum_acc_fab, and f_txact_wake.

When there are queued activations to transmit, f_txact:tx 1104 is self-triggered (Wake 1114), e.g., via the instant PE sending a wavelet to itself. The instant PE executes instructions of the task, de-queuing an activation and transmitting the activation on the broadcast wire to the next layer (Activations to Next Layer 1121). When more items remain in the queue, the instant PE reschedules the task (Reschedule 1115), e.g., via the instant PE sending a wavelet to itself. When the queue is empty, the instant PE sends a closeout wavelet to close the wavefront (Closeouts to Next Layer 1122).

The activations (incoming and outgoing) and the partial sums (incoming and outgoing), as well as the closeout wavelets are communicated as wavelets (see, e.g., FIGS. 13A-16 and section "Wavelets"). In some embodiments and/or usage scenarios, one or more of the wavelets correspond to one or more elements of fabric vectors as described by one or more DSDs and/or XDSDs.

Data structures for the various state machines are referenced via a plurality of DSDs stored in respective DSRs (see, e.g., FIGS. 21A-24 and section "Vectors and Data Structure Descriptors"), as described by the following table.

| DSR | Data Structure Name | Description |
| --- | --- | --- |
| DS1 | Wrow | Weight matrix, rows |
| DS2 | Wcol | Weight matrix, cols (points to same data as DS2) |
| DS3 | Fpsum | Forward partial sum vector - full vector of all psums<br>Length: number of neurons<br>Stride: 1 |
| DS4 | fpsum_acc_mem | Forward partial sum vector - subset for psum accumulate<br>Same data as psum but organized as 2d array<br>Length: number of neurons in subset<br>Stride: 1 |
| DS5 | fpsum_acc_fab | Forward partial sum vector - subset for psum accumulate<br>Fabric type: col:ep=f_psum:prop<br>Length: number of neurons in subset |
| DS6 | Fact | Forward activation storage vector<br>Length: 1 |

-continued

| DSR | Data Structure Name | Description |
|---|---|---|
| DS7 | fact_fab | Stride: 1<br>Forward activation fabric transmit<br>Fabric type: col:ep=f_txact:acc<br>Length: 1 |
| DS8 | f_txact_wake | Self reschedule wake up wavelet<br>Fabric type: col:ep=f_txact:tx |
| DS9 | fact_close_fab | Forward activation close out fabric transmit<br>Fabric type: col:ep=f_txact:close<br>Length: 1 |

The foregoing example workload mapping is with respect to SGD. However, the techniques are readily applicable to MBGD and CPGD, with and without RCP.

In some embodiments and/or usage scenarios, all or any portions of the actions of FIG. 11 correspond or are related conceptually to operations performed by and/or elements of PEs 122 of FIG. 1. In some embodiments and/or usage scenarios, all or any portions of elements of FIG. 11 conceptually correspond to all or any portions of executions of instructions of Task SW on PEs 260 of FIG. 2.

Figure 12:
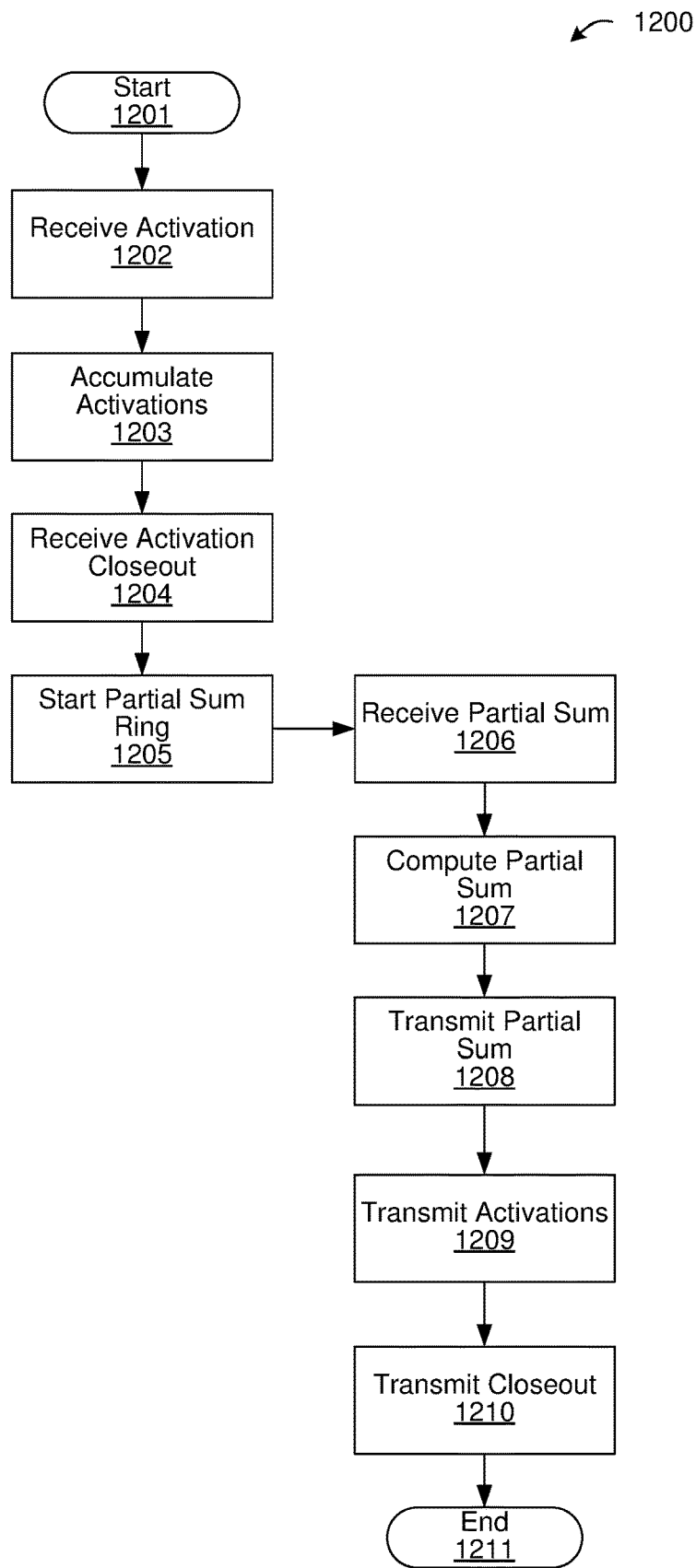
FIG. 12 illustrates selected details of an embodiment of flow associated with activation accumulation and closeout, followed by partial sum computation and closeout.

FIG. 12 illustrates selected details of an embodiment of flow associated with activation accumulation and closeout, followed by partial sum computation and closeout as Activation Accumulation/Closeout and Partial Sum Computation/Closeout 1200.

Flow begins (Start 1201). Activations are received (Receive Activation 1202) and accumulated (Accumulate Activations 1203), e.g., as processed by f_rxact:acc 1101 of FIG. 11. In response to receiving an activation closeout (Receive Activation Closeout 1204), partial sum computation on a 'ring' of PEs is initiated (Start Partial Sum Ring 1205), e.g., as performed by f_rxact:close 1102 of FIG. 11 and indicated by Start Psums 1116 of FIG. 11. An example ring of PEs is illustrated in FIG. 10B as PE0 1070, PE3 1073, and PE6 1076, with corresponding partial sum accumulation illustrated by PSA 1090. In some embodiments and/or usage scenarios, Receive Activation Closeout 1204 concludes accumulating activations and enforces ordering with respect to initiating partial sum computation, e.g., ensuring that all activations are received and accumulated prior to initializing partial sum computation. An (input) partial sum is received by an instant PE (Receive Partial Sum 1206), added to a partial sum computed by the instant PE (Compute Partial Sum 1207) and a result of the addition forms an (output) partial sum that is transmitted to a next PE of the ring (Transmit Partial Sum 1208). The reception, adding, and transmission are performed, e.g., by f_psum:prop 1103 of FIG. 11 and the input/output partial sums are as indicated respectively by Prop Psums 1130 and Prop Psums 1131 also of FIG. 11. When a final sum has been computed by completion of the partial sum computations on the ring of PEs, activations for output to the next layer are produced and transmitted (Transmit Activations 1209), e.g., by f_txact:tx 1104 of FIG. 11 and as indicated by Activations to Next Layer 1121 also of FIG. 11. When all activations have been transmitted, a closeout is transmitted (Transmit Closeout 1210), e.g., also by f_txact:tx 1104 of FIG. 11 and as indicated by Closeouts to Next Layer 1122 also of FIG. 11. Flow is then complete (End 1211). In some embodiments and/or usage scenarios, Transmit Closeout 1210 concludes transmitting closeouts and enforces ordering transmitting activations with respect to further processing, e.g., ensuring that all activations are transmitted before further processing.

In some embodiments and/or usage scenarios, closeouts conclude other portions of a neural network, e.g., transmitting deltas.

In some embodiments and/or usage scenarios, all or any portions of the actions of Activation Accumulation/Closeout and Partial Sum Computation/Closeout 1200 correspond or are related conceptually to operations performed by and/or elements of PEs 122 of FIG. 1. In some embodiments and/or usage scenarios, all or any portions of elements of Activation Accumulation/Closeout and Partial Sum Computation/Closeout 1200 conceptually correspond to all or any portions of executions of instructions of Task SW on PEs 260. In various embodiments and/or usage scenarios, a closeout (e.g., associated with action 1210) is an example of a control wavelet.

Wavelets

Figure 13A:
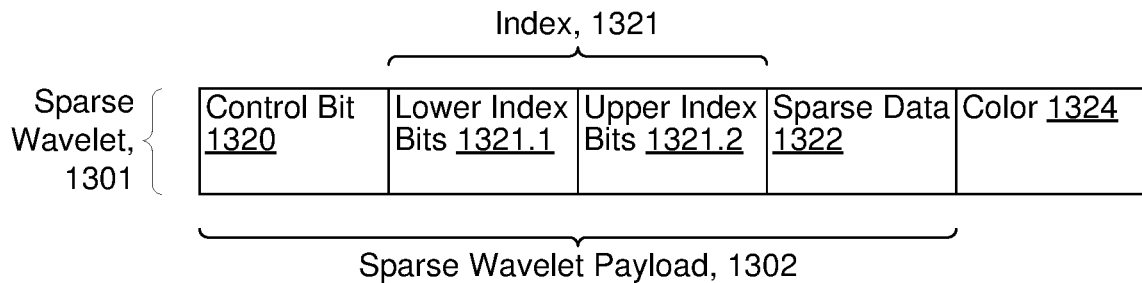
FIG. 13A illustrates selected details of an embodiment of a sparse wavelet.

FIG. 13A illustrates selected details of an embodiment of a sparse wavelet, as Sparse Wavelet 1301. Sparse Wavelet 1301 comprises Sparse Wavelet Payload 1302 and Color 1324. Sparse Wavelet Payload 1302 comprises Index 1321, Sparse Data 1322, and Control Bit 1320. Index 1321 comprises Lower Index Bits 1321.1 and Upper Index Bits 1321.2.

In some embodiments, Sparse Data 1322 comprises a field for a 16-bit floating-point number or a 16-bit integer number. In various scenarios, Sparse Data 1322 variously represents a weight of a neural network, an input or stimulus of a neural network, an activation of a neural network, or a partial sum of a neural network.

In some embodiments, Index 1321 comprises a 16-bit field. In some scenarios, Index 1321 is an integer number and is an index that explicitly indicates a specific neuron of a neural network. In some embodiments, Lower Index Bits 1321.1 is six bits, and Upper Index Bits 1321.2 is 10 bits.

In some embodiments, Control Bit 1320 is 1-bit field. In some scenarios, Control Bit 1320 indicates whether Sparse Wavelet Payload 1302 triggers control activity or data activity. In some scenarios, control activity comprises computing the last activation of a neuron and data activity comprises computing activations of a neuron that are not the last activation. In some embodiments and/or usage scenarios, the control activity comprises a closeout activity, such as associated with any one or more of Closeouts from Prior Layer 1112 and/or Closeouts to Next Layer 1122 of FIG. 11, as well as any one or more of Receive Activation Closeout 1204 and/or Transmit Closeout 1210 of FIG. 12.

In some embodiments, Color 1324 comprises a 5-bit field. In some embodiments, a color corresponds to a virtual channel over a shared physical channel, such as via routing in accordance with the color. In some scenarios, a color is used for a specific purpose such as sending configuration information to processing elements or sending input of a neural network to a neuron that is mapped to a processing element.

Figure 13B:
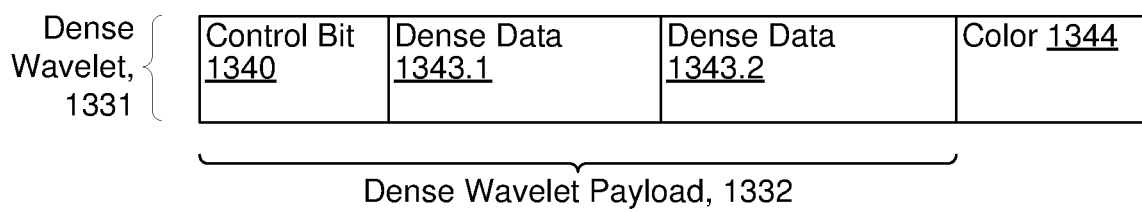
FIG. 13B illustrates selected details of an embodiment of a dense wavelet.

FIG. 13B illustrates selected details of an embodiment of a dense wavelet, as Dense Wavelet 1331. Dense Wavelet 1331 comprises Dense Wavelet Payload 1332 and Color 1344. Dense Wavelet Payload 1332 comprises Dense Data 1343.1, Dense Data 1343.2, and Control Bit 1340.

In some embodiments, Control Bit 1340 is a 1-bit field and is functionally identical to Control Bit 1320.

In some embodiments, Color 1344 comprises a 5-bit field and is functionally identical to Color 1324.

In some scenarios, Dense Data 1343.1 and Dense Data 1343.2 comprise fields for respective 16-bit floating-point numbers or respective 16-bit integer numbers. In various scenarios, Dense Data 1343.1 and Dense Data 1343.2 variously represent weights of a neural network, inputs or stimuli of a neural network, activations of a neural network, or partial sums of a neural network. In some scenarios, Dense Data 1343.1 and Dense Data 1343.2 collectively comprise a 32-bit floating-point number (e.g., Dense Data 1343.1 comprises a first portion of the 32-bit floating-point number and Dense Data 1343.2 comprises a second portion of the 32-bit floating-point number).

In various embodiments and/or usage scenarios, usage of sparse wavelets vs. dense wavelets is variously predetermined, dynamically determined, and/or both. In various embodiments and/or usage scenarios, usage of sparse wavelets vs. dense wavelets is determined by software.

Figure 14:
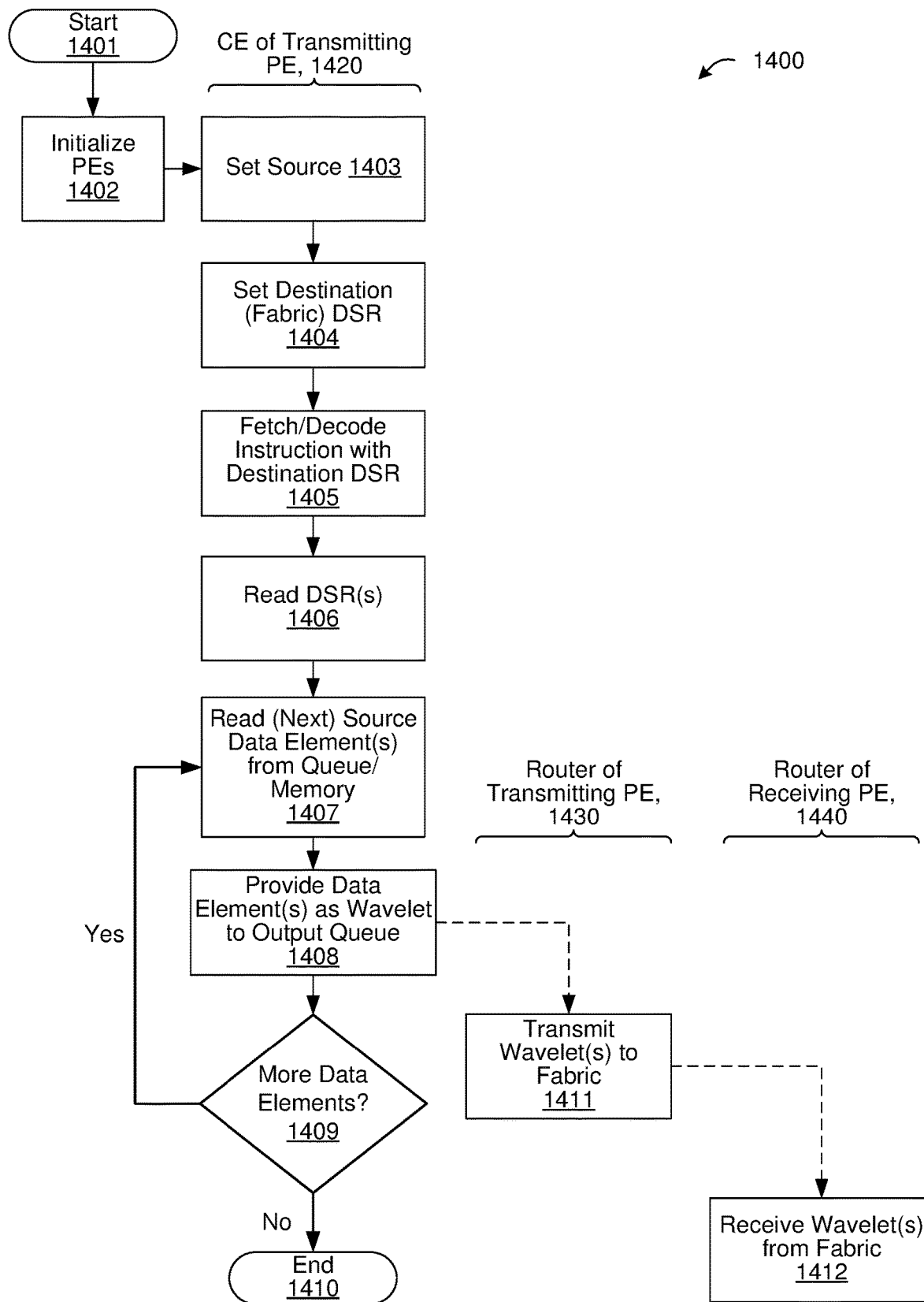
FIG. 14 illustrates selected details of an embodiment of creating and transmitting a wavelet.

FIG. 14 illustrates selected details of an embodiment of creating and transmitting a wavelet, as Wavelet Creation Flow 1400. Actions of Wavelet Creation Flow 1400 are performed by various agents. A transmitting PE comprises a CE that performs actions 1403-1409, as illustrated by CE of Transmitting PE 1420. The transmitting PE further comprises a router that performs action 1411, as illustrated by Router of Transmitting PE 1430. A receiving PE comprises a router that performs action 1412, as illustrated by Router of Receiving PE 1440.

Creating and transmitting a wavelet begins (Start 1401) by initializing at least one transmitting PE and one or more receiving PEs, as well as any PEs comprising routers implementing a fabric coupling the transmitting PEs and the receiving PEs (Initialize PEs 1402). Each of the PEs comprises a respective router (e.g., Router 510 of FIG. 5) and a respective CE (e.g., Compute Element 520 of FIG. 5). In some scenarios, initializing a PE enables the CE of the PE to perform computations and enables the router of the PE to transmit, receive, and/or route wavelets over the fabric.

In various embodiments, a DSR holds a DSD comprising information about an operand such as location of data elements (e.g., memory, fabric input, and/or fabric output), number of the data elements (e.g., length), an address or addresses of the data elements (e.g., start address and stride in memory). For fabric output operands (e.g., wavelets sent via the fabric), the DSR comprises a color for the wavelet(s) on the fabric, a control bit, and optionally a value or location of an index.

In some embodiments, the CE of the transmitting PE configures a source (Set Source 1403). In some scenarios, the source is a source DSD describing a source operand. In various embodiments, the source DSD describes one or more data elements stored in one of: cache and memory. In other embodiments, the source DSD describes one or more data elements received via the fabric (e.g., the data elements are payloads of wavelets arriving via the fabric). In some other scenarios, the source comprises a source register (e.g., one of RF 842). In yet other scenarios, the source comprises an immediate specified in an instruction.

The CE also configures a destination DSD in a destination DSR describing the location of a destination operand. In various embodiments, the location of the destination operand is the fabric (Set Destination (Fabric) DSR 1404). In some embodiments, the destination DSD describes one or more data elements transmitted via the fabric. In various embodiments, the source and the destination DSDs are configured via one or more instructions.

Subsequently, the CE fetches and decodes an instruction (e.g., FMACH, MOV, LT16) comprising one or more source operands, an operation, and a destination operand specified by the DSD in the destination DSR (Fetch/Decode Instruction with Destination DSR 1405). In some embodiments, the operand type fields of the instruction specify whether an operand is specified by a DSD.

The CE reads the destination DSD from the destination DSR and any source DSDs in source DSRs (Read DSR(s) 1406). Based on the DSDs, the CE determines the type of data structure, the source of the data element(s), whether multiple data elements are read together (e.g., for a SIMD operation), and a total number of data elements for each operand. In some scenarios, DSRs are read for one or more of: a source0 operand, a source1 operand, and a destination operand. In some embodiments and/or usage scenarios, the DSRs are read entirely or partially in parallel, and in other embodiments and/or usage scenarios, the DSRs are read entirely or partially sequentially.

The CE of the transmitting PE reads (e.g., from register or memory) the first data element(s) specified by the source (Read (Next) Data Elements(s) from Queue/Memory 1407) and performs the operation specified by the instruction (e.g., multiplication) on the first data element(s). In response to the destination operand being specified as a fabric type by the destination DSD, the CE creates one or more wavelets. One or more results of the operation (e.g., in a form of data elements) are used to form a wavelet payload, based on the destination DSD. The control bit of the wavelet payload and the color of the wavelet are specified by the destination DSD. The wavelet payload and the color are provided to the router of the transmitting CE (Provide Data Element(s) as Wavelet to Output Queue 1408). In some embodiments and/or usage scenarios, a single data element is used to create the payload of a sparse wavelet. In other embodiments and/or usage scenarios, two data elements are used to create the payload of a dense wavelet. In various embodiments, four data elements are used to create the payload of two wavelets. In some embodiments, the number of data elements used is specified by the destination DSD.

The CE of the transmitting PE determines if additional data element(s) are specified by the destination DSD (More Data Elements? 1409). If additional data element(s) are specified by the destination DSD, then the CE creates additional wavelet(s) via actions Read (Next) Source Data Element(s) from Queue/Memory 1407, Provide Data Element(s) as Wavelet to Output Queue 1408, and More Data Elements? 1409 until no additional data element(s) are specified by the destination DSD. If no additional data element(s) are specified by the destination DSD, then flow concludes (End 1410). In some embodiments, the wavelets created via action 1408 are of the same color as specified by the destination DSR.

The router of the transmitting PE transmits the wavelet(s) in accordance with the color of the wavelet(s) (Transmit Wavelet(s) to Fabric 1411), in accordance with respective colors of the wavelets. In some embodiments and/or usage scenarios, the transmitting is directly to the router of the receiving PE. In some embodiments and/or usage scenarios, the transmitting is indirectly to the router of the receiving PE, e.g., via one or more intervening PEs acting to forward the wavelet(s) in accordance with the colors. The router of the receiving PE receives the wavelet(s) in accordance with the color (Receive Wavelet(s) from Fabric 1412).

In various embodiments, action 1411 is performed asynchronously with respect to any one or more of actions 1407, 1408, and 1409. For example, a plurality of wavelets is produced by action 1408 before any of the produced wavelets are transmitted as illustrated by action 1411.

In various embodiments, Receive Wavelet(s) from Fabric 1412 corresponds in various respects to Receive Wavelet at Router 1503 of FIG. 15.

In various embodiments and/or usage scenarios, all or any portions of any one or more of elements of Wavelet Creation Flow 1400 correspond conceptually to and/or are related conceptually to operations performed by and/or elements of a PE, e.g., PE 499 of FIG. 4.

In various embodiments and/or usage scenarios, all or any portions of any one or more of elements of Wavelet Creation Flow 1400 (e.g., any one or more of actions 1403-1409) correspond conceptually to and/or are related conceptually to operations performed by and/or elements of a compute element, such as all or any portions of a CE of a PE, e.g., Compute Element 520 of FIG. 5 and/or CE 800 of FIG. 8. As an example, the destination DSR (associated with Set DSR Destination (Fabric) DSR 1404) is one of DSRs 846. In some scenarios, the source DSR (associated with Set Source 1403) is one of DSRs 846; in other scenarios the source register (associated with Set Source 1403) is one of RF 842.

As another example, CE 800 as the CE of the transmitting PE performs action 1403 in response to a load DSR instruction copying information from Memory 854 into the source DSR (e.g., one of DSRs 846). In various embodiments, the source DSR specifies the location of the data elements as one of Memory 854, D-Store 848, and RF 842. In some scenarios, the source DSR specifies an address of a first data element in Memory 854 (e.g., address 0x0008), a number of data elements (e.g., nine data elements), and a stride between subsequent data elements (e.g., 12 bytes). As another example, CE 800 performs action 1403 by writing data into a register of RF 842.

As another example, CE 800 as the CE of the transmitting PE performs action 1404 in response to a load DSR instruction copying information from Memory 854 into the destination DSR (e.g., one of DSRs 846). In various embodiments, the destination DSR specifies transformation of one or more data elements into one or more wavelets and transmitted by Router 510 via a fabric-coupled egress port (e.g., North 513). The destination DSR specifies a color for the wavelet(s), a control bit for the wavelet(s), a number of data elements (e.g., length), and information about an index of the wavelet(s). In some scenarios, the destination DSR specifies the value of the index and in other scenarios the destination DSR specifies a location of the value of the index (e.g., in a register of RF 842).

As another example, CE 800 as the CE of the transmitting PE performs actions 1406, 1407, 1408, and 1409 in response to fetching and decoding an instruction specifying a destination DSR as a destination operand (action 1405). In some embodiments and/or usage scenarios, D-Seq 844 reads the source DSR(s) and accesses one, two, or four data elements specified by each source DSR, e.g., from Memory 854 or D-Store 848, thereby performing action 1407. In various embodiments, Memory 854 and/or D-Store 848 provide the data elements to Data Path 852. The Data Path 852 performs the operation on the data elements (e.g., adding source0 data elements to source1 data elements). In accordance with the destination DSD, Data Path 852 transforms the result data of the operation into a wavelet and writes the wavelet to one of Output Queues 859 as specified by a color of the destination DSD, thereby performing action 1408. In some embodiments, CE 800 of the transmitting PE performs action 1409 by comparing a number of data elements specified in the destination DSD (e.g., a length) against the number of data elements sent via action 1408 (e.g., tracked by a counter).

As another example, CE 800 as the CE of the transmitting PE performs action 1408. The CE transforms the one or two data element(s) into a wavelet payload, according to the destination DSD. In some embodiments and/or usage scenarios, the CE transforms a single data element into a wavelet payload formatted in accordance with Sparse Wavelet 1301 of FIG. 13A. The single data element is transformed into an instantiation of Sparse Data 1322, an index value specified by the destination DSD is transformed into an instantiation of Index 1321, and a control bit from the destination DSD is transformed into an instantiation of Control Bit 1320, thereby forming an instantiation of Sparse Wavelet Payload 1302.

As another example, CE 800 as the CE of the transmitting PE transforms two data elements into a wavelet payload formatted in accordance with Dense Wavelet 1331 of FIG. 13B. The first data element is transformed into an instantiation of Dense Data 1343.1 and the second data element is transformed into an instantiation of Dense Data 1343.2. The control bit from the destination DSD is transformed into an instantiation of Control Bit 1340, thereby forming an instantiation of Dense Wavelet Payload 1332.

In some embodiments, the CE provides the wavelet(s) to the router asynchronously (e.g., in accordance with action 760 of FIG. 7C).

In various embodiments and/or usage scenarios, all or any portions of any one or more of elements of Wavelet Creation Flow 1400 (e.g., any one or more of actions 1411 and 1412) correspond conceptually to and/or are related conceptually to operations performed by and/or elements of a router, such as all or any portions of a router of a PE, e.g., Router 510 of FIG. 5 and/or Router 600 of FIG. 6, action 760 of FIG. 7C, and action 747 of FIG. 7B.

As an example, Transmit Wavelet(s) to Fabric 1411 is performed by Router 600 as Router of Transmitting PE 1430 in accordance with action 760 of FIG. 7C. As another example, Receive Wavelet(s) from Fabric 1412 is performed by Router 600 as Router of Receiving PE 1440 in accordance with action 747 of FIG. 7B.

In some embodiments and/or usage scenarios, all or any portions of elements of Wavelet Creation Flow 1400 conceptually correspond to all or any portions of executions of instructions of Task SW on PEs 260 of FIG. 2.

FIG. 15 illustrates selected details of an embodiment of receiving a wavelet as Wavelet Receive Flow 1500. Actions of Wavelet Receive Flow 1500 are performed by various agents. A receiving PE comprises a router performing actions 1503-1506, as illustrated by Router of Receiving PE 1520. The receiving PE further comprises a CE performing action 1507, as illustrated by CE of Receiving PE 1530.

Receiving a wavelet begins (Start 1501) by initializing at least one transmitting PE and one or more receiving PEs as well any PEs comprising routers implementing fabric coupling the transmitting PEs and the receiving PEs (Initialize PEs 1502). Each of the PEs comprises a respective router (e.g., Router 510 of FIG. 5) and a respective CE (e.g., Compute Element 520 of FIG. 5). In some scenarios, initializing a PE enables the CE of the PE to perform computations and enables the router of the PE to transmit, receive, and/or forward wavelets over the fabric.

The following description assumes there is a single receiving PE. In usage scenarios where there is plurality of receiving PEs, the respective routers and CEs of each of the receiving PEs perform processing in accordance with FIG. 15.

The router of the receiving PE receives a wavelet 'on a color' (e.g., the wavelet comprises the color) of the fabric (Receive Wavelet at Router 1503), as transmitted by the transmitting PE. The router checks the destination(s) of the wavelet based on the color, e.g., by reading a configuration register. If the destination(s) of the wavelet includes other PEs (To Other PE(s)? 1504), then the router transmits the wavelet to the destination PE(s). The router sends the wavelet to output(s) of the router (Transmit Wavelet to Output(s) 1505), and the wavelet is transmitted from the output across the fabric to the destination PE(s). If the destination(s) of the wavelet does not include other PEs, then the transmitting is omitted.

If the destination(s) of the wavelet do not include the local CE (For Local CE? 1506), then no further action is taken (End 1510). If one of the destination(s) of the wavelet is the local CE, then the router provides the wavelet to the local CE via the Off Ramp and the wavelet is written into a picker queue associated with the color that the wavelet was received on (Write Wavelet to Picker Queue 1507), thereby receiving the wavelet (End 1510).

In various embodiments and/or usage scenarios, all or any portions of any one or more of elements of Wavelet Receive Flow 1500 (e.g., any one or more of actions 1503-1506) correspond conceptually to and/or are related conceptually to operations performed by and/or elements of a router, such as all or any portions of a router of a PE, e.g., Router 510 of FIG. 5 and/or Router 600 of FIG. 6.

As an example, Receive Wavelet at Router 1503 is performed by Router 600 as Router of Receiving PE 1520 when a wavelet is received on one of Data In 610. Subsequently, To Other PE(s)? 1504 and For Local CE? 1506 are performed by Router 600, using the color of the wavelet to determine the destination(s) of the wavelet, e.g., by reading Dest 661. For each input color, Dest 661 indicates the output destination(s), e.g., one or more of Data Out 620. If Dest 661 indicates that the output includes other PEs (e.g., via one of SkipX+ 621, SkipX– 622, X+ 623, X– 624, Y+ 625, and Y– 626), then the wavelet is sent to other PEs by Router Sched 654. If Dest 661 indicates that the output includes the CE of the PE (e.g., Offramp 627), then the wavelet is sent to the CE by Router Sched 654. The wavelet remains in one of Data Queues 650 until action 1505 is performed by scheduling the wavelet (e.g., by Router Sched 654) to be sent to one or more of Data Out 620.

In various embodiments and/or usage scenarios, all or any portions of any one or more of elements of Wavelet Receive Flow 1500 (e.g., action 1507) correspond conceptually to and/or are related conceptually to operations performed by and/or elements of a compute element, such as all or any portions of a CE of a PE, e.g., Compute Element 520 of FIG. 5 and/or CE 800 of FIG. 8. As an example, Write Wavelet to Picker Queue 1507 is performed by sending the wavelet via Off Ramp 820 to CE 800 and writing the wavelet into one of Input Qs 897. In some embodiments, action 1507 additionally comprises setting the active bit (of Active Bits 898) corresponding to the one of Input Qs 897.

In some embodiments and/or usage scenarios, wavelets are received by the router, queued, and routed to router output ports without any specific determination that a wavelet is for a local CE. Instead, wavelets destined for the local CE are routed to the off ramp and are then written into the picker queue. Wavelets not destined for the local CE are routed to other-than the off ramp router outputs.

FIG. 16 illustrates selected details of an embodiment of consuming a wavelet as Wavelet Consumption Flow 1600. Actions of Wavelet Consumption Flow 1600 are performed by a CE of a PE.

Consuming a wavelet begins (Start 1601) by the picker selecting the wavelet from a queue for processing (Picker Selects Wavelet for Processing 1602), and then the CE processes the wavelet. The CE fetches and executes instructions associated with the wavelet (Fetch, Execute Instructions 1603), thereby consuming the wavelet (End 1604). In some embodiments and/or usage scenarios, fetching and executing instructions associated with the wavelet ends with fetching and executing a terminate instruction.

In some embodiments, Picker Selects Wavelet for Processing 1602 is performed by Picker 830 of FIG. 8. In various scenarios, Picker 830 selects one of Input Qs 897 that is ready (e.g., Block Bits 899 and Active Bits 898 are certain values), according to a scheduling policy such as round-robin or pick-from-last. In some embodiments, portions of Wavelet Consumption Flow 1600 correspond to portions of Processing a Wavelet for Task Initiation 900 of FIG. 9A. As an example, action 1602 corresponds to action 902. As another example, action 1603 corresponds to actions 903, 904, 910, 905, and 906.

Figure 23:
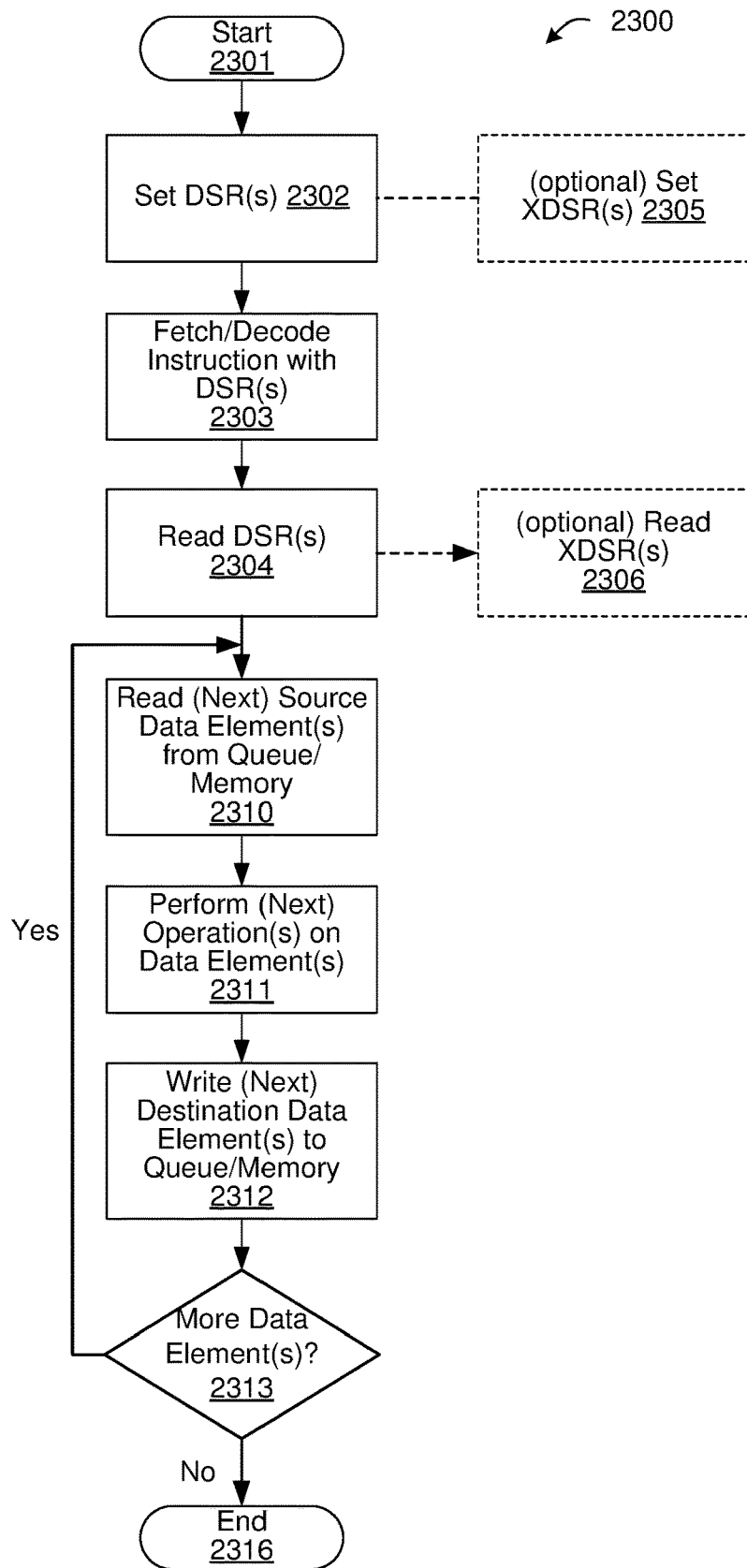
FIG. 23 illustrates selected details of accessing operands in accordance with data structure descriptors.

In some other scenarios, the wavelet is accessed as an operand by an instruction (e.g., FMACH) executing on the CE and the wavelet is consumed by the CE during the execution of the instruction, e.g., as illustrated in FIG. 23.

Neuron Smearing

Figure 17:
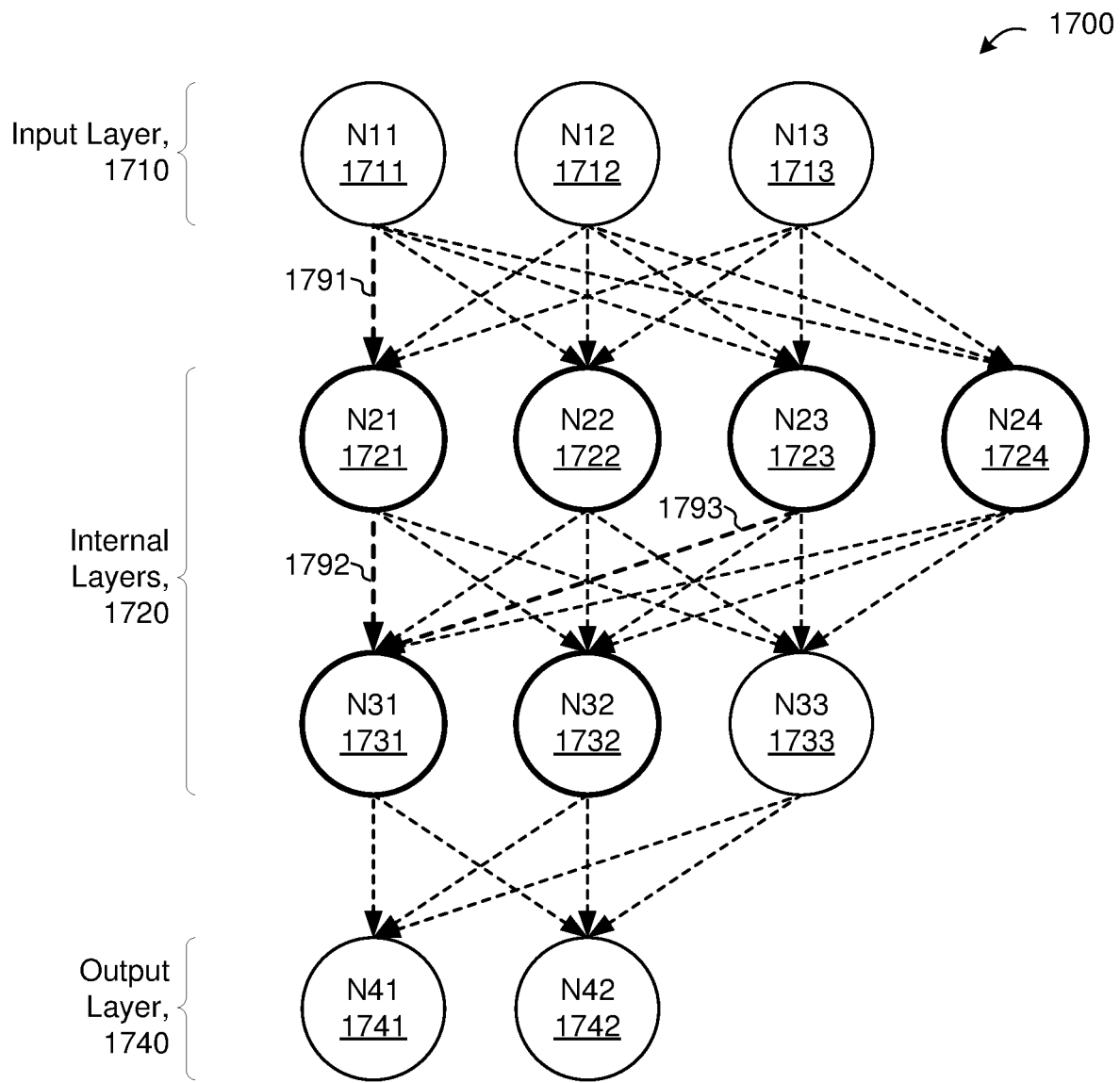
FIG. 17 illustrates selected details of an embodiment of a neural network.

FIG. 17 illustrates selected details of an embodiment of a neural network as Neural Network 1700. Network 1700 comprises three portions Input Layer 1710, Internal Layers 1720, and Output Layer 1740. Each layer comprises a plurality of neurons. Input Layer 1710, comprises neurons N11 1711, N12 1712, and N13 1713. Internal Layers 1720 comprises a first layer of neurons N21 1721, N22 1722, N23 1723, and N24 1724, followed by a second layer of neurons N31 1731, N32 1732, and N33 1733. Output Layer 1740 comprises neurons N41 1741 and N42 1742.

Selected neurons (N21 1721, N22 1722, N23 1723, and N24 1724 as well as N31 1731 and N32 1732) and communications (1791, 1792, and 1793) between the selected neurons are highlighted in the figure. The selected neurons and pathways are discussed in more detail following.

Figure 18A:
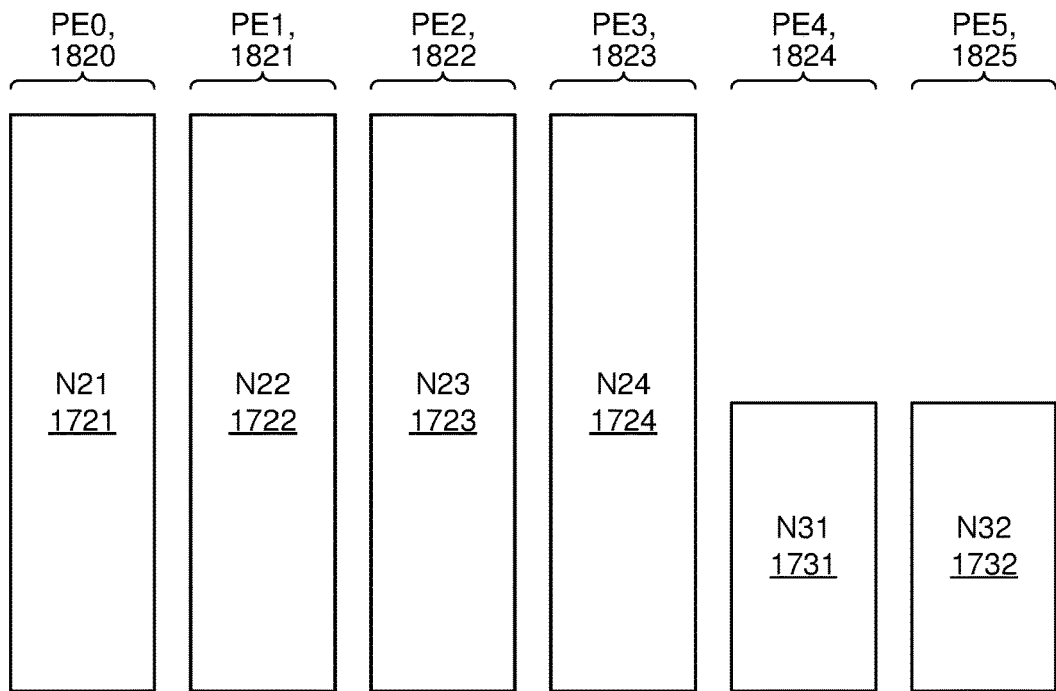
FIG. 18A illustrates selected details of a first embodiment of an allocation of processing elements to neurons.

FIG. 18A illustrates selected details of a first embodiment of an allocation of processing elements to neurons. Sometimes allocation of processing elements to neurons is referred to as placing neurons in processing elements or alternatively placement of neurons. Like numbered elements of FIG. 18A correspond to like numbered elements of FIG. 17. A first allocation of processing elements to a subset of neurons of FIG. 17 (the highlighted neurons N21 1721, N22 1722, N23 1723, and N24 1724 as well as N31 1731 and N32 1732) is conceptually illustrated. Vertical distance in the figure indicates relative usage of computational resources of each of five processing elements PE0 1820, PE1 1821, PE2 1822, PE3 1823, PE4 1824, and PE5 1825.

Each of neurons N21 1721, N22 1722, N23 1723, and N24 1724 represents approximately an equal amount of computational resources, e.g., M operations, K storage capacity, and J bandwidth to and from the storage. Each of neurons N31 1731 and N32 1732 represents approximately an equal amount of computational resources, e.g., M/2 operations, K/2 storage, and J/2 bandwidth. Thus, each of N31 1731 and N32 1732 represents approximately one half the computational resources of each of N21 1721, N22 1722, N23 1723, and N24 1724. In various embodiments, examples of computational resources comprise compute operations, storage capacity, read bandwidth from storage, write bandwidth to storage, input connections from other neurons, and output connections to other neurons.

In the illustrated embodiment, neuron processing is allocated such that each of the foregoing neurons is allocated to an entire PE. More specifically, N21 1721 is allocated to PE0 1820, N22 1722 is allocated to PE1 1821, N23 1723 is allocated to PE2 1822, N24 1724 is allocated to PE3 1823, N31 1731 is allocated to PE4 1824, and N32 1732 is allocated to PE5 1825. Therefore, four of the six processing elements are fully subscribed (PE0 1820, PE1 1821, PE2 1822, and PE3 1823), while two of the six processing elements are only one-half subscribed (PE4 1824 and PE5 1825).

Figure 18B:
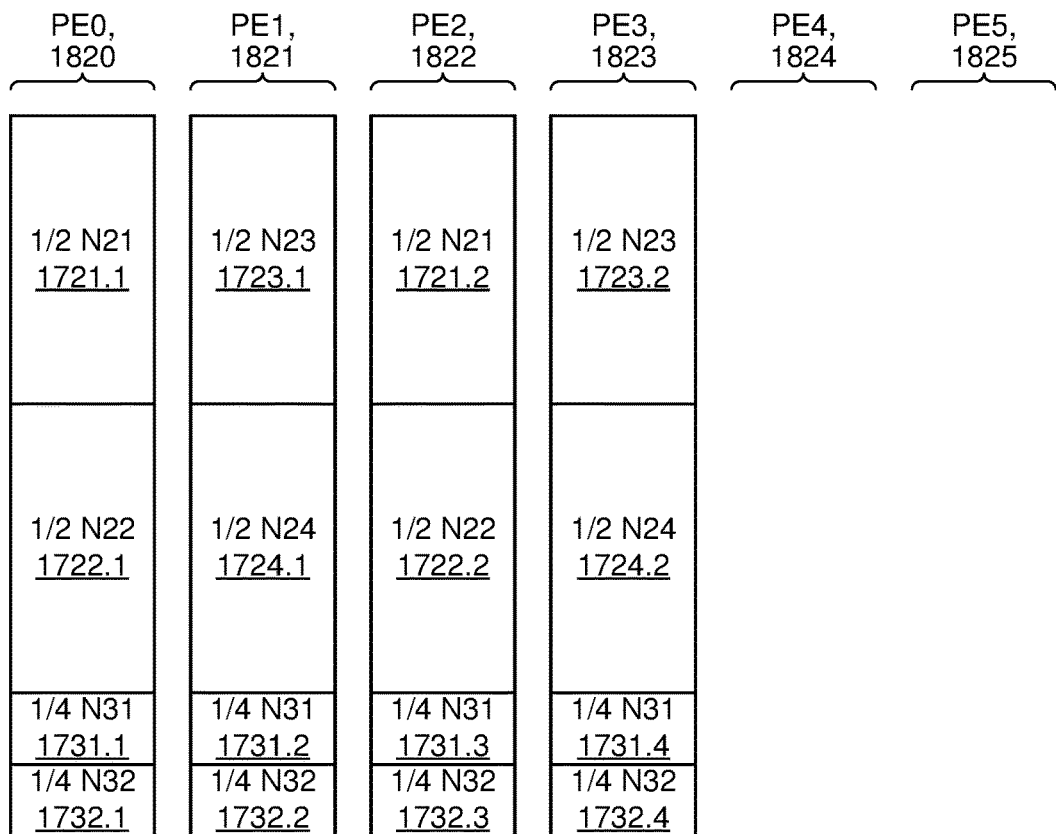
FIG. 18B illustrates selected details of a second embodiment of an allocation of processing elements to neurons.

FIG. 18B illustrates selected details of a second embodiment of an allocation of processing elements to neurons. Like numbered elements of FIG. 18B correspond to like numbered elements of FIG. 17 and FIG. 18A. A second allocation of processing elements to a subset of neurons of FIG. 17 (the highlighted neurons N21 1721, N22 1722, N23 1723, and N24 1724 as well as N31 1731 and N32 1732) is conceptually illustrated. As in FIG. 18A, vertical distance in the figure indicates relative usage of computational resources of each of five processing elements PE0 1820, PE1 1821, PE2 1822, PE3 1823, PE4 1824, and PE5 1825. Also as in FIG. 18A, each of N31 1731 and N32 1732 represents approximately one half the computational resources of each of N21 1721, N22 1722, N23 1723, and N24 1724.

In the illustrated embodiment, neuron processing is allocated such that processing for respective neurons is "smeared" across processing elements. Conceptually, neurons are "split" into portions suitable for processing elements to be allocated to. As illustrated in the figure, neurons are split and processing elements allocated so that four of the six processing elements are equally (and fully) subscribed (PE0 1820, PE1 1821, PE2 1822, and PE3 1823), while two of the six processing elements are completely unsubscribed and therefore available for other uses (PE4 1824, and PE5 1825). In some embodiments and/or usage scenarios, unsubscribed processing elements remain unused and consume little or no active and/or static power (e.g., via one or more of clock gating and power gating). More specifically, N21 1721 is allocated in two halves (½ N21 1721.1 and ½ N21 1721.2) to two respective processing elements (PE0 1820 and PE2 1822). Similarly, N22 1722 is allocated in two halves (½ N22 1722.1 and ½ N22 1722.2) to two respective processing elements (PE0 1820 and PE2 1822). N23 1723 is allocated in two halves (½ N23 1723.1 and ½ N23 1723.2) to two respective processing elements (PE1 1821 and PE3 1823) and N24 1724 is allocated in two halves (½ N24 1724.1 and ½ N24 1724.2) to two respective processing elements (PE1 1821 and PE3 1823). N31 1731 is allocated in four fourths (¼ N31 1731.1, ¼ N31 1731.2, ¼ N31 1731.3, and ¼ N31 1731.4) to four respective processing elements (PE0 1820, PE1 1821, PE2 1822, and PE3 1823). Similarly, N32 1732 is allocated in four fourths (¼ N32 1732.1, ¼ N32 1732.2, ¼ N32 1732.3, and ¼ N32 1732.4) to four respective processing elements (PE0 1820, PE1 1821, PE2 1822, and PE3 1823). In various embodiments, neurons are split and processing elements allocated based on one or more computational resources associated with the neurons. In some embodiments, neurons are split and processing elements allocated based on the hardware resources available in the processing elements (e.g., some neurons require specific hardware resources such as PRNGs).

Figure 19:
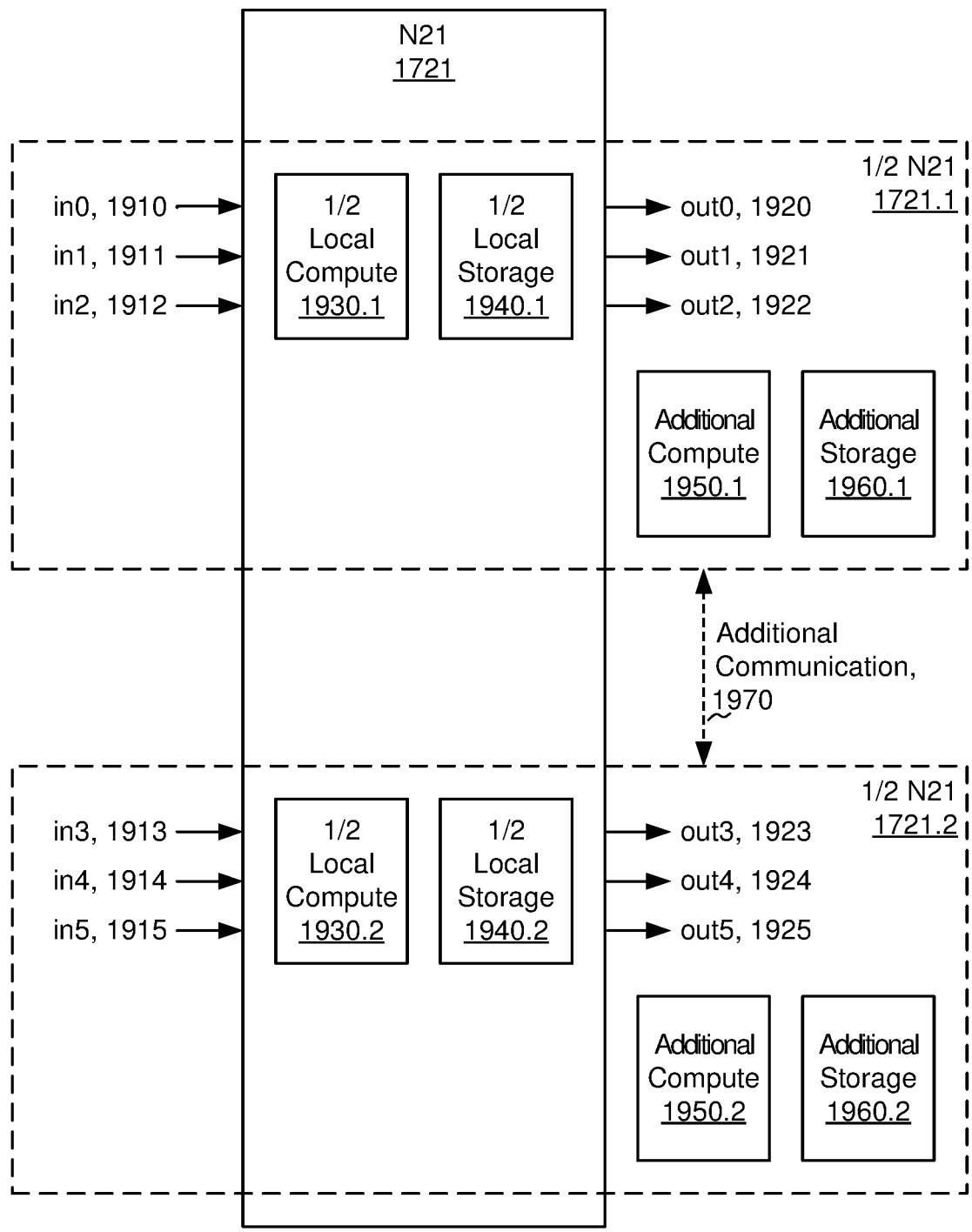
FIG. 19 illustrates selected details of an embodiment of smearing a neuron across a plurality of processing elements.

FIG. 19 illustrates selected details of an embodiment of smearing a neuron across a plurality of processing elements. The splitting results in portions of the split neuron that are then smeared across processing elements. Like numbered elements of FIG. 19 correspond to like numbered elements of FIG. 17, FIG. 18A, and FIG. 18B. As illustrated by FIG. 18B, N21 1721 is split into two portions ½ N21 1721.1 and ½ N21 1721.2 implemented respectively by PE0 1820 and PE2 1822.

Conceptually, N21 1721 is considered to comprise local compute and local storage, as well as inputs and outputs. Respective elements of N21 1721 are partitioned respectively. The local compute of N21 is partitioned into ½ Local Compute 1930.1 and ½ Local Compute 1930.2. The local storage of N21 is partitioned into ½ Local Storage 1940.1 and ½ Local Storage 1940.2. The inputs of N21 are partitioned into a first half in0 1910, in1 1911 and in2 1912 as well as a second half in3 1913, in4 1914, and in5 1915. The outputs of N21 are partitioned into a first half out0 1920, out1 1921, out2 1922 as well as a second half out3 1923, out4 1924, and out5 1925.

½ Local Compute 1930.1, ½ Local Storage 1940.1, in0 1910, in1 1911, in2 1912, out0 1920, out1 1921, and out2 1922 are implemented by PE0 1820. ½ Local Compute 1930.2, ½ Local Storage 1940.2, in3 1913, in4 1914, and in5 1915, out3 1923, out4 1924, and out5 1925 are implemented by PE2 1822.

In some embodiments and/or usage scenarios, smearing a neuron across more than one processing element comprises combining partial results from the portions of the smeared neuron into results corresponding to results of the entire (original non-smeared) neuron. The combining is implemented, e.g., at least in part by additional computation, additional storage, and/or additional communication that would not otherwise be performed/used by the entire neuron. Additional Compute 1950.1 and Additional Storage 1960.1 are representative of additional compute and additional storage for ½ N21 1721.1, and are implemented by PE0 1820. Additional Compute 1950.2 and Additional Storage 1960.2 are representative of additional compute and additional storage for ½ N21 1721.2, and are implemented by PE2 1822.

Additional Communication 1970 is representative of additional communication between ½ N21 1721.1 and ½ N21 1721.2, and is implemented by fabric connectivity between PE0 1820 and PE2 1822. In some embodiments and/or usage scenarios, all or any portions of Additional Communication 1970 is representative of communications that would occur internally to a single processing element if the single processing element entirely implemented N21 1721.

Figure 20:
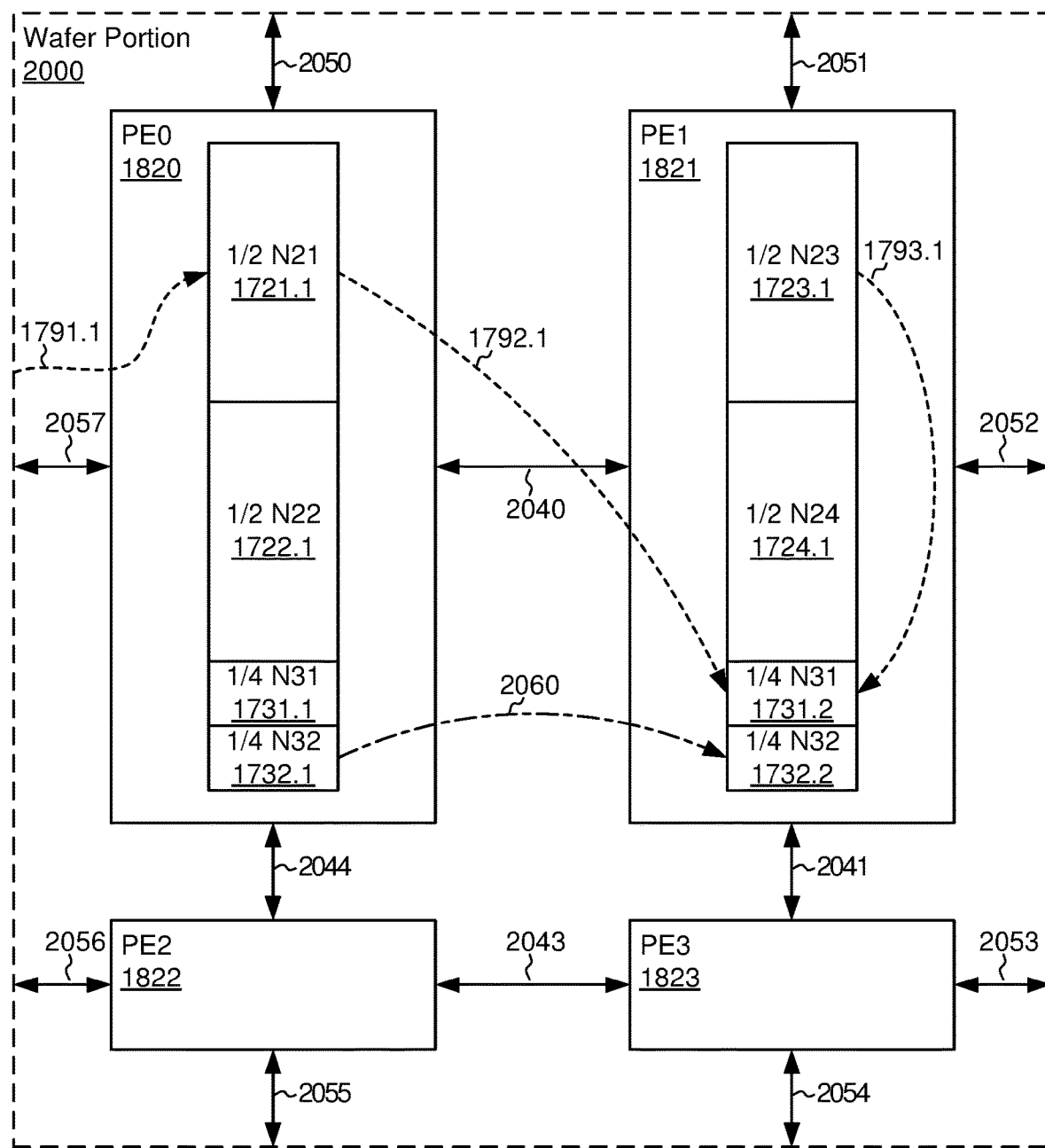
FIG. 20 illustrates selected details of an embodiment of communication between portions of split neurons.

FIG. 20 illustrates selected details of an embodiment of communication between portions of split neurons. Like numbered elements of FIG. 20 correspond to like numbered elements of FIG. 17, FIG. 18A, FIG. 18B, and FIG. 19. Allocations of PE0 1820, PE1 1821, PE2 1822, and PE3 1823 to neuron portions are as illustrated by FIG. 18B. For clarity, only allocations specific to PE0 1820 and PE1 1821 are illustrated.

Wafer Portion 2000 comprises PE0 1820, PE1 1821, PE2 1822, and PE3 1823. Couplings between PEs of Wafer Portion 2000 are illustrated as (coupling between adjacent PEs) 2040 coupling PE0 1820 and PE1 1821, 2041 coupling PE1 1821 and PE3 1823, 2043 coupling PE3 1823 and PE2 1822, and 2044 coupling PE2 1822 and PE0 1820. Couplings to PEs adjacent to Wafer Portion 2000 are illustrated as (portion of coupling between adjacent PEs) 2050, 2051, 2052, 2053, 2054, 2055, 2056, and 2057. The couplings to adjacent PEs are 'portions' since in some embodiments and/or usage scenarios, all or any portions of the couplings are comprised in wafer portions adjacent to Wafer Portion 2000, rather than entirely in Wafer Portion 2000. In various embodiments and/or usage scenarios, and as at least in part further described elsewhere herein, communication between processing elements over the couplings is via virtual channel, a type of logical coupling implemented by the routers within the processing elements, in accordance with a specified color of a wavelet, e.g., as determined by Neuron to PE Mapping SW 212 of FIG. 2 executing on Placement Server(s) 150 of FIG. 1. It is understood that a wavelet is a type of packet (a network packet), "fabric packet" refers to a packet that is fabric-transfer-enabled (enabled for and compatible with physical transfer over physical fabric couplings), "fabric vector" refers to fabric-transfer-enabled vector data, and the neuron smearing concepts herein (including but not limited to communication via virtual channels) apply to embodiments described in terms of communications, computations, or storage, using packets, fabric packets, or fabric vectors.

As a first example, communication portion 1791.1 conceptually represents a portion of communication 1791 between N11 1711 and N21 1721 (of FIG. 17), e.g., from an input layer to an internal layer, with portions of a split neuron in respective processing elements. More specifically, recall that N21 1721 is split into two portions (½ N21 1721.1 and ½ N21 1721.2; see FIG. 18B). Thus, communication 1791 is split into two portions. Communication portion 1791.1 is illustrative specifically of the portion that is with respect to ½ N21 1721.1. Communication portion 1791.1 is transported via (portion of coupling between adjacent PEs) 2057 between a PE adjacent to Wafer Portion 2000 to PE0 1820 (allocated to ½ N21 1721.1). In some embodiments and/or usage scenarios, communication 1791 is split into two portions, communication portion 1791.1 (illustrated) and communication portion 1791.2 (not illustrated). In some embodiments and/or usage scenarios, transport of communication portion 1791.1 and communication portion 1791.2 are via a same virtual channel In some embodiments and/or usage scenarios, transport of communication portion 1791.1 and communication portion 1791.2 are via respective unique virtual channels.

As a second example, communication portion 1792.1 conceptually represents a portion of communication 1792 between N21 1721 and N31 1731 (of FIG. 17), e.g., from a first internal layer to a second internal layer, with portions of split neurons in respective processing elements. More specifically, recall that N21 1721 is split into two portions (½ N21 1721.1 and ½ N21 1721.2; see FIG. 18B). Further recall that N31 1731 is split into four portions (¼ N31 1731.1, ¼ N31 1731.2, ¼ N31 1731.3, and ¼ N31 1731.4; see FIG. 18B). Thus, communication 1792 is split into portions. Communication portion 1792.1 is illustrative specifically of the portion that is with respect to ½ N21 1721.1 and ¼ N31 1731.2. Communication portion 1792.1 is transported via (coupling between adjacent PEs) 2040 between PE0 1820 (allocated to ½ N21 1721.1) and PE1 1821 (allocated to ¼ N31 1731.2). In various embodiments and/or usage scenarios, transport of communication portion 1792.1 (illustrated) and, e.g., other portions (not illustrated) of communication 1792 are via a same virtual channel, via unique virtual channels per portion, via virtual channels per portion associated with a particular neuron, and/or via virtual channels per portion associated with a particular processing element.

As a third example, communication portion 1793.1 conceptually represents a portion of communication 1793 between N23 1723 and N31 1731 (of FIG. 17), e.g., from a first internal layer to a second internal layer, with portions of split neurons in a same processing element. More specifically, recall that N23 1723 is split into two portions (½ N23 1723.1 and ½ N23 1723.2); see FIG. 18B). Further recall that N31 1731 is split into four portions (¼ N31 1731.1, ¼ N31 1731.2, ¼ N31 1731.3, and ¼ N31 1731.4; see FIG. 18B). Thus, communication 1793 is split into portions. Communication portion 1793.1 is illustrative specifically of the portion that is with respect to ½ N23 1723.1 and ¼ N31 1731.2. Communication portion 1793.1 is transported via one or more mechanisms internal to PE1 1821 (allocated to ½ N23 1723.1 and ¼ N31 1731.2). E.g., PE1 1821 uses internal resources (such as a router) to internally feedback an output as an input, and/or to internally provide an input from an output. In some embodiments and/or usage scenarios, transport of communication portion 1793.1 is via a virtual channel that results in an output being used as an input, and/or an input being provided from an output.

As a fourth example, communication 2060 conceptually represents all or any portions of Additional Communication 1970 (of FIG. 19), e.g., communications within a neuron that is split across processing elements. More specifically, communication 2060 illustrates specifically communications between two of the four portions that N32 1732 is split into (¼ N32 1732.1 and ¼ N32 1732.2; see FIG. 18B). Communication 2060 is transported via (coupling between adjacent PEs) 2040 between PE0 1820 (allocated to ¼ N32 1732.1) and PE1 1821 (allocated to ¼ N32 1732.2). In various embodiments and/or usage scenarios, communication 2060 is via virtual channel dedicated to communication 2060, a virtual channel shared with communication 2060 and communications between other portions of N32 1732, and a virtual channel shared with communication 2060 and all or any portions of neurons split across processing elements.

In some embodiments and/or usage scenarios, all or any portion of Wafer Portion 2000 comprises PEs 122 of FIG. 1. In some embodiments and/or usage scenarios, any one of PE0 1820, PE1 1821, PE2 1822, and PE3 1823 correspond to PE 497 of FIG. 4. In some embodiments and/or usage scenarios, any one or more of coupling between adjacent PEs 2041, 2040, 2043, and 2044 and/or portion of coupling between adjacent PEs 2050, 2051, 2052, 2053, 2054, 2055, 2056, and 2057 correspond to any one or more of North coupling 430, East coupling 431, South coupling 432, and West coupling 433 of FIG. 4.

Concepts relating to neuron smearing (e.g., as described with respect to and illustrated by FIG. 17, FIG. 18A, FIG. 18B, FIG. 19, and FIG. 20) are applicable to neural networks of various topologies and types, such as FCNNs, RNNs, CNNs, LSTM networks, autoencoders, deep belief networks, and generative adversarial networks.

In various embodiments and/or usage scenarios, neurons are split into same-sized portions, e.g., halves, fourths, eights, and so forth. In various embodiments and/or usage scenarios, neurons are split into different-sized portions, e.g., a first portion that is a half, and second and third portions that are respectively each fourths. In various embodiments and/or usage scenarios, neurons are split into arbitrarily-sized portions.

In various embodiments and/or usage scenarios, a multiplicity of PEs are allocated to a single neuron. In various embodiments and/or usage scenarios, a single PE is allocated to the respective entireties of a multiplicity of neurons.

In various embodiments and/or usage scenarios, allocation of PEs to neurons is entirely or partially responsive to static and/or dynamic measurements of computational and/or storage requirements. In various embodiments and/or usage scenarios, allocation of PEs to neurons is entirely or partially responsive to dimensionality of data to be processed.

In various embodiments and/or usage scenarios, dataflow as represented by directions of arrows is unidirectional (as illustrated by drawn arrowhead), bidirectional, and/or reverse-direction (against drawn arrowhead). As a specific example, in various embodiments and/or usage scenarios, communication 1792 (of FIG. 17) is representative of dataflow from N21 1721 to N31 1731 (e.g., during forward propagation) or in reverse from N31 1731 to N21 1721 (e.g., during back propagation). Thus, communication portion 1792.1 and therefore communication on (portion of coupling between adjacent PEs) 2040 occurs from PE0 1820 to PE1 1821 (e.g., during forward propagation) and in reverse from PE1 1821 to PE0 1820 (e.g., during back propagation).

In various embodiments and/or usage scenarios, each neuron has: associated storage for a weight per incoming activation, a partial sum accumulation computation, and an output activation function computation. For those scenarios in which single neurons are split across multiple PEs, the weights are respectively locally stored in the multiple PEs, multiply and accumulate operations are respectively locally performed in the multiple PEs, and locally generated partial sums are communicated via virtual channels to a particular PE for production of a final sum. The activation function following the final sum can be performed in the same particular PE or in another PE, all as determined by Neuron to PE Mapping SW 212 of FIG. 2 executing on Placement Server(s) 150 of FIG. 1. Non-zero activation outputs are communicated via virtual channels to neurons of a subsequent layer of the neural network.

In various embodiments and/or usage scenarios, the partial sums, the accumulations, and the activation functions, are implemented using all digital techniques, including digital logic and/or digital processing. In various embodiments and/or usage scenarios, exclusive of defects, the fabric comprises a homogenous collection of PEs enabled to perform digital arithmetic via one or more of: a task performing floating-point arithmetic, floating-point multiplier logic, fused multiply and accumulate digital logic, and floating-point addition using stochastic rounding. In various embodiments and/or usage scenarios, the PEs of the homogenous collection are further enabled to perform each activation functions as a nonlinear activation function selected from the group consisting of Rectified Linear Unit (ReLU), sigmoid, and tan h.

It is understood that the representation in FIG. 17 of a neural network is a type of dataflow graph, and the foregoing concepts relating to neural networks and neuron smearing apply to embodiments described in terms of a dataflow graph. In some embodiments and/or usage scenarios, nodes of the dataflow graph correspond to neurons, node slices correspond to split neurons, and one or more of the nodes are implemented using resources of a plurality of processing elements.

Vectors and Data Structure Descriptors

In various embodiments and/or usages scenarios, processing of one or more vectors, each vector comprising respective one or more of data elements, is performed. A vector is variously read from memory (e.g., of a CE of a PE, such as Memory 854 or D-Store 848 of FIG. 8), written to the memory, received from a fabric, or transmitted to the fabric. Vectors read from or written to the memory are sometimes referred to as 'memory vectors'. Vectors received from or transmitted to the fabric (e.g., as wavelets) are sometimes referred to as 'fabric vectors'. DSDs from DSRs (as well as XDXDs from XDSRs) are usable to determine addressing patterns for memory vectors and accessing patterns for fabric vectors.

Each element identifier in the description of FIGS. 21A-E, FIGS. 22A-B, and FIGS. 23-24 having a first digit of "8" refers to an element of FIG. 8, and for brevity is not otherwise specifically identified as being an element of FIG. 8.

FIG. 21A illustrates selected details of an embodiment of a Fabric Input Data Structure Descriptor (aka Fabric Input DSD), as Fabric Input Data Structure Descriptor 2100. In some embodiments, Fabric Input Data Structure Descriptor 2100 describes a fabric vector received by a PE from the fabric, as well as various parameters relating to processing of the fabric vector. In various embodiments and/or usage scenarios, either a source0 operand or a source1 operand of an instruction refers to a DSR containing an instance of a DSD in accordance with Fabric Input Data Structure Descriptor 2100.

Fabric Input Data Structure Descriptor 2100 comprises Length 2101, UTID (Microthread Identifier) 2102, UE (Microthread Enable) 2103, SW (SIMD Width) 2104, AC (Activate Color) 2105, Term (Terminate Microthread on Control Wavelet) 2106, CX (Control Wavelet Transform Enable) 2107, US (Microthread Sparse Mode) 2108, Type 2109, SS (Single Step) 2110, SA (Save Address/Conditional Single Step Mode) 2111, SC (Color Specified/Normal Mode) 2112, SQ (Queue Specified/Normal Mode) 2113, and CH (Color High) 2114.

In some embodiments, Length 2101 comprises a 15-bit integer specifying the length of the vector, e.g., the number of data elements in the vector.

In some embodiments, UE (Microthread Enable) 2103 comprises a 1-bit field indicating whether, under at least some conditions, microthreading is enabled during processing of the fabric vector, sometimes referred to as the fabric vector 'enabling microthreading'. If at least one operand (source or destination) of an instruction is a fabric vector enabling microthreading, then the instruction is referred to as a 'microthreaded instruction', and on either an input or output stall during processing an iteration of the instruction, processing is enabled to proceed (provided sufficient microthreading resource are available) to another instruction (e.g., of the same task, or of another task). When the stall is cleared, then processing (eventually) returns to the previously stalled instruction at the iteration that was stalled. An example input stall is when at least one element of an input fabric vector or a FIFO operand is not available as an input (e.g., a source data element). An example output stall is when there is insufficient space to buffer results associated with an element of an output fabric vector or a FIFO for an output (e.g., a destination data element). In some scenarios, a fabric vector that does not enable microthreading is processed synchronously and stalls processing on either an input or output stall. In some scenarios, a fabric vector that enables microthreading is processed asynchronously and reduces or avoids stalling the processing element on either an input or output stall. If a fabric vector enables microthreading, then the processing element is enabled to conditionally switch to processing a different instruction (instead of stalling) and subsequently resume processing the fabric vector at a later point in time (e.g., when data is available).

In some embodiments, UTID (Microthread Identifier) 2102 comprises a 3-bit field identifying one of a plurality of microthreads and/or resources associated with one of a plurality of microthreads. The microthreads and/or the resources are associated, e.g., with a fabric vector that enables microthreading. In some embodiments, the hardware provides resources for eight microthreads. In some embodiments and/or usage scenarios, UTID 2102 identifies or partially identifies one of Input Qs 897.

In some embodiments, SW (SIMD Width) 2104 comprises a 2-bit field specifying the number of operations (e.g., one, two, or four) that are, in some implementations, executed in parallel. For example, an FMACH, FADDH, FMULH or MOV16 instruction performs multiple (up to four) operations in parallel on respective operands. In some implementation, the SW field is used to determine how to parse wavelets into data versus index information. For example, when the SW field is four, then two wavelets, each having two data values (and no index values) provide four operands, e.g., in parallel. Continuing with the example, when the SW field is two, then a single wavelet having two data values (and no index value) provides two operands, e.g., in parallel. Continuing with the example, when the SW field is one, then a single wavelet having a single data value and a single index value provides a single operand.

In some embodiments, AC (Activate Color) 2105 comprises a 6-bit field specifying a color to activate (e.g., via an activate operation). In some scenarios, when processing is complete for a fabric vector that enables microthreading, the color specified by the AC field is activated and a task initiated based on the activated color. The completion of processing occurs, e.g., when all elements of the fabric vector have been processed, or when Term 2106 indicates to terminate upon encountering a control wavelet and a control wavelet is encountered while processing the fabric vector. In some embodiments, AC 2105 is enabled to specify one of: a local color and a fabric color.

In some embodiments, Term (Terminate Microthread on Control Wavelet) 2106 comprises a 1-bit field specifying whether to terminate upon receiving a control wavelet. If the wavelet at the head of the queue specified by Fabric Input Data Structure Descriptor 2100 (e.g., one of Input Qs 897 as variously specified by various functions of any combination of UTID 2102, SC 2112, and/or SQ 2113, as described elsewhere herein) is a control wavelet (e.g., Control Bit 1320 of FIG. 13A or Control Bit 1340 of FIG. 13B is asserted) and Term 2106 is asserted, then the instruction is terminated and the color specified by AC 2105 is activated.

In some embodiments, CX (Control Wavelet Transform Enable) 2107 comprises a 1-bit field specifying whether to transform control wavelets. If CX 2107 is asserted, then in response to receiving a control wavelet in the fabric vector, bits 15:6 of the index register are all '1's. In some embodiments and/or usage scenarios, if bits 15:6 of the index register are all '1's, then the control bits of any output wavelets associated with an output fabric vector referencing the index register are asserted.

In some embodiments, US (Microthread Sparse Mode) 2108 comprises a 1-bit field specifying whether a fabric vector that enables microthreading (e.g., via the UE field) is processed in a sparse mode. If US 2108 is asserted, then the fabric vector comprises a vector of sparse data elements and respective wavelet indices of the operand described by Fabric Input Data Structure Descriptor 2100. The indices are optionally and/or selectively used for address calculation of memory operands, dependent on WLI 2152 (of FIG. 21C).

In some embodiments, Type 2109 comprises a 3-bit field specifying a data structure type and/or how to interpret other fields of Fabric Input Data Structure Descriptor 2100. Type 2109 is "0" for all instances of Fabric Input Data Structure Descriptor 2100.

In some embodiments, SS (Single Step) 2110 comprises a 1-bit field specifying whether single step mode operation is enabled, under at least some conditions, for operations using the DSD as an operand. In some scenarios, an instruction with one or more operands that enable single step mode operates in single step mode.

In some embodiments, SA (Save Address/Conditional Single Step Mode) 2111 comprises a 1-bit field specifying whether save address mode operation is enabled, under at least some conditions, for operations using the DSD as an operand.

In some embodiments and/or usage scenarios, a color is activated and in response a task is initiated at an address based at least in part on the color. Once initiated, the task executes. In some scenarios, an input fabric vector is provided from the queue associated with the color of the currently executing task. In some embodiments, SC (Color Specified, Normal Mode) 2112 comprises a 1-bit field that if asserted, specifies that the input fabric vector is provided from a specific queue (e.g., one of Input Qs 897) associated with a specific fabric color. The specific fabric color is specified (e.g., as a 5-bit color) as a concatenation of lower bits UTID 2102 (comprising a 3-bit field) and upper bits CH 2114 (comprising a 2-bit field). In some embodiments, SQ (Queue Specified, Normal Mode) 2113 comprises a 1-bit field that if asserted, specifies that the input fabric vector is provided from a specific queue (e.g., one of Input Qs 897). If SQ 2113 is asserted, then the input fabric vector is provided from the one of Input Qs 897 specified by UTID 2102.

FIG. 21B illustrates selected details of an embodiment of a Fabric Output Data Structure Descriptor (aka Fabric Output DSD), as Fabric Output Data Structure Descriptor 2120. In some embodiments, Fabric Output Data Structure Descriptor 2120 describes a fabric vector created by a PE and transmitted over the fabric, as well as various parameters relating to processing of the fabric vector. In various embodiments and/or usage scenarios, a destination operand of an instruction refers to a DSR containing an instance of a DSD in accordance with Fabric Output Data Structure Descriptor 2120.

Fabric Output Data Structure Descriptor 2120 comprises Length 2121, UTID (Microthread Identifier) 2122, UE (Microthread Enable) 2123, SW (SIMD Width) 2124, Color 2126, C (Output Control Bit) 2127, Index Low 2128.1, Type 2129, SS (Single Step) 2130, SA (Save Address/Conditional Single Step Mode) 2131, WLI (Wavelet Index Select) 2132, Index High 2128.2, and AC (Activate Color) 2125.

In some embodiments, the elements of Fabric Output Data Structure Descriptor 2120 (Length 2121, UTID 2122, UE 2123, SW 2124, SS 2130, SA 2131, and AC 2125) are respectively similar in function and/or operation with respect to the elements of Fabric input Data Structure Descriptor 2100 (Length 2101, UTID 2102, UE 2103, SW 2104, SS 2110, SA 2111, and AC 2105).

In some embodiments, Color 2126 comprises a 5-bit field specifying the fabric color used to transmit wavelets associated with the fabric vector.

In some embodiments, C (Output Control Bit) 2127 comprises a 1-bit field specifying whether a wavelet is a control wavelet. If C 2127 is asserted, then any wavelets created based on the DSD are control wavelets (e.g., Control Bit 1320 of FIG. 13A is asserted).

In some embodiments, Index Low 2128.1 comprises a 3-bit field and Index High 2128.2 comprises a 3-bit field. The concatenation of Index Low 2128.1 and Index High 2128.2 is collectively referred to as Index 2128. In some scenarios, Index 2128 is used to form an index for a wavelet (e.g., Index 1321 of FIG. 13A).

In some embodiments, Type 2129 comprises a 3-bit field specifying a data structure type and/or how to interpret other fields of Fabric Output Data Structure Descriptor 2120. Type 2129 is "0" for all instances of Fabric Output Data Structure Descriptor 2120.

In some embodiments, WLI (Wavelet Index Select) 2132 comprises a 1-bit field specifying in part the index of the fabric vector. In some scenarios, if WLI 2132 is "1", then the index is the value from a register (e.g., GPR4 of RF 842). In some scenarios, if WLI 2132 is "0", then the index is a zero-extension to 16 bits of Index 2128.

FIG. 21C illustrates selected details of an embodiment of a 1D Memory Vector Data Structure Descriptor (aka 1D Memory Vector DSD), as 1D Memory Vector Data Structure Descriptor 2140. In some embodiments, 1D Memory Vector Data Structure Descriptor 2140 describes a one-dimensional memory vector stored in the memory, as well as various parameters relating to processing of the memory vector. In various embodiments and/or usage scenarios, any one or more of a source0 operand, a source1 operand, and a destination operand of an instruction refer to respective DSRs containing respective instances of DSDs in accordance with 1D Memory Vector Data Structure Descriptor 2140.

1D Memory Vector Data Structure Descriptor 2140 comprises Length 2141, Base Address 2142, Type 2149, SS (Single Step) 2150, SA (Save Address/Conditional Single Step Mode) 2151, WLI (Wavelet Index Select) 2152, and Stride 2153.

In some embodiments, some of the elements of 1D Memory Vector Data Structure Descriptor 2140 (Length 2141, SS 2150, and SA 2151) are respectively similar in function and/or operation with respect to some of the elements of Fabric Input Data Structure Descriptor 2100 (Length 2101, SS 2110, and SA 2111). In some scenarios, if the length of the memory vector is more than 15 bits, then 4D Memory Vector Data Structure Descriptor 2140 is used.

In some embodiments, Base Address 2142 comprises a 15-bit integer specifying the base address of the memory vector.

In some embodiments, Type 2149 comprises a 3-bit field specifying a data structure type and/or how to interpret other fields of 1D Memory Vector Data Structure Descriptor 2140. Type 2149 is "1" for all instances of 1D Memory Vector Data Structure Descriptor 2140.

In some embodiments, WLI (Wavelet Index Select) 2152 comprises a 1-bit field specifying in part the index of the vector. If WLI 2152 is "0", then the index is 0. In some scenarios, if WLI 2152 is "1", then the index is the value from a register (e.g., GPR4 of RF 842) or the index of a sparse wavelet (e.g., Index 1321 of FIG. 13A).

In some embodiments, Stride 2153 comprises a 9-bit signed integer specifying the stride of the vector. In some scenarios, Base Address 2142, an index specified by WLI 2153, and Stride 2153 enable calculating addresses of data elements in a 1D memory vector. The address of the first data element in the 1D memory vector is Base Address 2142 plus the index specified by WLI 2153. The address of the next data element in the 1D vector is the address of the first data element plus Stride 2153. For example, Base Address 2142 is 136, WLI 2153 is 1, GPR4 holds the value 6, Stride 2153 is –2, and Length 2141 is 10, then the memory vector comprises data located at addresses {142, 140, 138, ..., 124}. In some scenarios, if the stride of the memory vector is more than nine bits, then 4D Memory Vector Data Structure Descriptor 2140 is used.

FIG. 21D illustrates selected details of an embodiment of a 4D Memory Vector Data Structure Descriptor (aka 4D Memory Vector DSD), as 4D Memory Vector Data Structure Descriptor 2160. In some embodiments, 4D Memory Vector Data Structure Descriptor 2160, in conjunction with 4D Memory Vector Extended Data Structure Descriptor 2240 of FIG. 22B, describe a 4-dimensional memory vector stored in the memory, as well as various parameters relating to processing of the memory vector. In some embodiments, 4D Memory Vector Data Structure Descriptor 2160, in conjunction with 4D Memory Vector Extended Data Structure Descriptor 2240 of FIG. 22B, describe a two-dimensional or three-dimensional memory vector stored in the memory, as well as various parameters relating to processing of the memory vector. In various embodiments and/or usage scenarios, any one or more of a source0 operand, a source1 operand, and a destination operand of an instruction refer to respective DSRs containing respective instances of DSDs in accordance with 4D Memory Vector Data Structure Descriptor 2160.

4D Memory Vector Data Structure Descriptor 2160 comprises Length Lower Bits 2161.1, Base Address 2162, Type 2169, SS (Single Step) 2170, SA (Save Address/Conditional Single Step Mode) 2171, WLI (Wavelet Index Select) 2172, and Length Upper Bits 2161.2.

In some embodiments, some of the elements of 4D Memory Vector Data Structure Descriptor 2160 (Base Address 2162, SS 2170, SA 2171, and WLI 2172) are respectively similar in function and/or operation with respect to 1D Memory Vector Data Structure Descriptor 2140 (Base Address 2142, SS 2150, SA 2151, and WLI 2152).

In some embodiments, Lower Bits 2161.1 comprises a 15-bit field and Length Upper Bits 2161.2 comprises a 9-bit field. The concatenation of Lower Bits 2161.1 and Length Upper Bits 2161.2 is collectively referred to (and illustrated as) Length 2161 (a 24-bit field) interpreted in conjunction with 4D Memory Vector Extended Data Structure Descriptor 2240.

In some embodiments, Type 2169 comprises a 3-bit field specifying an extended DSR (XDSR), storing, e.g., an extended DSD (XDSD). The XDSD specifies and describes one of: a circular memory buffer (e.g., Circular Memory Buffer Extended Data Structure Descriptor 2210 of FIG. 22A) and a four-dimensional memory vector (e.g., 4D Memory Vector Extended Data Structure Descriptor 2240 of FIG. 22B).

FIG. 21E illustrates selected details of an embodiment of a Circular Memory Buffer Data Structure Descriptor (aka Circular Memory Buffer DSD), as Circular Memory Buffer Data Structure Descriptor 2180. In some embodiments, Circular Memory Buffer Data Structure Descriptor 2180, in conjunction with Circular Memory Buffer Extended Data Structure Descriptor 2210, describes one of: a circular buffer of data elements stored in the memory and a FIFO of data elements stored in the memory; as well as various parameters relating to processing of the data elements. In various embodiments and/or usage scenarios, any one or more of a source0 operand, a source1 operand, and a destination operand of an instruction refer to respective DSRs containing respective instances of DSDs in accordance with Circular Memory Buffer Data Structure Descriptor 2180.

Circular Memory Buffer Data Structure Descriptor 2180 comprises Length 2181, Base Address 2182, FW (FIFO Wrap Bit) 2188, Type 2189, SS (Single Step) 2190, SA (Save Address/Conditional Single Step Mode) 2191, WLI (Wavelet Index Select) 2192, and SW (SIMD Width) 2184.

In some embodiments, a circular memory buffer access always has an index of zero and a stride of one.

In some embodiments, some of the elements of Circular Memory Buffer Data Structure Descriptor 2180 (Length 2181, Base Address 2182, SS 2190, and SA 2191) are respectively similar in function and/or operation with respect to some of the elements of 1D Memory Vector Data Structure Descriptor 2140 (Length 2141, Base Address 2142, SS 2150, and SA 2151). In some embodiments, Type 2189 is similar in function and/or operation to Type 2169 of 4D Memory Vector Data Structure Descriptor 2160. In some embodiments, SW 2184 of Circular Memory Buffer Data Structure Descriptor 2180 is similar in function and/or operation to SW 2104 of Fabric Input Data Structure Descriptor 2100.

In some embodiments, FW (FIFO Wrap Bit) 2188 comprises a 1-bit field enabling distinguishing between a full FIFO and an empty FIFO. FW (FIFO Wrap Bit) 2188 is toggled when an access wraps around the address range of the FIFO.

In some embodiments, WLI 2192 has no impact on the index of a circular buffer.

FIG. 22A illustrates selected details of an embodiment of a Circular Memory Buffer Extended Data Structure Descriptor, as Circular Memory Buffer Extended Data Structure Descriptor 2210. Circular Memory Buffer Extended Data Structure Descriptor 2210 comprises Type 2211, Start Address 2212, End Address 2213, FIFO 2214, Push (Activate) Color 2215, and Pop (Activate) Color 2216.

In some embodiments, Type 2211 comprises a 1-bit field specifying the type of data structure. Type 2211 is "1" for all instances of Circular Memory Buffer Extended Data Structure Descriptor 2210.

In some embodiments, Start Address 2212 comprises a 15-bit field specifying the start address of the circular buffer in the memory. In some embodiments, End Address 2213 comprises a 15-bit integer specifying the end address of the circular buffer in the memory. When an address is incremented (e.g., by the stride to initiate the next access) and equals End Address 2213, the address is reset to Base Address 2212, thereby providing circular access behavior.

In some embodiments, FIFO 2214 comprises a 1-bit field specifying whether the circular buffer is a FIFO. If FIFO 2214 is "0", then the circular buffer is not a FIFO. If FIFO 2214 is "1", then the circular buffer is a FIFO.

In some embodiments, Push (Activate) Color 2215 and Pop (Activate) Color 2216 comprise 6-bit fields specifying colors to activate (e.g., via an activate operation). In some embodiments, Push (Activate) Color 2215 and Pop (Activate) Color 2216 are enabled to specify ones of: a local color and a fabric color.

In various embodiments, two circular memory buffer DSRs are enabled to describe a FIFO of data elements stored in a same region of the memory. A destination DSR (e.g., DDSR8) describes a write pointer of the FIFO, and a source1 DSR (e.g., S1DSR8) describes a read pointer of the FIFO. In some embodiments, destination and source1 DSRs have a same identifier. In various embodiments, only some of DSRs 846 are enabled to describe FIFOs, (e.g., DDSR8-DDSR11 and S1DSR8-S1DSR11).

FW (FIFO Wrap Bit) 2188 of the two DSRs enables detecting if a FIFO is full or empty. When a FIFO is used as a destination, Base Address 2182 and FW 2188 of the associated S1DSR is read and compared to values from the DDSR. If Base Address 2182 of the two DSRs are the same, but FW 2188 are different, then the FIFO is full. When a FIFO is used as a source, Base Address 2182 and FW 2188 of the associated DDSR are read and compared to values from the S1DSR. If Base Address 2182 of the two DSRs are the same and FW 2188 are the same, then the FIFO is empty. In some scenarios (e.g., microthreading), in response to a read accessing an empty FIFO or a write accessing a full FIFO, processing is switched to an instruction in another task until the FIFO is respectively not empty or not full.

In some embodiments and/or usage scenarios, software (e.g. Task SW on PEs 260 of FIG. 2) configures and operates a FIFO as an extension of queues of a PE. For example, a FIFO is enabled to store data elements to provide capacity in addition to one or more queues of Input Qs 897 and Output Queues 859. As another example, a FIFO is enabled to provide additional capacity for the fabric connecting PEs by buffering wavelets.

FIG. 22B illustrates selected details of an embodiment of a 4D Memory Vector Extended Data Structure Descriptor, as 4D Memory Vector Extended Data Structure Descriptor 2240. In some embodiments, 4D Memory Vector Extended Data Structure Descriptor 2240 partially describes a four-dimensional vector of data elements stored in the memory. 4D Memory Vector Extended Data Structure Descriptor 2240 comprises Type 2241, Dimensions 2242, DF (Dimension Format) 2243, Select Stride 1 2244.1, Select Stride 2 2244.2, Select Stride 3 2244.3, Select Stride 4 2244.4, and Stride 2245. In some embodiments, 4D Memory Vector Extended Data Structure Descriptor 2240 comprises 51 bits.

In some embodiments, Type 2241 comprises a 1-bit field specifying the type of data structure. Type 2241 is "0" for all instances of 4D Memory Vector Extended Data Structure Descriptor 2240.

In some embodiments, Dimensions 2242 comprises a 20-bit field used to initialize the length of the next dimension of the vector.

In some embodiments, DF (Dimension Format) 2243 comprises a 5-bit field that, in conjunction with Length 2161 of FIG. 21D, specifies the length of each dimension of the N-dimensional vector. Conceptually, Length 2161 is divided into six consecutive 4-bit nibbles and each dimension is expressed using one or more of the nibbles. Bits are asserted in DF 2243 to indicate demarcations between the dimensions in Length 2161. For example, DF 2242 is "01110" (binary), indicating that the first dimension is expressed using two nibbles, e.g., bits [7:0], and represents a length between 1 and 128. Similarly, the second dimension is expressed using one nibble, e.g., bits [11:8], and represents a length between 1 and 4. An N-dimension vector is represented by asserting (N−1) bits in DF 2242, and only the last dimension uses more than four nibbles. In some embodiments and/or usage scenarios, a one-dimensional vector is described using this format, e.g., if the vector is too long for Length 2141 (of FIG. 21C) to describe. In some embodiments and/or usage scenarios, a two-dimensional or three-dimensional vector is described using this format.

In some embodiments, Select Stride 1 2244.1 comprises a 1-bit field specifying a stride for the first dimension of the vector. If Select Stride 1 2244.1 is "0", then the stride is 1. If Select Stride 1 2244.1 is "1", then the stride is specified by Stride 2245.

In some embodiments, Select Stride 2 2244.2 comprises a 3-bit field and encodes a stride for the second dimension of the vector. If Select Stride 2 2244.2 is "0", then the stride is 1. If Select Stride 2 2244.2 is "1", then the stride is specified by Stride 2245. If Stride Select 2 2244.2 is 2-7, then the stride is specified by a corresponding (DSR) stride register (e.g., of the six stride registers of DSRs 846.

In some embodiments, Select Stride 3 2244.3 and Select Stride 4 2244.4 comprise respective 3-bit fields. In some embodiments, Select Stride 3 2244.3 and Select Stride 4 2244.4 are respectively similar in function and/or operation with respect to the third and fourth dimension as Select Stride 2 2244.2 is with respect to the second dimension.

In some embodiments, Stride 2245 comprises a 15-bit field specifying a stride of the vector in the memory. In some scenarios, Stride 2245 enables using a longer stride for a one-dimensional vector than Stride 2153 (of FIG. 21C).

FIG. 23 illustrates selected details of an embodiment of accessing operands in accordance with data structure descriptors, as Data Structure Descriptor Flow 2300. In some embodiments, actions of Data Structure Descriptor Flow 2300 are performed by a CE (e.g., CE 800).

Accessing a source operand via a data structure descriptor begins (Start 2301) by initializing one or more DSRs of a CE of a PE with respective DSDs (Set DSR(s) 2302) and optionally initializing respective XDSDs and/or stride values of the CE ((optional) Set XDSR(s) 2305). In some embodiments, the initialized DSRs (as well as the optionally initialized XDSRs and stride registers holding the stride values) are initialized by instructions that move data from memory to the DSRs. Subsequently, the CE fetches and decodes an instruction (e.g., FMACH, MOV, or LT16) comprising one or more operands specified by the initialized DSRs and optionally one or more XDSRs and/or stride registers (Fetch/Decode Instruction with DSR(s) 2303). In some embodiments, the operand type fields of the instruction specify whether an operand is specified by a DSR.

The CE reads one or more DSDs from the DSRs (Read DSR(s) 2304) and determines one or more of: the type of data structure, the source of the data element(s), whether multiple data elements are read together (e.g., for a SIMD operation), and the total number of data elements for each operand. Depending on the determination, for each DSD read, an XDSR and one or more stride registers are also optionally read ((optional) Read XDSR(s) 2306), as described with respect to FIG. 24. In some scenarios, DSRs are read for one or more of: a source0 operand, a source1 operand, and a destination operand, and are identified by respective operand fields of the instruction obtained in action 2303. In some embodiments and/or usage scenarios, any one or more of the DSRs, the XDSRs and the stride registers are read entirely or partially in parallel, and in other embodiments and/or usage scenarios, any one or more of the DSRs, the XDSRs and the stride registers are read entirely or partially sequentially.

Based upon the DSDs obtained in action 2304 (and optional XDSRs and stride values obtained in action 2306), the CE reads one or more source data element(s) from the fabric and/or memory (Read (Next) Source Data Element(s) from Queue/Memory 2310). For each source specified by the instruction obtained in action 2303 (e.g., each of source0 and source1), the CE reads sufficient elements for an iteration of the operation specified in the instruction, and in accordance with SIMD width information in the DSDs. In some embodiments and/or usage scenarios, sufficient elements for an iteration is at least one element and no more than the number indicated by the SIMD width information. In various embodiments, sufficient elements is no more than the number of elements comprised by one or two entries in a queue of Input Queues 897 and no more than the number of elements comprised by one or two entries in a queue of Output Queues 859. Data element(s) from the fabric (e.g., a source data structure is a fabric vector) are accessed via one or more queues of the CE. In some embodiments and/or usage scenarios, the CE also reads data element(s) from registers.

After reading the source data element(s), the CE performs the operation using the data element(s) as inputs (Perform (Next) Operation(s) on Data Element(s) 2311). The operation is specified by the instruction obtained in action 2303 (e.g., a multiply-accumulate operation for an FMACH instruction, a move operation for a MOV instruction, or a less than integer comparison for LT16).

In some scenarios, the operation (e.g., a multiply-accumulate operation or a move operation) produces one or more output data element(s). The CE writes the output data element(s) to the fabric or the memory (Write (Next) Destination Data Element(s) to Queue/Memory 2312), based upon the DSDs obtained in action 2304 (and optional XDSRs and stride values obtained in action 2306). Data element(s) sent to the fabric (e.g., the destination data structure is a fabric vector) are formed into wavelets and transmitted to the fabric via the router of the PE. In some other scenarios, there are no output data elements (e.g., some comparison operations).

After writing any results from the operation, the CE determines if there are additional data element(s) to process (More Data Element(s)? 2313). In some embodiments, the DSD specifies the total number of data elements to access (e.g., the length of the vector) and the CE compares the number of data element(s) that have been accessed (e.g., tracked via a counter) to the total number of data element(s) specified by the length. If there are additional data element(s) to process, the CE repeats actions 2310-2313 until all data element(s) have been processed and flow concludes (End 2316).

In various embodiments and/or usage scenarios, all or any portions of any one or more of elements of Data Structure Descriptor Flow 2300 (e.g., any one or more actions of 2302-2312) correspond conceptually to and/or are related conceptually to operations performed by and/or elements of a CE, e.g., CE 800.

As an example, the source DSRs holding source DSDs (associated with Set DSR(s) 2302 and Read DSR(s) 2304) are one or more of DSRs 846 (e.g., S0DSRs, S1DSRs, DDSRs, XDSRs, and stride registers). In some embodiments, CE 800 performs Set DSR(s) 2302 responsive to instruction(s) that write DSDs into DSRs, e.g., LDS0WDS, LDS1WDS, LDXDS, and LDSR.

As another example, CE 800 performs Fetch/Decode Instruction with DSR(s) 2303. In various embodiments, PC 834 and I-Seq 836 fetch instructions from Memory 854 and Dec 840 decodes fetched instructions. In some embodiments, instructions are formatted in accordance with one of: Multiple Operand Instruction 2510 of FIG. 25A, One Source, No Destination Operand Instruction 2520 of FIG. 25B, and Immediate Instruction 2530 of FIG. 25C. In some embodiments, decoding includes detecting that an instruction operand is specified by a DSD, e.g., that the value of Operand 1 Type 2514.1 is "1".

As another example, CE 800 performs Read DSR(s) 2304 in response to an instruction with one or more operands specified by a DSR. In various embodiments, D-Seq 844 reads the DSR(s) specified by the instruction obtained in action 2303 from DSRs 846. In some embodiments, DSDs read from the DSRs are formatted in accordance with one or more of: Fabric Input Data Structure Descriptor 2100 of FIG. 21A, Fabric Output Data Structure Descriptor 2200 of FIG. 21B, 1D Memory Vector Data Structure Descriptor 2140 of FIG. 21C, 4D Memory Vector Data Structure Descriptor 2160 of FIG. 21D, and Circular Memory Buffer Data Structure Descriptor 2180 of FIG. 21E. In some embodiments and/or usage scenarios, D-Seq 844, e.g., responsive to DSDs having Type 2169 or Type 2189 specifying an XDSR, performs (optional) Read XDSR(s) 2306. In various embodiments, XDSDs read from the XDSRs are formatted in accordance with one of: Circular Memory Extended Buffer Data Structure Descriptor 2180 of FIG. 22A and 4D Memory Vector Extended Data Structure Descriptor 2160 of FIG. 22B.

As another example, CE 800 performs Read (Next) Source Data Element(s) from Queue/Memory 2310 based upon the source DSD(s) read in action 2304 and optionally XDSD(s) read in action 2306. In some scenarios, a source DSD specifies (e.g., via Type 2149) that an operand originates from memory, and D-Seq 844 reads data element(s) from D-Store 848 or Memory 854 at address(es) specified by the DSD (e.g., based in part upon one or more of: Base Address 2142, WLI 2152, and Stride 2153). In some scenarios, a source DSD specifies (e.g., via Type 2109) that an operand originates from the fabric and CE 800 reads data element(s) from one of Input Qs 897. In some embodiments and/or usage scenarios, data elements are directly transmitted from one of Input Qs 897 to Data Path 852. In other embodiments and/or usage scenarios, data elements are transmitted from one of Input Qs 897 to RF 842 and from RF to Data Path 852. In some embodiments, the one of Input Qs 897 is implicitly specified by portions of the DSD (e.g., one or more of: UTID 2102, SC 2112, and SQ 2113). In some scenarios, the CE reads from the queue associated with the color of the current task (e.g., the task associated with the instruction obtained in action 2303). In some scenarios (e.g., SQ 2113 is "1"), the CE reads from a queue specified by UTID 2102. In some scenarios (e.g., SC 2112 is "1"), the CE reads from a queue associated with the color specified by UTID 2102 concatenated with CH 2114. In some scenarios, the CE reads one, two, or four data elements from the specified queue based upon SW 2104.

In some embodiments and/or usage scenarios, when CE 800 attempts to read more data element(s) than are available in the specified queue of Input Qs 897, or alternatively attempts to read from an empty FIFO (e.g., as implemented in accordance with a DSD in accordance with FIG. 21E), then CE 800 stalls. In some embodiments and/or usage scenarios (e.g., microthreading), Picker 830 is enabled to select a different task from Input Qs 897 while waiting for the data element(s), thereby enabling CE 800 to avoid stalling. Microthreading is described in more detail in FIG. 26 and section "Microthreading".

As another example, CE 800 performs Perform (Next) Operation(s) on Data Element(s) 2311. In some embodiments, Data Path 852 uses the data element(s) read in action 2310 as inputs to the operation specified by the instruction obtained in action 2303. In some scenarios (e.g., a computational operation), action 2311 produces output data element(s), while in other scenarios (e.g., a comparison operation), action 2311 produces no output data element. In some embodiments, Data Path 852 is enabled to perform more than one operation simultaneously (e.g., in an iteration), e.g., performing two or four multiply-accumulate operations simultaneously using SIMD execution resources.

As another example, CE 800 performs Write (Next) Source Data Element(s) to Queue/Memory 2312 based upon the destination DSD read in action 2304 and optionally XDSD(s) read in action 2306. In some scenarios, the destination DSD specifies (e.g., via Type 2149) that an operand is destined for memory, and D-Seq 844 writes data element(s) to D-Store 848 or Memory 854 at address(es) specified by the destination DSD (e.g., based in part upon one or more of: Base Address 2142, WLI 2152, and Stride 2153).

In various embodiments and/or usage scenarios, portions of action 2312 (e.g., writing destination data elements to the fabric) correspond conceptually to and/or are related conceptually to Provide Data Element(s) as Wavelet to Output Queue 1408 of FIG. 14. In some scenarios, a destination DSD specifies (e.g., via Type 2129) that an operand is sent to the fabric and CE 800 creates wavelet(s) (e.g., based in part upon Fabric Output Data Structure Descriptor 2120) from the data element(s) and transmits them via Output Queues 859 and On Ramp 860 to Router 600 (of FIG. 6) to the fabric. In some scenarios, the CE transmits one, two, or four data elements as wavelets, based upon SW 2124 of the destination DSD.

In some embodiments and/or usage scenarios, when CE 800 attempts to transmit more wavelets than resources available in Router 600 (e.g., there are insufficient resources in Data Queues 650 of FIG. 6), or alternatively attempts to write to a full FIFO (e.g., as implemented in accordance with a DSD in accordance with FIG. 21E), then CE 800 stalls. In some embodiments and/or usage scenarios (e.g., microthreading), Picker 830 is enabled to select a different task from Input Qs 897 while waiting for more resources, thereby enabling CE 800 to avoid stalling. Microthreading is described in more detail in FIG. 26 and section "Microthreading".

As another example, CE 800 performs action 2313. In some embodiments, D-Seq 844 determines how many data element(s) have been processed (e.g., by incrementing a counter for each data element) and compares this against the length of the vector (e.g., Length 2101).

Figure 24:
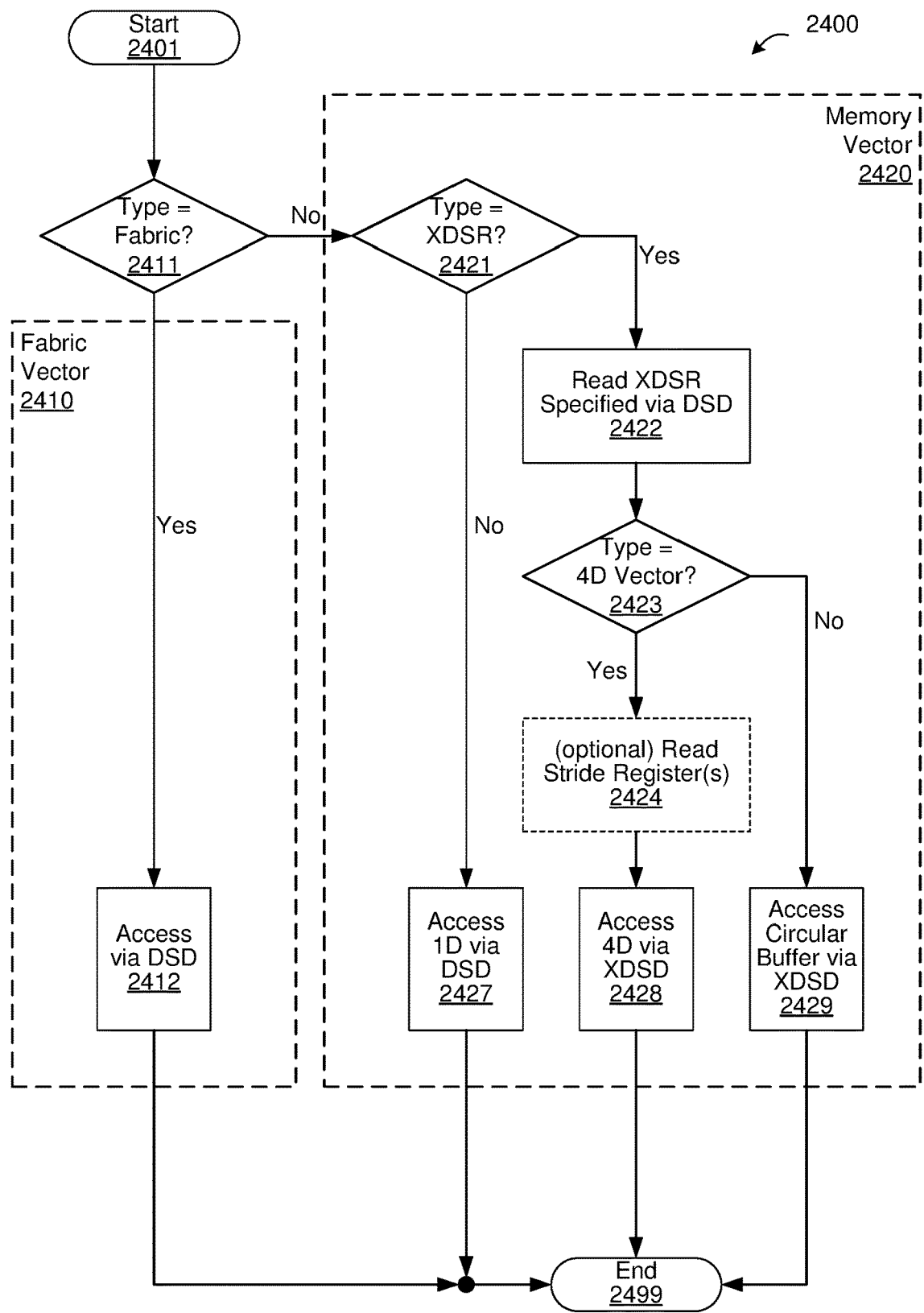
FIG. 24 illustrates selected details of an embodiment of decoding a data structure descriptor.

FIG. 24 illustrates selected details of an embodiment of decoding a data structure descriptor, as Data Structure Descriptor Decode Flow 2400. In various embodiments and/or usage scenarios, Memory Data Structure Descriptor Flow 2400 is a conceptual representation of all or any portions of actions 2304, 2306, 2310, and 2312 (of FIG. 23) as performed for each DSR describing a fabric or a memory vector. In summary, FIG. 23 illustrates fetching and decoding an instruction comprising one or more operands specified by initialized DSRs, reading the DSRs to obtain and decode corresponding DSDs, reading (next) source data elements in accordance with the DSDs, performing an operation on the source data elements, writing output data elements of the operation in accordance with the DSDs, and iterating back to reading the next source data elements until complete. FIG. 24 illustrates, for fabric vectors (Fabric Vector 2410) and memory vectors (Memory Vector 2420), further details regarding decoding the DSDs obtained from the DSRs, as well as optionally reading one or more XDSRs and stride registers to obtain and decode corresponding XDSDs and stride values, to determine memory access patterns used to access data elements of the memory vectors of the instruction (e.g., any one or more of source0, source1, and destination). Conceptually, the actions illustrated in FIG. 24 are performed for each DSD obtained via action 2304 of FIG. 23. In some embodiments, actions of Memory Data Structure Descriptor Flow 2400 are performed by a CE (e.g., CE 800).

Decoding a DSD (e.g., as obtained via action 2304 of FIG. 23) begins (Start 2401) by the CE determining whether the DSD corresponds to a fabric vector (Type=Fabric? 2411), e.g., in accordance with FIG. 21A or FIG. 21B. If so, then accesses of the operand described by the DSD proceed as a fabric vector using the DSD (Access via DSD 2412), e.g., if the operand is a source (FIG. 21A), then action 2310 (of FIG. 23) reads from the fabric in accordance with the DSD, and if the operand is a destination (FIG. 21B), then action 2312 (of FIG. 23) writes to the fabric in accordance with the DSD. Decoding the DSD is then complete (End 2499).

If the DSD does not correspond to a fabric vector, then the DSD corresponds to a memory vector. The CE then determines whether the DSD corresponds to a 1D memory vector (Type=XDSR? 2421), e.g., in accordance with FIG. 21C. If so, then accesses of the operand described by the DSD proceed as a 1D memory vector using the DSD (Access 1D via DSD 2427). E.g., if the operand is a source, then action 2310 reads the source from the memory in accordance with a 1D memory vector described by the DSD, and if the operand is a destination, then action 2312 writes to the memory in accordance with a 1D memory vector described by the DSD. Decoding the DSD is then complete (End 2499). Each iteration of data elements in FIG. 23 (actions 2310-2313) advances the operand memory addresses in accordance with the 1D memory vector described by the DSD.

If the DSD does not correspond to a 1D memory vector, then the DSD corresponds to either a 4D memory vector (e.g., in accordance with FIG. 21D) or a circular buffer (e.g., in accordance with FIG. 21E). The CE reads an XDSR specified by the DSD (Read XDSR Specified via DSD 2422, also conceptually corresponding to (optional) Read XDSR(s) 2306 of FIG. 23) to obtain an XDSD. The XDSR is specified by Type 2169 (of FIG. 21D) or Type 2189 (of FIG. 21E).

The CE then determines whether the XDSD specifies a 4D memory vector (e.g., in accordance with FIG. 22B). If so, then the CE optionally reads one or more stride registers ((optionally) Read Stride Register(s) 2424, also conceptually corresponding to (optional) Read XDSR(s) 2306 of FIG. 23), as optionally specified by the XDSD. Accesses of the operand described by the DSD, the XDSD, and any optional stride values (obtained from the stride registers) proceed as a 4D memory vector using the DSD, the XDSD, and the optional stride values (Access 4D via XDSD 2428). E.g., if the operand is a source, then action 2310 reads the source from the memory in accordance with the 4D memory vector, and if the operand is a destination, then action 2312 writes to the memory in accordance with the 4D memory vector. Decoding the DSD is then complete (End 2499). Each iteration of data elements in FIG. 23 (actions 2310-2313) advances the operand memory addresses in accordance with the 4D memory vector described by the DSD.

If the XDSD does not correspond to a 4D memory vector, then the XDSD corresponds to a circular buffer (e.g., in accordance with FIG. 22A). Accesses of the operand described by the DSD and the XDSD proceed as a circular buffer using the DSD and the XDSD (Access Circular Buffer via XDSD 2429). E.g., if the operand is a source, then action 2310 reads the source from the memory in accordance with the circular buffer, and if the operand is a destination, then action 2312 writes to the memory in accordance with the circular buffer. Decoding the DSD is then complete (End 2499). Each iteration of data elements in FIG. 23 (actions 2310-2313) advances the operand memory addresses in accordance with the circular buffer described by the DSD.

In various embodiments, D-Seq 844 performs Type=Fabric? 2411 and/or Type=XDSD? 2421 based upon a DSD read in action 2304 (of FIG. 23). In some embodiments, a type field of the DSD (e.g., Type 2109 of FIG. 21A, Type 2129 of FIG. 21B, Type 2149 of FIG. 21C, Type 2169 of FIG. 21D, or Type 2189 of FIG. 21E) determines if the data structure is one of: a fabric vector (e.g., the Type="0"), a 1D vector (e.g., the Type="1"), and an XDSD type (e.g., the Type="2-7"). In various embodiments (e.g., the Type="2-7"), the value of the type field specifies which XDSR of DSRs 846 to read for action 2422. In some embodiments, D-Seq 844 performs action 2422 and receives the XDSD from DSRs 846. In some other embodiments, DSRs 846 performs actions 2421 and 2422 and transmits the DSD and the XDSD to D-Seq 844.

As another example, D-Seq 844 performs Type=4D Vector? 2423 based upon the XDSD of action 2422. In some embodiments, the type field of the XDSD (e.g., Type 2211 of FIG. 22A or Type 2241 of FIG. 22B) read from the XDSR determines if the data structure is one of a 4D vector (e.g., the XDSD Type="0") and a circular buffer (the XDSD Type="1").

As another example, D-Seq 844 generates memory access(es) in accordance with action 2427 by computing the memory address(es) based upon the DSD (e.g., of action 2304), using e.g., Base Address 2142, WLI 2152, Length 2141, and Stride 2153 of the DSD, as described elsewhere herein. Similarly, D-Seq 844 generates memory access(es) in accordance with action 2428 by computing the memory address(es) based upon the DSD (e.g., of action 2404) and XDSD of action 2422 using e.g., Base Address 2162, Length 2161, WLI 2172, Stride 2245, Stride Select 1 2244.1, and DF 2243 of the DSD and the XDSD, as described elsewhere herein. Similarly, D-Seq 844 generates memory access(es) in accordance with action 2429 by computing the memory address(es) based upon the DSD (e.g., of action 2404) and XDSD of action 2422 using e.g., Base Address 2182, Length 2181, WLI 2192, Start Address 2212, and End Address 2213 of the DSD and the XDSD, as described elsewhere herein.

In some embodiments, D-Seq 844 sends each computed address to one of D-Store 848 and Memory 854. In response to receiving a computed address, the D-Store and/or the Memory accesses two bytes of data at the computed address.

Instruction Formats

Figure 25A:
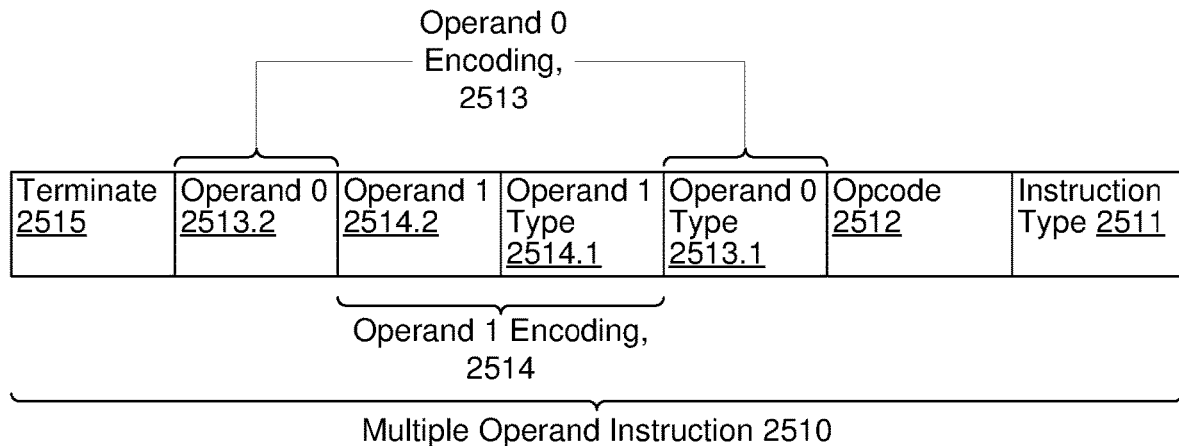
FIG. 25A illustrates selected details of an embodiment of a multiple operand instruction.
Figure 25B:
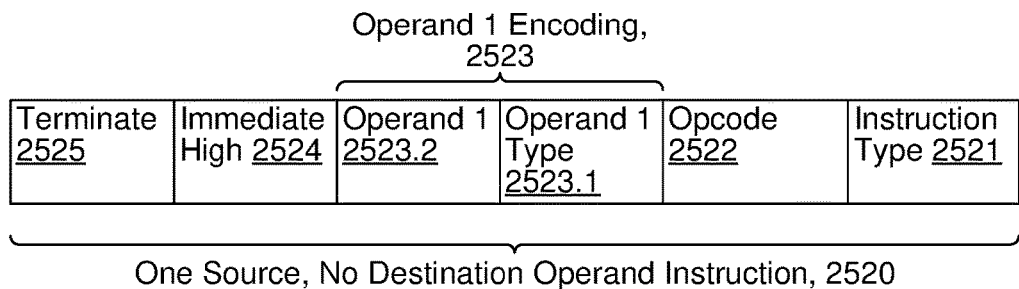
FIG. 25B illustrates selected details of an embodiment of a one source, no destination operand instruction.
Figure 25C:
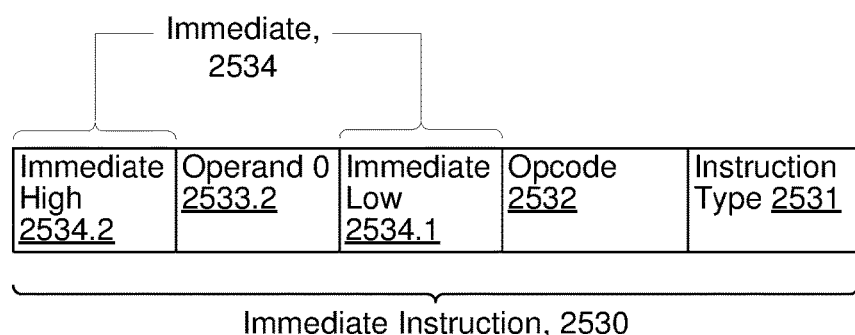
FIG. 25C illustrates selected details of an embodiment of an immediate instruction.

Each element identifier in the description of FIGS. 25A-C having a first digit of "8" refers to an element of FIG. 8, and for brevity is not otherwise specifically identified as being an element of FIG. 8.

FIG. 25A illustrates selected details of an embodiment of a multiple operand instruction, as Multiple Operand Instruction 2510. Multiple Operand Instruction 2510 is one of: a two/three source, one destination operand instruction (e.g., a multiply-add such as FMACH), a two source, no destination operand instruction (e.g., a comparison such as LT16), and a one source, one destination operand instruction (e.g., a move instruction such as MOV16).

Multiple Operand Instruction 2510 comprises various fields: Instruction Type 2511, Opcode 2512, Operand 0 Encoding 2513, Operand 1 Encoding 2514, and Terminate 2515. Operand 0 Encoding 2513 comprises Operand 0 Type 2513.1 and Operand 0 2513.2. Operand 1 Encoding 2514 comprises Operand 1 Type 2514.1 and Operand 1 2514.2. In some embodiments, Multiple Operand Instruction 2510 comprises 20 bits.

In some embodiments, the value of Instruction Type 2511 distinguishes between different types of instructions (e.g., two/three source, one destination and one source, and one destination instruction types) according to the table following. In various embodiments, the value of Opcode 2512 specifies a particular operation (e.g., multiply, add, or subtract). The length of Opcode 2512 varies between different types of instructions as described in the table following.

| Instruction Family | Value of Instruction Type 2511 | Length of Opcode 2522 |
|---|---|---|
| Two/three source, one destination | 10 | 5 bits |
| Two source, no destination | 1110 | 4 bits |
| One source, one destination | 110 | 5 bits |

In some embodiments, Operand 0 Encoding 2513 describes a source and/or destination operand, according to the table following. In some embodiments, Operand 1 Encoding 2714 describes a source operand.

| Instruction Family | Operand 0 Encoding 2513 | Operand 1 Encoding 2514 |
|---|---|---|
| Two/three source, one destination | Source0 and destination | Source1 |
| Two source, no destination | Source0 | Source1 |
| One source, one destination | Destination | Source1 |

In some embodiments, Operand 0 2513.2 and Operand 1 2514.2 comprise respective 4-bit fields. In some embodiments, Operand 0 Type 2513.1 and Operand 1 Type 2514.1 comprise respective 2-bit fields and respectively determine how to interpret Operand 0 2513.2 and Operand 1 2514.2. For a two/three source operand, one destination operand instruction, Operand 0 Type 2513.1 is interpreted according to the table following.

| Value of 2513.1 | Operand 0 Encoding 2513 |
|---|---|
| 0 | Source0 is S0DSR[Operand 0 2513.2], destination is S0DSR[Operand 0 2513.1] |
| 1 | Source0 is S0DSR[Operand 0 2513.2], destination is DDSR[Operand 0 2513.1] |
| 2 | Source0 is GPR[Operand 0 2513.2], destination is GPR[Operand 0 2513.1] |
| 3 | Source0 is GPR[Operand 0 2513.2], destination is DDSR[Operand 0 2513.1] if Operand 1 Type 2514.1 is 0, destination is GPR[0] otherwise |

For example, if the value of Operand 0 Type 2513.1 is "1" and the value of Operand 0 2513.2 is "4", then Operand 0 Encoding 2513 specifies that the source0 operand is a vector described by S0DSR[4] and the destination operand is a vector described by DDSR[4].

For a two source operand, no destination operand instruction, Operand 0 Type 2513.1 is interpreted according to the table following.

| Value of 2513.1 | Operand 0 Encoding 2513 |
|---|---|
| 0 | Source0 is S0DSR[Operand 0 2513.2] |
| 1 | Source0 is GPR[Operand 0 2513.2] |

For example, if the value of Operand 0 Type 2513.1 is "0" and the value of Operand 0 2513.2 is "4", then Operand 0 Encoding 2513 specifies that the source0 operand is a vector described by S0DSR[4].

For a one source operand, one destination operand instruction, Operand 0 Type 2513.1 is interpreted according to the table following.

| Value of 2513.1 | Operand 0 Encoding 2513 |
|---|---|
| 0 | Destination is DDSR[Operand 0 2513.2] |

| Value of 2513.1 | Operand 0 Encoding 2513 |
|---|---|
| 1 | Destination is GPR[Operand 0 2513.2] |

For example, if the value of Operand 0 Type 2513.1 is "0" and the value of Operand 0 2513.2 is "4", then Operand 0 Encoding 2513 specifies that the destination operand is a vector described by DDSR[4].

For Multiple Operand Instruction 2510, Operand 1 Type 2514.1 is interpreted according to the table following.

| Value of 2514.1 | Operand 1 Encoding 2514 |
|---|---|
| 0 | Source1 is S1DSR[Operand 1 2514.2] |
| 1 | Source1 is the data in memory at the address specified by GPR[6] |
| 2 | Source1 is GPR[Operand 1 2514.2] |
| 3 | Source1 is an immediate |

For example, if the value of Operand 0 Type 2513.1 is "0" and the value of Operand 0 2513.2 is "4", then Operand 0 Encoding 2513 specifies that the destination operand is a vector described by DDSR[4].

In various embodiments, a source1 operand that is an immediate specifies one of: several predetermined values (e.g., 0, 1, and −1) and a pseudo-random number generated by an LFSR. For example, if the value of Operand 1 Type 2514.1 is "3" and the value of Operand 1 2514.2 is "8", then Operand 1 Encoding 2514 specifies a PRN generated by an LFSR.

In various embodiments, a source1 operand that is a floating-point immediate specifies one of: several predetermined values (e.g., 0, 1, −1, +infinity, −infinity, min normal, max normal, −min normal, −min normal) and a pseudo-random number generated by an LFSR. For example, if the value of Operand 1 Type 2514.1 is "3" and the value of Operand 1 2514.2 is "8", then Operand 1 Encoding 2514 specifies a PRN generated by an LFSR.

In some embodiments, Terminate 2515 comprises a 1-bit field specifying that the instruction is the last instruction in a task. When the instruction finishes execution, the task is terminated, enabling selection and execution of a new task (e.g., via Terminate 812 and Picker 830).

FIG. 25B illustrates selected details of an embodiment of a one source, no destination operand instruction, as One Source, No Destination Instruction 2520. One Source, No Destination Instruction 2520 comprises Instruction Type 2521, Opcode 2522, Operand 1 Encoding 2523, Immediate High 2524, and Terminate 2525. Operand 1 Encoding 2523 describes a source operand and comprises Operand 1 Type 2523.1 and Operand 1 2523.2. In some embodiments, One Source, No Destination Instruction 2520 comprises 20 bits.

In some embodiments, Instruction Type 2521 comprises four bits, "1111", specifying that the instruction is a one source, no destination operand instruction, and Opcode 2522 comprises a 4-bit field specifying a particular operation (e.g., block, unblock, activate, set active PRNG, data filter, conditional branch, and jump).

In some embodiments, Immediate High 2524 comprises a 4-bit field. In some scenarios, Immediate High 2524 concatenated with Operand 1 2523.2 forms an 8-bit immediate.

In some embodiments, Operand 1 Type 2523.1 comprises a 2-bit field that determines how Operand 1 2523.2 is interpreted. If Operand 1 Type 2523.1 is "0", then Operand 1 Encoding 2523 specifies a vector (e.g., a fabric vector of data elements from Input Qs 897, or a memory vector of data elements in one of Memory 854 and D-Store 854) and the value of Operand 1 2523.2 identifies which one of the 12 S1DSRs of DSRs 846 describe the vector. If Operand 1 Type 2523.1 is "1", then Operand 1 Encoding 2523 describes a value in memory (e.g., one of Memory 854 and D-Store 848) at an 8-bit address formed by a concatenation of Immediate High 2524 with Operand 1 2523.2. If Operand 1 Type 2523.1 is "2", then Operand 1 Encoding 2523 describes a value in a register (e.g., one of RF 842) identified by the value of Operand 1 2523.2. If Operand 1 Type 2523.1 is "3", then Operand 1 Encoding 2523 describes an immediate. If Opcode 2522 specifies an operation (e.g., block, unblock, or activate) that operates on 16-bit integer operands, then the immediate comprises eight bits and is a concatenation of Immediate High 2524 and Operand 1 2523.2.

In some embodiments, Terminate 2525 comprises a 1-bit field specifying that the instruction is the last instruction in a task. When the instruction finishes execution, the task is terminated, enabling selection and execution of a new task (e.g., via Terminate 812 and Picker 830. If One Source, No Destination Instruction 2520 is a conditional branch, then the task is only terminated if the conditional branch is not taken.

FIG. 25C illustrates selected details of an embodiment of an immediate instruction, as Immediate Instruction 2530. Immediate Instruction 2530 comprises Instruction Type 2531, Opcode 2532, Operand 0 2533.2, and Immediate 2534. In some embodiments, Immediate Low 2534.1 comprises a 9-bit field and Immediate High 2534.2 comprises a 1-bit field. The concatenation of Immediate Low 2534.1 and Immediate High 2534.2 is collectively referred to (and illustrated as) as Immediate 2534. In some embodiments, Immediate Instruction 2520 comprises 20 bits.

In some embodiments, Instruction Type 2531 comprises a 1-bit field, "0", specifying that the instruction is an immediate instruction, and Opcode 2532 comprises a 5-bit field specifying a particular operation (e.g., load source0 DSR, load source1 DSR, load destination DSR, store source0 DSR, store source1 DSR, and store destination DSR). In some scenarios, execution of an Immediate Instruction 2530 (e.g., a load DSR instruction, and a load XDSR instruction) loads data from one of Memory 854 and D-Store 848 to a DSR of DSRs 846. In other scenarios, execution of an Immediate Instruction 2530 (e.g., a store DSR instruction, and a store XDSR instruction) stores data from a DSR of DSRs 846 to one of Memory 854 and D-Store 848.

In some embodiments, Operand 0 2533.2 comprises a 4-bit field and Opcode 2532 determines how Operand 0 2533.2 is interpreted. In some scenarios (e.g., if Operand 0 2533.2 specifies an operation without a register operand such as a jump operation), Immediate Low 2534.1, Operand 0 2533.2, and Immediate High 2534.2 are concatenated to form a 14-bit immediate. In some other scenarios, Immediate 2534 is sign extended to form a 16-bit immediate. In yet other scenarios, Immediate 2534 is sign extended to form a 15-bit address. In yet other scenarios, Immediate 2534 is shifted one bit to the left and sign extended to form a 15-bit address (e.g., for 32-bit data).

Microthreading

Figure 26:
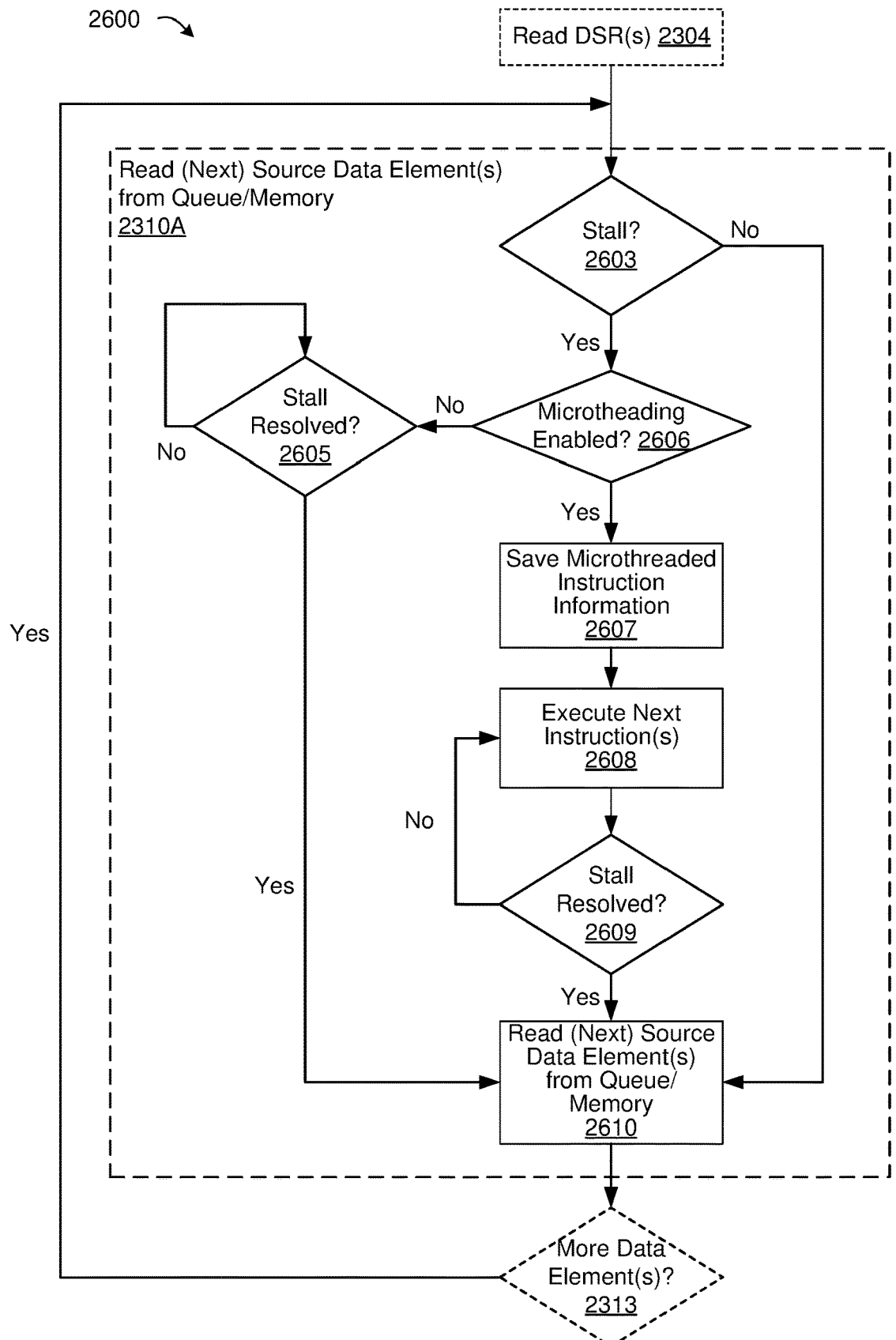
FIG. 26 illustrates selected details of processing in accordance with microthreading.

FIG. 26 illustrates selected details of processing in accordance with a microthreaded instruction, as Microthreading Instruction Flow 2600. In some embodiments, actions of flow 2600 are performed by a CE (e.g., CE 800). In various embodiments and/or usage scenarios, flow 2600 is conceptually related to flow 2300 of FIG. 23, Fabric Input Data Structure Descriptor 2100 of FIG. 21A, and Fabric Output Data Structure Descriptor 2120 of FIG. 21B.

Flow 2600 is descriptive of processing that occurs in the context of Data Structure Descriptor Flow 2300 of FIG. 23. Specifically, flow 2600 illustrates, as Read (Next) Source Data Element(s) from Queue/Memory 2310A, an alternate embodiment of Read (Next) Source Data Element(s) from Queue/Memory 2310 of FIG. 23, illustrating various details of processing relating to microthreading. As in the context of FIG. 23, processing begins by the CE reading one or more DSDs from the DSRs (Read DSR(s) 2304). In some scenarios, DSRs are read for one or more of: a source0 operand, a source1 operand, and a destination operand. Based upon the DSD(s) and the status of one or more of fabric inputs, fabric outputs, FIFO inputs, and FIFO outputs, the CE determines if a stall condition exists (Stall? 2603). When no stall condition exists, the CE reads one or more source data element(s) from the fabric and/or memory (Read (Next) Source Data Element(s) from Queue/Memory 2610).

When a stall condition exists, the CE determines if microthreading is enabled (Microthreading Enabled? 2606) for the instruction fetched in Fetch/Decode Instruction with DSR(s) 2303 of FIG. 23. If so, then the CE saves information about the microthreaded instruction (e.g., updated length of DSD(s), the cause of the stall, and/or all or any portions of the instruction itself) (Save Microthreaded Instruction Information 2607). The CE executes the next instructions (Execute Next Instruction(s) 2608). In some embodiments and/or usage scenarios, the next instruction is the instruction immediately following the microthreaded instruction. In some other embodiments and/or usage models, the next instruction is part of a different task (e.g., a task selected by the scheduler for execution).

The CE periodically, e.g., every core clock cycle, monitors the stall condition(s) (e.g., detected at action 2603) to detect if the stall condition(s) have abated and the operands are ready (Stall Resolved? 2609). When the stall has not resolved, the CE continues executing the next instructions (action 2608). When the stall has been resolved, the CE resumes executing the microthreaded instruction by reading source data elements (Read (Next) Source Data Element(s) from Queue/Memory 2610), thereby concluding flow. If microthreading is not enabled, then the CE stalls processing until the stall condition(s) have abated and the operands are ready (Stall Resolved? 2605). When the stall has been resolved, the CE resumes executing the instruction by reading source data elements (Read (Next) Source Data Element(s) from Queue/Memory 2610), thereby concluding flow.

In various embodiments and/or usage scenarios, actions of flow 2600 are conceptually related to a CE, e.g., CE 800 of FIG. 8. Action 2304 is a specific example of Action 2304 of FIG. 23, wherein at least one of the DSRs holds a fabric DSD (e.g., in accordance with one of Fabric Input Data Structure Descriptor 2100 of FIG. 21A and Fabric Output Data Structure Descriptor 2120 of FIG. 21B) that enables microthreading (e.g., one of UE 2103 and UE 2123 is respectively enabled). In some embodiments, a stall is caused by one or more of: a destination FIFO (e.g., in accordance with Circular Memory Buffer Data Structure Descriptor 2180 of FIG. 21E and Circular Memory Buffer Extended Data Structure Descriptor 2210 of FIG. 22A) that has insufficient space for data element(s), a source FIFO that has insufficient data element(s), a source fabric vector on a virtual channel with an input queue with insufficient data element(s) (e.g., one of Input Qs 897), and a destination fabric vector on a virtual channel with an output queue that has insufficient space for data element(s) (e.g., one of Output Queues 859). In some embodiments and/or usage scenarios, the sufficient number of data elements and/or the sufficient space is determined in accordance with the SIMD width of the DSD(s) read in Action 2304 (e.g., SW 2104 of Fabric Input Data Structure Descriptor 2100 of FIG. 21A).

In some embodiments and/or usage scenarios, action 2607 saves information about the microthreaded instruction (e.g., from Dec 840) to UT State 845. In various embodiments, the information comprises one or more of: stall condition(s) to monitor in action 2609 (e.g., waiting for one or more of: a FIFO with insufficient space, a FIFO with insufficient data element(s), a fabric input, and a fabric output), portions of the DSD(s) (e.g., information identifying a queue from one or more of D-Seq 844 and DSRs 846), and/or all or any portions of the instruction itself. In various embodiments, the CE writes associated state to the respective DSD(s) that were read in action 2304. For example, a microthreaded instruction that specifies reading 32 data elements from fabric input and writing the 32 data elements to a 1D memory vector is stalled after reading and writing four data elements. Length 2101 of the source DSD and Length 2141 of the destination DSD are written indicating that the length is now 28 data elements. The CE also writes the next address to Base Address 2142 of the destination DSD (e.g., increment the address by the length of four data elements times Stride 2153). In some other embodiments, the CE writes the all or any portions of the instruction information to a shadow version(s) of the respective DSD(s) read in action 2304.

In some embodiments and/or usage scenarios, action 2610 is performed in accordance with the information stored about the microthreaded instruction in UT State 845 and the respective DSD(s) that were updated in action 2607. For example, when action 2609 flows to action 2610, a partial restore is optionally and/or selectively performed by reading information from UT State 845. In various other embodiments, action 2610 is performed in accordance with the information stored about the microthreaded instruction in UT State 845 and the respective shadow version(s) of the DSD(s) that were updated in action 2607. For example, when action 2609 flows to action 2610, a partial restore is optionally and/or selectively performed by reading information from any combination of UT State 845 and the respective shadow version(s) of the DSD(s) that were updated in action 2607.

Deep Learning Accelerator Example Uses

In various embodiments and/or usage scenarios, as described elsewhere herein, a deep learning accelerator, such as a fabric of PEs (e.g., as implemented via wafer-scale integration and as illustrated, for example, in FIG. 4) is usable to train a neural network, and/or to perform inferences with respect to a trained neural network. The training, in some circumstances, comprises determining weights of the neural network in response to training stimuli. Various techniques are usable for the training, such as Stochastic Gradient Descent (SGD), Mini-Batch Gradient Descent (MBGD), Continuous Propagation Gradient Descent (CPGD), and Reverse CheckPoint (RCP). Following, CPGD is contrasted with other techniques, and then each of SGD, MBGD, CPGD, and RCP are described in more detail.

Past deep neural network training approaches (e.g., SGD and MBGD) have used so-called anchored-delta learning. That is, the delta derived weight updates have been 'anchored' or held fixed until processing of all activations for a training set batch or a mini-batch are completed. In some circumstances, the layer-sequential nature of anchored-delta learning resulted in high-latency sequential parameter updates (including for example, weight updates), which in turn led to slow convergence. In some circumstances, anchored-delta learning has limited layer-parallelism and thus limited concurrency.

In contrast, in some circumstances, use of a continuous propagation (aka immediate-delta) learning rule for deep neural network training, as taught herein, provides faster convergence, decreases the latency of parameter updates, and increases concurrency by enabling layer-parallelism. Deltas computed from the immediate network parameters use updated information corresponding to the current parameter slope. Continuous propagation enables layer parallelism by enabling each layer to learn concurrently with others without explicit synchronization. As a result, parallelization along the depth of a network enables more computing resources to be applied to training. Parallelism available in continuous propagation realizes up to a 10× wall clock time improvement, as compared to MBGD techniques, in some usage scenarios. The continuous propagation approach also enables avoiding using extra memory to store the model parameter values for multiple vectors of activations.

In some embodiments and/or usage scenarios, a neural network is trained using continuous propagation of stimuli to perform SGD. In some embodiments of training via CPGD, RCP enables reducing the number of activations held in memory (thus reducing the memory footprint) by recomputing selected activations. In some scenarios, recomputing activations also improves the accuracy of the training estimates for the weights. In training without RCP, every layer of neurons receives activations during one or more forward passes, and saves the activations to re-use for computations performed during the one or more backward passes associated with the forward passes (e.g., the one or more delta, chain, and weight update passes associated with the forward passes). In some scenarios (e.g., relatively deep neural networks), the time between saving the activations and the associated backward pass is relatively long and saving all activations uses relatively more memory than saving fewer than all the activations.

For example, only some of the layers of neurons (e.g., every even layer) save the respective activations and the other layers discard the respective activations (e.g., every odd layer). The layers with saved activations (e.g., every even layer) use the most recent weights to recompute and transmit the recomputed activations to the layers that discarded activations (e.g., every odd layer). In some scenarios, the recomputed activations differ from the discarded activations because the most recent weights are different from the weights that were available during the forward pass (e.g., one or more weight updates occurred between the forward pass and the associated backward pass). In various embodiments, the number and type of layers that save and discard activations is selected to optimize for the desired balance of reduced memory usage and increased computation. As one example, every fourth layer saves activations and all other layers discard activations. As another example, convolutional layers are selected to save activations and other layers are selected to discard activations.

In various embodiments and/or usage scenarios, any one or more of SGD, MBGD, and CPGD, with or without RCP, are implemented via one or more of: a fabric of processing elements (e.g., as illustrated in FIG. 4), one or more GPUs, one or more CPUs, one or more DSPs, one or more FPGAs, and one or more ASICs.

SGD, e.g., with back-propagation, is usable (as described elsewhere herein) for training a neural network. However, learning via gradient descent is inherently sequential, because each weight update uses information from a gradient measurement made after completion of a full forward pass through the neural network. Further, weight updates are made during a corresponding backward pass through the neural network (following and corresponding to the forward pass), and thus the last weight update occurs after completion of the entire corresponding backward pass.

MBGD enables more parallelism than SGD by gradient averaging over a mini-batch, processing several (a 'mini-batch' of) activations in parallel. However, speed of sequential updates, compared to SGD, is unchanged, and weight updates, as in SGD, are completed after completion of all corresponding backward passes through the neural network. As mini-batch size increases by processing more activations in parallel, gradient noise is reduced. Beyond a point the reduction in gradient noise, in some scenarios, results in poor generalization.

CPGD enables parallel processing and updating of weights in all layers of a neural network, while activations propagate through the layers in a stream. Thus CPGD overcomes, in some embodiments and/or usage scenarios, sequential processing limitations of SGD and MBGD.

RCP enables reduced memory usage via (re)computing activations that would otherwise be stored, and is usable in combination with SGD, MBGD, and CPGD.

Pipeline flow diagrams are usable to compare and contrast various SGD, MBGD, CPGD, and CPGD with RCP techniques. Information flows and concurrency in training techniques are visible with the pipeline flow diagrams. FIGS. 27A-D illustrate embodiments of pipeline flows for layers of a neural network flow from left to right, e.g., activations enter from the left and forward pass propagation of layer computations flows to the right. A gradient computation is performed in the rightmost layer to begin the backward pass propagation of layer computations including weight updates from right to left. Time advances from top to bottom.

Figure 27A:
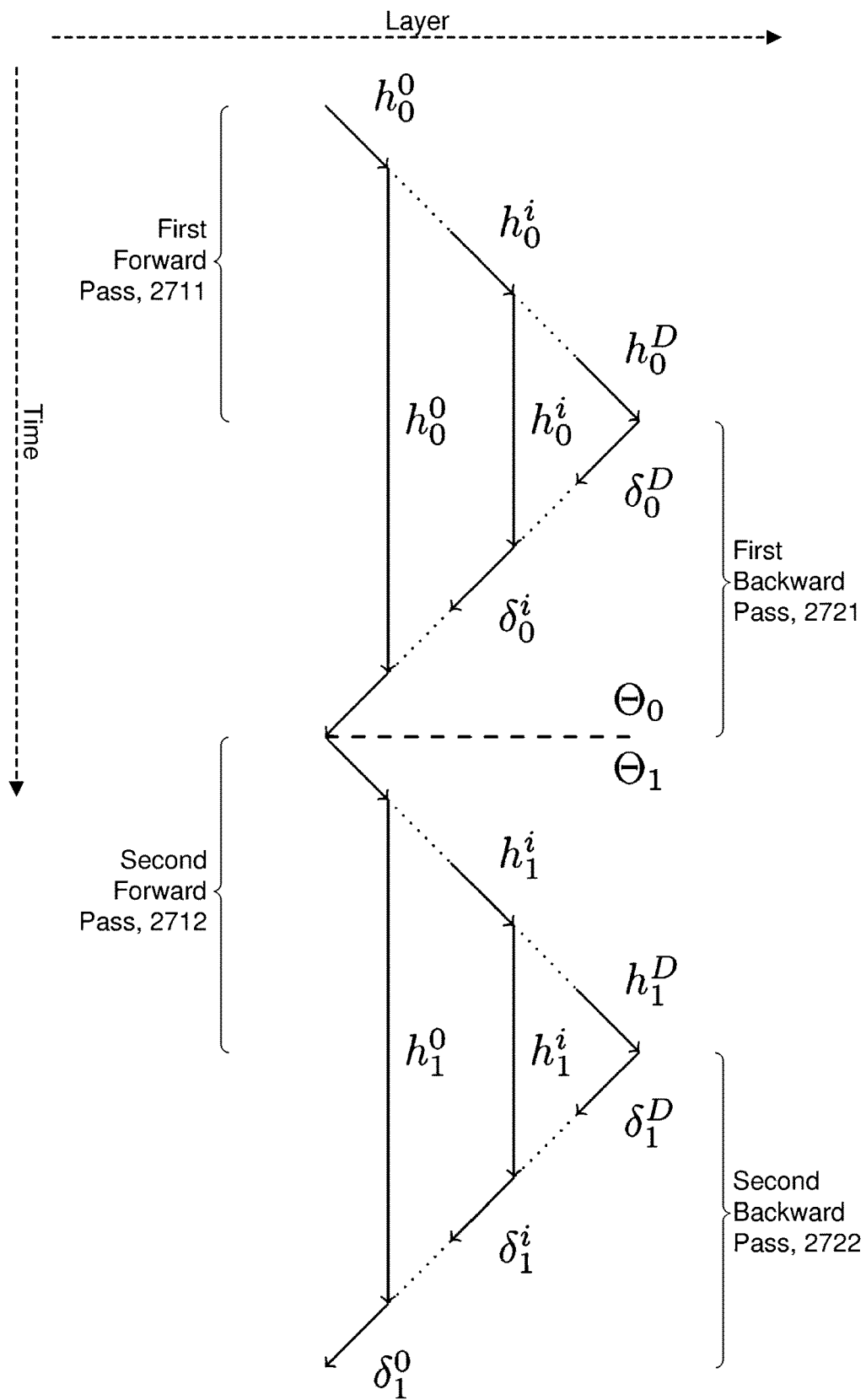
FIG. 27A illustrates an embodiment of a pipeline flow for Stochastic Gradient Descent (SGD).

FIG. 27A illustrates an embodiment of a pipeline flow for SGD. Weight updates of layers of a neural network are completed after completion of a corresponding full forward pass and a corresponding full backward pass through all the layers of the neural network. A next forward pass begins only after completion of weight updates corresponding with an immediately preceding forward pass. As illustrated, First Forward Pass 2711 is performed (from the first layer to the last layer, illustrated left to right in the figure). Then First Backward Pass 2721 is performed (from the last layer to the first layer, illustrated right to left in the figure). During First Backward Pass 2721, weights are updated, from the last layer to the first layer. The last weight update (of the first layer) is completed as First Backward Pass 7621 completes. Then Second Forward Pass 2712 is performed (using the weights updated during First Backward Pass 2721), followed by Second Backward Pass 2722, during which weight updates are performed.

Figure 27B:
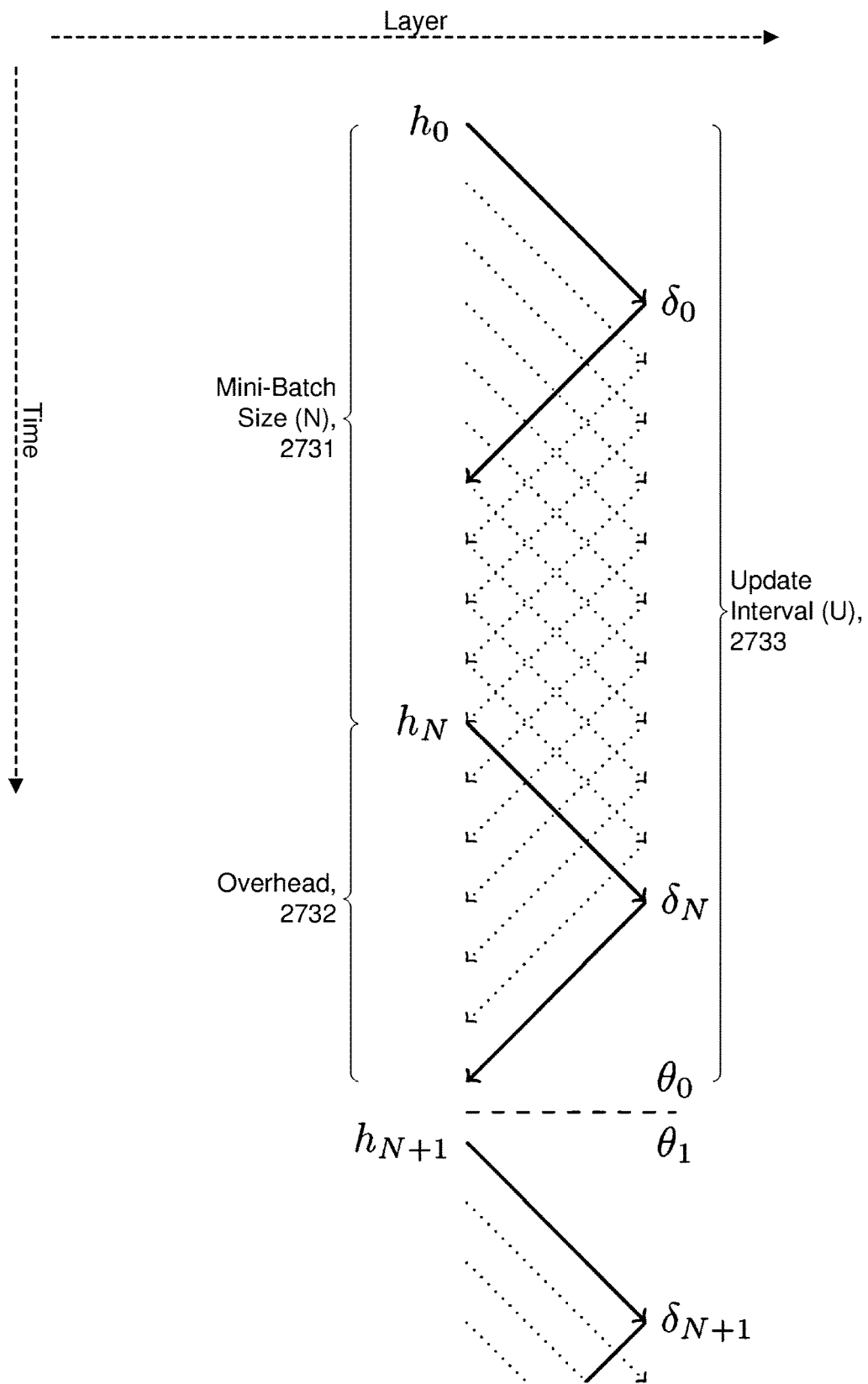
FIG. 27B illustrates an embodiment of a pipeline flow for Mini-Batch Gradient Descent (MBGD).

FIG. 27B illustrates an embodiment of a pipeline flow for MBGD. A plurality of activations are processed with identical weights. Coordinated quiet times are used to synchronize weight updates. In some embodiments and/or usage scenarios, MBGD processing is characterized by Mini-Batch Size (N) 2731, Overhead 2732, and Update Interval (U) 2733.

Unlike gradient-descent techniques (e.g., SGD and MBGD) that use a full forward pass and a full backward pass through a network to compute a gradient estimate, and thus result in a sequential dependency, CPGD uses a differential construction to replace the sequential dependency with a continuous model that has sustained gradient generation. In some embodiments and/or usage scenarios, CPGD enables layer parallelism by enabling each layer of a neural network to be trained (e.g., to 'learn') concurrently with others of the layers without explicit synchronization. Thus, parallelization along the depth of a neural network enables applying more computing resources to training. In various embodiments and/or usage scenarios, CPGD provides comparable accuracy and improved convergence rate expressed in epochs of training compared to other techniques.

Figure 27C:
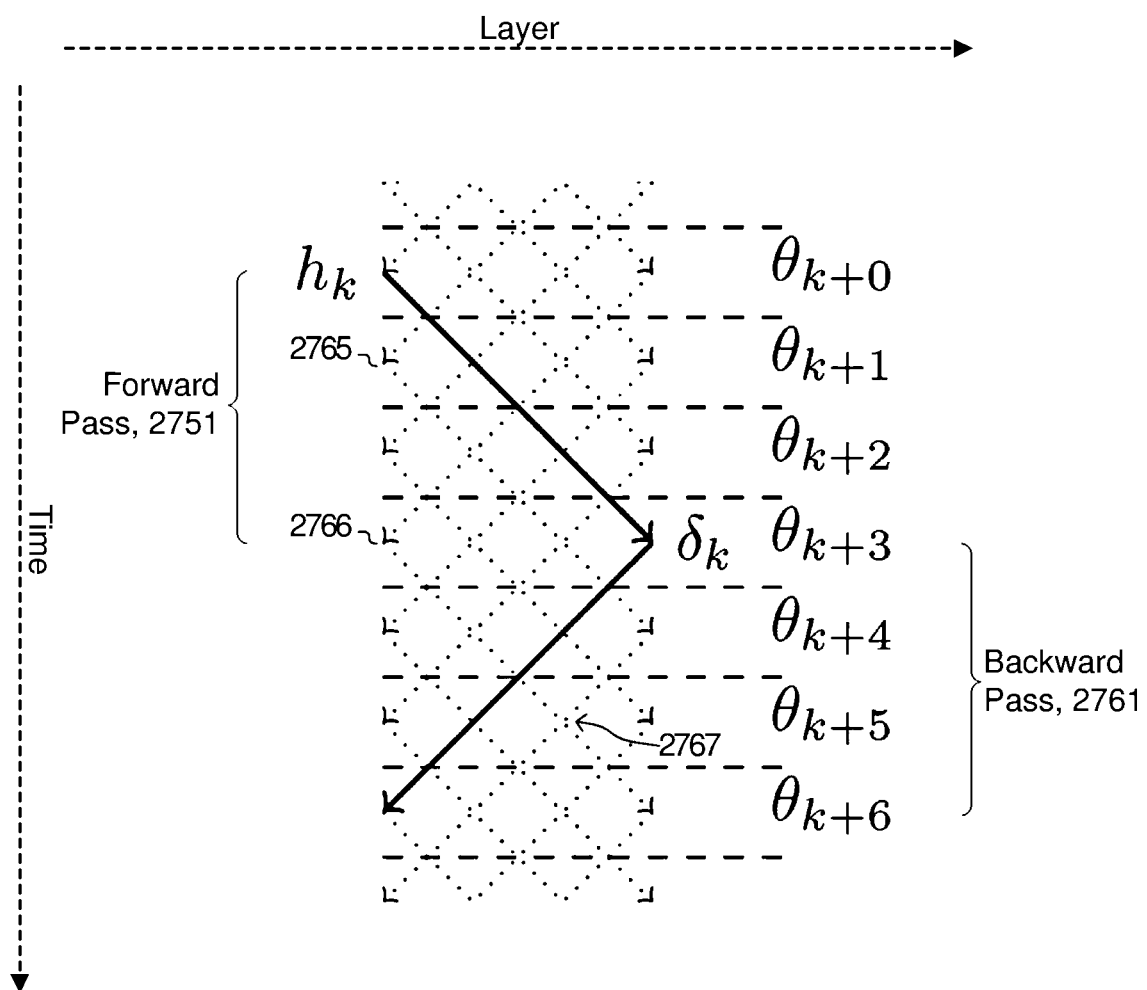
FIG. 27C illustrates an embodiment of a pipeline flow for Continuous Propagation Gradient Descent (CPGD).

FIG. 27C illustrates an embodiment of a pipeline flow for CPGD. CPGD processing maintains a model in flux. Hidden representations and deltas enter every layer at every time step, and weights update at every time step. The CPGD processing is a coordinated synchronous operation. In some embodiments and/or usage scenarios, CPGD processing is characterized by Forward Pass 2751 and a corresponding Backward Pass 2761, respectively representing one of a number of forward passes and one of a number of corresponding backward passes. In operation, respective forward passes of a plurality of forward passes operate in parallel with each other, respective backward passes of a plurality of backward passes operate in parallel with each other, and the pluralities of forward passes and the pluralities of backward passes operate in parallel with each other. Weight updates (made during backward passes) are used by forward passes and backward passes as soon as the weight updates are available.

As a specific example, Forward Pass 2765 begins, and later Forward Pass 2766 begins. At least a portion of Forward Pass 2765 operates in parallel with at least a portion of Forward Pass 2766. At least a portion of a corresponding backward pass for Forward Pass 2765 operates in parallel with at least a portion of Forward Pass 2766. Further, the corresponding backward pass completes at least some weight updates that are used by Forward Pass 2766, as shown by example Weight Update Use 2767.

Figure 27D:
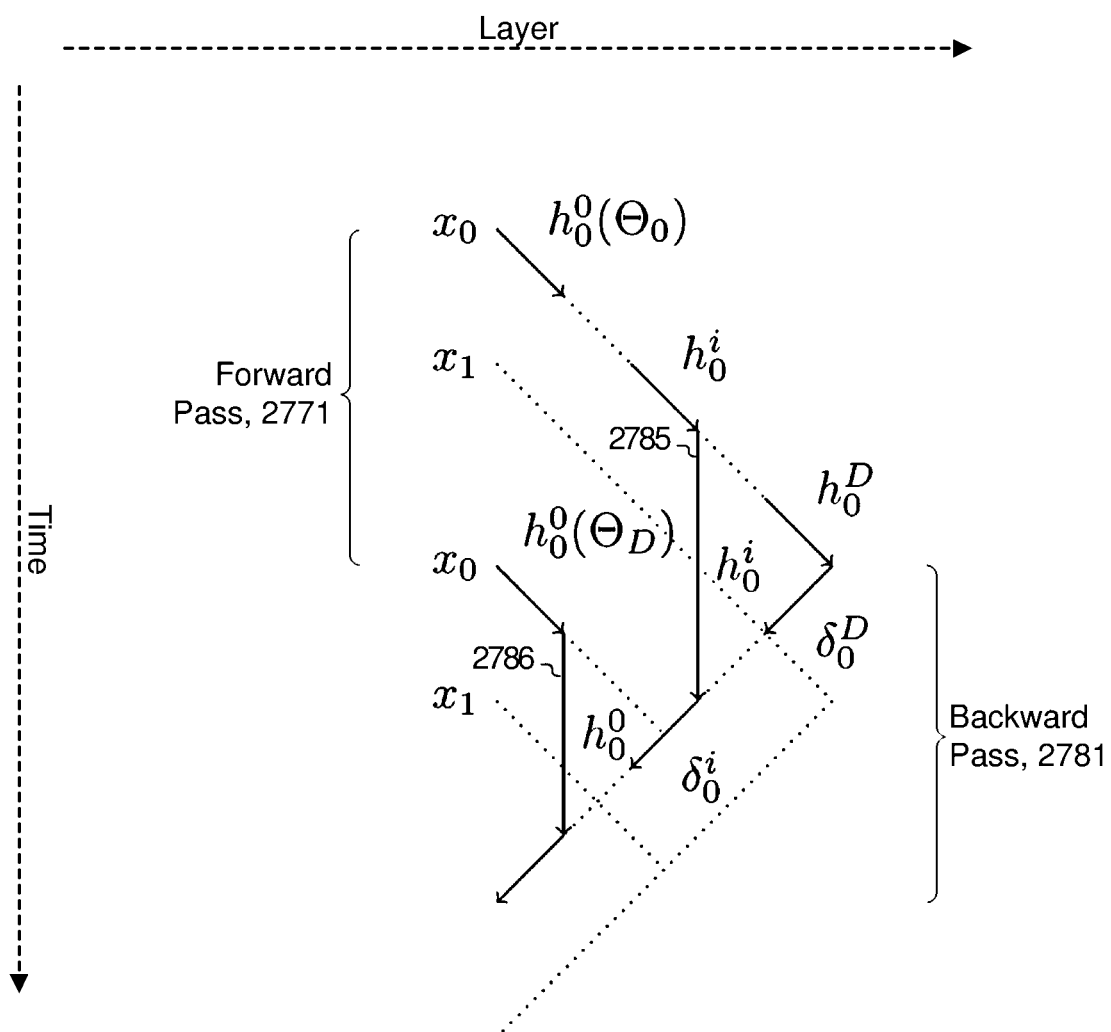
FIG. 27D illustrates an embodiment of a pipeline flow for Continuous Propagation Gradient Descent (CPGD) with Reverse CheckPoint (RCP).

FIG. 27D illustrates an embodiment of a pipeline flow for CPGD with RCP. CPGD with RCP omits saving selected activations, instead recomputing the selected activations. In some embodiments and/or usage scenarios, the recomputing is performed with updated weights. Thus, reverse checkpoint enables reduced memory (illustrated as reduced area covered by vertical lines passing saved hidden representations forward in time) and reduces time disparity between calculated hidden representations and corresponding deltas.

As a specific example, CPGD with RCP processing is characterized by Forward Pass 2771 and a corresponding Backward Pass 2781. A first activation is computed during the Forward Pass and stored in a layer for use in the corresponding Backward Pass, as illustrated by Activation Storage 2785. Activation Storage 2785 is occupied during portions of Forward Pass and Backward Pass and unavailable for other uses. A specific example of memory reduction is illustrated by Recomputed Activation Storage 2786. A second activation is computed during the Forward Pass, but is discarded and does not require any storage. During the Backward Pass the second activation is recomputed and stored in a layer for use in the Backward Pass as illustrated by Recomputed Activation Storage 2786. Recomputed Activation Storage 2786 is unoccupied throughout the entire Forward Pass and available for other uses (e.g., other forward passes, other backward passes), thereby reducing the memory required.

Considering parallelization more generally, in some embodiments and/or usage scenarios, parallelizing a computation (e.g., neural network training) spreads the computation over separate computation units operating simultaneously. In a model-parallel regime, separate units simultaneously evaluate a same neural network using distinct model parameters. In a data-parallel regime, separate workers simultaneously evaluate distinct network inputs using the same formal model parameters. Some scaling techniques use fine-grained data parallelism across layers and among units in a cluster.

MBGD, in some embodiments and/or usage scenarios, improves accuracy of a gradient estimate as a function of a mini-batch size, n. However, computation to perform MBGD for mini-batch size n is approximately equal to computation to perform SGD for n steps. In some situations, SGD for n steps is more efficient than MBGD for a mini-batch size n by approximately the square root of n. Thus, higher parallelism (e.g., as in MBGD) and higher efficiency (e.g., as in SGD) are sometimes mutually exclusive.

In some embodiments and/or usage scenarios, a deep neural network is a high-dimensional parameterized function, sometimes expressed as a directed acyclic graph. Back propagation techniques are sometimes expressed by a cyclic graph. The cycle in the graph is a feedback iteration. Gradients produced by a first full network evaluation change weights used in a next iteration, because the iteration is a discrete approximation of a continuous differential system. The discrete approximation comprises an unbiased continuous-noise process with time-varying statistics. The noise process provides regularization to enable the continuous system to model phenomena observed in discrete-time learning systems. In the discrete case, regularization is provided by a sampling procedure (e.g., SGD), by learning rate, and/or by other explicit mechanisms. A time-dependent noise process enables using a learning-rate schedule that erases local high-frequency contours in parameter space. As a correct region is approached, regularization is reduced, leading, in some circumstances, to a better final solution.

CPGD, in a conceptual framework of an arbitrary feedforward neural network, expresses all nodes as functions of time and applies functional composition to formulate representations in terms of internal state and stimuli the internal state is subjected to. A factorization results with individual layers as systems with independent local dynamics. Two dimensions are depth of the network and time evolution of parameters. In some embodiments and/or usage scenarios implementing acceleration by mapping network layers to computational units separated in space, there is latency communicating between the network layers. Thus there is a time delay communicating between the layers. Some implementations of CPGD are synchronous implementations that account for the time delays.

During CPGD processing, an activation vector and associated hidden representations are combined with model parameters at different time steps during the forward pass of the activation vector. The difference between model parameters at different time steps versus a same time step is not detectable by the activation vector going forward. Conceptually it is as if a fixed set of parameters from successive time steps were used to form an aggregate parameter state that is then used for learning.

There is a choice during the backward pass (e.g., delta propagation) to use either immediate parameters (e.g., weights) after updating or to retrieve historical parameters anchored to when the corresponding forward pass was performed. Deltas computed from the immediate parameters use updated information corresponding to a current parameter slope. Some embodiments and/or usage scenarios use immediate parameters. Some embodiments and/or usage scenarios use historical parameters.

Some implementations of CPGD use memory on an order similar to SGD. Reverse checkpoint (as described elsewhere herein) is usable with CPGD, such as to reduce memory usage. Some embodiments and/or usage scenarios of reverse checkpoint use immediate parameters (e.g., weights) to recompute activations. Some embodiments and/or usage scenarios of reverse checkpoint use historical parameters to recompute activations. In some embodiments and/or usage scenarios using immediate parameters to recompute activations, a time disparity between parameters used for computing forward propagating activations and backward-propagating deltas is reduced in the aligning wavefronts.

Continuous propagation techniques are usable in conjunction with mini-batch style processing (e.g., MBGD). In some embodiments and/or usage scenarios, a subsequent batch is started before an immediately preceding batch is completed, conceptually similar to asynchronous SGD. Parameter inconsistency within the pipeline is limited to no more than one batch boundary.

In some embodiments and/or usage scenarios, enabling data to stream through a neural network and to perform computations without a global synchronization boundary, enables extracting learning information not otherwise extracted. In some embodiments and/or usage scenarios, a lower learning rate dominates using larger batch sizes. In some embodiments and/or usage scenarios, hidden activity and/or delta arcs are conceptually interpreted as individual vectors or alternatively batch matrices. The batch matrices interpretation enables implementing techniques as described herein directly on GPUs, CPUs, DSPs, FPGAs, and/or ASICs.

FIGS. 28A-28E illustrate various aspects of forward pass and backward pass embodiments in accordance with SGD, MBGD, CPGD, and RCP processing. In the figures, two layers of neurons are illustrated, representing respective layers of, e.g., a portion of a deep neural network. In various embodiments and/or usage scenarios, the deep neural network comprises thousands or more layers and thousands or more neurons per layer. In various embodiments and/or usages scenarios, the first layer is an input layer receiving activations for training from an agent external to the deep neural network. In various embodiments and/or usage scenarios, the second layer is an output layer where the forward pass completes, and the backward pass begins. In various embodiments and/or usage scenarios, the first layer and the second layer are internal layers.

Figure 28A:
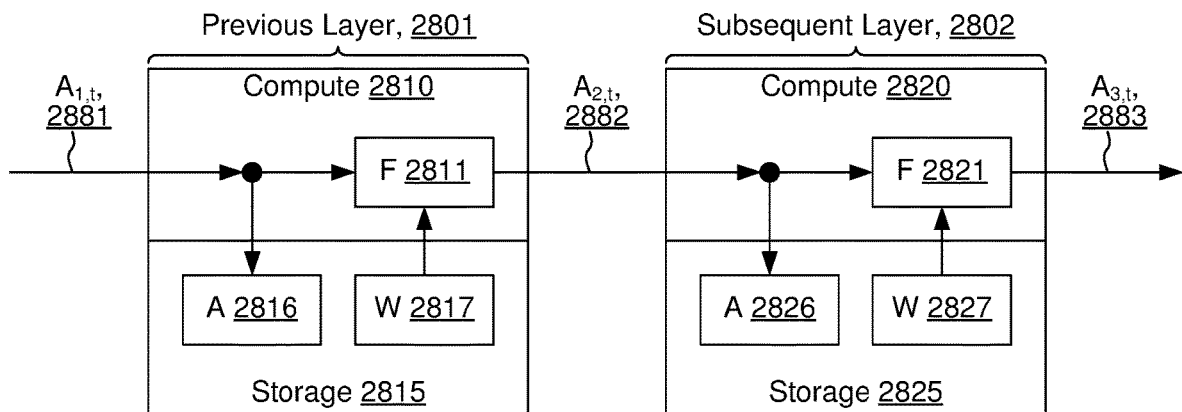
FIGS. 28A-28E illustrate various aspects of forward pass and backward pass embodiments in accordance with SGD, MBGD, CPGD, and RCP processing.
Figure 28B:
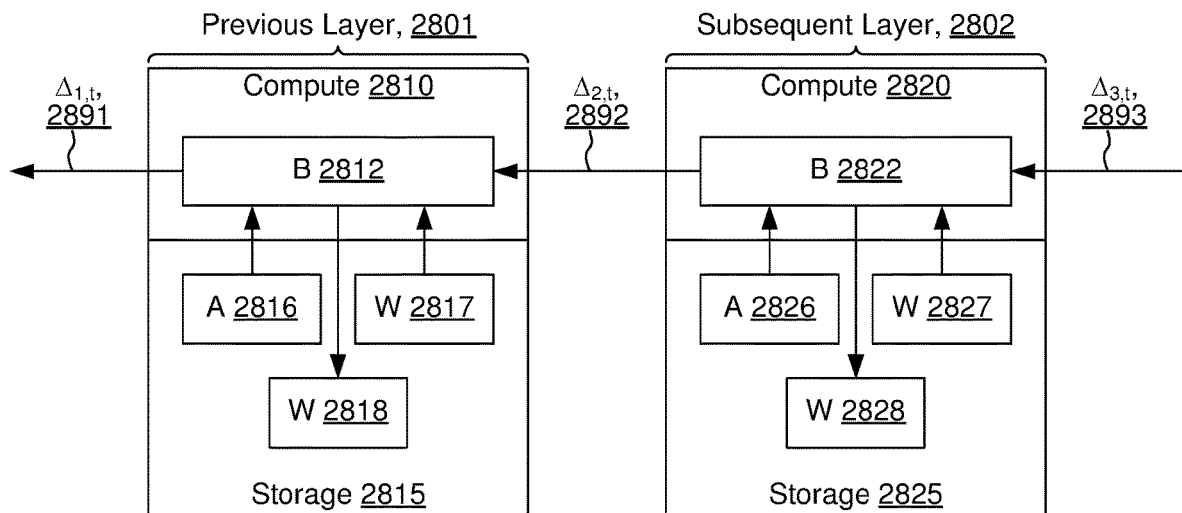

FIG. 28A and FIG. 28B respectively illustrate forward pass and backward pass embodiments in accordance with SGD, MBGD, and CPGD, without RCP. The two layers are illustrated as Previous Layer 2801 and Subsequent Layer 2802. Previous Layer 2801 comprises Compute 2810 and Storage 2815. Subsequent Layer 2802 comprises Compute 2820 and Storage 2825. Compute 2810 and Compute 2820 are examples of compute resources and Storage 2815 and Storage 2825 are examples of storage resources.

Figure 28C:
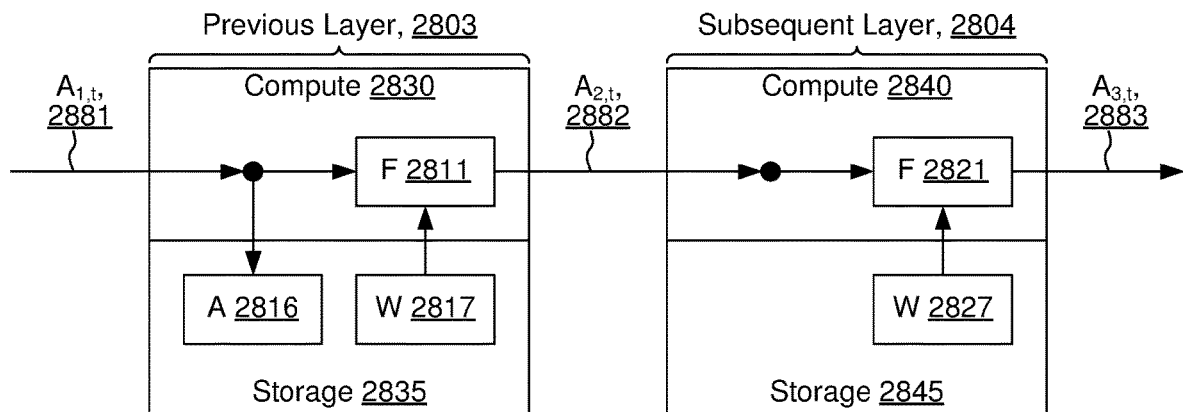
Figure 28D:
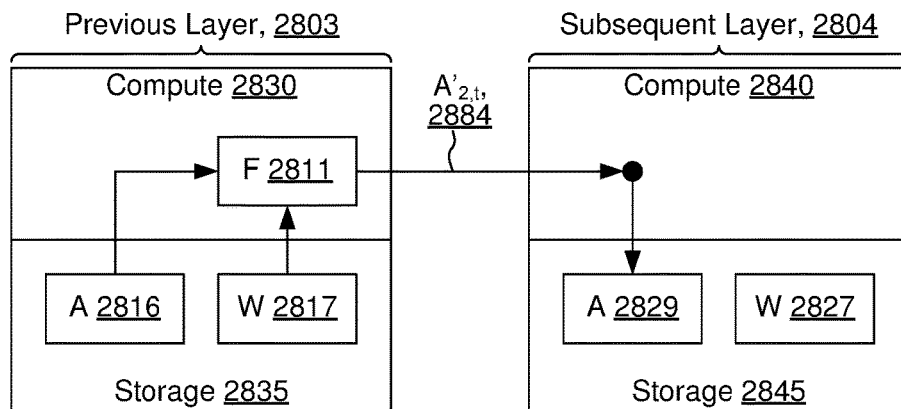
Figure 28E:
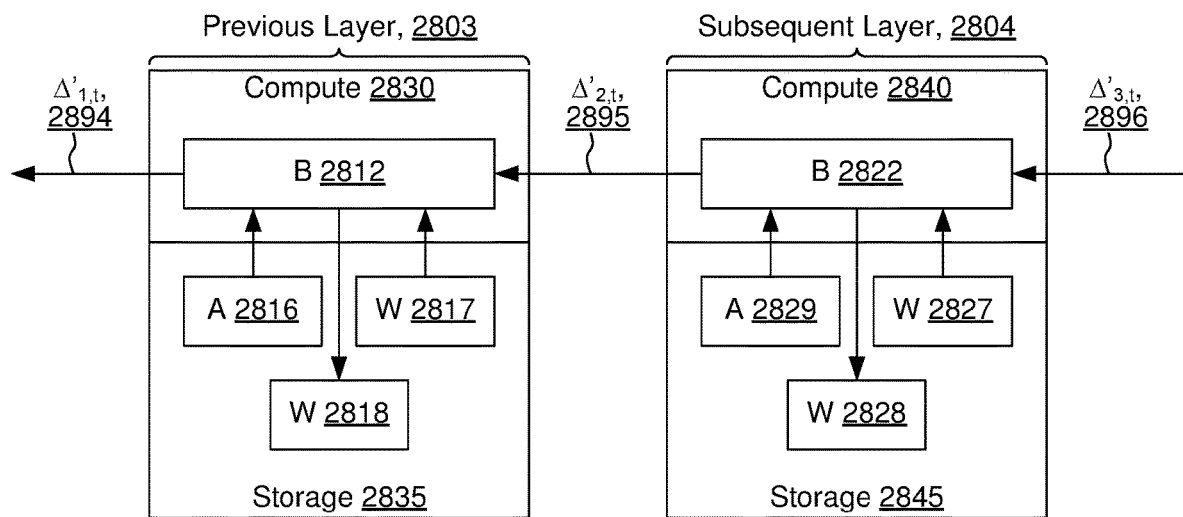

FIGS. 28C-28E illustrate forward pass and backward pass embodiments in accordance with SGD, MBGD, and CPGD, with RCP. The two layers are illustrated as Previous Layer 2803 and Subsequent Layer 2804. Previous Layer 2803 comprises Compute 2830 and Storage 2835. Subsequent Layer 2804 comprises Compute 2840 and Storage 2845. Compute 2830 and Compute 2840 are examples of compute resources and Storage 2835 and Storage 2845 are examples of storage resources.

Like-numbered elements in FIGS. 28A-28E have identical structure and operation, although the compute resources produce different results dependent on differing inputs, and the storage resources store and subsequently provide different values dependent on differing values stored. Other embodiments are envisioned with differing compute resources and/or differing storage resources usable for forward pass and backward pass computation and storage. E.g., a backward pass uses a transpose weight storage not used by a forward pass. Other embodiments are envisioned with differing compute and/or storage resources usable for differing forward pass and backward pass implementations. E.g., an RCP-based embodiment uses an additional compute resource (not illustrated) than used for forward pass or backward pass processing without RCP.

Regarding FIG. 28A, Compute 2810 is enabled to perform computations, such as forward pass computations F 2811. Storage 2815 is enabled to store activations, such as in A 2816. Storage 2815 is further enabled to store weights, such as in W 2817. Compute 2820, F 2821, Storage 2825, A 2826, and W 2827, are, in various embodiments and/or usage scenarios, substantially similar or identical in structure and/or operation respectively to Compute 2810, F 2811, Storage 2815, A 2816, and W 2817.

In forward pass operation for SGD or MBGD, activation $A_{1,t}$ 2881 is received by Previous Layer 2801 and stored in A 2816 (for later use during the backward pass). $A_{1,t}$ 2881 and a weight $W_{1,t}$, previously stored in W 2817, are then processed in accordance with F 2811 to produce activation $A_{2,t}$ 2882. $A_{2,t}$ 2882 is then passed to Subsequent Layer 2802. Similarly to the Previous Layer, $A_{2,t}$ 2882 is received by Subsequent Layer 2802 and stored in A 2826 (for later use during the backward pass). $A_{2,t}$ 2882 and a weight $W_{2,t}$, previously stored in W 2827 are then processed in accordance with F 2821 to produce activation $A_{3,t}$ 2883. $A_{3,t}$ 2883 is then provided to a next subsequent layer (if present) for processing, and so forth, until the forward pass is complete and the backward pass commences. If Subsequent Layer 2802 is the output layer, then the forward pass is completed and the backward pass corresponding to the forward pass is initiated.

Regarding FIG. 28B, for clarity, elements of Compute 2810 and Compute 2820 dedicated to forward pass processing (F 2811 and F 2821) are omitted. With respect to structure and operation illustrated and described with respect to FIG. 28A, FIG. 28B illustrates that Compute 2810 is further enabled to perform additional computations, such as backward pass computations B 2812, and Compute 2820 is further enabled to perform additional computations, such as backward pass computations B 2822. Storage 2815 is further enabled to store a computed weight, such as in W 2818, and Storage 2825 is further enabled to store a computed weight, such as in W 2828. B 2822 and W 2828 are, in various embodiments and/or usage scenarios, substantially similar or identical in structure and/or operation respectively to B 2812 and W 2818.

In backward pass operation for SGD or MBGD, delta $\Delta_{3,t}$ 2893 is received from the next subsequent layer (if present) during backward pass processing. If Subsequent Layer 2802 is the output layer, then Subsequent Layer 2802 computes delta $\Delta_{3,t}$ according to the delta rule, e.g., as a function of the difference between the output of the Subsequent Layer (e.g., the estimated output) and the training output (e.g., desired output). $\Delta_{3,t}$ 2893, the weight $W_{2,t}$ previously stored in W 2827, and the activation $A_{2,t}$ previously stored in A 2826, are then processed in accordance with B 2822 (e.g., in accordance with the delta rule) to produce delta $\Delta_{2,t}$ 2892 and a new weight $W_{2,t+1}$ that is then stored in W 2828 for use in a next forward pass. $\Delta_{2,t}$ 2892 is then passed to Previous Layer 2801. Similarly to the Subsequent Layer, delta $\Delta_{2,t}$ 2892, the weight $W_{1,t}$ previously stored in W 2817, and the activation $A_{1,t}$ previously stored in A 2816, are then processed in accordance with B 2812 to produce delta $\Delta_{1,t}$ 2891 and a new weight $W_{1,t+1}$ that is then stored in W 2818 for use in the next forward pass. $\Delta_{1,t}$ 2891 is then passed to a next previous layer (if present) for processing, and so forth, until the backward pass is complete and a next forward pass commences. If Previous Layer 2801 is the input layer, then the backward pass is complete, and the next forward pass commences.

In SGD and MBGD (and unlike CPGD), the next forward pass is delayed until the previous backward pass completes, e.g., W 2817 and W 2827 are respectively updated with W 2818 and W 2828 after W 2817 and W 2827 have been used for a same forward pass and a same corresponding backward pass. Therefore, the next forward pass is performed using weights that are from the same backward pass.

FIG. 28A, in addition to illustrating SGD and MBGD forward pass processing, also illustrates CPGD forward pass processing. However, operation for CPGD is different compared to SGD and MBGD, in that weight updates and the next forward pass are performed as soon as possible, rather than being delayed until completion of the previous backward pass. E.g., W 2817 and W 2827 are respectively updated with W 2818 and W 2828 as soon as possible. Therefore, the next forward pass has selective access to weights from prior iterations, and thus selectively produces activations differing from those produced under the same conditions by SGD and MBGD.

More specifically, in Previous Layer 2801, $A_{1,t}$ 2881 is received and stored in A 2816, identically to SGD and MBGD. $A_{1,t}$ 2881 and a weight $W_{1,t-k-j}$ previously stored in W 2817 are then processed in accordance with F 2811 to produce activation $A_{2,t}$ 2882. The weight $W_{1,t-k-j}$ was produced and stored by a backward pass corresponding to a forward pass preceding the instant forward pass by k–j forward passes. $A_{2,t}$ 2882 is then passed to Subsequent Layer 2802, and similarly to the Previous Layer, $A_{2,t}$ 2882 is received and stored in A 2826, identically to SGD and MBGD. $A_{2,t}$ 2882 and a weight $W_{2,t-k}$ previously stored in W 2827 are then processed in accordance with F 2821 to produce activation $A_{3,t}$ 2883. The weight $W_{2,t-k}$ was produced and stored by a backward pass corresponding to a forward pass preceding the instant forward pass by k forward passes. Note that the Previous Layer and the Subsequent Layer, for processing of a same forward pass, use weights from different backward passes. As in SGD and MBGD, $A_{3,t}$ 2883 is then provided to a next subsequent layer (if present) for processing, and so forth, until the forward pass is complete and the backward pass commences. If Subsequent Layer 2802 is the output layer, then the forward pass is completed and the backward pass corresponding to the forward pass is initiated. In some embodiments and/or usage scenarios, the value of j is 0 and (k–j) and (k) are equal. In various embodiments and/or usage scenarios, the Previous Layer and the Subsequent Layer simultaneously process one of: different forward passes, different backward passes, and a forward pass and a different backward pass.

FIG. 28B, in addition to illustrating SGD and MBGD backward pass processing, also illustrates CPGD backward pass processing. Processing of the backward pass in CPGD is identical to that of SGD and MBGD. However, selected results (e.g., selected weights) are used earlier than in SGD and MBGD. For example, $W_{1,t-k-j}$, as produced by backward pass t–k–j, and $W_{1,t-k}$, as produced by backward pass t–k are used earlier than in SGD and MBGD, e.g., forward pass t.

FIG. 28C illustrates an embodiment of forward pass processing of any of SGD, MBGD, and CPGD, in combination with RCP. Compute 2830 and Storage 2835, are, in various embodiments and/or usage scenarios, substantially similar or identical in structure and/or operation respectively to Compute 2810 and Storage 2815. Compute 2840 and Storage 2845, are, in various embodiments and/or usage scenarios, substantially similar or identical in structure and/or operation respectively to Compute 2820 and Storage 2825, other than omission of storage for activations A 2826 of Storage 2825 having no counterpart in Storage 2845.

In forward pass operation, with respect to Previous Layer 2803, activation $A_{1,t}$ 2881 is received and processed in accordance with forward pass processing in Compute 2830, and stored in Storage 2835 as described with respect to FIG. 28A. However, with respect to Subsequent Layer 2804, activation $A_{2,t}$ 2882 is received, and processed in accordance with forward pass processing in Compute 2840, but is not stored (instead it is recomputed in accordance with RCP during backward pass processing).

FIG. 28D and FIG. 28E respectively illustrate first and second portions of an embodiment of backward pass processing of any of SGD, MBGD, and CPGD, in combination with RCP. For clarity, elements of Compute 2830 and Compute 2840 dedicated to forward pass processing (F 2821) are omitted. With respect to structure and operation illustrated and described with respect to FIG. 28C, FIG. 28D and FIG. 28E illustrate that Compute 2830 is further enabled to perform additional computations, such as backward pass computations B 2812, and Compute 2840 is further enabled to perform additional computations, such as backward pass computations B 2822. Storage 2835 is further enabled to store a computed weight, such as in W 2818, and Storage 2845 is further enabled to store a computed weight, such as in W 2828, as well as a recomputed activation, such as in A 2829.

In the first portion of the backward pass operation, activations not stored in the corresponding forward pass are recomputed. In SGD and MBGD scenarios, the recomputed activation is formulated in Previous Layer 2803 by processing the activation stored from the forward pass in A 2816 and weight stored in W 2817 in accordance with F 2811 to produce activation $A'_{2,t}$ 2884, that is then stored in A 2829 of Subsequent Layer 2804. Since SGD and MBGD delay weight updates and commencement of a next forward pass until the forward pass and corresponding backward pass are complete, $A'_{2,t}$ 2884 is identical to the value discarded during the forward pass, $A_{2,t}$ 2882.

In a CPGD scenario, the recomputed activation is formulated according to the same topology as the SGD and MBGD scenarios. However, CPGD performs updates without delays and enables commencement of a next forward pass without regard to completion of previous backward passes. Thus, a weight value stored at the time of the backward pass, e.g., in W 2817, according to embodiment and/or usage scenarios, selectively differs from the weight value stored during the corresponding forward pass. As a specific example, in accordance with FIG. 28C, W 2817 stored $W_{1,t-k-j}$ during the forward pass. However, during the backward pass, additional weight updates have occurred, e.g., corresponding to m iterations, and now W 2817 stores $W_{1,t-k-j+m}$. Therefore, $A'_{2,t}$ 2884 selectively differs from the value discarded during the forward pass, $A_{2,t}$ 2882.

In the second portion of backward pass operation, computation proceeds using the recomputed activation. In SGD and MBGD scenarios, since the recomputed activation is identical to the discarded activation (e.g., conceptually the value stored in A 2829 is identical to the value stored in A 2826), the backward processing produces results that are identical to the results described with respect to FIG. 28B. E.g., deltas $\Delta'_{3,t}$ 2896, $\Delta'_{2,t}$ 2895, and $\Delta'_{1,t}$ 2894 are identical, respectively, to $\Delta_{3,t}$ 2893, $\Delta_{2,t}$ 2892, and $\Delta_{1,t}$ 2891. In the CPGD scenario, since the recomputed activation selectively differs from the discarded activation, the backward processing produces results that are selectively different from the results described with respect to FIG. 28B. E.g., deltas $\Delta'_{3,t}$ 2896, $\Delta'_{2,t}$ 2895, and $\Delta'_{1,t}$ 2894 are selectively different, respectively, to $\Delta_{3,t}$ 2893, $\Delta_{2,t}$ 2892, and $\Delta_{1,t}$ 2891.

In some embodiments and/or usage scenarios, W 2817 is distinct from W 2818 (as illustrated), and in some embodiments and/or usage scenarios, W 2818 and W 2817 are a same portion of storage (not illustrated), such that saving a new value in W 2818 overwrites a previously saved value in W 2817. Similarly, W 2827 is variously distinct from or the same as W 2828. In various embodiments and/or usage scenarios, A 2829 is variously implemented to use fewer memory locations and/or use a same number of memory locations for a shorter time than A 2826.

In various embodiments and/or usages scenarios, activations and/or weights are implemented and/or represented by any one or more scalar, vector, matrix, and higher-dimensional data structures. E.g., any one or more of A 2816, A 2826, A 2829, W 2817, W 2827, W 2818, and W 2828 are enabled to store any one or more of one or more scalars, one or more vectors, one or more matrices, and one or more higher-dimensional arrays.

In various embodiments and/or usage scenarios, one or more elements of Previous Layer 2801 and Subsequent Layer 2802 are implemented by respective PEs, e.g., a portion of PE 499 or similar elements of FIG. 4. E.g., PE 497 implements Previous Layer 2801 and PE 498 implements Subsequent Layer 2802. Activation $A_{2,t}$ 2882 and delta $\Delta_{2,t}$ 2892 are communicated via East coupling 431. In some embodiments and/or usage scenarios, one or more elements of Previous Layer 2801 and Subsequent Layer 2802 are implemented by one or more of CPUs, GPUs, DSPs, and FPGAs.

In various embodiments and/or usage scenarios, all or any portions of elements of F 2811, F 2821, B 2812, and B 2822 conceptually correspond to all or any portions of executions of instructions of Task SW on PEs 260 of FIG. 2.

Floating-Point Operating Context and Stochastic Rounding Operation

In some scenarios, an FP computation results in a value that has more precision than is expressible by the number format. For example, without rounding, an FP multiply result is twice the precision of the inputs. Rounding is used to remove the additional precision, so, e.g., the result is the same precision as the number format. The IEEE 754 standard describes five different (deterministic) rounding modes. Two modes round to the nearest value, but with different rules for breaking a tie. The default mode for some computing is round to nearest, with ties rounding to the nearest value with a '0' in the ULP. A second mode is round to nearest with ties rounded away from zero. Three modes round according to a specific rule. Round to zero is equivalent to truncation and simply removes all bits after the ULP. Round to infinity is equivalent to rounding up and rounding to negative infinity is equivalent to rounding down. IEEE 754 FP arithmetic is sometimes performed in accordance with one of the five rounding modes.

In some neural network embodiments and/or usage scenarios, a training process iterates through many FP computations that form long dependency chains. For example, a single iteration includes many vector and/or matrix FP operations that each have long dependency chains. For another example, many iterations are performed, each dependent on a preceding one of the iterations, resulting in long dependency chains. In some situations, because of the long dependency chains, tiny biases in rounding compound across many computations to systematically bias results, thus reducing accuracy, increasing training time, increasing inference latency, and/or reducing energy efficiency. In some scenarios and/or embodiments, use of stochastic rounding of FP results reduces the systematic bias, thereby improving accuracy, decreasing training time, decreasing inference latency, and/or increasing energy efficiency. In some scenarios and/or embodiments, rounding is performed on results of dependent FP operations (e.g. FP multiply-accumulate operations), and the rounded results are then fed back into a subsequent dependent FP operation, resulting in long dependency chains of rounded operations/results.

In some circumstances, performing stochastic rounding enables retaining some precision that would otherwise be lost if performing non-stochastic (e.g. deterministic) rounding. For example, consider a scenario with a neural network comprising a layer with thousands or millions of parameters, each parameter represented by a floating-point number with an N-bit mantissa. If the average magnitude of the parameter updates is small (e.g., 10% of updates are represented by an N+1-bit mantissa, and the remainder are even smaller), then without stochastic rounding the parameter updates would be rounded to zero and no learning would occur. With stochastic rounding, approximately 10% of the weights would be updated and learning would occur, essentially recovering some numerical precision lost by the N-bit mantissa, and thereby improving the latency of training the neural network and/or improving the accuracy of the trained neural network.

In some circumstances, neural network computations are conceptually statistical, and performing stochastic rounding instead of non-stochastic rounding enables effectively higher precision than would otherwise be possible in view of a particular FP precision. The improved precision of stochastic rounding enables smaller and more power-efficient compute logic (e.g., FPUs) and smaller and more power-efficient storage (e.g., latches, registers, and memories), thus enabling higher performance, lower latency, more accurate, and/or more power-efficient systems for training neural networks and performing inference with trained neural networks.

In various embodiments and/or usage scenarios, stochastic rounding is implemented at least in part via one or more PRNGs. An example of a PRNG is an RNG that deterministically generates a pseudo-random sequence of numbers, determined by an initial seed value. An LFSR is an example of a PRNG. Various PRNGs are implemented with LFSRs of varying length with respect to the number of bits of generated random numbers. For a first example, a 3-bit PRNG is implemented with a 3-bit LFSR. For a second example, a 32-bit LFSR is used to implement a 3-bit PRNG, such as by using the three LSBs of the LFSR as a 3-bit PRNG. Throughout the description herein, the term random number generator (RNG) will be understood to mean a pseudo-random number generator (PRNG), unless otherwise explicitly specified.

Figure 29:
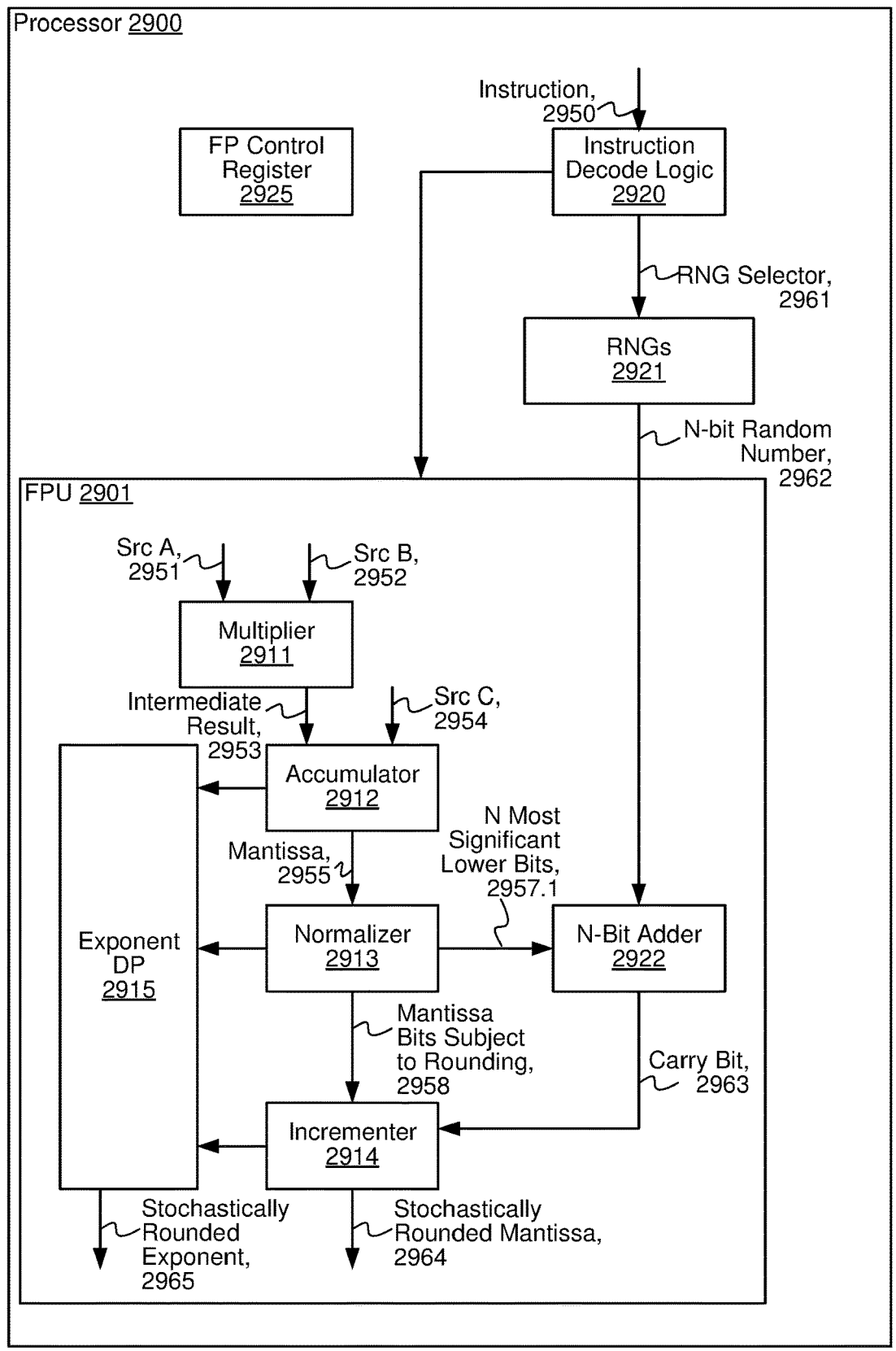
FIG. 29 illustrates selected details of an embodiment of a processor comprising a floating-point unit and enabled to perform stochastic rounding.

FIG. 29 illustrates selected details of Processor 2900 comprising FPU 2901 and enabled to optionally and/or selectively perform stochastic rounding for floating-point operations that produce floating-point, integer, and/or fixed-point results. In some embodiments, Processor 2900 comprises or is a portion of a deep learning accelerator, CPU, a GPU, an ASIC, or an FPGA. In various embodiments, any one or more of a deep learning accelerator, a CPU, a GPU, an ASIC, and an FPGA incorporates techniques as illustrated by FIG. 29.

Various embodiments comprise a plurality of instances of Processor 2900 and/or variations thereof. In various embodiments, a two-dimensional (or more-dimensional) array comprises a plurality of the instances of Processor 2900. In various embodiments, the array dimensionality is implemented as any one or more of a physical arrangement, a logical arrangement, a virtual arrangement, and a communication arrangement. In various usage scenarios, all or any portions of the instances perform all or any portions of operations that are long dependency chains. In various usage scenarios, the instances communicate with each other in accordance with the long dependency chains, such as to communicate results of computation, partial computations, intermediate calculations, feedback values, and so forth. In various usage scenarios, the long dependency chains comprise long dependency chains of FP computations. In various usage scenarios, the long dependency chains are performed wholly or in part to train one or more neural networks and/or to perform inferences with respect to one or more trained neural networks. In various usage scenarios, rounding bias is reduced in at least some of the long dependency chains (or one or more portions thereof) by using stochastic rounding such as enabled by random number information provided by the respective instance of RNGs 2921 included in each instance of Processor 2900. In some embodiments, Processor 2900 is a portion of a neural network accelerator.

Figure 30A:
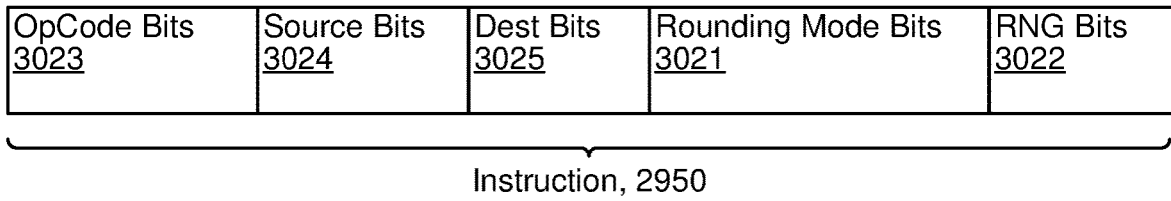
FIG. 30A illustrates selected details of an embodiment of a floating-point instruction that optionally specifies stochastic rounding.

FPU 2901 comprises FP control and execution logic such as Instruction Decode Logic 2920, RNGs 2921, FP Control Register 2925, Multiplier 2911, Accumulator 2912, Normalizer 2913, and Exponent DP 2915, as well as rounding logic such as N-bit Adder 2922 and Incrementer 2914. Processor 2900 comprises Instruction Decode Logic 2920 that is enabled to receive Instruction 2950 and decode Instruction 2950 into operations executed by FPU 2901. FIG. 30A illustrates selected details of Instruction 2950. In various embodiments, Processor 2900 comprises one or more RNGs 2921, and Instruction Decode Logic 2920 is coupled to the one or more RNGs 2921. In other embodiments, Processor 2900 comprises FPU 2901, and FPU 2901 comprises one or more RNGs 2921. In various embodiments, one or more of RNGs 2921 comprises one or more LFSRs.

In various embodiments, RNGs 2921 are initialized with seed values by configuration instructions, are readable by configuration instructions, and/or are writable by configuration instructions. In some usage scenarios, RNGs 2921 are managed to enable time-sharing of a computational system implemented in part by Processor 2900. For example, RNGs 2921 are initialized as part of initializing a first neural network computation, and after a portion of the first computation is completed, RNGs 2921 are read and saved in a first portion of non-volatile memory (not illustrated). Then, RNGs 2921 are initialized as part of initializing a second neural network computation, and after a portion of the second computation is completed, RNGs 2921 are read and saved in a second portion of the memory. Then, RNGs 2921 are written using the saved values from the first portion of the memory, and the first computation is resumed. In some embodiments, PRNGs enable deterministic random number generation which is advantageous in some usage scenarios, e.g., enabling reproducible computations. In various embodiments, RNGs 2921 comprise an entropy source that is not pseudo-random (e.g., truly random or quasi-random).

In some embodiments, RNGs 2921 comprises one random number generator (e.g., a single PRNG, a single PRNG comprising a LFSR).

Instruction Decode Logic 2920 is coupled to FPU 2901 and communicates an operation to be performed by FPU 2901, such as an FP multiply-accumulate operation with optional stochastic rounding, an FP multiply operation with optional stochastic rounding, an integer-to-FP data conversion with optional stochastic rounding, and so forth. The operation to be performed is specified by OpCode Bits 3023 of Instruction 2950 (See FIG. 30A). FPU 2901 comprises execution hardware that performs the operations. In various embodiments, Multiplier 2911 and Accumulator 2912 are coupled to various data storage locations such as registers, flops, latches, bypass networks, caches, explicitly addressed RAMs/DRAMs/SRAMs, and accumulation resources. Multiplier 2911 receives as operands Src A 2951 and Src B 2952 from the data storage locations specified by Source Bits 3024 of Instruction 2950 (see FIG. 30A) and performs an FP multiply (without normalizing and without rounding) of the operands to generate Intermediate Result 2953 (having exponent and mantissa portions). Accumulator 2912 is coupled to Multiplier 2911 and the data storage locations. Accumulator 2912 receives as operands Intermediate Result 2953 from Multiplier 2911 and Src C 2954 from the data storage location specified by Source Bits 3024 of Instruction 2950, and performs an FP add (without normalizing and without rounding) of the operands to generate Mantissa 2955 (as well as an exponent provided to Exponent DP 2915).

Figure 30B:
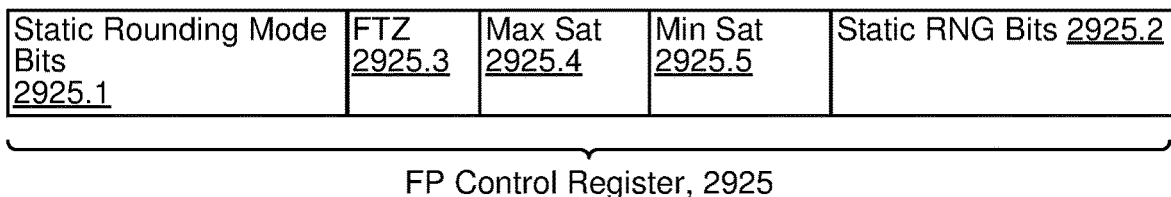
FIG. 30B illustrates selected details of an embodiment of a floating-point control register associated with controlling stochastic rounding.
Figure 30C:
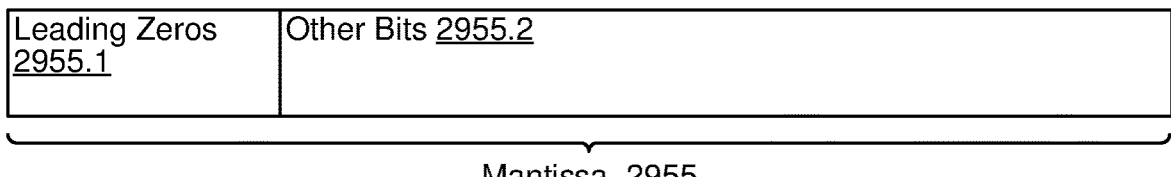
FIG. 30C illustrates selected details of an embodiment of a mantissa of a result of a floating-point operation, subject to normalization and rounding.
Figure 30D:
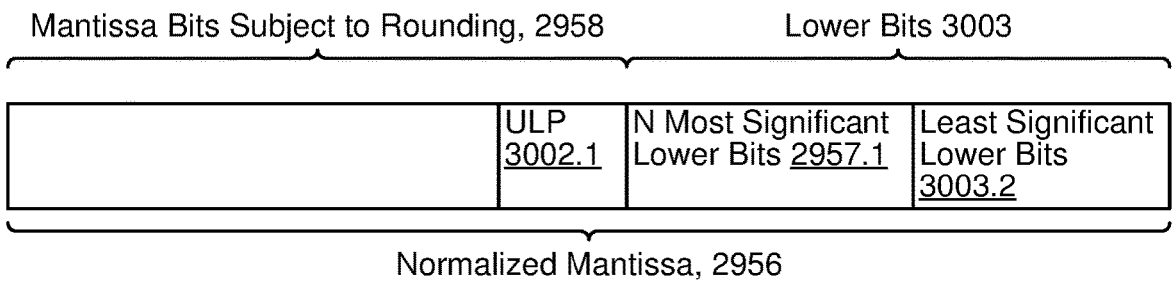
FIG. 30D illustrates selected details of an embodiment of a normalized mantissa of a result of a floating-point operation after normalization, and subject to rounding.

Referring to FIG. 29, FIG. 30C, and FIG. 30D, Normalizer 2913 is coupled to Accumulator 2912 and receives Mantissa 2955 from Accumulator 2912. According to usage scenario, Mantissa 2955 has zero or more more-significant zero bits, illustrated by Leading Zeros 2955.1. The remainder of less significant bits of Mantissa 2955 is denoted as Other Bits 2955.2. Normalizer 2913 normalizes Mantissa 2955 by detecting Leading Zeros 2955.1 and shifting Other Bits 2955.2 to the left, removing Leading Zeros 2955.1 to produce Normalized Mantissa 2956 comprising Mantissa Bits Subject to Rounding 2958 and N Most Significant Lower Bits 2957.1. Normalizer 2913 is coupled to Incrementer 2914 and N-bit Adder 2922. Normalizer 2913 provides Mantissa Bits Subject to Rounding 2958 to Incrementer 2914, and N Most Significant Lower Bits 2957.1 to N-bit Adder 2922. In various embodiments, the bit widths of Mantissa Bits Subject to Rounding 2958 and Stochastically Rounded Mantissa 2964 vary according to FP data format and/or FP data precision. For example, the bit widths of Mantissa Bits Subject to Rounding 2958 and Stochastically Rounded Mantissa 2964 are 11 bits for half-precision, 24 bits for single-precision, and 53 bits for double-precision.

Instruction Decode Logic 2920 is enabled to select a random number resource of RNGs 2921. Instruction Decode Logic 2920 decodes Rounding Mode Bits 3021 to determine a rounding mode associated with processing of the operation (the operation being specified by OpCode Bits 3023). If Rounding Mode Bits 3021 specify stochastic rounding, then Instruction Decode Logic 2920 decodes RNG Bits 3022 to generate RNG Selector 2961. RNGs 2921, in response to RNG Selector 2961, provide N-bit Random Number 2962. In various embodiments, RNGs 2921, further in response to RNG Selector 2961, advance the selected random number resource to produce a next random number. For example, RNGs 2921 implements four random number resources specified, selected, and identified respectively as 0, 1, 2, and 3. Each random number resource comprises a separate LFSR. In response to RNG Bits 3022 having a value of '1', Instruction Decode Logic 2920 provides a value of '1' on RNG Selector 2961. In response to RNG Selector 2961 being '1', RNGs 2921 provides the value of LFSR '1' as N-bit Random Number 2962, and subsequently advances the state of LSFR '1' to a next state. In various embodiments, one or more random number resources of RNGs 2921 are usable as source operands of instructions, such as any more of Src A 2951, Src B 2952, and Src C 2954, thereby providing random numbers as input data for the instructions.

In some embodiments, N-bit Adder 2922 is an integer adder that is enabled to receive and sum two inputs: N Most Significant Lower Bits 2957.1 and N-bit Random Number 2962. N-bit Adder 2922 provides a carry out of the sum as Carry Bit 2963. Incrementer 2914 receives Mantissa Bits Subject to Rounding 2958 and Carry Bit 2963. Incrementer 2914 provides an output that is a conditional increment of Mantissa Bits Subject to Rounding 2958 as Stochastically Rounded Mantissa 2964. If Carry Bit 2963 is asserted, then Incrementer 2914 provides an increment (starting at ULP 3002.1) of Mantissa Bits Subject to Rounding 2958 as Stochastically Rounded Mantissa 2964. If Carry Bit 2963 is de-asserted, then Incrementer 2914 provides Mantissa Bits Subject to Rounding 2958 without change as Stochastically Rounded Mantissa 2964. In various embodiments, the bit width of Incrementer 2914 varies to accommodate the bit width of Mantissa Bits Subject to Rounding 2958. For example, if the bit width of Mantissa Bits Subject to Rounding 2958 is 11 bits (half-precision), then Incrementer 2914 is also 11 bits. In various embodiments, N is 3, the N Most Significant Lower Bits 2957.1 comprises 3 bits, the N-bit Random Number 2962 comprises 3 random bits, and the N-bit Adder 2922 comprises a 3-bit adder. In various other embodiments, N is variously 4, 5, 7, or any integer number.

Exponent DP 2915 is an FP exponent data path that adjusts, in accordance with normalization information received from Normalizer 2913, an exponent received from Accumulator 2912. In some embodiments and/or usage scenarios, Exponent DP 2915 receives rounding information (such as stochastic rounding information) from Incrementer 2914 and further adjusts the exponent accordingly, producing Stochastically Rounded Exponent 2965. Stochastically Rounded Exponent 2965 and Stochastically Rounded Mantissa 2964 taken together form a complete FP result, suitable, for example, for storage for later use, or for feedback to any of Src A 2951, Src B 2952, and Src C 2954 as an input operand for subsequent operations.

In various embodiments, Processor 2900 comprises FP Control Register 2925. In some embodiments, FPU 2901 comprises FP Control Register 2925. In some embodiments, FP Control Register 2925 specifies that all or any portions of operations (such as all FP multiplies and all FP multiply-accumulates) are performed using a specified rounding mode (e.g., a stochastic rounding mode of a plurality of rounding modes). In various embodiments, rounding mode information from Instruction 2950 overrides the specified rounding mode from FP Control Register 2925 (such as on an instruction-by-instruction basis). In some embodiments, FP Control Register 2925 provides random number resource selection information specifying that all stochastically rounded operations are performed using a specified one or more random number resources of RNGs 2921. In various embodiments, random number resource selection information from Instruction 2950 overrides the random number resource selection information from FP Control Register 2925.

The partitioning in FIG. 29 is merely exemplary. In various embodiments, two or more elements of FIG. 29 are implemented as a single unit. For example, in some embodiments, Multiplier 2911 and Accumulator 2912 are implemented as a fused FP multiplier-accumulator.

As illustrated, FPU 2901 is enabled to perform FP multiply-accumulate operations with optional stochastic rounding In some embodiments, additional hardware (not illustrated) enables FPU 2901 to perform additional FP operations with optional stochastic rounding, such as addition, subtraction, multiplication, division, reciprocal, comparison, absolute value, negation, maximum, minimum, elementary functions, square root, logarithm, exponentiation, sine, cosine, tangent, arctangent, conversion to a different format, and conversion from/to integer.

In various embodiments and/or usage scenarios, Processor 2900 has hardware logic to fetch a stream of instructions from an instruction storage element, providing the fetched instructions to Instruction Decode Logic 2920 as respective instances of Instruction 2950. In various embodiments, the instruction storage element implements non-transitory media, such as computer readable medium such as a computer readable storage medium (e.g., media in an optical and/or magnetic mass storage device such as a disk, or an integrated circuit having non-volatile storage such as flash storage).

FIG. 30A illustrates selected details of floating-point Instruction 2950 that optionally specifies stochastic rounding. Instruction 2950 comprises several bit fields. In various embodiments and/or usage scenarios, Instruction 2950 comprises any zero or more of OpCode Bits 3023, Source Bits 3024, Dest Bits 3025, Rounding Mode Bits 3021, and/or RNG Bits 3022. OpCode Bits 3023 specifies one or more FP operations to be executed, such as any one or more of addition, subtraction, multiplication, division, reciprocal, comparison, absolute value, negation, maximum, minimum, elementary functions, square root, logarithm, exponentiation, sine, cosine, tangent, arctangent, conversion to a different format, conversion from/to integer, and multiply-accumulate. In various embodiments, OpCode Bits 3023 optionally specifies one or more data types associated with the operations, such as any one or more of integer, floating-point, half-precision floating-point, single-precision floating-point, and double-precision floating-point data types. Source Bits 3024 optionally specifies one or more source operands corresponding to locations of input data for the operations. Dest Bits 3025 optionally specifies one or more destination operands corresponding to locations for storage of output data of the operations. In various embodiments, source and/or destination operands are various storage locations, such as registers, flops, latches, bypass networks, caches, explicitly addressed RAMs/DRAMs/SRAMs, and accumulation resources. In various embodiments, source and/or destination operands are various other elements, such as elements of a bypass network.

Rounding Mode Bits 3021 optionally specifies one or more rounding modes to use when processing the operations, such as stochastic rounding, any IEEE 754 standard rounding, and any other rounding modes. RNG Bits 3022 optionally specifies one or more random number resources of RNGs 2921 to use when processing the operations, such as when performing stochastic rounding.

FIG. 30B illustrates selected details of FP Control Register 2925 associated with controlling stochastic rounding. In various embodiments, FP Control Register 2925 comprises a bit field Static Rounding Mode Bits 2925.1 that specifies a rounding mode to use for operations performed by FPU 2901. In various embodiments, Static Rounding Mode Bits 2925.1 specifies a stochastic rounding mode or one of five IEEE 754 standard rounding modes (the five IEEE 754 rounding modes are deterministic rounding modes that depend only the input data to be rounded). In some scenarios, all operations performed by FPU 2901 use the rounding mode specified by Static Rounding Mode Bits 2925.1. In some embodiments, Static Rounding Mode Bits 2925.1 is set by a configuration instruction. For example, a configuration instruction sets Static Rounding Mode Bits 2925.1 to specify a stochastic rounding mode, and all subsequently executed operations use stochastic rounding until Static Rounding Mode Bits 2925.1 are changed to specify a different rounding mode. In some embodiments and/or usage scenarios, Rounding Mode Bits 3021 of Instruction 2950 override Static Rounding Mode Bits 2925.1 of FP Control Register 2925, such as on a per-instruction basis.

In some embodiments, FP Control Register 2925 comprises bit field FTZ 2925.3 that controls behavior of subnormal FP numbers. When FTZ 2925.3 is set to a first value (e.g., 1), FPU 2901 flushes subnormal results of an operation to zero. When FTZ 2925.3 is set to a second value (e.g., 0), FPU 2901 flushes subnormal results of an operation to the minimum normal value. In various embodiments, FP Control Register 2925 comprises bit fields Max Sat 2925.4 and/or Min Sat 2925.5. When Max Sat 2925.4 is set to a first value (e.g., 0), operations performed by FPU 2901 that overflow the FP representation return infinity, while otherwise retaining behavior of the rounding mode specified (e.g., by Rounding Mode Bits 3021). When Max Sat 2925.4 is set to a second value (e.g., 1), operations performed by FPU 2901 that overflow the FP representation return the maximum normal magnitude value, instead of returning infinity, while otherwise retaining behavior of the rounding mode specified (e.g., by Rounding Mode Bits 3021). When Min Sat 2925.5 is set to a first value (e.g., 0), operations performed by FPU 2901 that underflow the FP representation return zero, while otherwise retaining behavior of the rounding mode specified (e.g., by Rounding Mode Bits 3021). When Min Sat 2925.5 is set to a second value (e.g., 1), operations performed by FPU 2901 that underflow the FP representation return the minimum normal magnitude value (e.g., in flush-to-zero rounding mode) or the minimum subnormal value (e.g. in another rounding mode), instead of returning zero, while otherwise retaining behavior of the rounding mode specified (e.g., by Rounding Mode Bits 3021).

In various embodiments, the number of random number resources implemented by RNGs 2921 is respectively 1, 2, 4, and 7. In various usage scenarios, respective groups of instructions specify (via respective values in RNG Bits 3022 and/or Static RNG Bits 2925.2) to use respective ones of the random number resources of RNGs 2921. For example, the respective RNG Bits 3022 value in a first group of instructions is a same first value, specifying that all the instructions in the first group use a same first random number resource of RNGs 2921 for stochastic rounding. Continuing with the example, the respective RNG Bits 3022 value in a second group of instructions is a same second value, specifying that all the instructions in the second group use a same second random number resource of RNGs 2921 for stochastic rounding. For another example, preceding execution of a first group of instructions, Static RNG Bits 2925.2 is set by a first configuration instruction to specify a first random number resource of RNGs 2921 for stochastic rounding. Continuing with the example, the first group of instructions is executed, in accordance with the first random number resource. Then, preceding a second group of instructions, Static RNG Bits 2925.2 is set by a second configuration instruction to specify a second random number resource of RNGs 2921 for stochastic rounding. Continuing with the example, the second group of instructions is executed, in accordance with the second random number resource. In some embodiments, specification of which RNG to use for an instruction is predetermined and/or implicit. E.g., in embodiments with a single RNG, the single RNG is used without reference to RNG Bits 3022 or Static RNG Bits 2925.2.

There are no requirements on arrangement in storage or execution with respect to instructions of the groups. In various embodiments and usage scenarios, instructions in the first group are contiguous with respect to each other in program storage and/or execution order, are not contiguous with respect to each other in program storage and/or execution order, and are variously arranged with respect to each other and other instructions, such as intermixed with one or more instructions of any other groups of instructions, and similarly for the second group and any other groups of instructions. In some embodiments and/or usage scenarios, using a same random number resource of a group of instructions improves determinism and/or reproducibility of execution.

In some scenarios where random number resource selection varies relatively frequently, instructions specify that random number resource selection is via respective values in RNG Bits 3022, and the respective values optionally vary from one instruction to the next. In some scenarios where random number selection varies relatively infrequently, instructions specify that random number resource selection is via Static RNG Bits 2925.2, and the value therein is held constant for several instructions.

FIG. 30C illustrates selected details of Mantissa 2955 (a mantissa of a result of a floating-point operation, subject to normalization and rounding), with the MSB on the left side and the LSB on the right side. In some embodiments, Mantissa 2955 has more bits than the mantissa of the FP data format used by the FP operation. In some embodiments, Mantissa 2955 of a half-precision multiply-accumulate operation is 45 bits, and Mantissa 2955 is normalized and rounded to a 16-bit representation with an 11-bit mantissa. Mantissa 2955 as illustrated has two fields, zero or more contiguous Leading Zeros 2955.1 and remaining bits Other Bits 2955.2 (having a most significant bit of value '1').

FIG. 30D illustrates selected details of Normalized Mantissa 2956 (a mantissa of a result of a floating-point operation after normalization, and subject to rounding), with the MSB on the left side and the LSB on the right side. Normalized Mantissa 2956 as illustrated has two fields, Mantissa Bits Subject to Rounding 2958 and Lower Bits 3003. The MSB of Normalized Mantissa 2956 is a leading '1' (although in some embodiments the leading '1' is not explicitly stored). The LSB of Mantissa Bits Subject to Rounding 2958 is ULP 3002.1. Lower Bits 3003 are bits less significant than ULP 3002.1. Lower Bits 3003 as illustrated has two fields, N Most Significant Lower Bits 2957.1 and Least Significant Lower Bits 3003.2. In various embodiments, stochastic rounding enables the N Most Lower Significant Bits 2957.1 to probabilistically influence rounding of Mantissa Bits Subject to Rounding 2958 starting at ULP 3002.1. In some embodiments and/or usage scenarios, the probabilistically influencing enables reducing systematic rounding bias in computations that comprise portions of long dependency chains, such as long dependency chains associated with neural network computations.

Figure 31:
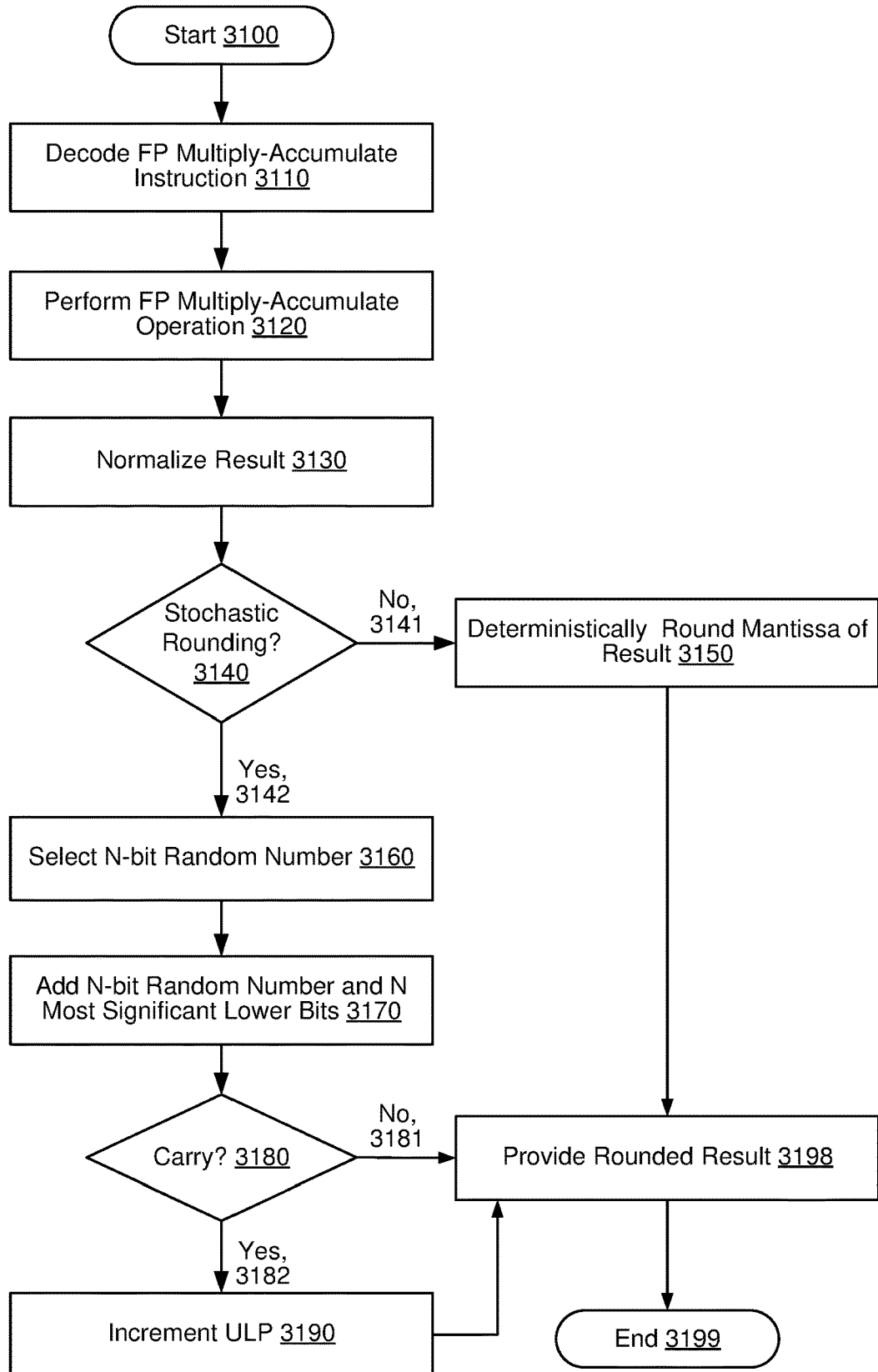
FIG. 31 illustrates a flow diagram of selected details of an embodiment of a processor executing a floating-point instruction with optional stochastic rounding.

FIG. 31 illustrates a flow diagram of selected details of Processor 2900 executing a floating-point instruction with optional stochastic rounding. For exposition, the instruction is an FP multiply-accumulate instruction. In other embodiments and/or usage scenarios, the instruction is any FP instruction such as addition, subtraction, multiplication, division, reciprocal, comparison, absolute value, negation, maximum, minimum, elementary functions, square root, logarithm, exponentiation, sine, cosine, tangent, arctangent, conversion to a different format, and conversion from/to integer.

Processing of Instruction 2950 begins in action 3100. In action 3110, Processor 2900 decodes Instruction 2950 and various specifiers therein. The specifiers include an operation specifier (such as specifying an FP multiply-accumulate operation via a specific encoding in OpCode Bits 3023). In various embodiments, the FP multiply-accumulate instruction specifies one of half-, single-, and double-precision data and operations. In some embodiments, the data and operation precision are specified by OpCode Bits 3023, and in other embodiments the data and operation precision are specified by a separate bitfield in Instruction 2950 (not illustrated).

In action 3120, Multiplier 2911 performs an FP multiplication of Src A 2951 and Src B 2952, producing Intermediate Result 2953 as a result (having exponent and mantissa portions). Accumulator 2912 then performs an FP add of Intermediate Result 2953 and Src C 2954, producing Mantissa 2955 as a result (as well as an exponent provided to Exponent DP 2915). In action 3130, Normalizer 2913 normalizes Mantissa 2955, detecting Leading Zeros 2955.1 (if any) and shifting Other Bits 2955.2 to the left, removing Leading Zeros 2955.1 to produce Normalized Mantissa 2956.

In action 3140, Processor 2900 determines the rounding mode, e.g., by decoding Rounding Mode Bits 3021. If Rounding Mode Bits 3021 specifies a stochastic rounding mode 3142, then flow proceeds to action 3160. If Rounding Mode Bits 3021 specifies other-than a stochastic rounding mode (e.g. round to nearest even) 3141, then flow proceeds to action 3150. In action 3150, FPU 2901 deterministically rounds (e.g. without stochastic rounding) according to the specified rounding mode, and flow proceeds to action 3198.

In action 3160, Processor 2900 selects a random number resource of RNGs 2921 (e.g., based on decoding RNG Bits 3022). In some embodiments, a random number resource of RNGs 2921 is selected based on Static RNG Bits 2925.2. The selected random number resource is provided as N-bit Random Number 2962. In action 3170, N-bit Random Number 2962 and N Most Significant Lower Bits 2957.1 are added together (integer addition) by N-bit Adder 2922.

In action 3180, subsequent flow is conditionally dependent on whether the addition performed by N-bit Adder 2922 produces a carry (Carry Bit 2963 is asserted). If so 3182, then flow proceeds to action 3190. If not 3181, then Mantissa Bits Subject to Rounding 2958 is provided without change (such as by a pass-through function of Incrementer 2914) as Stochastically Rounded Mantissa 2964, and flow proceeds to action 3198. In action 3190, Incrementer 2914 provides an increment (starting at ULP 3002.1) of Mantissa Bits Subject to Rounding 2958 as Stochastically Rounded Mantissa 2964. Flow then proceeds to action 3198, where Stochastically Rounded Exponent 2965 and Stochastically Rounded Mantissa 2964 are collectively provided to a destination in accordance with the destination operand specifier (Dest Bits 3025). Processing of the instruction is then complete at action 3199.

In some embodiments and/or usage scenarios, action 3170 is conceptually a mechanism to compare N-bit Random Number 2962 and N Most Significant Lower Bits 2957.1 to determine whether to round up (3182) or round down (3181). By using N-bit Random Number 2962 as a comparison source, probability of the round up/down decision is equal to the fraction represented by N Most Significant Lower Bits 2957.1 (e.g., the probability of rounding away from zero is the fraction represented by N Most Significant Lower Bits 2957.1), which enables unbiased rounding. In some embodiments, Least Significant Lower Bits 3003.2 is ignored when performing stochastic rounding In some embodiments, the LSB of N Most Significant Lower Bits 2957.1 is replaced with a logical OR of what N Most Significant Lower Bits 2957.1 would otherwise be and one or more bits of Least Significant Lower Bits 3003.2.

In some embodiments and/or usage scenarios, Processor 2900 is enabled to optionally and/or selectively perform stochastic rounding for floating-point operations that produce integer results or fixed-point results. For example, Processor 2900 is enabled to perform stochastic rounding for a floating-point to integer conversion operation, with the stochastic rounding affecting the resultant integer value. For another example, Processor 2900 is enabled to perform stochastic rounding for a floating-point to fixed-point conversion operation, with the stochastic rounding affecting the resultant fixed-point value.

In various embodiments and/or usage scenarios, the training process with FP computations that form long dependency chains corresponds conceptually and/or is related conceptually to concepts disclosed in section "Deep Learning Accelerator Example Uses" (see, e.g., FIGS. 27A-28E and related text) and section "Example Workload Mapping and Exemplary Tasks" (see, e.g., FIGS. 11-12 and related text). For example, First Forward Pass 2711 of FIG. 27A, Forward Pass 2751 of FIG. 27C, and Forward Pass 2771 of FIG. 27D respectively correspond to FP computations with long dependency chains. For another example, f_psum:prop 1103 of FIG. 11 corresponds to an element of a long dependency chain of FP computations.

In various embodiments and/or usage scenarios, all or any portions of Processor 2900 of FIG. 29 correspond and/or are related conceptually to all or any elements of a PE or a CE of a PE. For example, an instance of Processor 2900 corresponds to an instance of PE 499 of FIG. 4. For another example, a two-dimensional array of instances of Processor 2900 corresponds to the two-dimensional array of instances of PE 499 interconnected as illustrated in FIG. 4. For another example, Processor 2900 corresponds to CE 800 of FIG. 8. For another example, all or any portions of FPU 2901 correspond and/or are related conceptually to various elements of Data Path 852 of FIG. 8. For another example, all or any portions of Instruction Decode Logic 2920 correspond or are related conceptually to elements of Dec 840 of FIG. 8. For another example, all or any potions of FP Control Register 2925 are implemented in CE 800. For another example, all or any portions of RNGs 2921 correspond and/or are related conceptually to various Data Path 852. In various embodiments and/or usage scenarios, one or more instances of Instruction 2950 are stored in memory 854 of FIG. 8.

In various embodiments and/or usage scenarios, one or more instances of Instruction 2950 correspond to all or any portions of Task SW on PEs 260 of FIG. 2, and/or correspond to all or any portions of Forward Pass, Delta Pass, Chain Pass, Update Weights 350 of FIG. 3. In various embodiments and/or usage scenarios, all or any portions of actions illustrated in FIG. 31 correspond to all or any portions of Execute Fetched Instruction(s) 906 of FIG. 9A.

In various embodiments and/or usage scenarios, all or any portions of Instruction 2950 correspond and/or are related conceptually to instructions, e.g., Multiple Operand Instruction 2510 of FIG. 25A, One Source, No Destination Operand Instruction 2520 of FIG. 25B, and Immediate Instruction 2530 of FIG. 25C. For example, OpCode Bits 3023 corresponds to Opcode 2512 of FIG. 25A. For another example, Source Bits 3024 corresponds to Operand 0 Encoding 2513 of FIG. 25A. For another example, Dest Bits 3025 corresponds to Operand 0 Encoding 2513 of FIG. 25A. For another example, Rounding Mode Bits 3021 is determinable from Operand 1 Encoding 2514 of FIG. 25A.

Scalability for Large Deep Neural Networks

A consideration in evaluating hardware architectures for implementing Deep Neural Networks (DNN) is storage capacity of the hardware in comparison to storage requirements for weights associated with the DNN. The weights are an example of a parameter of a neural network. Additional storage required for forward partial sums, activations (including but not limited to layer outputs), and other implementation overhead (e.g. for convolutions), however, is in some situations, modest compared to the storage requirements for the weights. In the context of academic and industrial benchmarks, popular DNNs include LeNet-5, AlexNet, VGG-16, GoogLeNet(v1), and ResNet-50. The popular DNNs range from 4 to 50 layers, require between 341k and 15.5G MAC (Multiply and Accumulate) operations, and require between 60k and 138M weights, in total across all layers. Assuming each weight requires 16-bit precision, the popular DNNs have storage requirements of between 120 kB and 276 MB, just for weights, after training. For 32-bit precision, the requirements are double. Additional storage is required during training, e.g., for gradient accumulations, delta partial sums, layer errors, and duplicated weights. For some training methods (e.g., minibatch), the weights are duplicated multiple times, increasing the weight storage requirements accordingly.

Various factors affect usage of memory of a hardware accelerator for deep neural networks, e.g., Memory 854 of FIG. 8, between instructions and data, and further between the various types of data, e.g. weights, gradient accumulations, forward partial sums, delta partial sums, and forward pass activations. E.g., the various factors include the dataflow graph being executed and the particular algorithms used. In various embodiments and/or usage scenarios, with respect to the PE comprising it, Memory 854 provides a private memory space with unified storage for neuron inputs, neuron outputs, and synaptic weights for neuron(s) mapped to the PE. It is understood, that for convolution layers, the term neuron represents a filter or kernel. In various embodiments and/or usage scenarios, there are 500k PEs in which Memory 854 holds 48 kB, with 16 kB used for instructions and 32 kB used for data per PE, for 24 GB total memory. Further according to embodiment there are, e.g., between 20k and 40k PEs per ASIC, and each ASIC holds between 0.96 and 1.92 GB, with between 0.24 and 0.48 GB used for instructions and between 0.72 and 1.44 GB used for data per ASIC. In various embodiments and/or usage scenarios, there are 3M PEs in which Memory 854 holds 8 kB, with 2 kB used for instructions and 6 kB used for data per PE, for 24 GB total memory. Further according to embodiment there are, e.g., between 20k and 40k PEs per ASIC, and each ASIC holds between 0.16 and 0.32 GB, with between 0.04 and 0.08 GB used for instructions and between 0.12 and 0.24 GB used for data per ASIC.

Using either 16-bit or 32-bit precision weights, any of the aforementioned embodiments, in which Memory 854 holds 48 kB, is enabled to minimally implement the most demanding (VGG-16) of the above mentioned popular DNNs in a single ASIC, with all layers concurrently resident, for one or both of inference and training (e.g., for one or both of forward propagation and backward propagation), and without using external check-pointing or other external (off chip, or off wafer) storage of any of the intermediate (not yet final) state of the DNN. Any of the aforementioned embodiments, in which Memory 854 holds 8 kB or more, is enabled to minimally implement any of the above mentioned popular DNNs across a small plurality of ASICs of the wafer, with all layers concurrently resident, for one or both of inference and training, and without using external check-pointing or other external (off chip, or off wafer) storage of any of the intermediate state of the DNN. The required minimum number of ASICs depends on the embodiment (e.g., 8 kB vs. 48 kB for Memory 854, and e.g., whether weights of 16-bit or 32-bit precision are used). Stated differently, all (e.g., 100%) of the neurons and synapses of large DNNs are implementable in hardware (more particularly, in wafer 412, of Deep Learning Accelerator 400, of FIG. 4), with all layers (input, hidden (aka intermediate), and output) concurrently resident and executing, for one or both of inference and training, and without using external check-pointing or other external (off chip, or off wafer) storage of any of the intermediate (not yet final) state of the DNN.

In various embodiments and/or usage scenarios, Data Path 852 of FIG. 8 includes respective dedicated hardware resources for floating-point multiply, format conversion, addition, shifting, and logic. In various embodiments and/or usage scenarios, Data Path 852 implements half-precision (16-bit) and single-precision (32-bit) IEEE-754 floating-point using a half-precision multiplier. In various embodiments and/or usage scenarios, Data Path 852 comprises an 11×11 multiplier array, an 8×8 multiplier array, a 22-bit adder, a 16-bit adder, a 22-bit shifter, and a 16-bit logic unit. Further according to embodiment there are, e.g., between 500k and 3M PEs per wafer, corresponding to between 500k and 3M instances of Data Path 852 and, except for defects, a corresponding number of multipliers, adders, shifters, and logic units per wafer. Further according to embodiment there are, e.g., between 20k and 40k PEs per ASIC, corresponding to between 20k and 40k instances of Data Path 852 and, except for defects, a corresponding number of multipliers, adders, shifters, and logic units per ASIC.

As described above, the aforementioned embodiments, in which Memory 854 holds between 8 kB and 48 kB, are enabled to minimally implement any of the above-mentioned popular DNNs via a small plurality of ASICs of the wafer. However, in view of the large number of MAC operations required for large DNNs (e.g., 15.5G MAC operations for VGG-16), performance (often viewed in terms of "wall-clock time") for minimal implementations of such large DNNs is constrained by the number of data path resources, particularly multipliers, which for various embodiments and/or usage scenarios are necessarily being reused. Yet, according to embodiment, the entire system will have 500k to 3M instances of Data Path 852, or 25× to 150× the number as a single ASIC. By smearing (as discussed in detail elsewhere herein) and/or spreading out the neurons of the DNN (across more PEs and more ASICS of the wafer, but mindful of transfer latencies between the spread neurons) will offer potential speedup (and corresponding reduced wall-clock time) via enabling increased concurrent use, particularly of multipliers. Stated differently, in various embodiments and/or usage scenarios, in executing the training and/or operation of a dataflow graph (e.g. a DNN), the system is enabled to scale the performance (e.g., reduce wall-clock time) by one to two orders of magnitude (potentially, e.g., 25× to 150×, according to embodiment) by altering the placement (the mapping of the DNN onto PEs) to change utilization (e.g., increase parallel operation of greater numbers of multipliers) of the large number of instances of Data Path 852 in Deep Learning Accelerator 400 (e.g., via selective spreading and/or smearing of the nodes of the dataflow graph, or the neurons of the DNN).

Other Embodiment Details

Embodiments and usage scenarios described with respect to FIGS. 1-31 are conceptually with respect to a PE comprising a CE that is programmable, e.g., that processes data according to instructions. Other embodiments are contemplated with one or more of the CEs being partially or entirely hardwired, e.g., that process data according to one or more fixed-circuit processing elements operable without instructions. As a specific example, a particular CE comprises a hardware logic unit circuit that implements all or a portion of an LSTM unit. The particular CE is comprised with a router in a particular PE that is operable in a fabric with other PEs. Some of the other PEs are similar to or identical to the particular PE and some of the other PEs are similar to or identical to PE 499 of FIG. 4.

Example Implementation Techniques

In some embodiments, various combinations of all or any portions of operations performed for and/or structure associated with any of accelerated deep learning; stochastic rounding for accelerated deep learning, microthreading for accelerated deep learning; task activating for accelerated deep learning; backpressure for accelerated deep learning; data structure descriptors and fabric vectors for accelerated deep learning; neuron smearing for accelerated deep learning; task synchronization for accelerated deep learning; dataflow triggered tasks for accelerated deep learning; a control wavelet for accelerated deep learning; and/or a wavelet representation for accelerated deep learning; as well as portions of a processor, microprocessor, system-on-a-chip, application-specific-integrated-circuit, hardware accelerator, or other circuitry providing all or portions of the aforementioned operations, are specified by a specification compatible with processing by a computer system. The specification is in accordance with various descriptions, such as hardware description languages, circuit descriptions, netlist descriptions, mask descriptions, or layout descriptions. Example descriptions include: Verilog, VHDL, SPICE, SPICE variants such as PSpice, IBIS, LEF, DEF, GDS-II, OASIS, or other descriptions. In various embodiments, the processing includes any combination of interpretation, compilation, simulation, and synthesis to produce, to verify, or to specify logic and/or circuitry suitable for inclusion on one or more integrated circuits. Each integrated circuit, according to various embodiments, is compatible with design and/or manufacture according to a variety of techniques. The techniques include a programmable technique (such as a field or mask programmable gate array integrated circuit), a semi-custom technique (such as a wholly or partially cell-based integrated circuit), and a full-custom technique (such as an integrated circuit that is substantially specialized), any combination thereof, or any other technique compatible with design and/or manufacture of integrated circuits.

In some embodiments, various combinations of all or portions of operations as described by a computer readable medium having a set of instructions stored therein, are performed by execution and/or interpretation of one or more program instructions, by interpretation and/or compiling of one or more source and/or script language statements, or by execution of binary instructions produced by compiling, translating, and/or interpreting information expressed in programming and/or scripting language statements. The statements are compatible with any standard programming or scripting language (such as C, C++, Fortran, Pascal, Ada, Java, VBscript, and Shell). One or more of the program instructions, the language statements, or the binary instructions, are optionally stored on one or more computer readable storage medium elements. In various embodiments, some, all, or various portions of the program instructions are realized as one or more functions, routines, sub-routines, in-line routines, procedures, macros, or portions thereof.

CONCLUSION

Certain choices have been made in the description merely for convenience in preparing the text and drawings, and unless there is an indication to the contrary, the choices should not be construed per se as conveying additional information regarding structure or operation of the embodiments described. Examples of the choices include: the particular organization or assignment of the designations used for the figure numbering and the particular organization or assignment of the element identifiers (the callouts or numerical designators, e.g.) used to identify and reference the features and elements of the embodiments.

Various forms of the words "include" and "comprise" are specifically intended to be construed as abstractions describing logical sets of open-ended scope and are not meant to convey physical containment unless described explicitly (such as followed by the word "within").

Although the foregoing embodiments have been described in some detail for purposes of clarity of description and understanding, the invention is not limited to the details provided. There are many embodiments of the invention. The disclosed embodiments are exemplary and not restrictive.

It will be understood that many variations in construction, arrangement, and use are possible consistent with the description, and are within the scope of the claims of the issued patent. For example, interconnect and function-unit bit-widths, clock speeds, and the type of technology used are variable according to various embodiments in each component block. The names given to interconnect and logic are merely exemplary, and should not be construed as limiting the concepts described. The order and arrangement of flowchart and flow diagram process, action, and function elements are variable according to various embodiments. Also, unless specifically stated to the contrary, value ranges specified, maximum and minimum values used, or other particular specifications (such as file types; and the number of entries or stages in registers and buffers), are merely those of the described embodiments, are expected to track improvements and changes in implementation technology, and should not be construed as limitations.

Functionally equivalent techniques known in the art are employable instead of those described to implement various components, sub-systems, operations, functions, routines, sub-routines, in-line routines, procedures, macros, or portions thereof. It is also understood that many functional aspects of embodiments are realizable selectively in either hardware (e.g., generally dedicated circuitry) or software (e.g., via some manner of programmed controller or processor), as a function of embodiment dependent design constraints and technology trends of faster processing (facilitating migration of functions previously in hardware into software) and higher integration density (facilitating migration of functions previously in software into hardware). Specific variations in various embodiments include, but are not limited to: differences in partitioning; different form factors and configurations; use of different operating systems and other system software; use of different interface standards, network protocols, or communication links; and other variations to be expected when implementing the concepts described herein in accordance with the unique engineering and business constraints of a particular application.

The embodiments have been described with detail and environmental context well beyond that required for a minimal implementation of many aspects of the embodiments described. Those of ordinary skill in the art will recognize that some embodiments omit disclosed components or features without altering the basic cooperation among the remaining elements. It is thus understood that much of the details disclosed are not required to implement various aspects of the embodiments described. To the extent that the remaining elements are distinguishable from the prior art, components and features that are omitted are not limiting on the concepts described herein.

All such variations in design are insubstantial changes over the teachings conveyed by the described embodiments. It is also understood that the embodiments described herein have broad applicability to other computing and networking applications, and are not limited to the particular application or industry of the described embodiments. The invention is thus to be construed as including all possible modifications and variations encompassed within the scope of the claims of the issued patent.

What is claimed is:

1. A method comprising:
sending a packet by a sending processing element to a fabric, the packet comprising a specifier and an indicator, the specifier being one of a plurality of specifiers each associated with a respective set of one or more sets of packets, the indicator being enabled to selectively indicate that the packet is a control packet, and the sending comprising executing a first instruction that comprises a destination operand that specifies a destination operand descriptor that is usable to determine at least in part the specifier and the indicator;
routing the packet from the sending processing element to one or more receiving processing elements, the routing being in accordance with the specifier and via the fabric and one or more routing elements;
in at least one of the receiving processing elements, receiving the packet from the fabric and processing the packet;
wherein the receiving comprises associating the packet with the respective set associated with the specifier;
wherein the processing comprises executing a second instruction that comprises a source operand that specifies a source operand descriptor that is usable to indicate at least in part the specifier and to selectively indicate termination upon receipt of a control packet; and
wherein the executing the second instruction comprises terminating the second instruction, responsive to (a) the packet being older than any other packets associated with the respective set associated with the specifier, (b) the indicator selectively indicating the packet is a control packet, and (c) the source operand descriptor selectively indicating to terminate upon receipt of a control packet.

2. The method of claim 1, wherein the packet is a first packet, the specifier is a first specifier, the source operand descriptor is further usable to indicate at least in part a second specifier of the plurality of specifiers, and further comprising selecting for processing a second packet associated with the respective set associated with the second specifier.

3. The method of claim 1, wherein:
the packet further comprises an index;
the destination operand descriptor is usable to determine at least in part the index;
the processing further comprises the at least one receiving processing element reading and executing one or more instructions; and
the reading is from a memory of the at least one receiving processing element at an address determined based at least in part on the index.

4. The method of claim 3, wherein the address is based at least in part on a portion of the index plus a base register of the at least one receiving processing element.

5. The method of claim 1, wherein the specifier is a first specifier, the source operand descriptor is further usable to indicate at least in part a second specifier of the plurality of specifiers, the first specifier and the second specifier are respectively associated with a first task and a second task, and the first task and the second task respectively implement a first portion of a neural network and a second portion of the neural network.

6. The method of claim 5, wherein the first portion of the neural network and the second portion of the neural network implement portions of one or more of: receiving activations of a neuron of a neural network, computing activations of a neuron of a neural network, transmitting activations of a neuron of a neural network, computing partial sums of activations of a neural network, receiving deltas of a neural network, computing deltas of a neural network, transmitting deltas of a neural network, receiving errors of a neural network, computing errors of a neural network, transmitting errors of a neural network, computing gradient estimates of a neural network, and updating weights of a neural network.

7. The method of claim 6, wherein the sending processing element is one of a fabric of processing elements, each processing element of the fabric of processing elements comprises a fabric router and a compute engine collectively enabled to perform dataflow-based and instruction-based processing, and the fabric of processing elements is implemented via wafer-scale integration.

8. The method of claim 5, wherein the second portion of the neural network is dependent on the first portion of the neural network.

9. The method of claim 1, wherein one or more of the sending, the routing, the receiving, and the processing comprise transitioning between implementing a first portion of a neural network and implementing a second portion of the neural network.

10. The method of claim 1, wherein the packet further comprises an index and further comprising:
reading one or more instructions from a memory of the at least one receiving processing element;
initiating execution of one of the one or more instructions;
wherein, responsive to the indicator selectively indicating the packet is a control packet, the reading is in accordance with the index; and
wherein, responsive to the indicator selectively indicating the packet is other than a control packet, the reading is in accordance with the specifier.

11. The method of claim 10, wherein the sending processing element is one of a fabric of processing elements, and each processing element of the fabric of processing elements comprises a fabric router and a compute engine enabled to perform dataflow-based and instruction-based processing.

12. The method of claim 11, wherein the fabric of processing elements is implemented via wafer-scale integration.

13. A method comprising:
sending a first packet by a sending processing element to a fabric, the first packet comprising a first specifier and an indicator, the first specifier being one of a plurality of specifiers each associated with a respective set of one or more sets of packets, the indicator being enabled to selectively indicate that the first packet is a control packet, and the sending comprising executing a first instruction that comprises a destination operand that specifies a destination operand descriptor that is usable to determine at least in part the first specifier and the indicator;
routing the first packet from the sending processing element to one or more receiving processing elements, the routing being in accordance with the first specifier and via the fabric and one or more routing elements;
in at least one of the receiving processing elements, receiving the first packet from the fabric and processing the first packet;
wherein the receiving comprises associating the first packet with the respective set associated with the first specifier;
wherein the processing comprises executing a second instruction that comprises a source operand that specifies a source operand descriptor that is usable to indicate at least in part the first specifier, to indicate at least in part a second specifier of the plurality of specifiers, and to selectively indicate termination upon receipt of a control packet; and
further comprising selecting for processing a second packet associated with the respective set associated with the second specifier, responsive to (a) the first packet being older than any other packets associated with the respective set associated with the first specifier, (b) the indicator selectively indicating the first packet is a control packet, and (c) the source operand descriptor selectively indicating to terminate upon receipt of a control packet.

14. The method of claim 13, further comprising terminating the second instruction.

15. The method of claim 13, wherein the first packet further comprises an index and further comprising:
reading one or more instructions from a memory of the at least one receiving processing element;
initiating execution of one of the one or more instructions;
wherein, responsive to the indicator selectively indicating the first packet is a control packet, the reading is in accordance with the index; and
wherein, responsive to the indicator selectively indicating the first packet is other than a control packet, the reading is in accordance with the first specifier.

16. The method of claim 13, wherein the first specifier and the second specifier are respectively associated with a first task and a second task, and the first task and the second task respectively implement a first portion of a neural network and a second portion of the neural network.

17. The method of claim 16, wherein the first portion of the neural network and the second portion of the neural network implement portions of one or more of: receiving activations of a neuron of a neural network, computing activations of a neuron of a neural network, transmitting activations of a neuron of a neural network, computing partial sums of activations of a neural network, receiving deltas of a neural network, computing deltas of a neural network, transmitting deltas of a neural network, receiving errors of a neural network, computing errors of a neural network, transmitting errors of a neural network, computing gradient estimates of a neural network, and updating weights of a neural network.

18. A system comprising:
- a sending processing element comprising means for sending a packet to a fabric, the packet comprising a specifier and an indicator, the specifier being one of a plurality of specifiers each associated with a respective set of one or more sets of packets, the indicator being enabled to selectively indicate that the packet is a control packet, and wherein the means for sending comprises means for executing a first instruction that comprises a destination operand that specifies a destination operand descriptor that is usable to determine at least in part the specifier and the indicator;
- one or more receiving processing elements and one or more routing elements;
- means for routing the packet from the sending processing element to the receiving processing elements, the means for routing being operable in accordance with the specifier and further operable via the fabric and the routing elements;
- wherein at least one of the receiving processing elements comprises means for receiving the packet from the fabric and further comprises means for processing the packet;
- wherein the means for receiving comprises means for associating the packet with the respective set associated with the specifier;
- wherein the means for processing comprises means for executing a second instruction that comprises a source operand that specifies a source operand descriptor that is usable to indicate at least in part the specifier and to selectively indicate termination upon receipt of a control packet; and
- wherein the means for executing the second instruction comprises means for terminating the second instruction, responsive to
  - (a) the packet being older than any other packets associated with the respective set associated with the specifier,
  - (b) the indicator selectively indicating the packet is a control packet, and
  - (c) the source operand descriptor selectively indicating to terminate upon receipt of a control packet.

19. The system of claim 18, wherein the packet is a first packet, the specifier is a first specifier, the source operand descriptor is further usable to indicate at least in part a second specifier of the plurality of specifiers, and further comprising means for selecting for processing a second packet associated with the respective set associated with the second specifier.

20. The system of claim 19, wherein:
- the first packet further comprises an index;
- the destination operand descriptor is usable to determine at least in part the index;
- the at least one receiving processing element comprises means for reading and executing one or more instructions;
- the reading is from a memory of the at least one receiving processing element at an address determined based at least in part on the index; and
- the address is based at least in part on a portion of the index plus a base register of the at least one receiving processing element.

* * * * *